US010840707B2

(12) United States Patent
Lyden

(10) Patent No.: US 10,840,707 B2
(45) Date of Patent: Nov. 17, 2020

(54) UTILITY POLE WITH SOLAR MODULES AND WIRELESS DEVICE AND METHOD OF RETROFITTING EXISTING UTILITY POLE

(71) Applicant: Robert M. Lyden, Ashland, OR (US)

(72) Inventor: Robert M. Lyden, Ashland, OR (US)

( * ) Notice: Subject to any disclaimer, the term of this patent is extended or adjusted under 35 U.S.C. 154(b) by 0 days.

(21) Appl. No.: 16/055,883

(22) Filed: Aug. 6, 2018

(65) Prior Publication Data

US 2020/0044453 A1 Feb. 6, 2020

(51) Int. Cl.
| | |
|---|---|
| *H02J 3/38* | (2006.01) |
| *H01Q 1/44* | (2006.01) |
| *H02J 50/20* | (2016.01) |
| *H02S 20/20* | (2014.01) |
| *F24S 25/10* | (2018.01) |

(52) U.S. Cl.
CPC ............. *H02J 3/383* (2013.01); *F24S 25/10* (2018.05); *H01Q 1/44* (2013.01); *H02J 50/20* (2016.02); *H02S 20/20* (2014.12)

(58) Field of Classification Search
CPC ........... H02J 3/383; H02J 50/20; H02S 20/20; H01Q 1/44; F24S 25/10
USPC ........................................................ 320/101
See application file for complete search history.

(56) References Cited

U.S. PATENT DOCUMENTS

| | | |
|---|---|---|
| 645,576 A | 3/1900 | Tesla |
| 649,621 A | 5/1900 | Tesla |
| 685,957 A | 11/1901 | Tesla |
| 787,412 A | 4/1905 | Tesla |
| 1,119,732 A | 12/1914 | Tesla |
| 3,844,840 A | 10/1974 | Bender |
| 4,173,229 A | 11/1979 | Halfon |
| 4,200,904 A | 4/1980 | Doan |
| 4,204,147 A | 5/1980 | King |
| 4,224,082 A | 9/1980 | Jacobson |
| 4,281,369 A | 7/1981 | Batte |
| 4,295,189 A | 10/1981 | Boys |
| 4,365,106 A | 12/1982 | Pulvari |
| 4,414,252 A | 11/1983 | Lampkin |
| 4,532,537 A | 7/1985 | Kane |
| 4,563,630 A | 1/1986 | Woodward et al. |
| 4,609,770 A | 9/1986 | Nishiura et al. |
| 4,636,579 A | 1/1987 | Hanak et al. |
| 4,670,293 A | 6/1987 | Yamano et al. |

(Continued)

FOREIGN PATENT DOCUMENTS

| | | |
|---|---|---|
| DE | 10107600 C1 | 8/2002 |
| EP | 1024550 A1 | 8/2000 |

(Continued)

OTHER PUBLICATIONS

"Jmbamboo", website http://home.att.net/jmbamboo/ from Nov. 30, 2002. Available from www.archive.org. 4 pages.

(Continued)

*Primary Examiner* — M Baye Diao
(74) *Attorney, Agent, or Firm* — Westman, Champlin & Koehler, P.A.

(57) ABSTRACT

A utility pole includes one or more solar modules configured to collect solar energy and convert the solar energy to electromagnetic energy and a wireless device configured to receive the electromagnetic energy from the one or more solar modules and to transmit the electromagnetic energy therefrom.

26 Claims, 87 Drawing Sheets

(56) References Cited

U.S. PATENT DOCUMENTS

| | | | |
|---|---|---|---|
| 4,689,874 A | 9/1987 | Nishiura et al. | |
| 4,717,790 A | 1/1988 | Gochermann | |
| 4,718,185 A | 1/1988 | Conlin et al. | |
| 4,768,738 A | 9/1988 | Weinert | |
| 4,841,416 A | 6/1989 | Doss | |
| 4,873,790 A | 10/1989 | Laterza | |
| 4,881,022 A | 11/1989 | Boys | |
| 4,989,124 A | 1/1991 | Shappell | |
| 5,085,900 A | 2/1992 | Hamlett | |
| 5,126,585 A | 6/1992 | Boys | |
| 5,149,188 A | 9/1992 | Robbins | |
| 5,270,636 A | 12/1993 | Lafferty | |
| 5,293,308 A | 3/1994 | Boys et al. | |
| 5,315,227 A | 5/1994 | Pierson et al. | |
| D353,014 S | 11/1994 | Elazari | |
| 5,385,848 A | 1/1995 | Grimmer | |
| 5,433,259 A | 7/1995 | Faludy | |
| 5,450,305 A | 9/1995 | Boys et al. | |
| 5,455,767 A | 10/1995 | Staerker | |
| 5,460,441 A | 10/1995 | Hastings et al. | |
| 5,478,407 A | 12/1995 | Dorison et al. | |
| 5,482,569 A | 1/1996 | Ihara et al. | |
| 5,528,113 A | 6/1996 | Boys et al. | |
| 5,564,816 A | 10/1996 | Arcadia et al. | |
| 5,584,940 A | 12/1996 | Yoshida | |
| 5,592,074 A | 1/1997 | Takehara | |
| 5,611,176 A | 3/1997 | Juengert et al. | |
| 5,619,078 A | 4/1997 | Boys et al. | |
| 5,674,325 A | 10/1997 | Albright et al. | |
| 5,703,468 A | 12/1997 | Petrillo | |
| 5,787,649 A | 8/1998 | Popowych et al. | |
| 5,821,638 A | 10/1998 | Boys et al. | |
| 5,863,354 A | 1/1999 | Yoshida | |
| 5,868,404 A * | 2/1999 | Montague | A63C 17/1409 |
| | | | 280/11.213 |
| 5,898,579 A | 4/1999 | Boys et al. | |
| 5,969,497 A | 10/1999 | McDonald et al. | |
| 6,020,658 A | 2/2000 | Woodhead et al. | |
| 6,049,315 A | 4/2000 | Meyer | |
| 6,060,658 A | 5/2000 | Yoshida et al. | |
| 6,099,637 A | 8/2000 | Cordaro | |
| 6,100,663 A | 8/2000 | Boys et al. | |
| 6,124,378 A | 9/2000 | Cordaro et al. | |
| 6,127,799 A * | 10/2000 | Krishnan | G06K 19/0723 |
| | | | 320/104 |
| 6,160,215 A | 12/2000 | Curtin | |
| 6,168,968 B1 | 1/2001 | Umemoto et al. | |
| 6,188,179 B1 | 2/2001 | Boys et al. | |
| 6,211,043 B1 | 4/2001 | Nishio et al. | |
| 6,224,016 B1 | 5/2001 | Lee et al. | |
| 6,237,521 B1 | 5/2001 | Müller | |
| 6,238,521 B1 | 5/2001 | Sing et al. | |
| 6,271,053 B1 | 8/2001 | Kondo | |
| 6,294,722 B1 | 9/2001 | Kondo et al. | |
| 6,300,158 B1 | 10/2001 | Simburger et al. | |
| 6,310,281 B1 | 10/2001 | Wendt et al. | |
| 6,313,394 B1 | 11/2001 | Shugar et al. | |
| 6,327,994 B1 | 12/2001 | Labrador | |
| 6,343,440 B1 | 2/2002 | Ayers | |
| 6,380,477 B1 | 4/2002 | Curtin | |
| 6,437,231 B2 | 8/2002 | Kurata et al. | |
| 6,455,767 B1 | 9/2002 | Müller | |
| 6,480,366 B1 | 11/2002 | Cordaro | |
| 6,483,202 B1 | 11/2002 | Boys | |
| 6,507,169 B1 | 1/2003 | Holtom et al. | |
| 6,543,725 B1 | 4/2003 | Meurer et al. | |
| 6,552,405 B2 | 4/2003 | Sugawara et al. | |
| 6,565,701 B1 | 5/2003 | Jerabek et al. | |
| 6,576,290 B2 | 6/2003 | Cordaro et al. | |
| 6,621,183 B1 | 9/2003 | Boys | |
| 6,705,441 B1 | 3/2004 | Boys et al. | |
| 6,903,532 B2 | 6/2005 | Boys et al. | |
| 6,975,198 B2 | 12/2005 | Baarman et al. | |
| 7,126,450 B2 | 10/2006 | Baarman et al. | |
| 7,212,414 B2 | 5/2007 | Baarman | |
| 7,233,222 B2 | 6/2007 | Baarman et al. | |
| 7,279,850 B2 | 10/2007 | Boys et al. | |
| 7,385,357 B2 | 6/2008 | Kuennen et al. | |
| 7,462,951 B1 | 12/2008 | Baarman et al. | |
| 7,474,062 B2 | 1/2009 | Boys et al. | |
| 7,518,267 B2 | 4/2009 | Baarman | |
| 7,522,878 B2 | 4/2009 | Baarman | |
| 7,633,235 B2 | 12/2009 | Boys | |
| 7,656,282 B2 * | 2/2010 | Saitou | B60C 23/0408 |
| | | | 340/442 |
| 7,741,734 B2 | 6/2010 | Joannopoulos et al. | |
| 7,781,916 B2 | 8/2010 | Boys | |
| 7,825,543 B2 | 11/2010 | Karalis et al. | |
| 7,969,269 B2 | 6/2011 | Boys et al. | |
| 8,319,091 B2 | 11/2012 | Lyden | |
| 8,957,301 B2 | 2/2015 | Lyden | |
| D740,187 S | 10/2015 | Jamieson | |
| 9,716,464 B2 * | 7/2017 | Collins | H02S 20/10 |
| 10,017,265 B1 * | 7/2018 | Larsen | B64D 27/24 |
| 2001/0020485 A1 | 9/2001 | Ford et al. | |
| 2001/0035205 A1 | 11/2001 | Kurata et al. | |
| 2002/0000242 A1 | 1/2002 | Matushiita et al. | |
| 2002/0092558 A1 | 7/2002 | Kim et al. | |
| 2002/0129849 A1 | 9/2002 | Heckeroth | |
| 2002/0134422 A1 | 9/2002 | Bauman et al. | |
| 2002/0139411 A1 | 10/2002 | Hiraishi et al. | |
| 2002/0153037 A1 | 10/2002 | Fischer | |
| 2002/0157702 A1 | 10/2002 | Cordaro | |
| 2002/0158584 A1 | 10/2002 | Cordaro | |
| 2002/0168474 A1 | 11/2002 | Cordaro et al. | |
| 2002/0182769 A1 | 12/2002 | Campbell | |
| 2002/0184833 A1 | 12/2002 | Jones | |
| 2003/0029493 A1 | 2/2003 | Plessing | |
| 2003/0041894 A1 | 3/2003 | Sverdrup, Jr. et al. | |
| 2003/0113481 A1 | 6/2003 | Huang et al. | |
| 2003/0127127 A1 | 7/2003 | Inamasu et al. | |
| 2003/0127128 A1 | 7/2003 | Fabick et al. | |
| 2003/0141417 A1 | 7/2003 | Cordaro | |
| 2003/0188777 A1 | 10/2003 | Gaudiana et al. | |
| 2004/0200522 A1 | 10/2004 | Fukawa et al. | |
| 2004/0211456 A1 | 10/2004 | Brown et al. | |
| 2004/0211459 A1 | 10/2004 | Suenaga et al. | |
| 2004/0221886 A1 | 11/2004 | Oono | |
| 2006/0065302 A1 | 3/2006 | Gibson et al. | |
| 2008/0054638 A1 | 3/2008 | Greene et al. | |
| 2008/0067874 A1 | 3/2008 | Tseng | |
| 2008/0074248 A1 * | 3/2008 | Mori | B60C 23/0416 |
| | | | 340/438 |
| 2008/0278264 A1 | 11/2008 | Karalis et al. | |
| 2009/0045773 A1 | 2/2009 | Pandya et al. | |
| 2009/0129126 A1 | 5/2009 | Boys | |
| 2009/0195332 A1 | 8/2009 | Joannopoulos et al. | |
| 2009/0195333 A1 | 8/2009 | Joannopoulos et al. | |
| 2009/0224856 A1 | 9/2009 | Karalis et al. | |
| 2009/0267709 A1 | 10/2009 | Joannopoulos et al. | |
| 2009/0267710 A1 | 10/2009 | Joannopoulos et al. | |
| 2009/0284083 A1 | 11/2009 | Karalis et al. | |
| 2009/0302688 A1 | 12/2009 | Boys | |
| 2010/0019604 A1 | 1/2010 | Sivasubramaniam et al. | |
| 2010/0096934 A1 | 4/2010 | Joannopoulos et al. | |
| 2010/0102639 A1 | 4/2010 | Joannopoulos et al. | |
| 2010/0102640 A1 | 4/2010 | Joannopoulos et al. | |
| 2010/0102641 A1 | 4/2010 | Joannopoulos et al. | |
| 2010/0109445 A1 | 5/2010 | Kurs et al. | |
| 2010/0117455 A1 | 5/2010 | Joannopoulos et al. | |
| 2010/0117456 A1 | 5/2010 | Karalis et al. | |
| 2010/0123353 A1 | 5/2010 | Joannopoulos et al. | |
| 2010/0123354 A1 | 5/2010 | Joannopoulos et al. | |
| 2010/0123355 A1 | 5/2010 | Joannopoulos et al. | |
| 2010/0127573 A1 | 5/2010 | Joannopoulos et al. | |
| 2010/0127574 A1 | 5/2010 | Joannopoulos et al. | |
| 2010/0127575 A1 | 5/2010 | Joannopoulos et al. | |
| 2010/0133918 A1 | 6/2010 | Joannopoulos et al. | |
| 2010/0133919 A1 | 6/2010 | Joannopoulos et al. | |
| 2010/0133920 A1 | 6/2010 | Joannopoulos et al. | |
| 2010/0141042 A1 | 6/2010 | Kesler et al. | |
| 2010/0148589 A1 | 6/2010 | Hamam et al. | |
| 2010/0164296 A1 | 7/2010 | Kurs et al. | |
| 2010/0164297 A1 | 7/2010 | Kurs et al. | |

(56) References Cited

U.S. PATENT DOCUMENTS

| | | | |
|---|---|---|---|
| 2010/0164298 A1 | 7/2010 | Karalis et al. | |
| 2010/0171368 A1 | 7/2010 | Schatz et al. | |
| 2010/0171370 A1 | 7/2010 | Karalis et al. | |
| 2010/0181844 A1 | 7/2010 | Karalis et al. | |
| 2010/0187911 A1 | 7/2010 | Joannopoulos et al. | |
| 2010/0201205 A1 | 8/2010 | Karalis et al. | |
| 2010/0207458 A1 | 8/2010 | Joannopoulos et al. | |
| 2010/0219694 A1 | 9/2010 | Kurs et al. | |
| 2010/0225175 A1 | 9/2010 | Karalis et al. | |
| 2010/0231053 A1 | 9/2010 | Karalis et al. | |
| 2010/0237706 A1 | 9/2010 | Karalis et al. | |
| 2010/0237707 A1 | 9/2010 | Karalis et al. | |
| 2010/0237708 A1 | 9/2010 | Karalis et al. | |
| 2010/0253152 A1 | 10/2010 | Karalis et al. | |
| 2010/0259108 A1 | 10/2010 | Giler et al. | |
| 2010/0264745 A1 | 10/2010 | Karalis et al. | |
| 2010/0277005 A1 | 11/2010 | Karalis et al. | |
| 2010/0289340 A1 | 11/2010 | Boys et al. | |
| 2010/0327657 A1* | 12/2010 | Kuran | H02J 3/38 307/43 |
| 2010/0327660 A1 | 12/2010 | Karalis et al. | |
| 2010/0327661 A1 | 12/2010 | Karalis et al. | |
| 2011/0002574 A1 | 1/2011 | Bermel et al. | |
| 2011/0012431 A1 | 1/2011 | Karalis et al. | |
| 2011/0018361 A1 | 1/2011 | Karalis et al. | |
| 2011/0025131 A1 | 2/2011 | Karalis et al. | |
| 2011/0043046 A1 | 2/2011 | Joannopoulos et al. | |
| 2011/0043047 A1 | 2/2011 | Karalis et al. | |
| 2011/0043048 A1 | 2/2011 | Karalis et al. | |
| 2011/0043049 A1 | 2/2011 | Karalis et al. | |
| 2011/0049996 A1 | 3/2011 | Karalis et al. | |
| 2011/0049998 A1 | 3/2011 | Karalis et al. | |
| 2011/0069339 A1 | 3/2011 | Huang et al. | |
| 2011/0074218 A1 | 3/2011 | Karalis et al. | |
| 2011/0074346 A1 | 3/2011 | Hall et al. | |
| 2011/0074347 A1 | 3/2011 | Karalis et al. | |
| 2011/0105020 A1 | 5/2011 | Boys et al. | |
| 2011/0116290 A1 | 5/2011 | Boys | |
| 2011/0133570 A1 | 6/2011 | Mayo et al. | |
| 2011/0140544 A1 | 6/2011 | Karalis et al. | |
| 2011/0148219 A1 | 6/2011 | Karalis et al. | |
| 2011/0162895 A1 | 7/2011 | Karalis et al. | |
| 2012/0181973 A1 | 7/2012 | Lyden | |
| 2013/0012061 A1* | 1/2013 | Rotzoll | H02M 7/003 439/535 |
| 2017/0040927 A1* | 2/2017 | Collins | H02S 40/34 |
| 2017/0324367 A1* | 11/2017 | Collins | H02S 30/20 |

FOREIGN PATENT DOCUMENTS

| | | |
|---|---|---|
| JP | H05152596 A | 6/1993 |
| JP | H05226681 A | 9/1993 |
| JP | H11168228 A | 6/1999 |

OTHER PUBLICATIONS

"Xantrex Technology Inc." website www.xantrex.com/product.asp?did=133 from Dec. 4, 2002, available from www.archive.org. 2 pages.
S.L. Wilkinson, "Electric Vehicles Gear Up" Chem. Eng. News., Oct. 13, 1997. 12 Pages.
K. Kurani et al, "The Marketability of Electric Vehicles: Battery Performance and Consumer Demand for Driving Range" 11th Annual Battery Conf. on Applications and Advances, p. 153-158. (1996).
"An Electric Vehicle Education Program" website http://www.science.sunbaru.com/teaching_ideas/constancejohnson.shtml, available from www.archive.org. 3 pages.
Lyden Letter to Govenor Arnold Schwarzenegger, Mar. 1, 2004.
Lyden Letter to Governor Arnold Schwarzenegger, Mar. 11, 2004.
"Partnership Plans to Commercialize Holographic Solar PV," Renewable Energy Access.com, 2 pages, Mar. 14, 2005.
"Konarka to Provide Camouflage—Pattern Solar," Renewable Energy Access.com, 2 pages, May 6, 2005.
"Solar Project Challenges Other Investment Options," Renewable Energy Access . com, 2 pages, May 11, 2005.
"Quantum Dots Could Double Solar PV Efficiency," Renewable Energy Access . com, 2 pages, May 24, 2005.
"Kyocera Completes Car Port 'Solar Grove'," Renewable Energy Access . com, 2 pages, Jun. 27, 2005.
"Seeing the Holographic Solar Answer," Renewable Energy Access . com, 1 page, Jul. 7, 2005.
"Cost Competitive Solar Called 'Imminent'," Renewable Energy Access . com, 2 pages, Jul. 21, 2005.
"Inventor Grows Energy-Saving 'Tree'," by Amanda Baillie, Sierra Vista Herald, The Arizona Republic, Aug. 6, 2005.
"GE's Discovery Advances Solar Energy," Renewable Energy Access . com, 1 page, Aug. 22, 2005.
"PV Powered," Website, 1 page, Sep. 28, 2005.
"Nanosolar," Website, 4 pages, Sep. 28, 2005.
"Konarka," website, 4 pages, Sep. 28, 2005.
"Nanosys," website, 6 pages, Sep. 28, 2005.
"Global Solar," website, 5 pages, Sep. 28, 2005.
"Spheral Solar Power," website, 2 pages, Sep. 28, 2005.
"International Energy Outlook 2000," by Jay E. Hakes, Energy Information Administration, Mar. 6, 2000.
"Solar Electric Products Catalog," 10th Ed., Kyocera Solar, Inc., 2003.
"Horne Power Journal," Issue 96, Aug.-Sep. 2003.
Earthflora.com, 10 pages from Website, Aug. 3, 2003.
"Stirling Energy Systems," Product Information from Website, 4 pages, Aug. 29, 2003.
World Oil Market and Oil Price Chronologies: 1970-2002, Energy Information Administration, Feb. 2003.
"Photovoltaic Paint?" by Richard Terra, 1 page.
KingSolar.com, Product Information from Website, 4 pages, Aug. 29, 2003.
R Powr, Product Information, 2 pages.
Uni-Solar PV Shingles, www.cetsolar.com, 2 pages., Aug. 29, 2003.
Sunny Boy, Product Information, 2 pages.
Iowa Thin Film, Product Information, 11 pages, Aug. 3, 2003.
"Electricity Distribution," Wikipedia, 2 pages, Aug. 12, 2003.
"Electric Power Transmission," Wikipedia, 2 pages, Aug. 12, 2003.
"Researchers Move Closer to Plastic, Cheaper Solar Power Cells," by Carrie Peyton, 3 pages, Mar. 29, 2002.
"UC Berkeley, LBNL Chemists Develop Technology for Cheap Plastic Solar Cells," Press Release by UC Berkeley, 2 pages, Mar. 28, 2002.
Novel Material from Lucent's Bell Labs May Lead to Low-Cost, High-Performance Plastic Circuits, by Lucent Technologies, 2 pages, Mar. 29, 2000.
"Solar Cell Pushes Efficiency Barrier," by Spectrolab, 5 pages, Aug. 1, 2003.
"First Solar Technology Wins R&D Award," from SolarAccess.com website, 2 pages, Sep. 16, 2003.
"Superconducting Cables Will be Used to Supply Electricity to Consumers," from www.futureenergies.com webiste, 2 pages, Aug. 13, 2003.
"Can Solar Paint Be Far Behind," by Kelly Beebe, 1 page.
"N. Carolina Sustainable Energy Asso. Regarding PV Sunflower," from website, Sep. 29, 2003.
"UA Scientists Are Developing 'Self-Assembling' Solar Cells," by Lori Stiles, 4 pages, Aug. 27, 2001.
Schwarzenegger Unveils 'Hydrogen Highways' Plan, from website, 2 pages, Apr. 22, 2004.

* cited by examiner

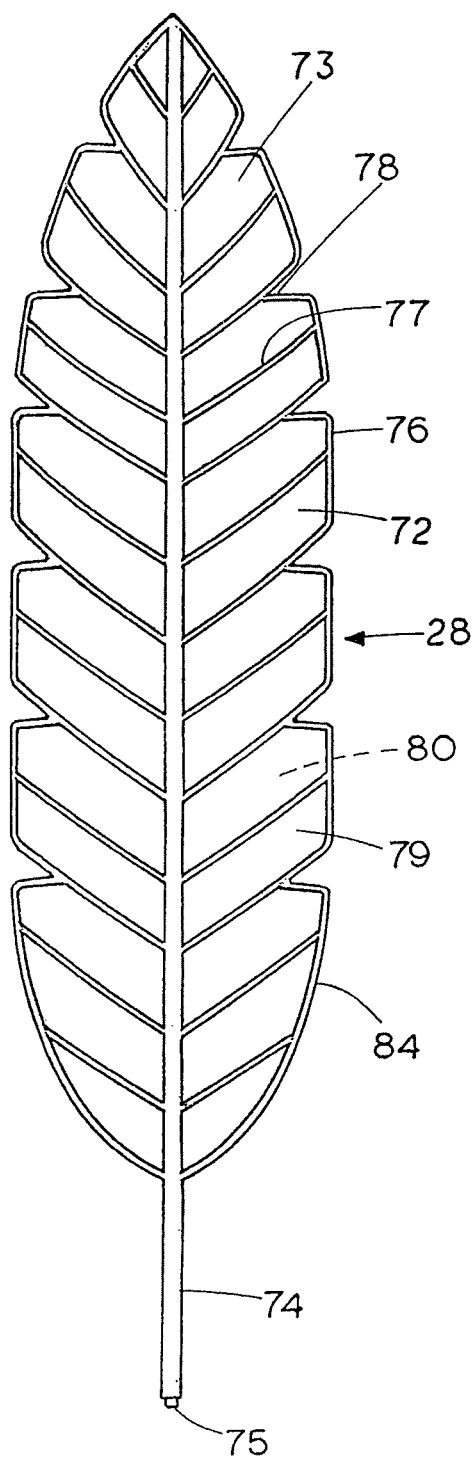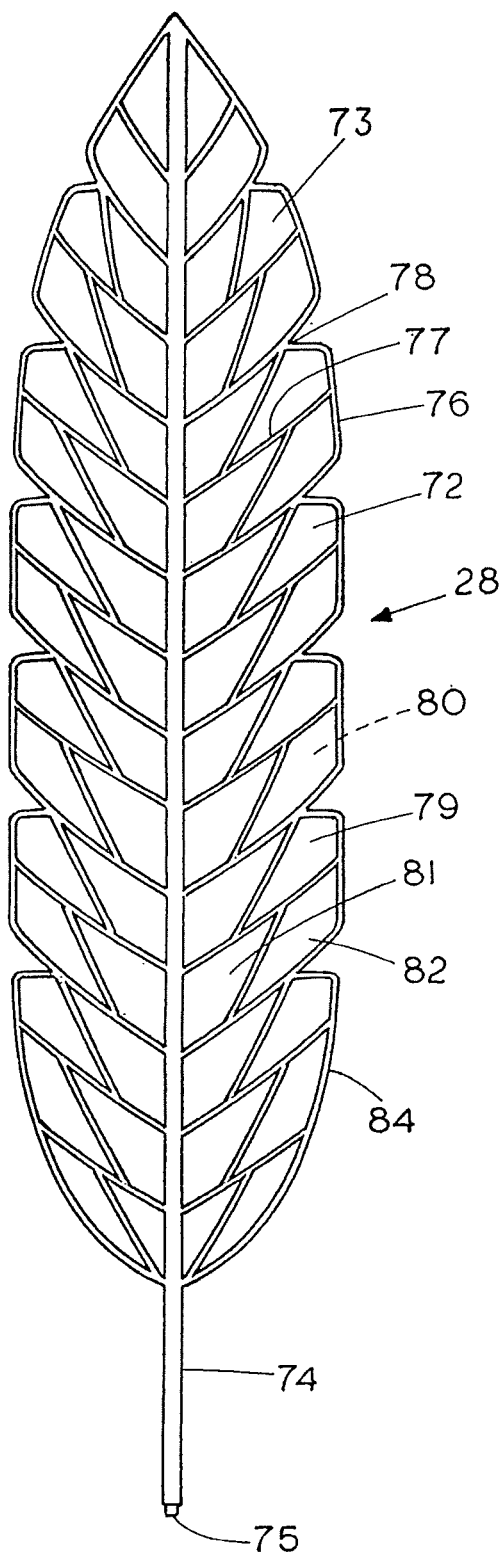

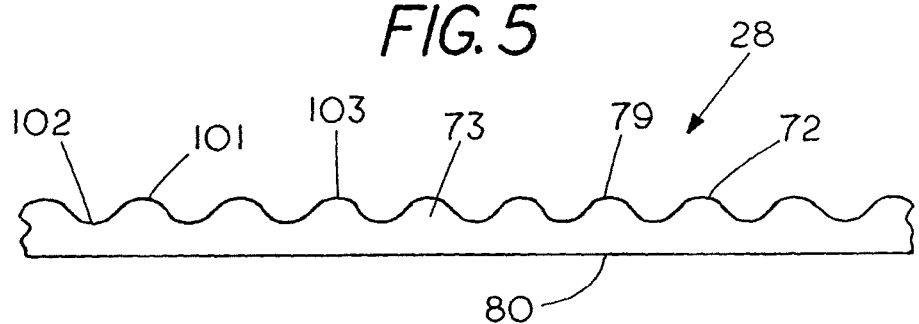
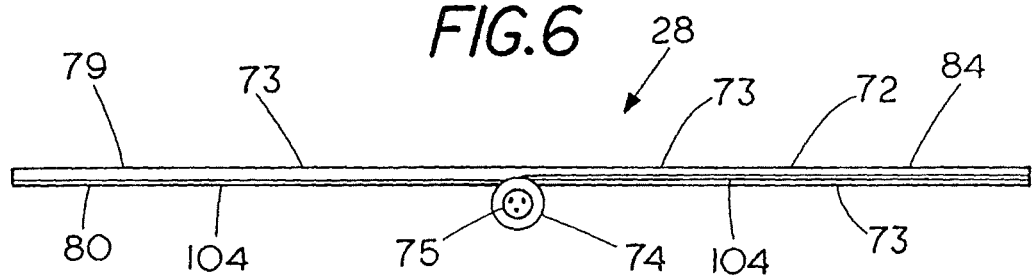
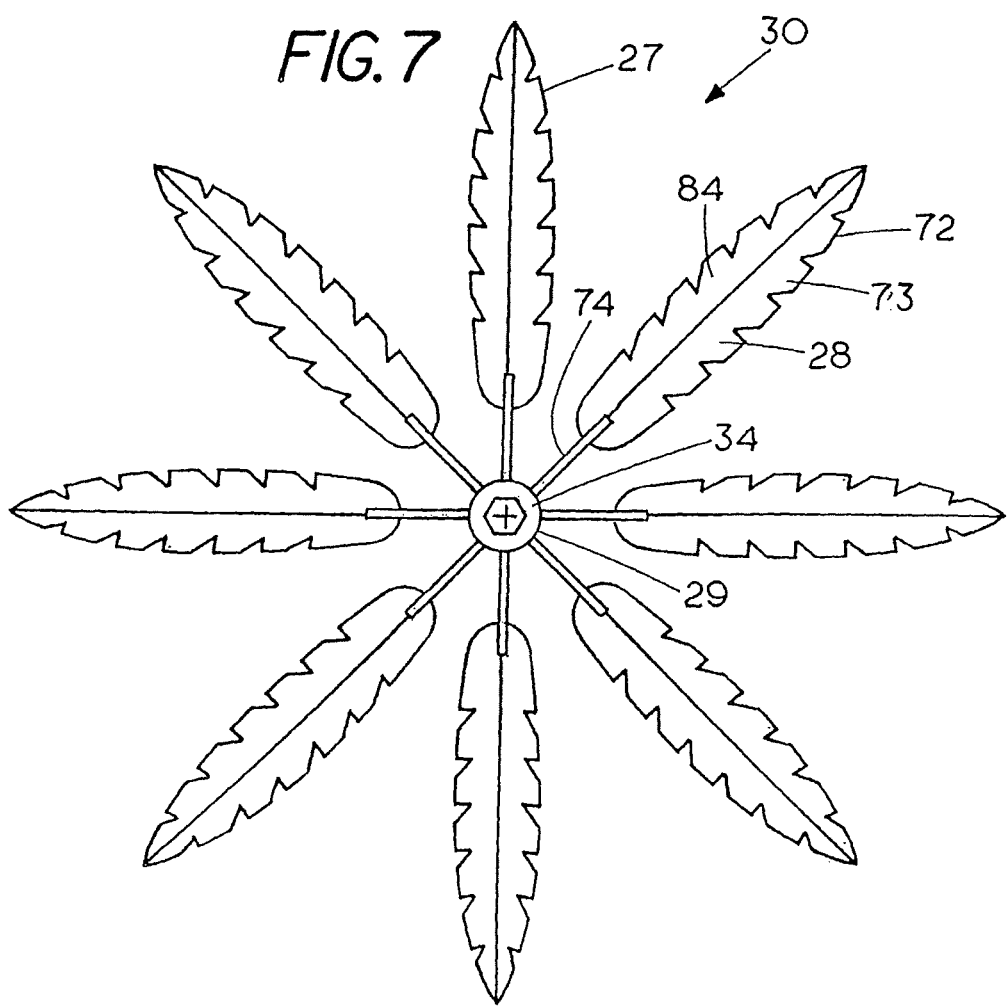

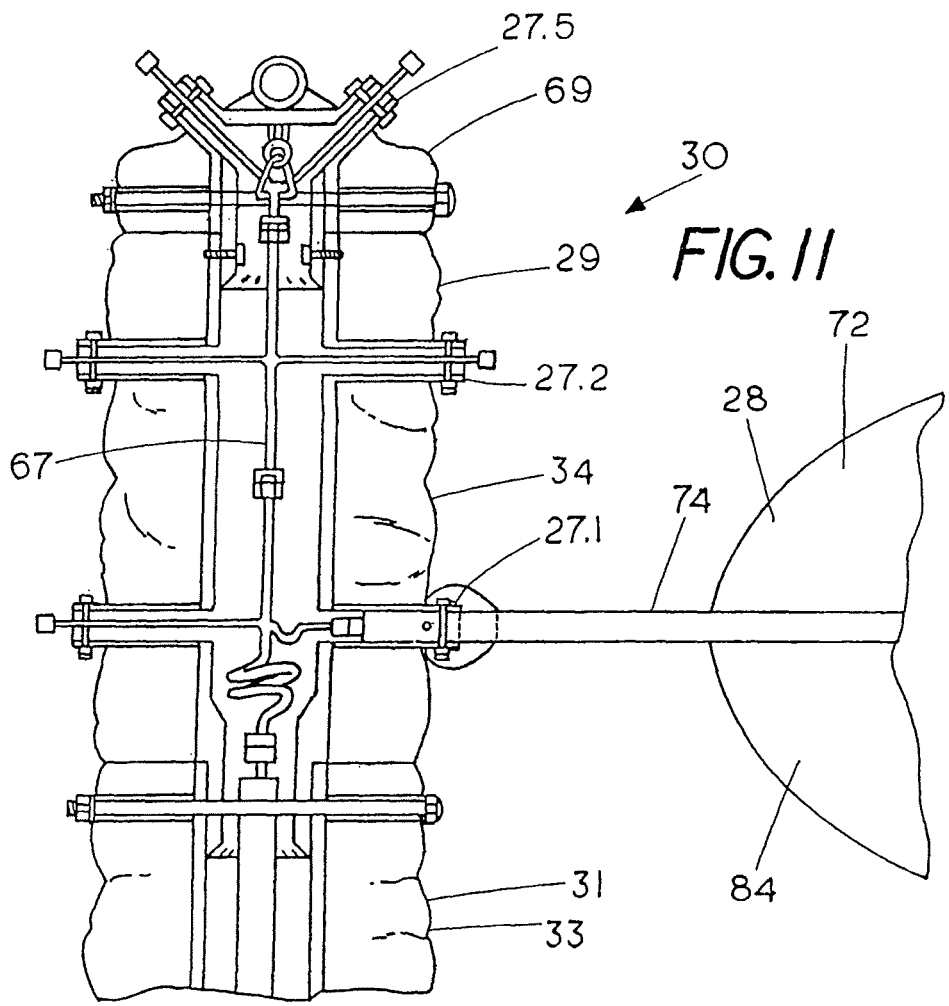
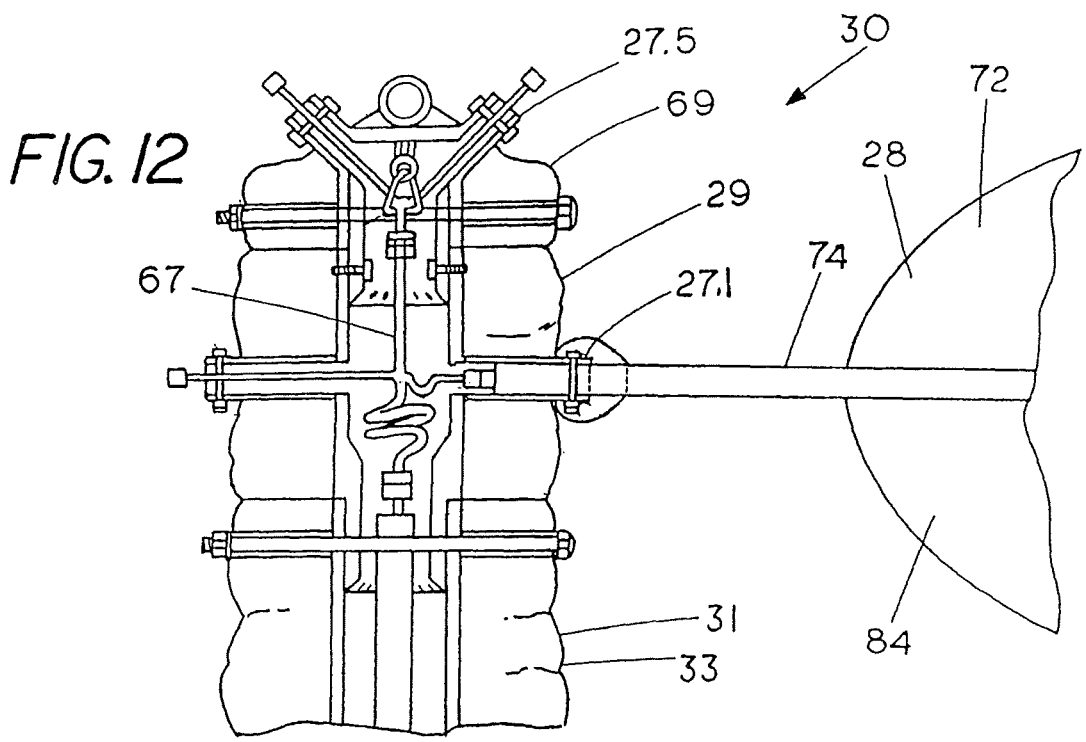

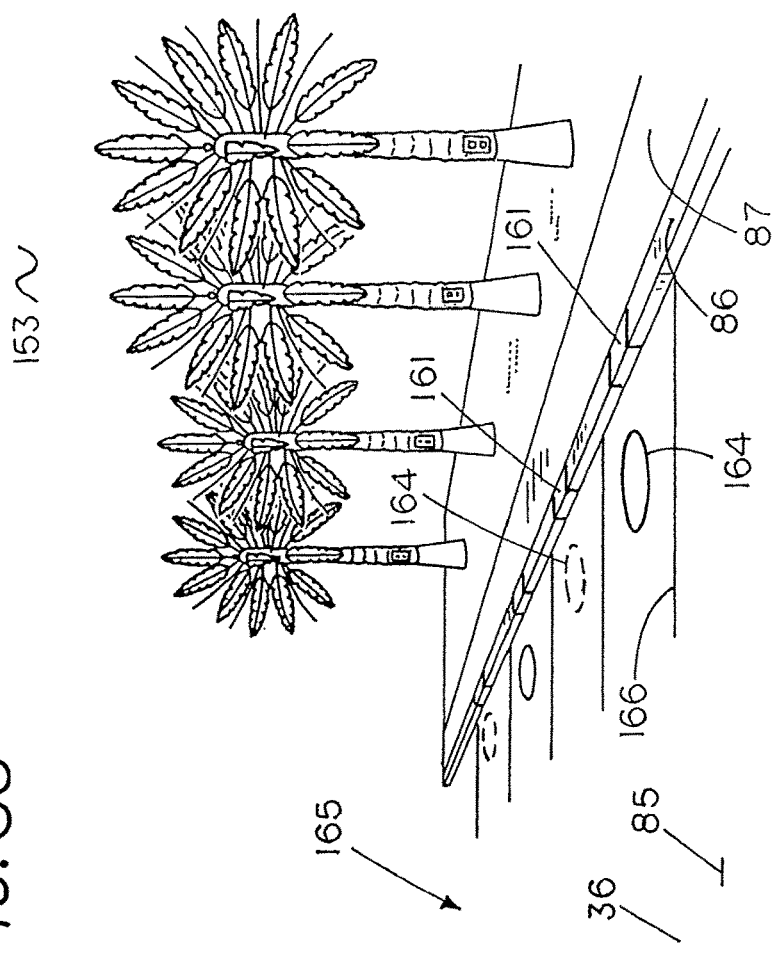
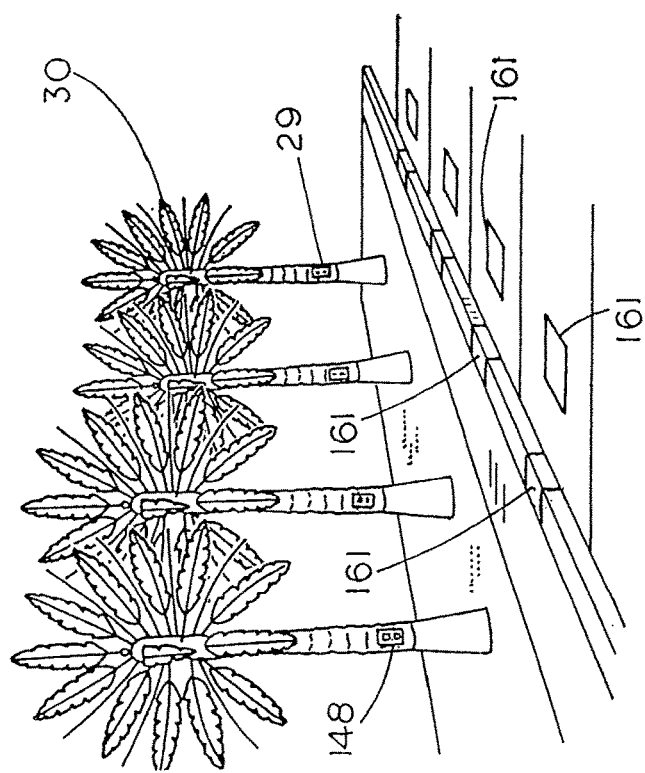
FIG. 36

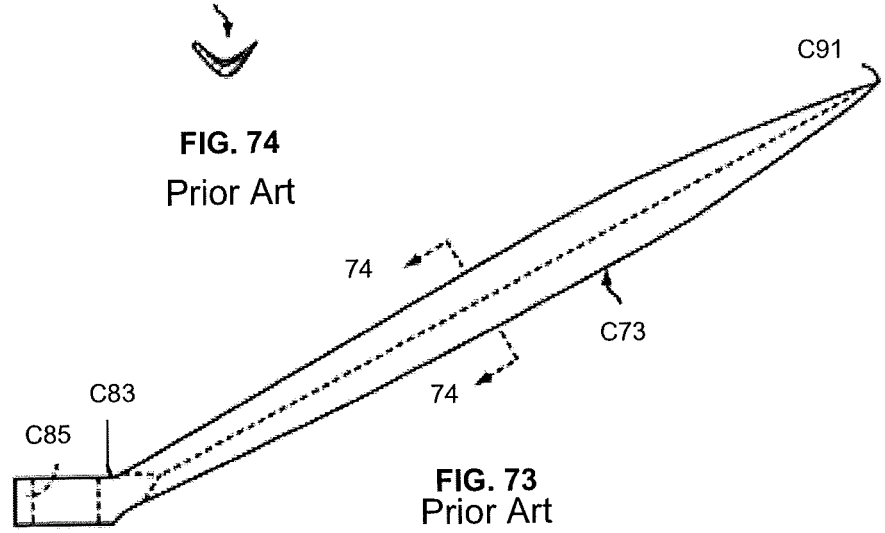
FIG. 74
Prior Art
FIG. 73
Prior Art
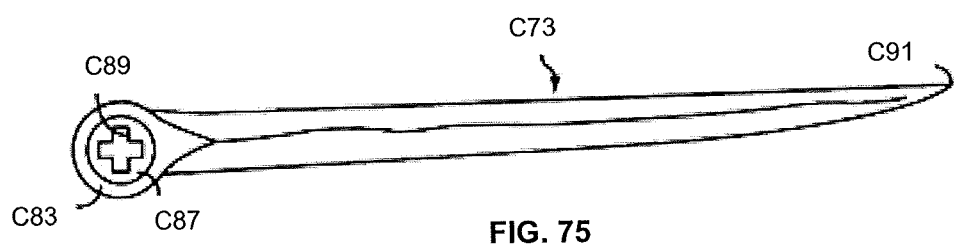
FIG. 75
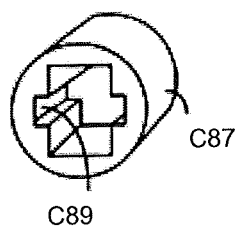
FIG. 77
Prior Art
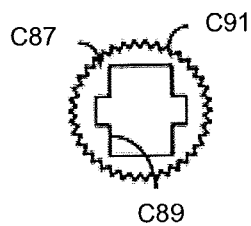
FIG. 78
Prior Art

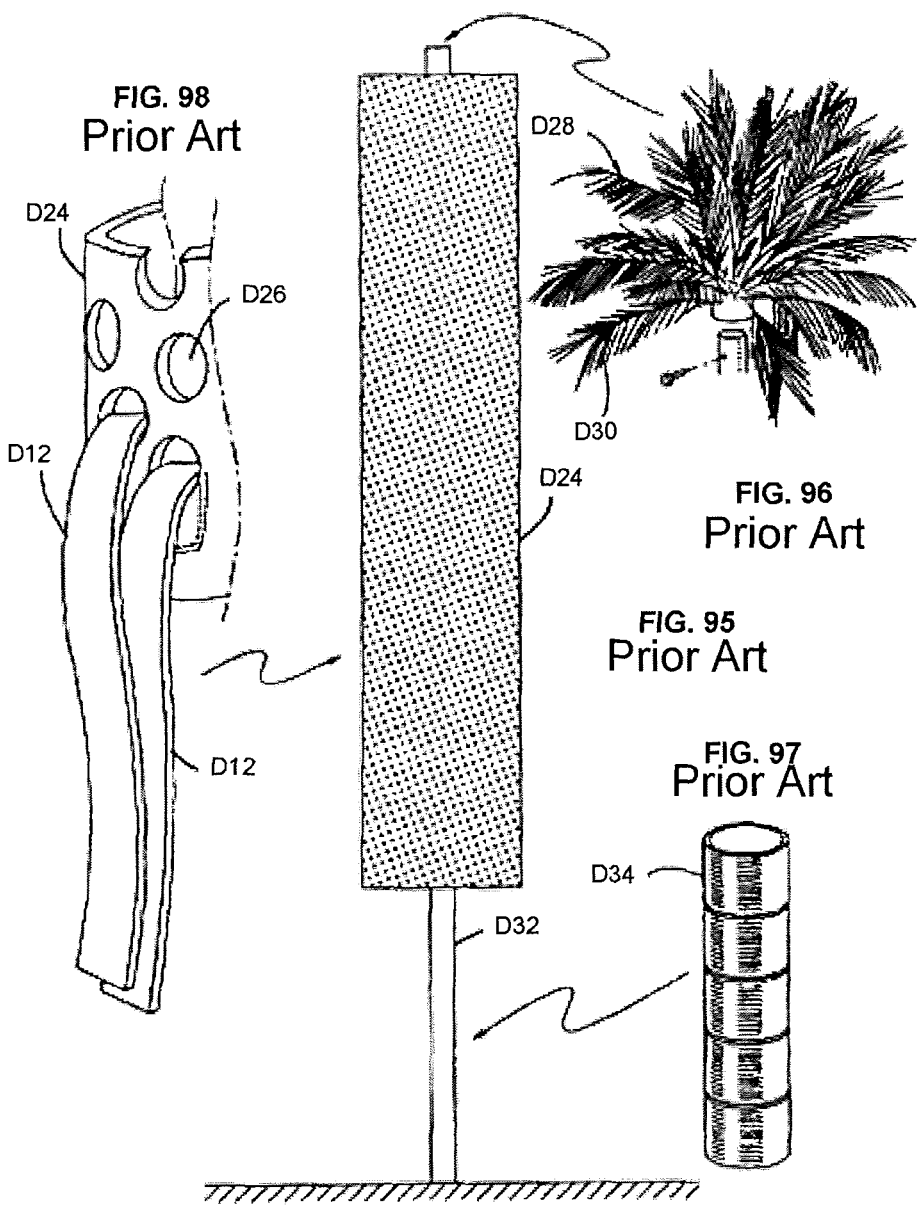

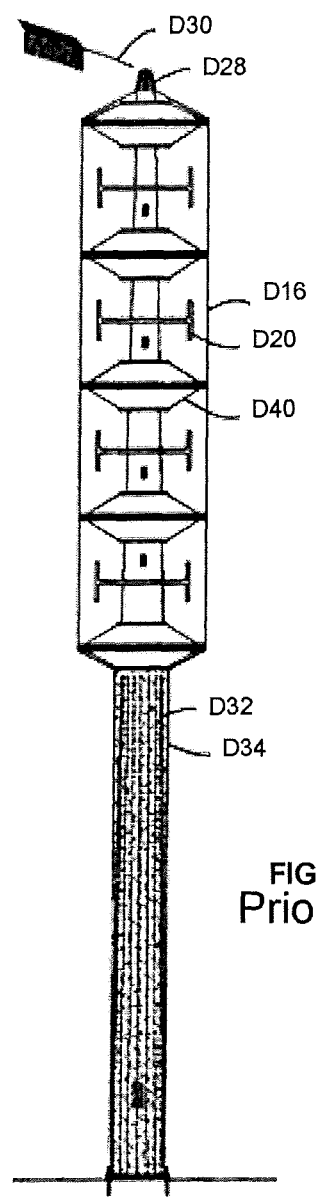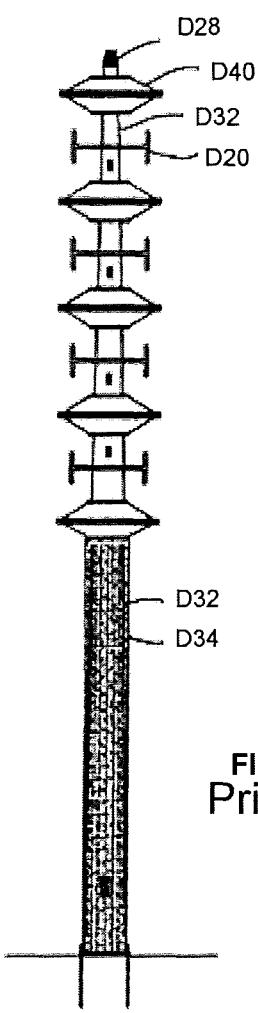
FIG. 99
Prior Art
FIG. 100
Prior Art

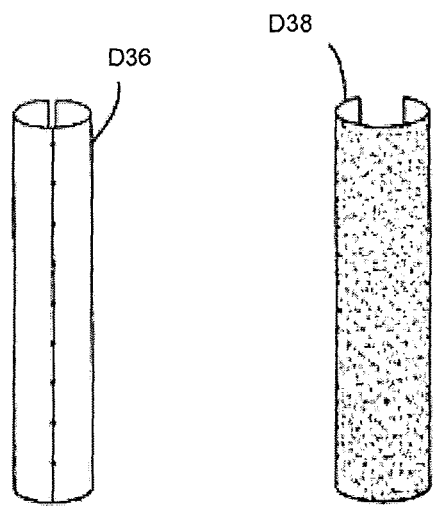
FIG. 107
Prior Art
FIG. 108
Prior Art
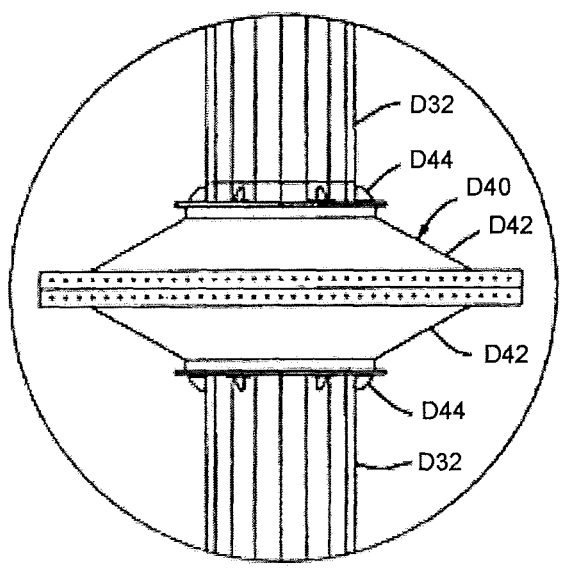
FIG. 109
Prior Art

FIG. 110
Prior Art
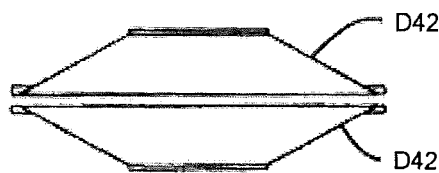
FIG. 111
Prior Art
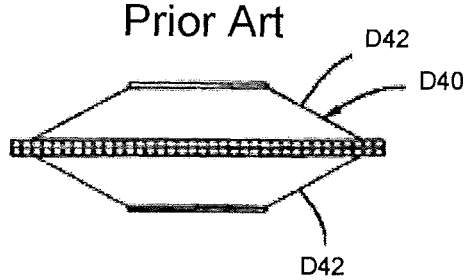
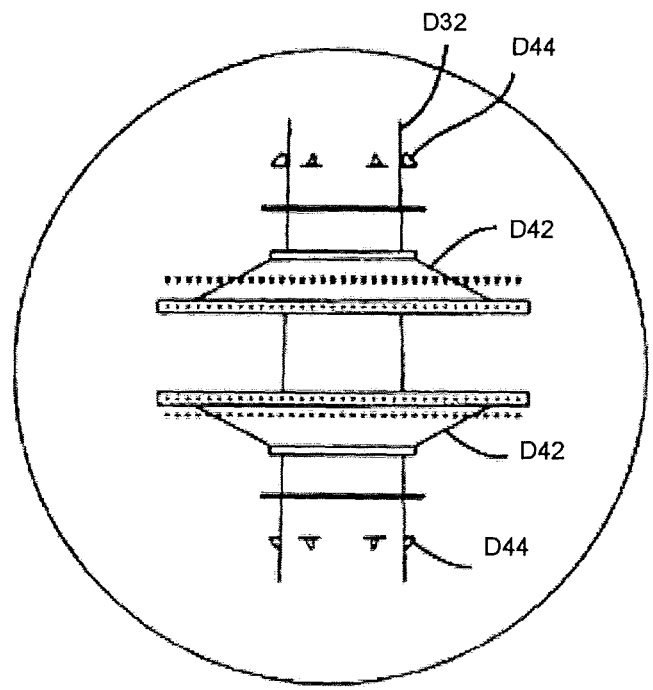
FIG. 112
Prior Art

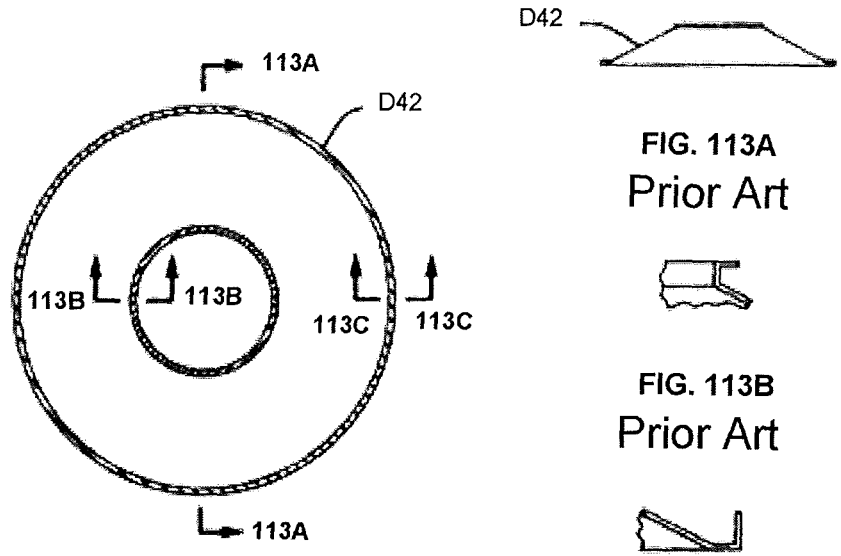
FIG. 113A
Prior Art
FIG. 113B
Prior Art
FIG. 113C
Prior Art
FIG. 113
Prior Art
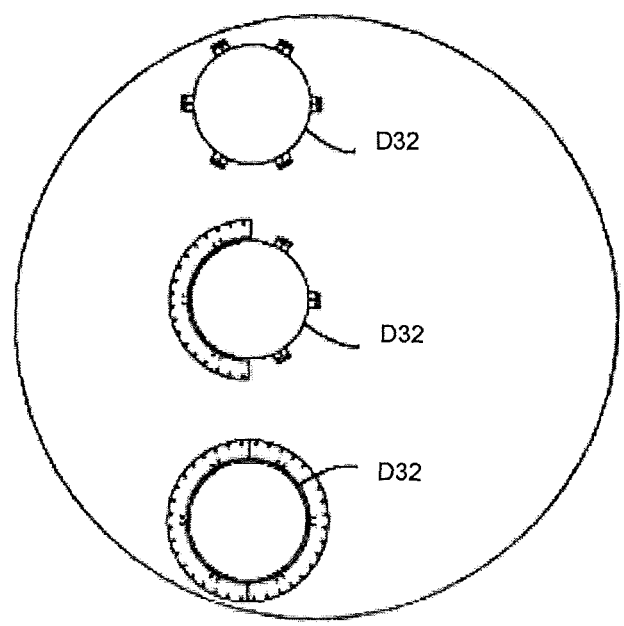
FIG. 114
Prior Art

PRIOR ART

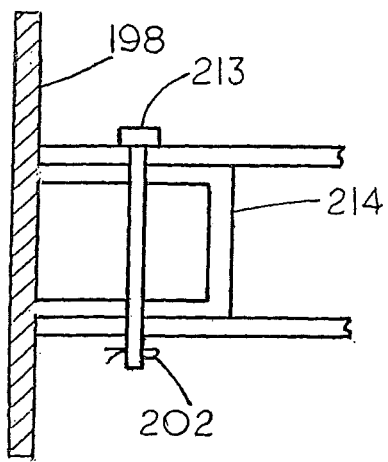
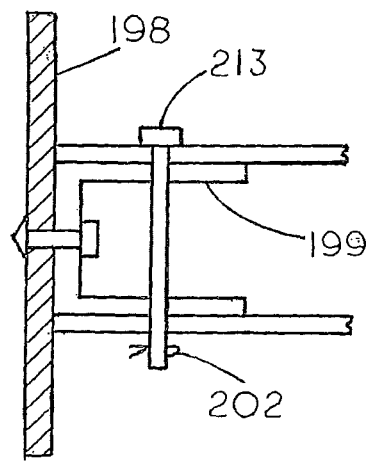
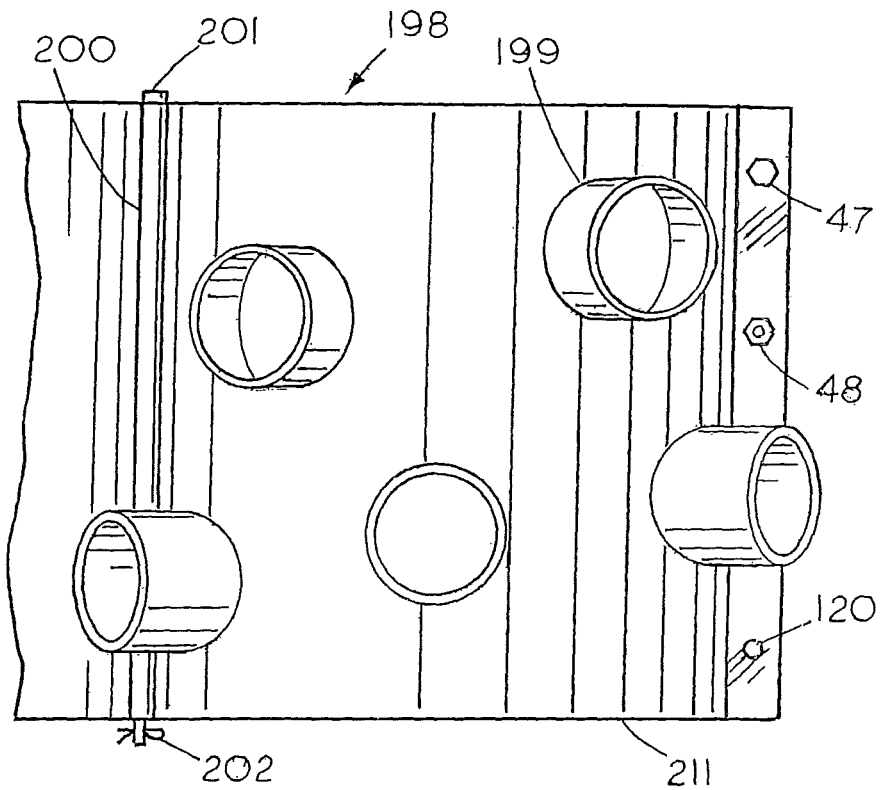

UTILITY POLE WITH SOLAR MODULES AND WIRELESS DEVICE AND METHOD OF RETROFITTING EXISTING UTILITY POLE

CROSS REFERENCE TO RELATED APPLICATIONS

None.

BACKGROUND

Field of the Invention

The present invention relates to a solar cell, a solar module, a solar array, a network of solar arrays, and a solar power grid for generating electric power for industrial, residential, and transportation use, and including means for wireless communication and transmission of electrical power.

Background

The world's present population is over six billion, and it is projected that by the year 2020 it will grow to over nine billion persons. Worldwide power consumption in 1997 was approximately 380 quadrillion British thermal units (Btu), and in response to the projected growth in population and industry the demand for power is expected to grow to about 608 quadrillion Btu by the year 2020. Likewise, worldwide consumption of oil is presently over 75 million barrels per day, and demand is expected to grow to about 120 million barrel per day by the year 2020. The world's oil reserves are estimated to be approximately 1,027 billion barrels. Fossil fuels such as coal, gas, and oil are non-renewable resources, and the burning of these fuels results in pollution of the earth's atmosphere, land, and water. Further, the burning of various fossil fuels contributes to global warming and dramatic changes in climate, thus mankind is presently faced with an environmental catastrophe. Various alternate means of producing power such as hydrogen cells are presently being developed for use. However, even the burning of a non-fossil fuel such as hydrogen can possibly contribute to the problem of global warming. The United States and other industrialized nations of the world are still largely dependent upon internal combustion engines for transportation which consume gasoline or diesel fuel. Accordingly, the demand for a renewable and environmentally friendly source of power is one of the foremost needs and problems facing mankind.

Moreover, the creation of power generating facilities have sometimes compromised aesthetics and had other adverse environmental impacts. Dams have sometimes restricted the navigation of waterways and adversely affected fish populations such as salmon in the Pacific Northwest region of the United States. Nuclear power stations have been associated with radiation leaks, pollution, and the production of hazardous radioactive waste, whereas coal, oil and gas burning power stations are associated with more conventional forms of pollution. The installation of poles including overhead transmission lines alongside roads can sometimes constitute a hazard for motorists and compromise aesthetics.

Substantially all of the energy required for the creation and maintenance of life on the earth was originally provided by the sun. Solar energy is renewable and environmentally friendly. Faced with population, energy, and pollution crises, mankind can take a lesson from nature. The evolution of trees and other natural foliage on earth has been such as to maximize their ability to collect sunlight and perform photosynthesis. The present invention is directed towards providing renewable solar energy using solar arrays which resemble and emulate some of the light gathering abilities of natural foliage. In the words of Thomas Aquinas, "Grace does not abolish nature but perfects it."

One of the present challenges and unanswered questions in the field of solar energy concerns how to make solar arrays that can provide environmentally green electrical energy and power comprising a structure which is aesthetically pleasing so as to be desirable for installation in close proximity to residential homes, businesses, parking areas, but also alongside streets, and highways. In this regard, solar arrays resembling palm trees which can provide electrical energy, and further comprise wireless transmission devices for the recharging and powering electrical devices including electric and hybrid transportation vehicles can provide a viable solution.

It is clear that United States needs to switch from automobiles which burn gasoline and diesel fuel to electric and hybrid vehicles as soon as possible. In this regard, it should be recognized that merely switching from automobiles that burn gasoline and diesel fuel to electric and hybrid vehicles which must be charged by electric power plants that burn fossil fuels would not provide a viable long term solution to the world's energy and pollution problems. At this time, and for the foreseeable future, the only clean and renewable form of electric power comes from the sun. That energy and power needs to be made available in and alongside our nation's public transportation right of ways including railways, roads and highways. Accordingly, the creation of a network of solar arrays and along roads and highways will not only provide electrical energy and power for residential and commercial use, but also support the widespread use of electric and hybrid transportation vehicles.

SUMMARY

An aspect of the present disclosure includes a utility pole that includes one or more solar modules configured to collect solar energy and convert the solar energy to electromagnetic energy and a wireless device configured to receive the electromagnetic energy from the one or more solar modules and to transmit the electromagnetic energy therefrom.

Another aspect of the present disclosure includes a method of retrofitting an existing utility pole to utilize solar energy. The method includes attaching a first bracket to the utility pole and attaching a plurality of solar modules to the first bracket. The solar modules are configured to collect solar energy and convert the solar energy to electromagnetic energy. The method includes attaching a wireless device configured to receive the electromagnetic energy from the one or more solar modules and to transmit the electromagnetic energy therefrom.

BRIEF DESCRIPTION OF THE DRAWINGS

FIG. 2 is a top plan view of an artificial palm frond that consists of a solar module including at least one solar cell for use with an artificial palm tree that consists of a solar array.

FIG. 3 is a top plan view an alternate artificial palm frond that consists of a solar module including a plurality of solar cells for use with an artificial palm tree that consists of a solar array.

FIG. 5 is a side cross-sectional view of an alternate solar module including a solar cell having a textured surface including a plurality of peaks and valleys.

FIG. 6 is a side cross-sectional view of an alternate solar module including a solar cell including an integral capacitor.

FIG. 7 is a top plan view of one layer of artificial palm fronds, each artificial palm frond consisting of a solar module including at least one solar cell for use with an artificial palm tree that consists of a solar array.

FIG. 11 is a side cross-sectional view of an alternate top portion of an artificial palm tree including provision for two layers showing both internal and external components.

FIG. 12 is a side cross-sectional view of an alternate top portion of an artificial palm tree including provision for one layer showing both internal and external components.

FIG. 36 is a side perspective view showing a plurality of wireless repeater devices located on a horizontal support surface in a parking lot having individual parking spaces indicated by lines.

FIG. 47 is an enlarged exploded view showing the mounting assemblies for mounting antennas to the antenna support structure of FIG. 42.

FIG. 73 is a side view of a frond leaflet that makes up a part of the frond illustrated in FIG. 72.

FIG. 74 is a sectional view of the frond leaflet of FIG. 73 taken along lines 74-74 of FIG. 73.

FIG. 75 is a plan view of the frond leaflet of FIG. 73.

FIG. 77 is an oblique view of a shaft insert that allows orientation of individual frond leaflets.

FIG. 78 illustrates another embodiment of the shaft insert of FIG. 77.

FIG. 95 is a side view of a fifth antenna support structure having features of the invention.

FIG. 96 is an isometric view of a top portion useable in the support structure of FIG. 95.

FIG. 97 is an isometric view of a base cover useable in the support structure illustrated in FIG. 95.

FIG. 98 is an isometric view of a portion of the support structure illustrated in FIG. 95 showing how the drooping members are disposed through holes in the cylinder portion of the support structure.

FIG. 99 is a side view of a sixth antenna support structure having features of the invention.

FIG. 100 is a side view of the support structure of FIG. 99, shown without the skirt portion.

FIG. 107 is an inner portion of a base cover useable in the support structure illustrated in FIG. 99.

FIG. 108 is an outside portion of a base cover useable in the support structure illustrated in FIG. 99.

FIG. 109 is a side view of a support member useable in the support structure illustrated in FIG. 99.

FIG. 110 is a diagrammatic side view of the two moieties of the support member illustrated in FIG. 109.

FIG. 111 is a diagrammatic view of the fully assembled support member illustrated in FIG. 110.

FIG. 112 is an exploded side view of the support member illustrated in FIG. 109.

FIG. 113 consists of four detailed views of various portions of the support member illustrated in FIG. 109.

FIG. 114 consists of three cross-sectional views of the support structure illustrated in FIG. 100.

FIG. 120 is a side view of the interior side of a bracket.

FIG. 121 is side view of an extension section of a bracket.

FIG. 122 is side view of the exterior side of a bracket.

FIG. 123 is a cross-sectional view taken along the line 123-123 shown in FIG. 122 of a receptacle including an opening for receiving the stem portion of a solar module therein.

FIG. 124 is a cross-sectional view of another receptacle including a projection for receiving the stem portion of a solar module.

FIG. 125 is a cross-sectional view of another alternative possible receptacle including a projection for receiving the stem portion of a solar module.

FIG. 126 is a side view of an alternative bracket including two staggered and gradually ascending layers of receptacles.

FIG. 127 is a side view of a top bracket including at least one layer of receptacles which are configured to secure the stem portions of solar modules at upward angles relative to horizontal.

FIG. 128 is a side view of a junction box for receiving lines in and also proving connections for at least one line out.

FIG. 129 is a side view of a conventional utility and/or telephone pole including a plurality of solar modules resembling palm fronds having stem portions.

FIG. 130 is a side view of a conventional utility and/or telephone pole including a plurality of solar modules resembling palm fronds having stem portions that are secured to the receptacles of two brackets.

FIG. 131 is a schematic view of an electric or hybrid automobile including at least one wireless device on a lane of a road or highway with a solar array resembling a palm tree delivering electric power to the automobile.

Figure 132:
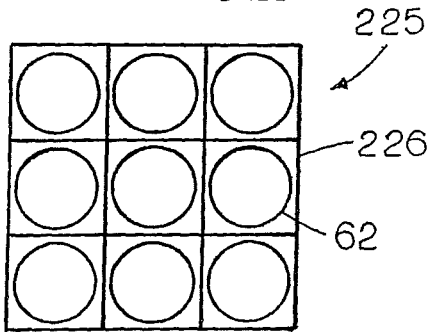

FIG. 132 is a top view of a coil array 225 including a plurality of coils.

Figure 133:
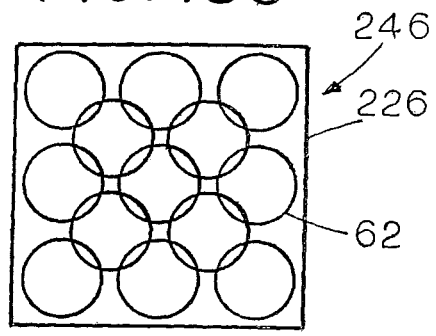

FIG. 133 is a top view of a coil array 246 including a plurality of staggered and overlapping coils.

Figure 134:
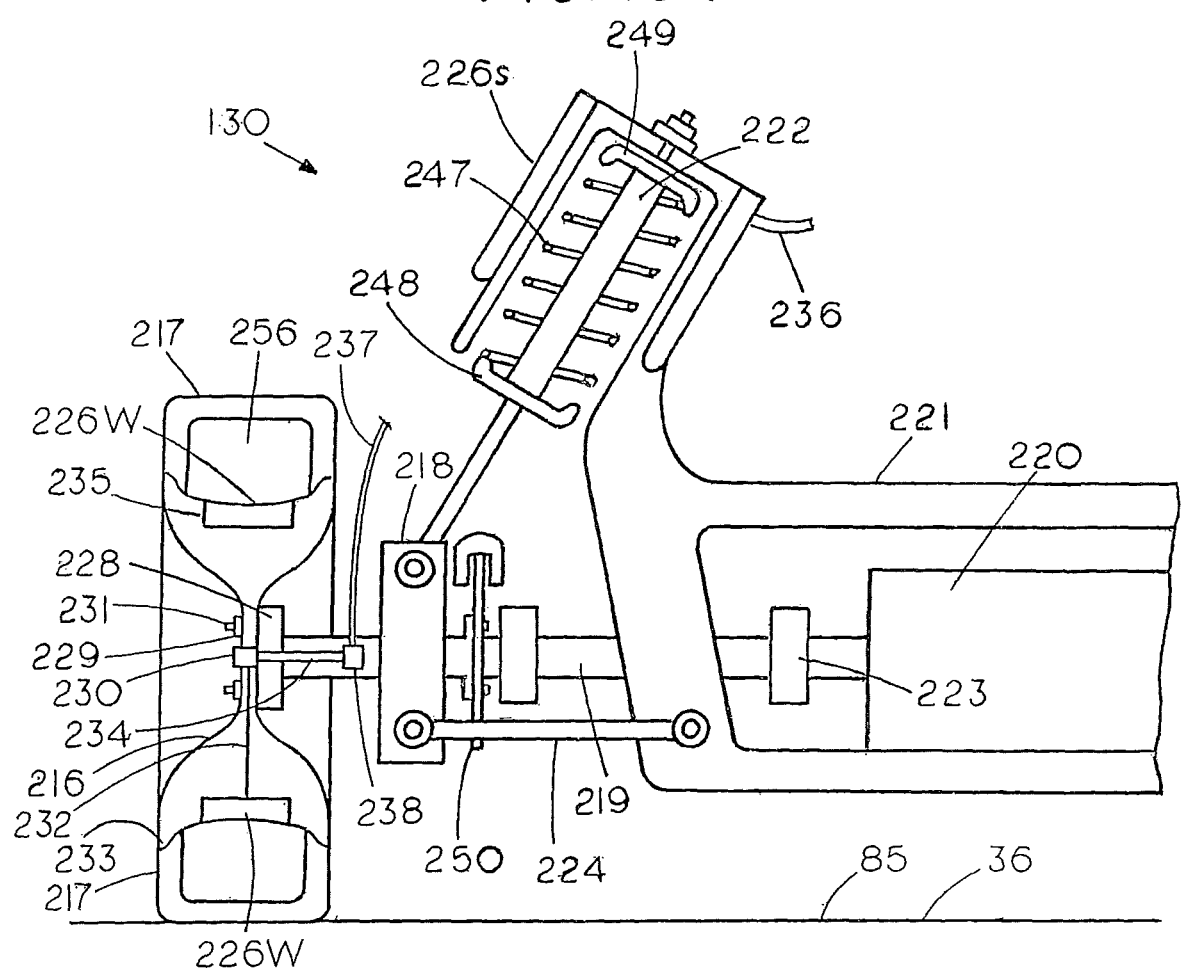

FIG. 134 is a rear and partial cross-sectional view of a portion of an automobile showing a wireless device located around the suspension spring and shock absorber column, and also a wireless device located in the wheel.

Figure 135:
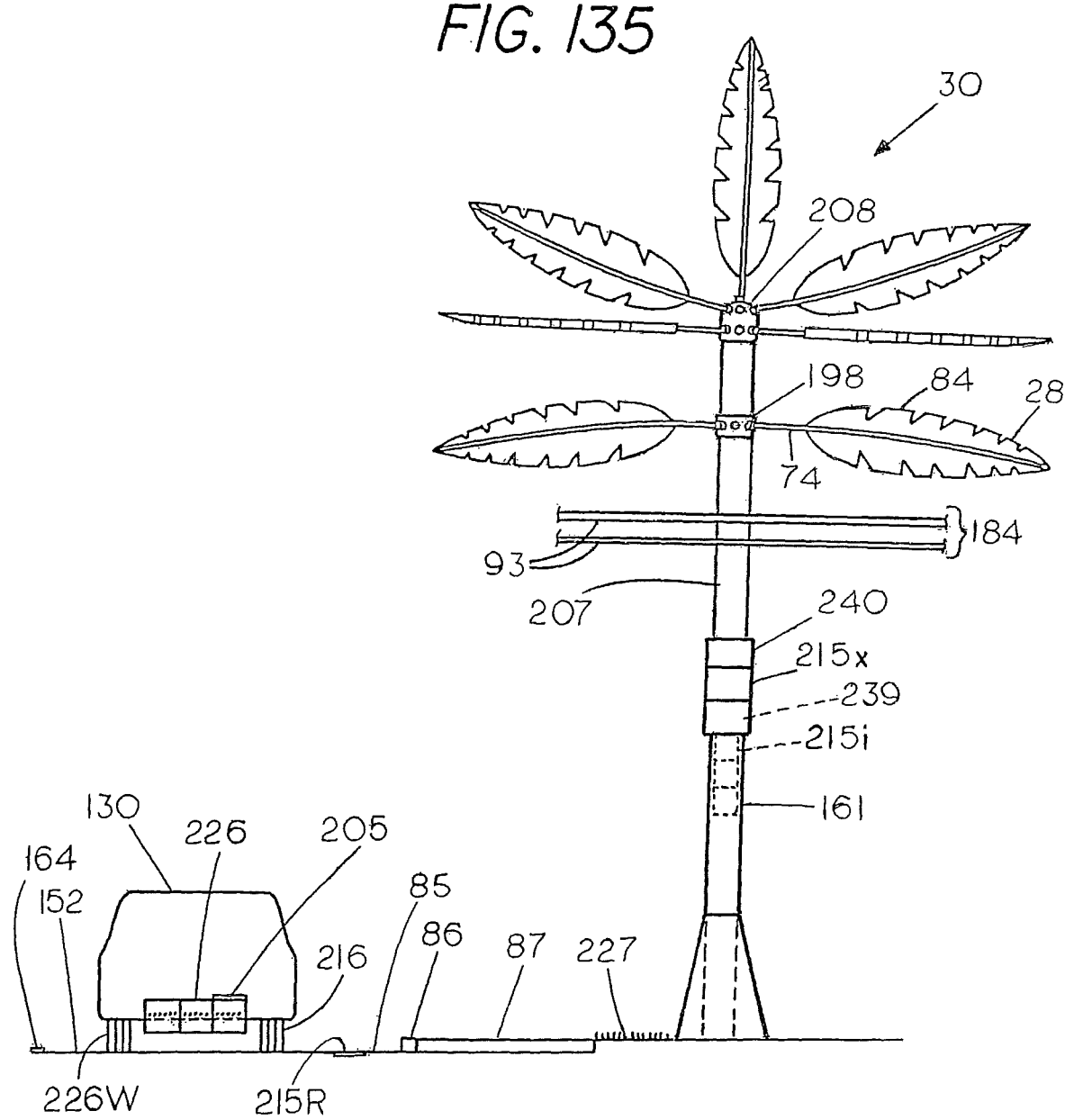

FIG. 135 is a rear and partial cross-sectional view of an electric or hybrid vehicle including at least one wireless device proceeding in the lane of a road or highway and an utility and/or telephone pole located in a greenspace which includes brackets and solar modules for making a solar array resembling a palm tree which includes at least one wireless device.

Figure 136:
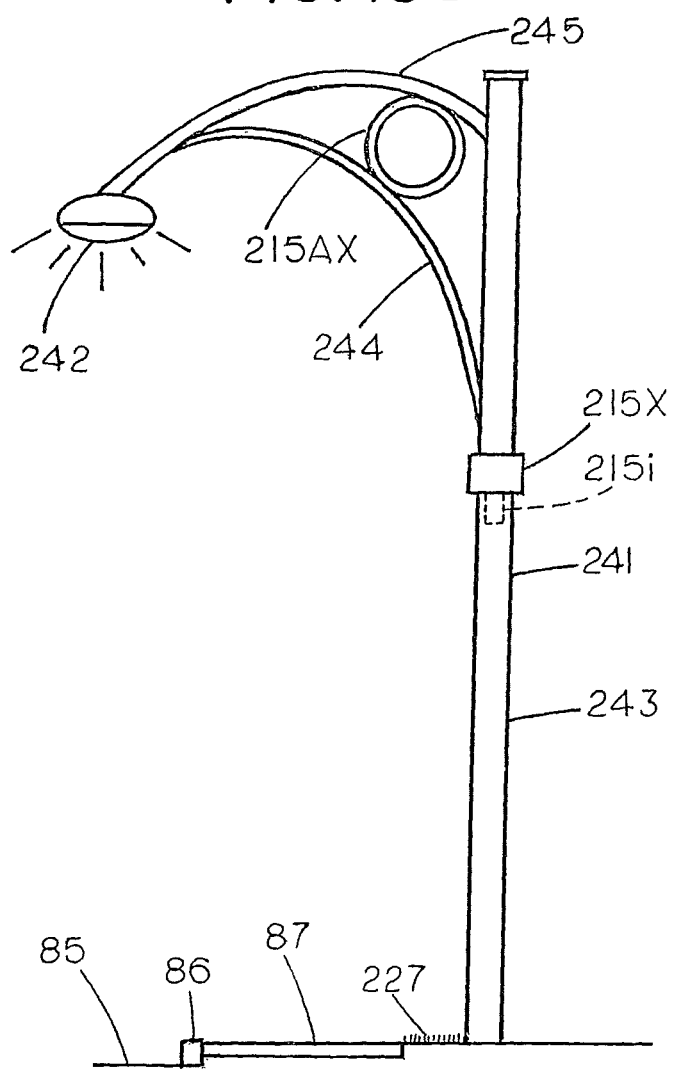

FIG. 136 is a side view of a utility pole for a street light showing an externally mounted wireless device on the vertical support pole portion, and another different externally mounted wireless device on the support structure for the arm portion, but also an internal wireless device.

Figure 137:
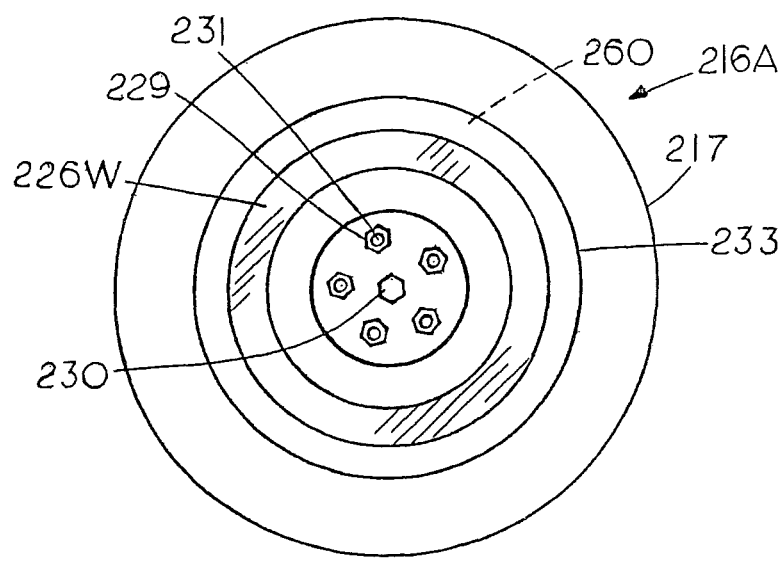

FIG. 137 is side view of a wheel and tire for a transportation vehicle with the hub cap removed showing a wireless device 226w mounted on the outside of the wheel.

Figure 138:
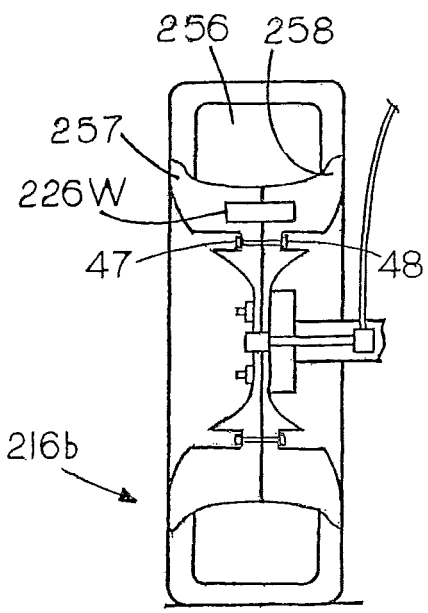

FIG. 138 is a front view of an alternative wheel and tire for a transportation vehicle with parts broken away.

Figure 139:
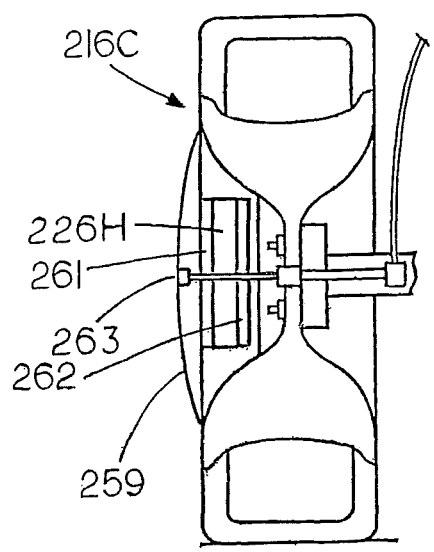

FIG. 139 is front view of a wheel and tire for a transportation vehicle with parts broken away with a removable hub cap that includes a wireless device.

Figure 140:
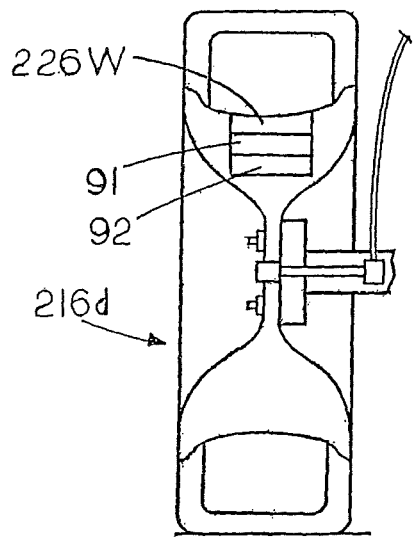

FIG. 140 is a front view of a wheel and tire with for a transportation vehicle with parts broken away which shows an alternative wheel including a wireless device, converter, and inverter.

Figure 141:
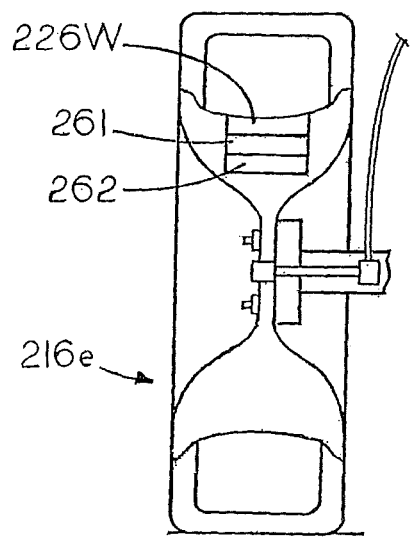

FIG. 141 is a front view of a wheel and tire for a transportation vehicle with parts broken away which shows an alternative wheel including a wireless device, capacitor, and battery disposed on the wheel.

Figure 142:
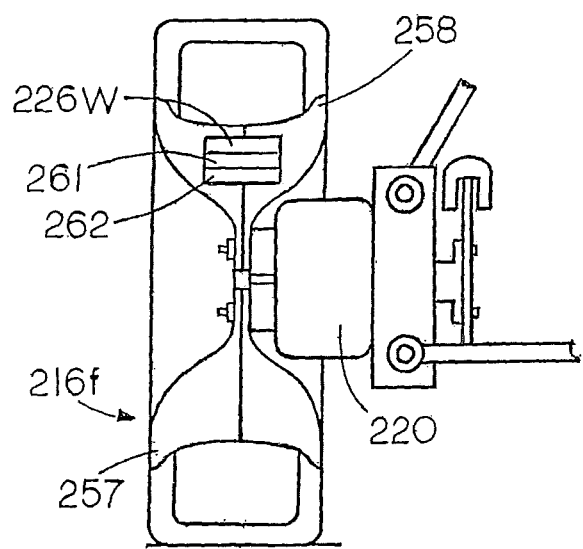

FIG. 142 is front view of a wheel and tire for a transportation vehicle with parts broken away which shows an alternative wheel including a wireless device, capacitor, and battery disposed on the wheel, and an electric motor located next to the wheel.

DETAILED DESCRIPTION

The present invention teaches a solar cell, a solar module, a solar array, a network of solar arrays, and also a solar power grid suitable for providing power for industrial, residential and transportation use. A solar cell or solar module including a plurality of solar cells can be made in a structure configured to have the appearance of natural foliage. Accordingly, a solar array including a plurality of solar modules each including at least one solar cell can be made to resemble a tree, including, but not limited to, a palm tree, a deciduous tree, or an evergreen tree. In this regard, a network of solar arrays can be made to resemble a row or grove of palm trees, and then meet both the functional and aesthetic demands of landscape architecture.

Palm Trees

Palm trees line the streets of Beverly Hills, Calif., but also Las Palmas Drive in Hope Ranch, and also along the beach in Santa Barbara, Calif., a location that is sometimes called the American Riviera. Similarly, palm trees line the street and beach area in the city of Bandol, France and much of the French Riviera. Further, the presence of palm trees has long been associated with the presence of an oasis, water, life, and wealth in the Middle East. Accordingly, palm trees line most of the major streets and highways in the United Arab Emirates. In contrast with conventional power and telephone poles associated with overhead transmission lines, a palm tree, even an artificial palm tree, has an appearance which is aesthetically pleasing and associated with a well to do neighborhood and community.

A multitude of different palm tree species exist having different characteristics. Common varieties of palm trees include date palms, banana palms, coconut palms, queen palms, and royal palms. Palm trees having upwards of six and even thirty or more leaves or palm fronds are common. Trees are one of nature's solar collectors. The palm tree often includes a multiplicity of palm fronds projecting at a plurality of different angles and orientations relative to the truck of the palm tree in order to maximize its ability to capture light. The resulting exposed surface area can be substantial, and in this regard nature has provided an efficient model for capturing sunlight from sunrise to sunset. Further, when the ground surface surrounding a tree such as a palm tree consists of light colored sand or other surface that reflects substantial light, the tree's leaves or palm fronds can capture reflected light as well as direct sunlight. Accordingly, light can sometimes be captured by the bottom side of the leaves or palm fronds as well as the top side. This greatly increases the exposed surface area and enhances the ability of the foliage to capture light.

Artificial Palm Tree Manufacturers

Manufacturers of artificial palm trees in the United States which are suitable or may be readily adapted for use in the present invention having a realistic appearance include Tropical Expressions of 2127 Bride Ave., Point Pleasant, N.J. 08742, having a website: http://tropicalexpressions.com as of Jun. 7, 2011, and phone (732) 899-1733; Tropical Palm Tress of 3950 N. 20$^{th}$ Street, Ozark, Mo. 65721, having a website: http://www.tropicalpalmtrees.com as of Jun. 7, 2011, and phone (417) 581-1048; Custom Made Palm Tree Company of 1201 DeValera Street, Akron, Ohio 44310, having a website: http://www.custompalmtrees.com as of Jun. 7, 2011, and phone (866) 349-4582; Earthfflora.com of 1099 Bradley Road, Westlake, Ohio 44145, having a website: http://www.earthflora.com as of Jun. 7, 2011, and phone (877) 252-1675; Oasis Illusions of 419 Mullica Hill Road, Richwood, N.J. 08074, having a website: http://www.oasisillusions.com as of Jun. 7, 2011, and phone ((856) 582-9422; Xtremely Tropical of 11428 Moog Drive, St. Louis, Mo. 63146, having a website: http://xtremelytropical.com as of Jun. 7, 2011, and phone (314) 785-1700; Artificial Plants and Trees of 51 Glen Street, Natick, Mass. 01760, having a website: http://artificalplantsandtrees.com as of Aug. 29, 2011, and phone (888) 532-0232.

Antenna Towers Disguised as Trees

Antenna towers which are disguised to have the appearance as trees are taught in U.S. Pat. Nos. 5,611,176, 5,787, 649, 6,343,440, and U.S. 2002/0184833, the complete contents of all of these patents and the patent application hereby being incorporated by reference herein. For example, the Custom Made PalmTree Company of Akron, Ohio presently makes and sells artificial palm trees for concealing cell towers which can be adapted for use in the present invention. Moreover, as shown and discussed in greater detail below in FIGS. 40 and 41, the present application teaches a solar array 30 which can provide energy for an antenna 170 and cell tower devices 171.

Solar Arrays Resembling Trees

Conventional solar cells are commonly made in standard geometric shapes such as squares, rectangles, or circles. However, the present invention teaches making solar cells and solar modules including at least one solar cell having the appearance of leafs, palm fronds, branches, plants, trees and other natural foliage. Further, the present invention teaches making solar cells and solar modules in colors to resemble natural foliage. For example, plastic solar cell thin films and solar cells made by painting or other coating process can be pigmented to assume a desired color, and this can include the primary colors red, yellow, blue, and green, as well as a multiplicity of other colors, shades, and tones. Moreover, instead of the individual solar cells in a solar module being square, rectangular, or circular in appearance, the present invention teaches solar cells having a structure configured to resemble that of natural foliage, and in particular, the structures found in various types of leaves which commonly include a plurality of veins and isolated groups of plant cells. As a result, artificial leaves, palm fronds, branches, plants, and trees, as well as other artificial foliage can be created which closely resemble their natural counterparts. Besides providing clean and renewable solar generated electric power, the artificial foliage can provide shade, serve as windbreak, and meet both the functional and aesthetic demands of landscape architecture. Several non-limiting embodiments of solar arrays resembling natural foliage, and including certain solar arrays configured to resemble palm trees are discussed in greater detail below.

Figure 1:
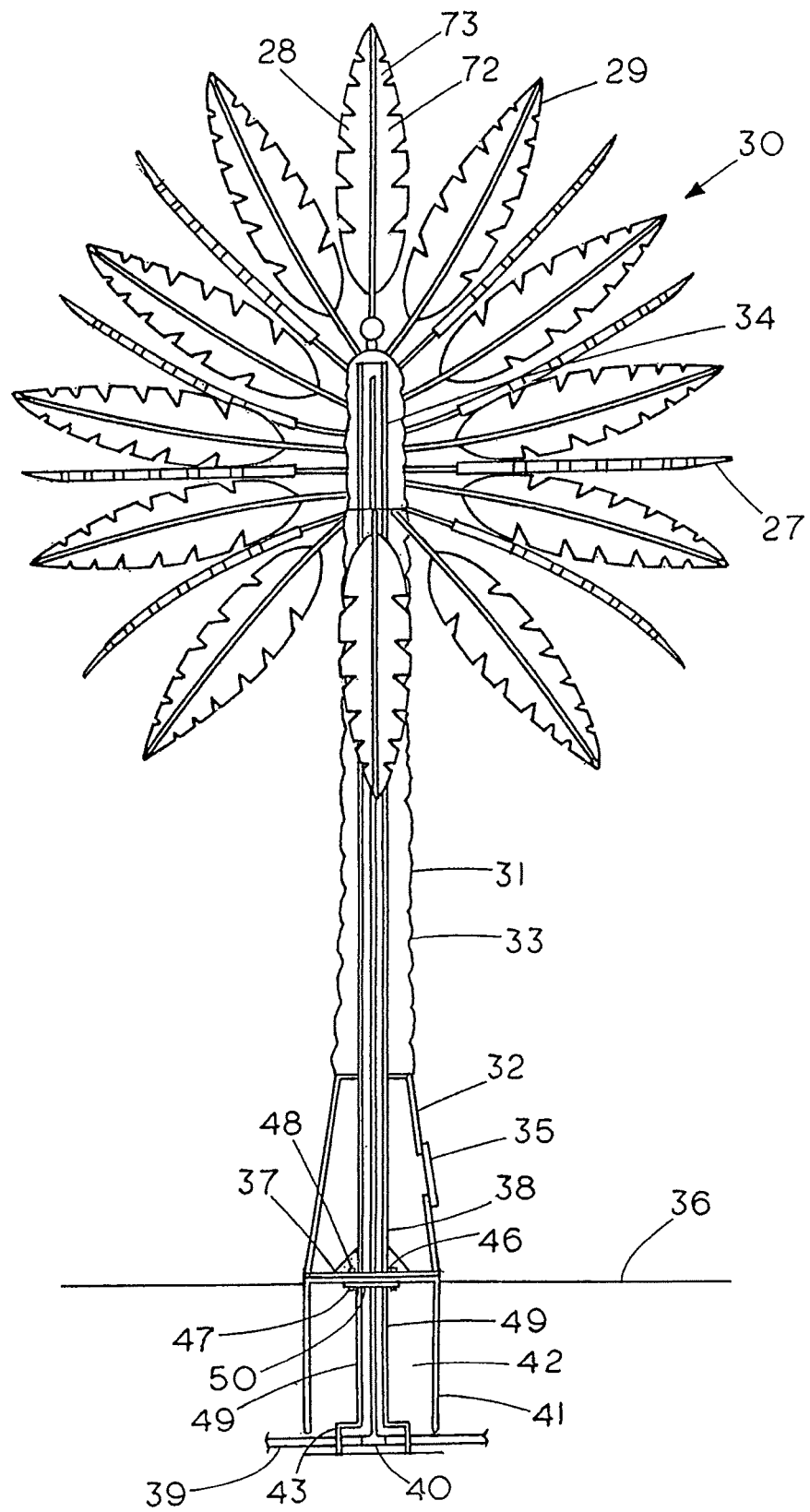
FIG. 1 is a perspective side view of an artificial palm tree that consists of a solar array.

FIG. 1 is a side perspective view of an artificial palm tree 29 that constitutes a solar array 30. The artificial palm tree 29 and solar array 30 can include a trunk 31 having a trunk bottom portion 32, a trunk middle portion 33, and trunk top portion 34. The truck bottom portion 32 can include an access door 35. The artificial palm tree 29 and solar array 30 can include a central support pole 38 including a base 37 having a reinforced base flange 46. The base flange 46 can bear against a footing 126 including support platform 49 having a reinforced platform flange 50. The support platform 49 can include a bottom portion including a stand-off 43 for permitting concrete to substantially encompass the support platform 49. The concrete can be contained when poured by a circular shaped tube or form 41. The top side of the platform flange 50 of the support platform 49 can then be made approximately level with the surrounding ground surface 36. The base flange 46 can be secured to the platform flange 50 using bolts 47, nuts 48, and washers 51 which can also be used to properly align the central support pole 38 vertically. The artificial palm tree 29 and solar array 30 can include a plurality of artificial palm fronds 72 that include at least one solar panel or solar module 28 including at least one solar cell 73. The artificial palm tree 29 and solar array 30 can include at least one layer 27 of artificial palm fronds 72, and each layer can include a plurality of artificial palm fronds 72 and solar modules 28. Alternatively, the structure and placement of the artificial palm fronds 72 and solar modules 28 can be configured to appear more random. The artificial palm tree 29 and solar array 30 can include a plurality of artificial palm fronds 72 that include at least one solar panel or solar module 28 including at least one solar cell 73. The solar cell 73 can be a photovoltaic solar cell comprising a monocrystalline, polycrystalline, or amorphous structure, or any other known structure. In this regard, a more detailed disclosure and discussion of solar cells and solar modules which can be suitable for use in making a solar array 30 of the present invention is provided below.

Solar Cells and Solar Modules

Photovoltaic solar cells having a monocrystalline, polycrystalline, or amorphous structure, and an efficiency in the range between 1-35 percent have been in use for some time, and the associated cost of electricity using this technology has been in the range between 20-30 cents per kilowatt-hour, as compared with 9-10 cents for hydroelectric generated power. However, the efficiency of photovoltaic solar cells continues to improve, and their costs continue to decline such that they are expected to be as cost-effective as other forms of power within the next decade.

Most commercial solar cells and modules on the market today are made from rigid crystalline silicon wafers that are about 150 um thick, and these products are relatively expensive to manufacture. These products can be made of a homogenous crystalline silicone material, or multicrystaline silicone materials, and may include silicone heterostructures. An example of a manufacturer which makes monocrystalline and polycrystalline solar panels is SolarWorld AG, which has a subsidiary in the United States located at 25300 N.W. Evergreen Road, Hillsboro, Oreg. 97124, (503) 844-3400, and a website: www.solar-world-usa.com as of Aug. 29, 2010.

Alternatively, the amorphous thin-film materials demonstrate efficiencies between 4-13% and the equipment required to make the material are well known. Manufacturers of amorphous thin-film materials include but are not limited to the following companies: PowerFilm, Inc. of 2337 230$^{th}$ Street, Ames, Iowa 50014, (888) 354-7773, having a website: www.powerfilmsolar.com as of Feb. 1, 2011, which makes a flexible thin film photovoltaic material based on amorphous silicon; Solarmer Energy, Inc. of 3445 Fletcher Avenue, El Monte, Calif. 91731, (626) 456-8082, having a website: www.solarmer.com as of Aug. 29, 2011, which makes transparent flexible thin film photovoltaic materials which can also be printed in multiple colors and on fabrics; and, Uni-Solar, that is, United Solar Ovonic, LLC. of 3800 Lapeer Road, Auburn Hills, Mich. 48326, (248) 293-0440, having a website: www.uni-solar.com as of Aug. 29, 2011, which makes several different types of both rigid and flexible solar products including "PowerBond," "PowerTilt," "EnerGen," and "PowerShingle."

In addition, three types of thin-film solar cells and modules have been developed with may utilize only a 1-4 um thick layer of semiconductor material and these are either based on amorphous silicon, cadmium telluride (CdTe), or copper-indium-gallium-selenide (CIGS). The cadmium telluride (CdTe) materials can achieve an efficiency of 16.5% and their manufacturing costs are low, but they are limited to application on rigid glass substrates. Manufacturers of cadmium telluride (CdTe) materials include but are not limited to the following companies: First Solar, Inc. of 350 West Washington Street, Suite 600, Tempe, Ariz. 85281, (419) 662-6899, having a website: www.firstsolar.com as of Feb. 1, 2011, which makes thin film photovoltaic modules on glass using cadmium telluride (CdTe) as a semiconductor instead of the more common crystalline silicon; and, Solexant, Corp. of 2329 Zanker Rd., San Jose, Calif. 95131, (408) 240-8900, having a website: www.solexant.com as of Aug. 29, 2011, which makes a nanocrystal ultrathin-film solar material using a roll to roll technique which will first use CdTe based nanocrystals, and they expect to use other nanocrystal materials within the next five years.

The copper-indium-gallium-selenide (CIGS) materials can achieve an efficiency of 19.9% and they can be applied on glass or flexible substrates, and have been relatively expensive to produce. Manufacturers of copper-indium-gallium-selenide (CIGS) materials include but are not limited to the following companies: Ascent Solar Technologies, Inc. of 12300 N. Grant Street, Thorton, Colo. 80241, (720) 872-5000, having a website: www.ascentsolar.com as of Aug. 29, 2011, which makes flexible thin film solar modules using copper indium galliaum (di)selenide (CIGS) that has shown a 19.5% efficiency in real world conditions; Solo-Power of 5981 Optical Court, San Jose, Calif. 95138, (408) 281-1582, having a website: www.solopower.com as of Aug. 29, 2011, which makes CIGS based photovoltaic materials using a proprietary electrochemical process in a roll to roll manufacturing process; Global Solar of 8500 South Rita Road, Tucson, Ariz. 85747, (520) 546-6318, having a website: www.globalsolar.com as of Aug. 29, 2011, which make a PowerFLEX thin film roll product having dimensions of 5.74 meters by 0.49 meters and an efficiency in the range between 10.5-12.6% which sells for approximately $875, thus a cost of approximately $2.50 per watt; and, Nanosolar, Inc. 5521 Hellyer Avenue, San Jose, Calif. 95138, (408) 365-5960, having a website: www.nanosolar.com as of Aug. 29, 2011, which makes a CIGS material printed on conductive metal foil using deposition processes developed for continuous steady-state processing within a roll-to-roll manufacturing.

Emerging types of photovoltaic materials include organic, inorganic and dye-sensitive solar cells. Manufacturers of organic solar cells include but are not limited to the following companies: Heliatek GmbH, of Treidlerstrasse 3, D-01139, Dresden, Germany, (49) 35121303430, having a website: www.heliatek.com as of Aug. 29, 2011, which makes organic photovoltaics (OPV) by vacuum depositing small molecule organic photovoltaics which has achieved an efficiency of 8.3%. An alternative manufacturing technology is to wet-print the organic material. The company can make a proprietary tandem cell construction. Another manufacturer of organic solar cells is Konarka Technologies, Inc. of 116 John Street, Suite 12, Lowell, Mass. 01852, (978) 569-1400, having a website: www.konarka.com as of Aug. 29, 2011, which makes flexible organic thin film photovoltaic material using a roll to roll printing process. The company has the ability to make green colored and also multi-colored photovoltaic material. Further, the company is making a transparent photovoltaic material which can be inserted into windows.

Manufacturers of dye-sensitive solar cells include but are not limited to the following companies: Dyesol of 3 Dominion Place, Queanbeyan, NSW, 2620, Australia (61) 2 6299 1592, having a website: www.dyesol.com as of Aug. 29, 2011, which makes dye-sensitive solar cells (DSSC or DSC) including ruthenium dye which is a light absorbing material sandwiched between glass and a electrolyte having a layer of titania that absorbs electrons to become an electric current; G24 Innovations of Wentloog Environmental Center, Wenloog, Cardiff, CF3 2EE, United Kingdom, (44) 29 2083 7340, having a website: www.g24i.com as of Feb. 1, 2011, which makes dye-sensitive solar cells or thin film (DSSC or DSTF) using ruthenium or organic dyes and titanium dioxide.

Nanotechnology is presently being used to create more efficient solar cells. For example, QDSoleil, Inc. of 2625

Hanover Street, Palo Alto, Calif. 94304, (650) 906-9230 having a website: www.qdsoleil.com as of Aug. 29, 2001, which is a subsidiary of Nanosys, Inc. having the same address, (650) 331-2101, and a website: www.nanosysinc.com as of Aug. 29, 2011, has entered into a strategic alliance with Samsung Electronics regarding co-development of solar energy products. The company is using inorganic quantum dots or nanocrystals, nanoscatterers and light capture materials, nanoparticles, nanorods, nanowires, semiconducting inks, and materials for dual nanocrystal and hybric nanocrystal designs.

The article "Solar-cell thinner than wavelengths of light hold huge power potential" which was published on the website: http://www.physorg.com/print204827475.html, as of Sep. 28, 2010, discusses the positive effects of providing a top layer including a patterned, roughened scattering layer which may have a green coloration. This technology can possibly result in more than a ten-fold increase in the energy being absorbed by next generation solar cells due to so-called "light trapping."

A graph created by the NREL, that is, the National Renewable Energy Laboratory and published on the internet at the website: http://en.wikipedia.org/wiki/File:PVeff (rev100921).jpg, as of Jan. 5, 2011, shows the relative efficiency of various modern solar cells in research lab settings, and the entirely of this publication is hereby incorporated by reference herein. It can be readily understood that some or all of the different types of solar cells and solar modules presently in production which are discussed herein, and which have been the subject of the research and development efforts and published results indicated in the NREL graph recited above could possibly be used to make solar arrays resembling natural foliage of the present invention.

The following U.S. patents are directed to photovoltaic roofing or shading applications: U.S. Pat. Nos. 4,636,579, 5,385,848, 5,433,259, 5,478,407, 5,482,569, U.S. 2002/0129849, and U.S. 2002/0134422, the complete content of all of these patents and patent applications hereby being incorporated by reference herein. Further, the following U.S. patents are directed to photovoltaic lights or signs: U.S. Pat. Nos. 4,200,904, 4,224,082, 4,281,369, 4,718,185, 4,841,416, 4,989,124, 5,149,188, 5,564,816, 6,060,658, 6,455,767, U.S. Pat. No. D353,014, the complete content of all of these patents hereby being incorporated by reference herein.

Solar cells have often been made in panels which comprise a relatively rigid material such as crystalline silicon or crystalline gallium arsenide. However, photovoltaic solar cells can also be made in the form of flexible plastic thin film, such as Powerfilm® made by PowerFilm, Inc., which holds both U.S. Pat. Nos. 6,300,158, and 5,385,848, the complete content of these patents hereby being incorporated by reference herein. Solar cells have also been made in the form of textiles and fabrics, or alternatively, they can be affixed to textile and fabric materials as taught in U.S. Pat. Nos. 4,768,738, 5,478,407, 6,237,521, and 6,224,016, the complete content of all of these patents hereby being incorporated by reference herein. The following U.S. patents and patent applications relate to solar cells, and in particular, many specifically relate to making thin film solar cells: U.S. Pat. Nos. 4,609,770, 4,670,293, 4,689,874, 5,584,940, 5,674,325, 5,863,354, 6,160,215, 6,168,968, 6,211,043, 6,224,016, 6,271,053, 6,294,722, 6,310,281, 6,327,994, 6,380,477, 6,437,231, 6,543,725, 6,552,405, U.S. 2001/0020485, U.S. 2002/0000242, U.S. 2002/0092558, U.S. 2002/0139411, and U.S. 2002/0153037, U.S. 2002/0182769, U.S. 2003/0029493, U.S. 2003/0041894, U.S. 2003/0113481, U.S. 2003/0127127, U.S. 2003/0127128, the complete content of all of these patents and patent applications hereby being incorporated by reference herein. Some of the advances and reduction in the cost of photovoltaic solar cells is expected to derive from the ability to make extremely thin film solar cells.

Alternately, photovoltaic solar cells can also be made by painting or otherwise coating the surfaces of a desired substrate. Other electronic devices such as capacitors, resistors, transistors can also be made in this manner, and these can be included and used in combination with a solar cell. For example, see U.S. Pat. Nos. 6,099,637, 6,124,378, 6,480,366, 6,576,290, U.S. 2002/0157702, U.S. 2002/0158584, and U.S. 2003/0141417, by James E. Cordaro, and also U.S. Pat. No. 4,414,252 to Curtis M. Lampkin, the complete content of all of these patents and patent applications hereby being incorporated by reference herein. Further, A. Paul Alivisatos, a professor of chemistry at University of California, Berkeley and others at Lawrence Berkeley National Laboratory are developing solar cells consisting of nanorods dispersed in an organic polymer or plastic which can be painted onto a surface. These researchers anticipate making solar cells which can absorb light having several different colors and wavelengths in order to better span the spectrum associated with sunlight. In addition, Neal R. Armstrong in the Department of Chemistry and others at the University of Arizona, are working to develop organic molecules that self-assemble or organize from liquid into efficient solar cell coatings, thus creating organic solar cell thin-films.

Controllers and Power Optimization

One of the practical problems associated with prior attempts to create solar arrays resembling natural foliage concerns the failure to recognize or to efficiently solve the problems associated with the unavoidable variation in the magnitude of sunlight provided on different sides of a solar array resembling natural foliage during the day, and also the related operational problems caused by the inadvertent shading of adjacent solar cells and modules. In brief, due to shading or disparate light conditions there could be a mismatch in the electrical output being produced by the various solar cells and solar modules and a reverse bias could then be created, and these conditions can trigger either diodes or switches to shut down those solar modules which are not then producing as much electrical output. And so it can be a case of all or nothing, and the electrical output produced by the solar cells and solar modules which are linked together then either match one another closely and they all work, or those solar modules producing less electrical energy output and which do not meet a certain tolerance field or threshold value get shut off and bypassed by either conventional diodes or switches.

For example, in an abstract and non-limiting hypothetical solar array resembling a palm tree having eight solar modules, one of the solar modules could be producing 20 volts at 4 amps, two could be producing 10 volts at 4 amps, two others producing 7.5 Volts at 4 amps, two more producing 2.5 Volts at 4 amps, and one producing 0 Volts. Given these large mismatches in voltage output, it is then possible for the diodes and switches associated with more conventional solar installations to shut off or bypass many of the solar modules and for most of the energy being produced by the solar array to then simply be lost. In order to better harvest the output being produced by the various solar modules in a solar array, a different structure and practical solution is required.

The present invention teaches monitoring and controlling the electrical activity of individual solar cells and/or solar modules, and also monitoring and controlling the electrical activity and the current flowing between different solar cells and/or solar modules included within the larger group of solar cells and/or solar modules used in a solar array resembling a palm tree in order to optimize the overall electrical energy output produced by a solar array of the present invention. Given the abstract and non-limiting hypothetical example of a solar array resembling a palm tree having eight solar modules provided above, let us suppose for illustrative purposes that one of the eight hypothetical solar modules on the solar array resembling a palm tree was producing 20 volts at 4 amps, two were producing 10 volts at 4 amps, two were producing 7.5 Volts at 4 amps, two were producing 2.5 volts at 4 amps, and one was producing 0 volts, the total output given the use of more conventional diodes and switches could then be limited to only the one solar module producing 20 volts at 4 amps for 80 watts of power. However, using monitoring and control devices having the ability to monitor and control the electrical activity of individual solar cells and/or solar modules, and also the electrical activity and the current flowing between different given solar cells and/or solar modules within the larger group of solar cells and/or solar modules included in a solar array resembling a palm tree, it would be possible, e.g., for the output of the two solar modules producing 10 volts at 4 amps to be added together in series to produce 20 volts at 4 amps, and the output of the two solar modules producing 7.5 volts at 4 amps to be added in series along with the two solar modules producing 2.5 volts at 4 amps to produce another 20 volts at 4 amps and for these to be then electrically coupled to the same circuit as the one solar module producing 20 volts at 4 amps to make possible a greater yield of electrical energy from the solar array, and in particular, 60 volts at 4 amps for 240 watts of electric power. Further, it can be readily understood that given a different structure and set of circumstances one or more solar cell and/or solar module could be selectively coupled in series and/or parallel in order to optimize the performance and power output of a solar array resembling natural foliage. Accordingly, the present invention can provide superior performance.

In addition, the use of electrical energy storage means such as capacitors and batteries can also provide another way of well harvesting electrical energy output from a solar array. In particular, when there is a mismatch in the electrical output from several solar cells and/or solar modules due to disparate light conditions or direct shading, the solar cells and/or solar modules can be operatively coupled to electrical energy storage means such as capacitors or batteries. For example, capacitors can be used to store up sufficient electrical energy from under-producing solar cells and/or solar modules to match the output coming from the solar cell and/or module producing the most voltage, or otherwise hit an engineered target range of operational voltage associated with the system design.

Again, the present invention teaches means for electronic monitoring and control including means for monitoring and controlling the electrical current, voltage, and output of each solar cell and/or solar module, and the electrical current, voltage, and output flowing between each of the solar cells and/or solar modules included in a solar array resembling natural foliage, and continuously changeably selecting at least two different solar cells located on at least two different solar modules for simultaneous operation from the larger group of solar modules in order to maximize the combined electrical energy output of the larger group of solar modules when a plurality of the solar modules are exposed to disparate light intensities, thereby optimizing the overall electrical energy output produced by a solar array of the present invention. Accordingly, it can be readily understood that the means for electronic monitoring and control can include what essentially comprises an electronic brain which may include one or more devices, e.g., a central processing unit, a controller, a micro-controller, an integrated circuit, a computer and the associated software for making intelligent, smart, and continuous real time selections for the purpose of optimizing the efficiency and operation of the solar array and maximizing its electrical energy and power output.

Other means for electronic monitoring and control and maximizing the electrical energy output of a solar array resembling a palm tree are possible and anticipated by the present invention. The structures, devices, and methods taught in the present invention can provide superior operational performance relative to the teachings associated with prior art efforts to create solar arrays resembling natural foliage because they provide for a greater harvest of the electrical energy being produced by the component parts of a solar array. Examples of devices for monitoring, controlling, and optimizing the operational performance and maximizing the electrical energy and power output of a solar array of the present invention, include, but are not limited to, the following devices and services:

Enphase Energy of 201 $1^{st}$ Street, Petaluma, Calif. 94952, having the website: http://www.enphase.com as of Aug. 3, 2011, and phone: (877) 797-4743 is a manufacturer of microinverters such as their model M215 which performs DC to AC power conversion on a per-module basis, and which comes with a 25-year limited warranty. These microinverters are then normally connected in parallel AC branch circuits. Further, the company's "Envoy Communications Gateway" networks with each microinverter and can transmit performance information to the internet. In addition, their "Enlighten" software enables customers to monitor and manage their solar power systems 24 hours a day. The company also offers an integrated "Environ" product which monitors and controls the temperature of a home, office, or another structure. In brief, these product can improve the efficiency and reliability of a solar power installation.

SolarEdge of 900 Golden Gate Terrace, Suite E, Grass Valley, Calif. 95945, having the website: http://www.solaredge.com as of Aug. 3, 2011, and phone: (530) 273-3096 is a manufacturer of "Power Optimizers" which may be imbedded such as their model PB250-CSI, or added onto solar modules such as their OP250-LV. These power optimizers employ DC-DC conversion allowing them either boost or buck the output voltage of the module without changing the output power, and can provide over 98% peak efficiency. The devices use a highly optimized algorithm that ensures that each module is kept at maximum power production and which prevent power losses even given solar module mismatches or partial shading conditions. The company uses a fixed string voltage at the optimal point for DC to AC inversion regardless of the number of modules in a string, their performance or the environmental conditions. SolarEdge also produces single and three phase solar PV inverters. They also offer a "SolarEdge PV Monitoring Portal," a "Module Monitoring" web-based application, and "Monitoring Combiner Box." These devices enable module-level, string-level and system-wide monitoring of a solar installation.

Tigo Energy of 420 Blossom Hill Road, Los Gatos, Calif. 95032, having the website: http://tigoenergy.com as of Aug. 3, 2011, and phone: (408) 402-0802, makes a "Module Maximizer" such as their model MM-ES50 which is connected to each solar module or panel and uses an impedance matching technology to extract the maximum power form each module. This technology is different from others which use micro-inverters or DC-DC voltage conversion. Further, the "Module Maximizer" can increase the output of a conventional solar panel by up to 20%, and it is 99% efficient and so produces little heat which could lead to degradation of a solar module. The "Module Maximizers" can either be wired in series or parallel depending on the particular application. The Tigo Energy solution is capable of quickly finding the maximum operating state for each solar module and maintain system stability during cloud cover or shading. In addition, the company offers "Maxi-Manager" software products which provide real time monitoring and trouble shooting for operators or owners of a solar installation.

Power-One of 740 Calle Plano, Camarillo, Calif. 93012, having the website: http://www.power-one.com/renewable-energy as of Aug. 3, 2011, and phone: (805) 987-8741, makes a variety of string inverters including the "Aurora Micro" which is a 300 watt micro-inverter, the "Aurora Optimizer" which uses DC-to-DC technology, and the "Aurora Uno" and "Aurora Trio" since and three phase inverters. The company also offers several central inverter such as the "Aurora Lite, Plus, and Ultra." Further, Power-One has a number of monitors and software for monitoring and controlling solar installations including their "Aurora Vision," "Aurora Universal," "Aurora Environmental," "EVO Easy Control," and "Desktop" products. Power-One has also recently purchased the company SolarMagic from National Semiconductor.

SolarMagic has produced charge controllers including integrated circuits, DC-DC power optimizers, microinverters, gate drivers, voltage regulators, sensing and detection devices, microcontrollers, and power optimizer chipsets for improving the harvest of electrical energy and overall efficiency of a solar installation. The company has also provided wireless radio frequency communication and remote shutdown options with its solar energy related products. The reference diagrams provided on the website http://www.national.com/en/solarmagic.com as of Aug. 3, 2011 also show bias voltage supply devices, input current and voltage sense amplifiers, output current and voltage sense amplifiers, quasi-resonant flyback devices, rectified full wave Sine-to-Sine bridges, temperature sensors, filters, switching power supplies, regulators, full bridge drivers, digital and panel controls, microcontrollers, RF receivers, h-bridge power stages, as well as other electronic devices for improving the overall efficiency and also monitoring and controlling a solar installation.

Accordingly, it can be readily understood that adaptors, AC disconnects, amplifiers, batteries, battery cables, battery controllers, battery status meters, bias voltage supply devices, breakers, capacitors, central processing units, chips, circuit breakers, coils, tesla coils, computers, conduit, connectors, controllers, charge controllers, micro-controllers, control panels, digital and panel controls, converters, combiners, DC disconnects, DC-DC power optimizers, diodes, drivers, gate drivers, full bridge drivers, extension cords, filters, fuses, generators, grid tie power centers, ground fault switches, h-bridge power stages, inductors, integrated circuits, inverters, micro-inverters, junction boxes, lights, meters, metal oxide semiconductors, output current and voltage sense amplifiers, off grid power centers, power supplies, power optimizer chipsets switching power supplies, quasi-resonant flyback devices, rectified full wave Sine-to-Sine bridges, regulators, RF receivers, repeaters, resistors, sensors, sensing and detection devices, software, shot reactors, static var compensators, surge protectors, switches, temperature sensors, thyristors, transformers, transistors, bi-polar junction transistors, voltage regulators, wiring, wireless RF communication devices, wireless transmitters, wireless receivers, wireless repeaters, and other electronic components or devices may be used or electrically coupled in functional relation with a solar array resembling natural foliage of the present invention.

FIG. 2 is a top plan view of an artificial leaf or palm frond 72 that includes at least one solar panel or solar module 28 for use with an artificial palm tree 29 that constitutes a solar array 30. Over two hundred varieties of palms exist in nature, and this particular embodiment generally resembles a banana leaf or palm frond. The artificial palm frond 72 includes a stem portion 74, a blade portion 84, at least one electrical connection or socket 75, a top side 79, a bottom side 80, an edge 76, a plurality of notches 78, and can also include a plurality of artificial veins 77. In some embodiments, the color of the solar cells 73 can be a medium or dark green, and that of the veins 77 and edge can be a lighter green, yellow, or brown. Further the color of the individual solar cells 73, and also both the top side 79 and bottom side 80 of the artificial palm frond 72 can be varied in different locations so as to create a natural appearance. The structure and color of the artificial palm frond 72 can also be selected to maximize light absorption from different angles of incidence, and if desired, the structure and color can also be selected for its ability to coincidentally reflect light which can then be absorbed by other nearby artificial palm fronds 72. In the embodiment shown in FIG. 2, the solar module 28 can include at least one solar cell 73. Depending upon their particular structure and electrical properties, the solar cells 73 can be wired in series, or alternately they can be wired in parallel with other solar cells 73. Likewise, depending upon their structure and electrical properties, the solar panels or modules 28 can also be wired in series or parallel. The bottom side 80 of the artificial palm frond 72 can consist of plastic material such as polyethylene, polypropylene, polyurethane, a metal material such as aluminum, copper, stainless steel, or a ceramic material. Flexible plastic or polyurethane materials can be advantageous for use, and in particular, when an artificial palm frond 72 is configured to resemble one for a coconut palm or a date palm tree. In the embodiment shown in FIG. 4, the palm fronds associated with these palm trees include a plurality of highly flexible separate blades. Artificial palm fronds 72 and leaves which are flexible can be advantageous when attempting to simulate a natural appearance. Moreover, artificial leaves, palm fronds, and branches which are flexible also enhance the ability of these structures to be self-cleaning, as wind, morning dew, and rain can then wash their surfaces clean. In the embodiment shown in FIG. 2, the stem 74 portion of the artificial palm frond 72 measures approximately one and one half feet in length and is approximately one inch in diameter. The blade 84 portion is approximately eight feet long and two feet wide and has a working surface area of approximately twelve square feet. Accordingly, an artificial palm tree 29 or solar array 30 including thirty two such artificial palm fronds 72 has a working surface area of 384 square feet, and so could provide double the power output of the model solar array discussed earlier that used a plurality of solar modules 28 consisting of PowerFilm, Inc.'s R15-1200 Powerfilm® photovoltaic thin film having a working surface of only 192 square feet. And an artificial palm tree 29 or solar array 30 including thirty six such artificial palm fronds 72 and solar modules 28 would have a working surface area of 432 square feet, and provide even more power. Accordingly, a network including 660 such solar arrays along a one mile stretch of highway could meet the needs of approximately 200 average homes.

FIG. 3 is a top plan view of an artificial palm frond 72 generally similar to that shown in FIG. 2. However, the artificial palm frond 72 shown in FIG. 2 further includes a middle portion 81 and also peripheral portion 82, each of these portions including a plurality of separate solar cells 73. The color as well as other physical and electrical properties of the middle portion 81 and peripheral portion 82 of the artificial palm frond 72 can be selectively varied, as desired, in order to enhance its efficiency and natural appearance. Depending upon the structure and electrical characteristics of the solar cells 73 being used, the use of more numerous solar cells 73, and the location of solar cells 73 in both the middle portion 81 and also the peripheral portion 82 can increase the efficiency of the solar module 28 when partial shading of the artificial palm frond 72 would occur.

Figure 4:
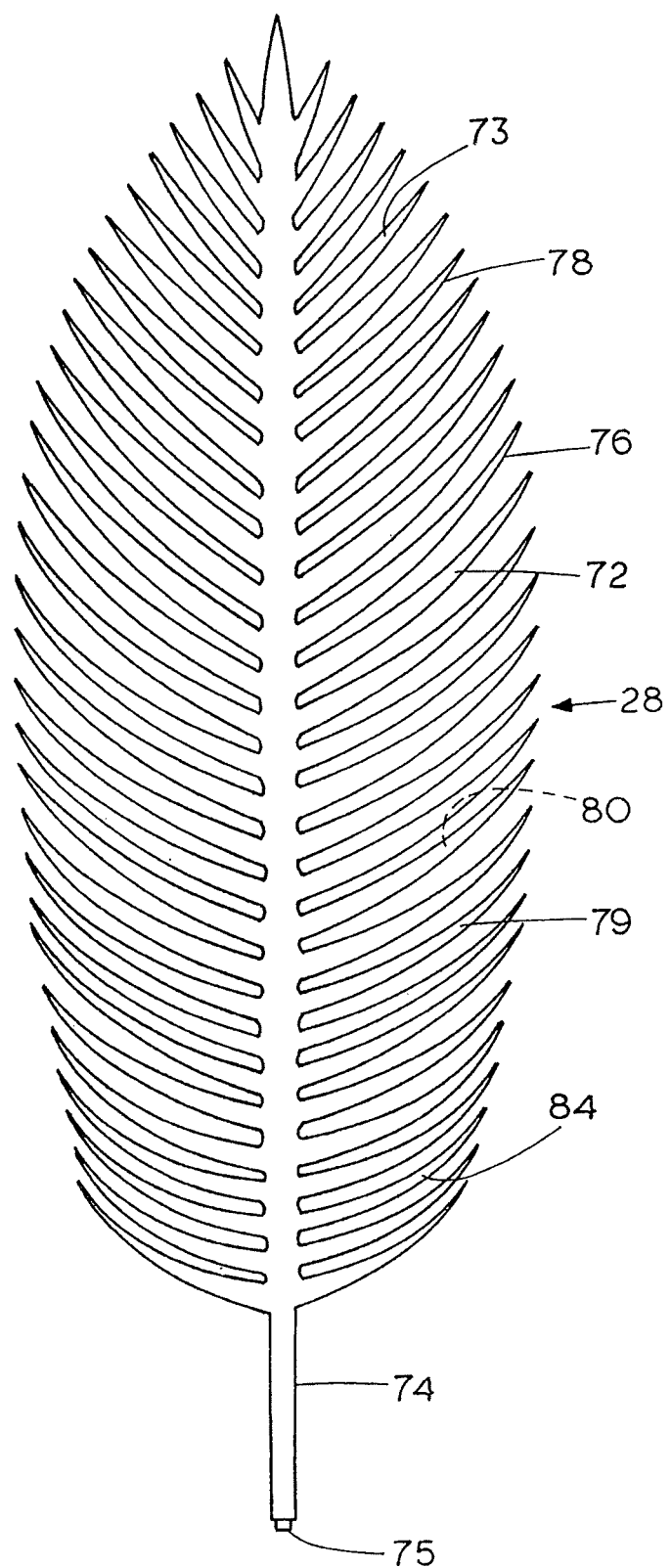
FIG. 4 is a top plan view an alternate artificial palm frond including a plurality of blades that consists of a solar module including a plurality of solar cells for use with an artificial palm tree that consists of a solar array.

FIG. 4 is a top plan view of an artificial palm frond 72 generally similar to that shown in FIGS. 2 and 3. However, this particular embodiment includes a plurality of separate and relatively thin blades 84. Accordingly, this embodiment of an artificial palm frond 72 has a structure configured to resemble the palm fronds associated with coconut palms and date palms.

FIG. 5 is an enlarged side view of an alternate solar module 28 including at least one solar cell 73 having a textured surface 103 including a plurality of peaks 101 and valleys 102. A textured surface 103 which is not perfectly planar and smooth can increase the effective working area of a solar module 28 and solar cell 73. Accordingly, the use of a textured surface 103 can sometimes enhance the light absorption properties, but also the light reflecting properties of a solar module 28 and solar cell 73. Many plant species have leaves or exterior surfaces that are not perfectly smooth, rather they commonly include textured surfaces, convolutions, or other irregularities. For example, many forms of seaweed have textured, ribbed or convoluted surfaces including numerous peaks and valleys, and this can provide greater surface area both for collecting light, but also for absorbing nutrients from the sea. Photovoltaic solar cells including textured surfaces are known in the prior art, such as U.S. Pat. No. 6,552,405 granted to Sugawara et al. and assigned to Kyocera Corporation, the complete contents of this patent hereby being incorporated by reference herein.

FIG. 6 is a side cross-sectional view of an alternate solar module 28 including an integral capacitor 104. The capacitor 104 can consist of a relatively thin layer which can be formed or deposited by conventional means including but not limited to painting, coating, vapor and also powder deposition upon one of the substrates used to make the solar module 72. U.S. Pat. No. 6,480,366 and U.S. Patent Application 2002/0158584 by James F. Cordaro teach painted capacitor energy storage, the complete contents of these two patent documents hereby being incorporated by reference herein. As shown on the left side in FIG. 6, an integral capacitor 104 can be positioned on the bottom side 80 of an artificial leaf or palm frond 72, thus the top side 79 can be used exclusively for absorbing light. Alternatively, as shown on the right side in FIG. 6, an integral capacitor 104 can be positioned between the top side 79 and bottom side 80 of an artificial leaf or palm frond 72, thus both the top side 79 and bottom side 80 can be used to absorb light. An artificial leaf or palm frond 72 including a solar module 28 including at least one solar cell 73 can be made in the general configuration shown on the left side of FIG. 6, or alternatively, in the general configuration shown on the right side of FIG. 6.

As shown, it is also possible to combine the two structures illustrated in FIG. 6 when making a single solar module 72. Moreover, a plurality of solar modules 28 including capacitors 104 can be selectively positioned in functional relation to a solar array 30 to maximize both energy production and energy storage.

FIG. 7 is a top plan view of a layer 27 including a plurality of artificial palm fronds 72. The artificial palm fronds 72 each include a solar module 28 including at least one solar cell 73, and can be used to create an artificial palm tree 29 that forms solar array 30. In the embodiment shown in FIG. 7, the layer 27 includes eight artificial palm fronds 72 each having a stem 74 approximately one and one half foot long. The blade 84 has a maximum width of approximately two feet, a length of approximately eight feet, and a working surface area of approximately twelve square feet. Other dimensions for the stem and blade portions can be used. However, given the configuration and dimensions shown in FIG. 7, a maximum blade 84 width of approximately three feet is all that can be attempted without causing portions of adjacent artificial palm fronds 72 to overlap one another. When less than eight artificial palm fronds 72 are used, then the width dimension of the blades 84 can be more easily increased. Generally, it is most advantageous to use between five and ten artificial palm fronds 72 in a single layer 27. As shown in FIG. 7, the artificial palm fronds 72 including solar modules 28 can be removably secured to the top portion 34 of the trunk 21 of an artificial palm tree 29.

Figure 8:
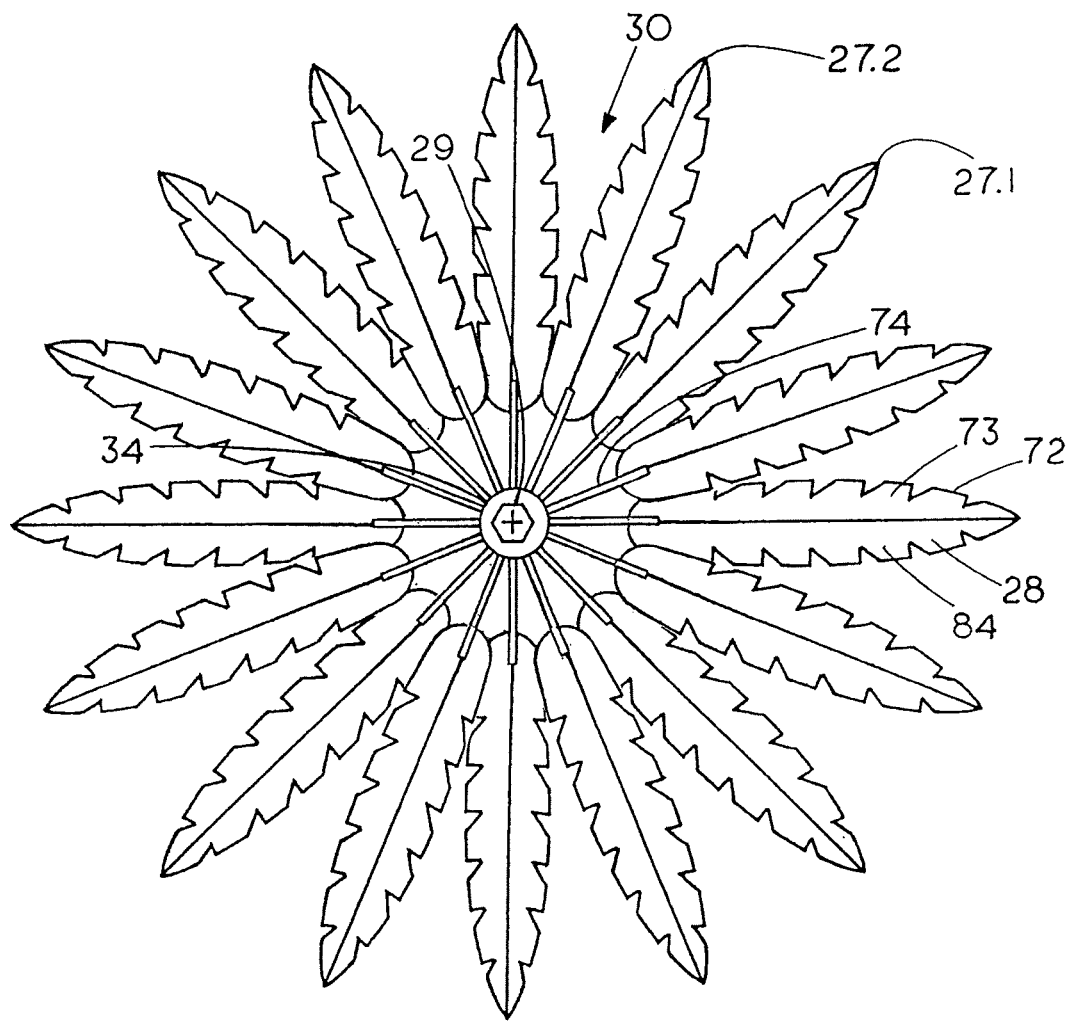
FIG. 8 is a top plan view of two staggered layers of artificial palm fronds, each artificial palm frond consisting of a solar module including at least one solar cell for use with an artificial palm tree that consists of a solar array.

FIG. 8 is a top plan view of two partially overlapping and staggered layers 27 of artificial palm fronds 72, each including a solar module 28 including at least one a solar cell 73 for use with an artificial palm tree 29 that consists of a solar array 30. In particular, shown is a first layer 27.1, and also a second layer 27.2 which is in a superior position relative to the first layer 27.1. Some photovoltaic solar panels or modules that are made with a plurality of solar cells which are wired in series can suffer a substantial degradation in their power output when even a single solar cell is shaded. And some of these solar panels or modules cannot be wired in parallel in order to simply correct for this problem, as those solar cells which are being shaded can still unduly influence the overall power output of the solar panel or solar module. However, as recited above in greater detail in the present application, it is possible to introduce electronic devices including, but not limited to monitors and controllers for monitoring and controlling the electrical activity, output and performance of individual solar cells, or groups of solar cells which are present in a solar module, as well as the electrical activity between different solar modules, and then appropriately turn off, isolate, combine, or otherwise control the current either flowing from or being directed towards a given solar cell or solar module. In this way, any undesired effects which might be caused by shading, or by a solar cell possibly becoming damaged or rendered inoperable can be avoided. Accordingly, the operational efficiency of the solar module and solar array can be optimized. One of the advantages of flexible thin film solar cells and also those which can be made by painting or other coating processes is that they can be less prone to suffering a dramatic reduction in their power output given low light conditions, shading, or damage to individual solar cells. In many cases, when a portion of the solar cell is being shaded, then the power output of that particular area is effected, but there is then little or no collateral effect upon other solar cells in a given solar module.

It can be advantageous to design a solar array in order to maximize its power output during operation. At some point, the introduction of a greater number of artificial palm fronds, or a larger size artificial palm frond, or additional layers of artificial palm fronds can introduce more substantial shading and this can provide diminishing returns with regards to the efficiency of the solar array. It can also be advantageous to consider and factor in the relative height, path, intensity, and position of the sun at various times of the year when designing and installing a solar array. In some cases, a single layer including between five and ten artificial palm fronds can provide optimal efficiency, and the appearance of these solar arrays can then more closely resemble certain palm species such as coconut palms. In other cases, a plurality of layers including solar modules consisting of artificial palm fronds each including a plurality of relatively thin blades can be more suitable, and in particular, when attempting to imitate the appearance of date palms.

Another consideration is whether to provide solar cells on only the top side, or on both the top side and bottom side of some or all of the artificial palm fronds. Given the presence of light-colored sand in desert conditions beneath a solar array, substantial light can be reflected from the surrounding ground surface to the solar modules overhead. Light can also be reflected by the artificial palm fronds to at least partially illuminate the top and bottom surfaces of other adjacent artificial palm fronds including solar cells. In the past, most conventional photovoltaic solar cells have been black or dark blue in coloration, as this was thought to maximize light absorption. However, in some circumstances it is possible for medium and dark green coloration to actually maximize the total light absorption of a solar array when the effect of reflected light as between various artificial leaves or palm fronds is considered. Further, the use of dark blue or black coloration can be associated with higher operating temperatures and this can possibly result in more rapid degradation of an artificial palm frond having a solar module including at least one solar cell over several decades of use.

Figure 9:
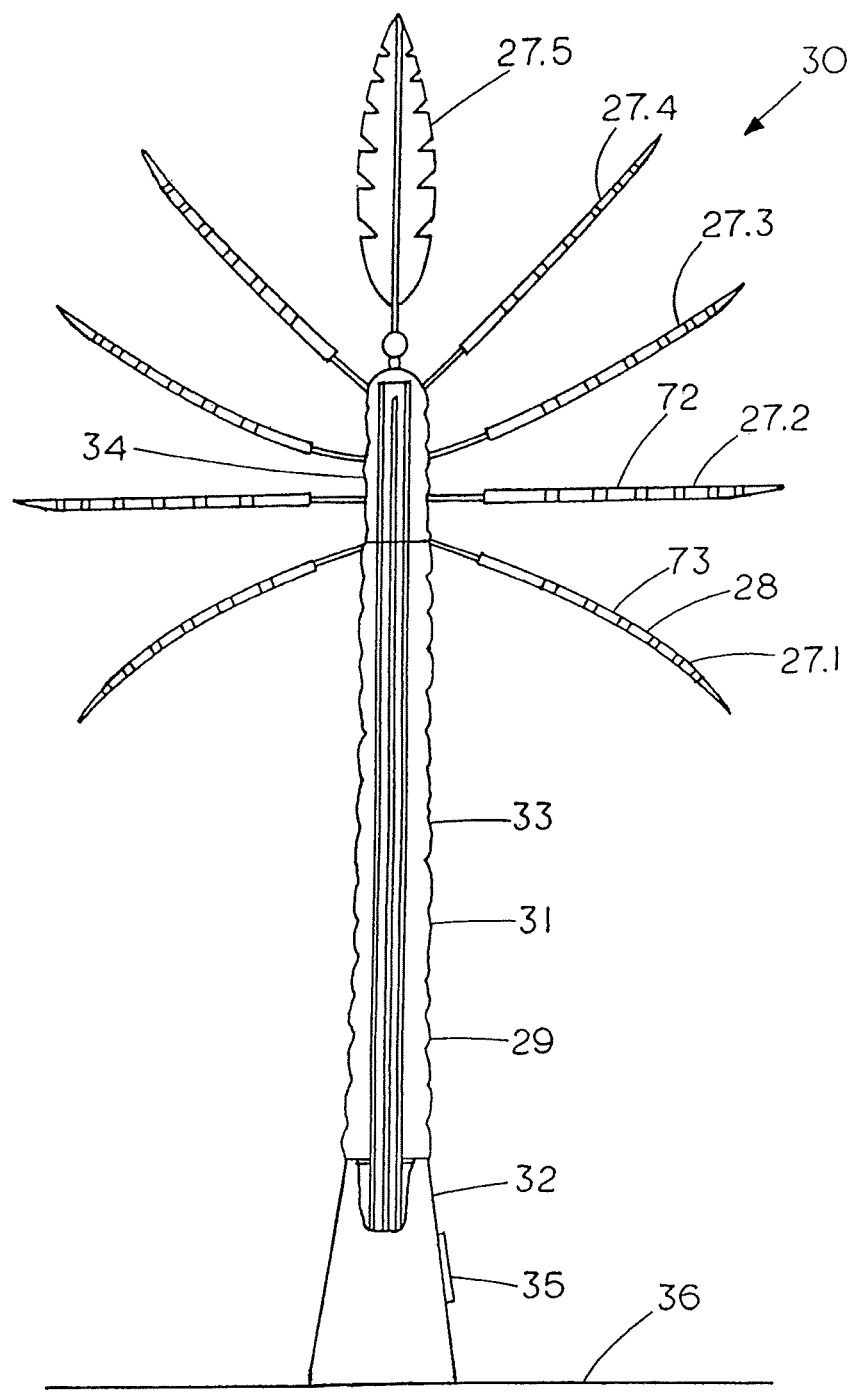
FIG. 9 is a perspective side view of an artificial palm tree that consists of a solar array showing one possible orientation of five layers of artificial palm fronds, each artificial palm frond consisting of a solar module including at least one solar cell.

FIG. 9 is a side perspective view of an artificial palm tree 29 generally similar to the embodiment shown in FIG. 1 forming a solar array 30, and showing the orientation of five layers 27 of artificial palm fronds 72 each including a solar module 28 including at least one solar cell 73. In the embodiment shown in FIG. 9, the artificial palm fronds 72 on the inferiormost first layer 27.1 are orientated downwards at approximately 45 degrees, whereas those on the second layer 27.2 are orientated approximately horizontally. The artificial palm fronds 72 on the third layer 27.3 are orientated upwards at approximately 30 degrees, whereas those on the fourth layer 27.4 are orientated upwards at approximately 45 degrees. The fifth layer 27.5 of artificial palm fronds 72 is orientated upwards between 45 and 90 degrees. The different orientations of these layers and also the staggered placement of the artificial palm fronds 72 can permit the capture of substantial direct light and also reflected light by the solar array 30. The structure and configuration shown in FIG. 9 can also provide a large resulting working area, and tends to minimize counterproductive shading of adjacent artificial palm fronds 72 and solar modules 28.

Figure 10:
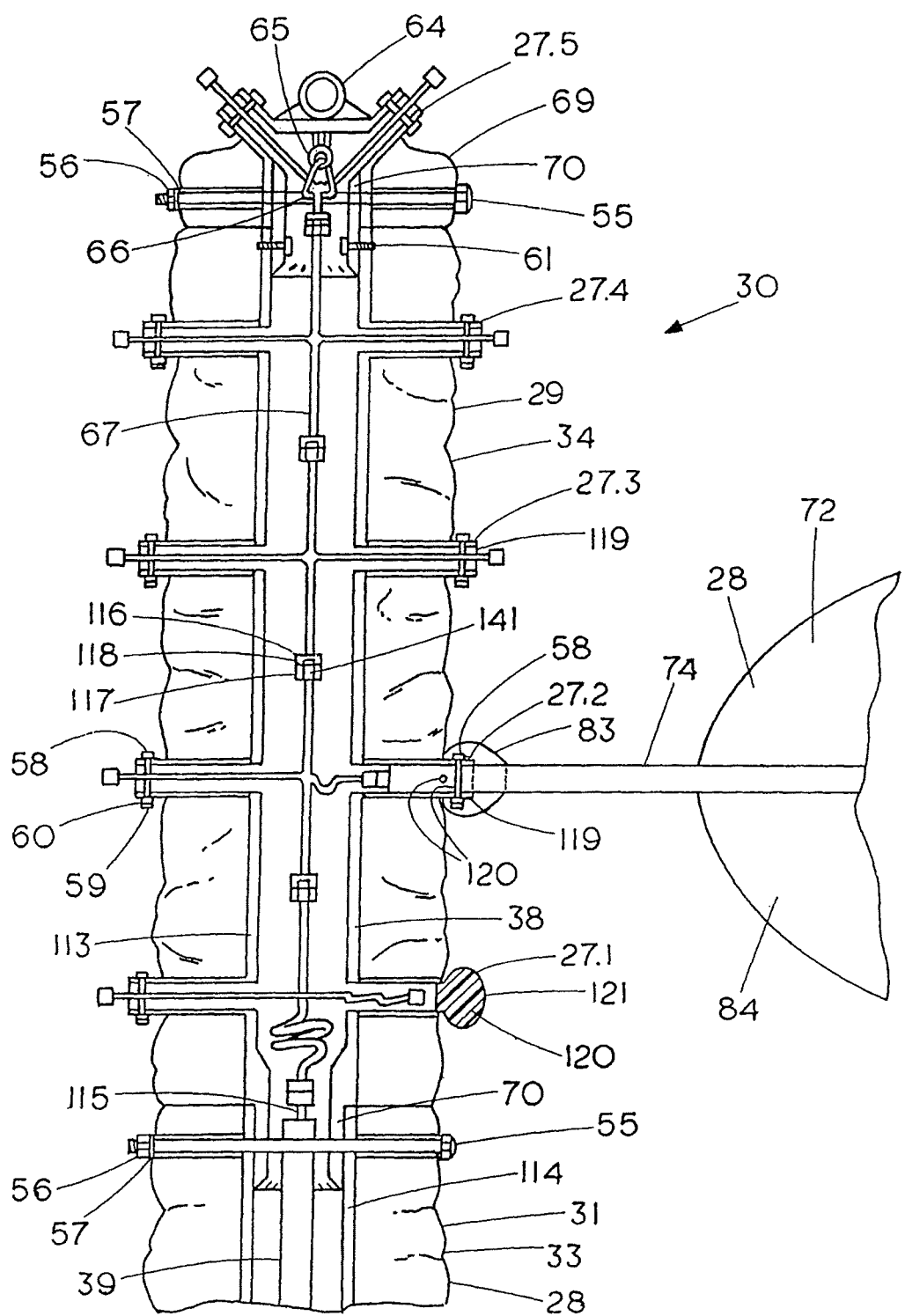
FIG. 10 is a side cross-sectional view of a top portion of a trunk of an artificial palm tree that consists of a solar array including provision for four layers, and also a cap portion showing both internal and external components.

FIG. 10 is a side cross-sectional view of a top portion 34 of the trunk 31 of an artificial palm tree 29 including provision for four layers 27, and also of a cap portion 69 of the trunk 31 of an artificial palm tree 29 including provision for one layer 27.5 showing both internal and external components. The top portion 34 of the trunk 31 includes a top portion 113 of pole 38 that includes a sleeve 70 which can be inserted within the inner diameter of the bottom portion 114 of the pole 38. The sleeve 70 can be made integral to the top portion 113 of the pole 38, or can be secured by mechanical fasteners such as bolts 61, or can be welded thereto. Alternately, a sleeve 70 portion can extend from the bottom portion 114 of pole 38 and instead be received within the inner diameter of the top portion 113 of the pole 38. The sleeve 70 and top portion 113 of the pole 38 can then be further removably secured to the bottom portion 114 of the pole 38 with the use of a long bolt 55, washer 57, and nut 56. When the long bolt 55 is removed, the entire top portion 34 and cap portion 69 of the trunk 31 including a plurality of solar modules 28 can be lifted and removed using a rope or cable which can be attached to the external ring 64 present at the top of the cap portion 69 of the trunk 31. Conversely, the entire top portion 34 and cap portion 69 of the trunk 31 including a plurality of solar modules 28 can be simply lifted and installed using a rope or cable that can be attached to the external ring 64 present at the top of the cap portion 69 of the trunk 31. Accordingly, the process of installing, repairing, or renewing components of a solar array 30 is made fast and easy.

As shown in FIG. 10, the top portion 34 of the trunk 31 includes four layers 27, namely, layers 27.1, 27.2, 27.3, 27.4, and 27.5 of solar modules 28, and each layer 27 can include between five and ten artificial palm fronds 72 including or essentially consisting of solar modules 28. The conduit 39 containing and protecting the electrical wire 115 terminates a short distance from the top of the middle portion 33 of the trunk 31 so as to avoid it possibly becoming damaged during the installation of the top portion 34 of the trunk 31. The electrical wire 115 can include a plug 116 and socket 117 type connector 118 which can include locking means 141 for selectively locking the two subcomponents together so as to prevent accidental disconnection. Likewise, a plurality of electric power cords 67 can be used to connect each layer 27 of solar modules 28 to the other, or alternatively, to simultaneously connect all of the layers 27. The electric power cords 67 can be affixed to an internal ring 65 via a clip 66 and thereby be suspended vertically.

The cap portion 69 of the trunk 31 can also include a sleeve 70, or alternatively, can receive a sleeve 70 for properly positioning and securing the cap portion 69 to the top portion 34 of the trunk 31. The cap portion 69 can then be further removably secured by using a long bolt 55, nut 56, and washer 57. A portion of an artificial palm frond 72 including or substantially consisting of a solar module 28 is also shown in position in FIG. 10. The stem 74 of the artificial palm frond 72 is configured to fit within the inner diameter of the receptacle 119. The stem 74 can then be further secured using a bolt 58, nut 59, and washer 60 which can either serve to clamp the receptacle 119 about the stem 74 of the artificial palm frond 29, or alternatively, and as show in FIG. 10, the bolt 58 can pass through an opening 120 in the stem 74. The stem 74 can be provided with a plurality of alternate openings 120 for possible use so as to permit the selection of a particular orientation of the artificial palm frond 72 during installation, as desired. The wiring connection between the artificial palm frond 72 including the solar module 28 can be made by manual means and the use of wire nuts 53, but as shown in FIG. 10, the wiring connection is preferably made with the use of a plug 116 and socket 117 connector 118 including locking means 141 which is generally similar in structure and function with those used to connect the electrical wire 115 and the electric power cords 67, but being smaller in size. Many different styles and sizes of connectors 118 are commercially available and can be used. A seal 83 can be used to cover and protect the junction of the stem 74 with the receptacle 119, and so prevent the ingress of dirt, water, insects, or rodents which could cause damage to the solar array 30. When not all of the provided layers 27 or receptacles 119 are required or desired for use in a given solar array 30, a plug 121 can be used to seal the opening 120 associated with a receptacle 119.

FIG. 11 is a side cross-sectional view of an alternate top portion 34 of the trunk 31 of an artificial palm tree 29 including provision for two layers 27.1 and 27.2, and also a cap portion 69 including provision for one layer 27.5 for use in making a solar array 30 showing both internal and external components. As a result, the top portion 34 of the trunk 31 of an artificial palm three 29 can be removably secured and assembled using a component that includes provision for two layers 27.1 and 27.2, that is, if and when this configuration is desired.

FIG. 12 is a side cross-sectional view of an alternate top portion 34 of the trunk 31 of an artificial palm tree 29 including provision for one layer 27.1 and also a cap portion 69 including provision for one layer 27.5 for use in making a solar array 30 showing both internal and external components. As a result, the top portion 34 of the trunk 31 of an artificial palm three 29 can be removably secured and assembled using a component that includes provision for only one layer 27.1, that is, if and when this configuration is desired. The provision of multiple power cords 67 each providing sufficient wiring for one layer of solar modules 28 which can be easily coupled together can facilitate rapid assembly. The possible provision of alternate top portions 34 in one, two, or four layer 27 configurations makes it possible to easily assemble different resulting structures. Accordingly, the power generating capability and also the aesthetic appearance of a solar array 30 can be customized.

Figure 13:
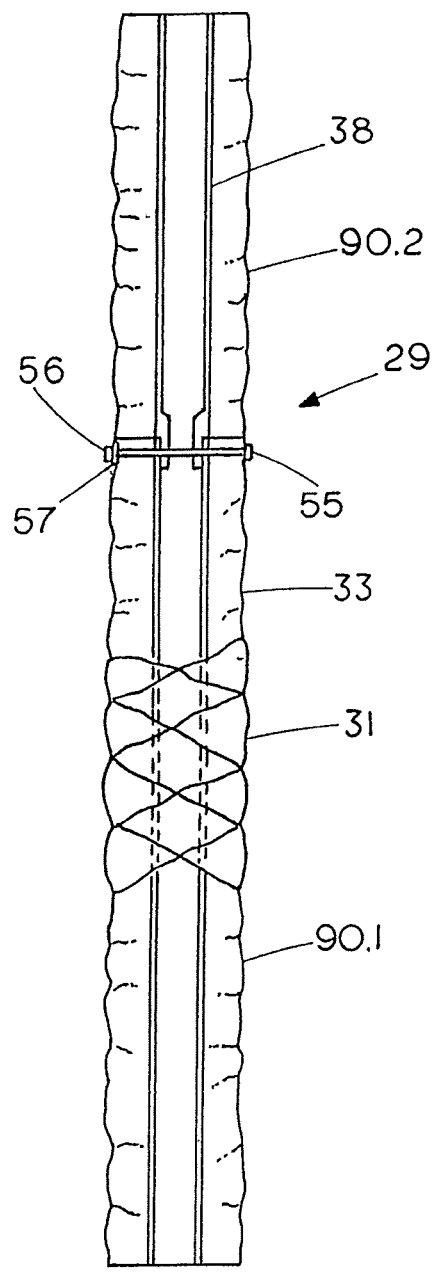
FIG. 13 is a side view with parts broken away of an alternate middle portion of a trunk of an artificial palm tree including at least two sections which can be removably secured together to substantially determine the overall height of an artificial palm tree.

FIG. 13 is a side view of an alternate middle portion 33 of the trunk 31 of an artificial palm tree 29 with parts broken away. The middle portion 33 includes at least two segments or sections 90, and in particular, sections 90.1 and 90.2, which can be removably secured together with the use of a long bolt 55, nut 56 and washer 57 in order to determine the overall height of the resulting trunk 31 of an artificial palm tree 29, as desired. Shown in FIG. 13 is a section 90.1 having a length of eight feet, and another section 90.2 having a length of four feet. Accordingly, multiple sections 90.1 and 90.2 can be easily combined in various partial or complete combinations to create trunks 31 and artificial palm trees 29 having different heights. The configuration and texture of the outer surface of the trunk 31 can be made to resemble that of a palm tree by making the molds for these components from an actual palm tree. The trunk 31 can then be made of plastic, polyurethane, fiberglass, metal, ceramic, and also natural organic and fibrous materials in various combinations.

Figure 14:
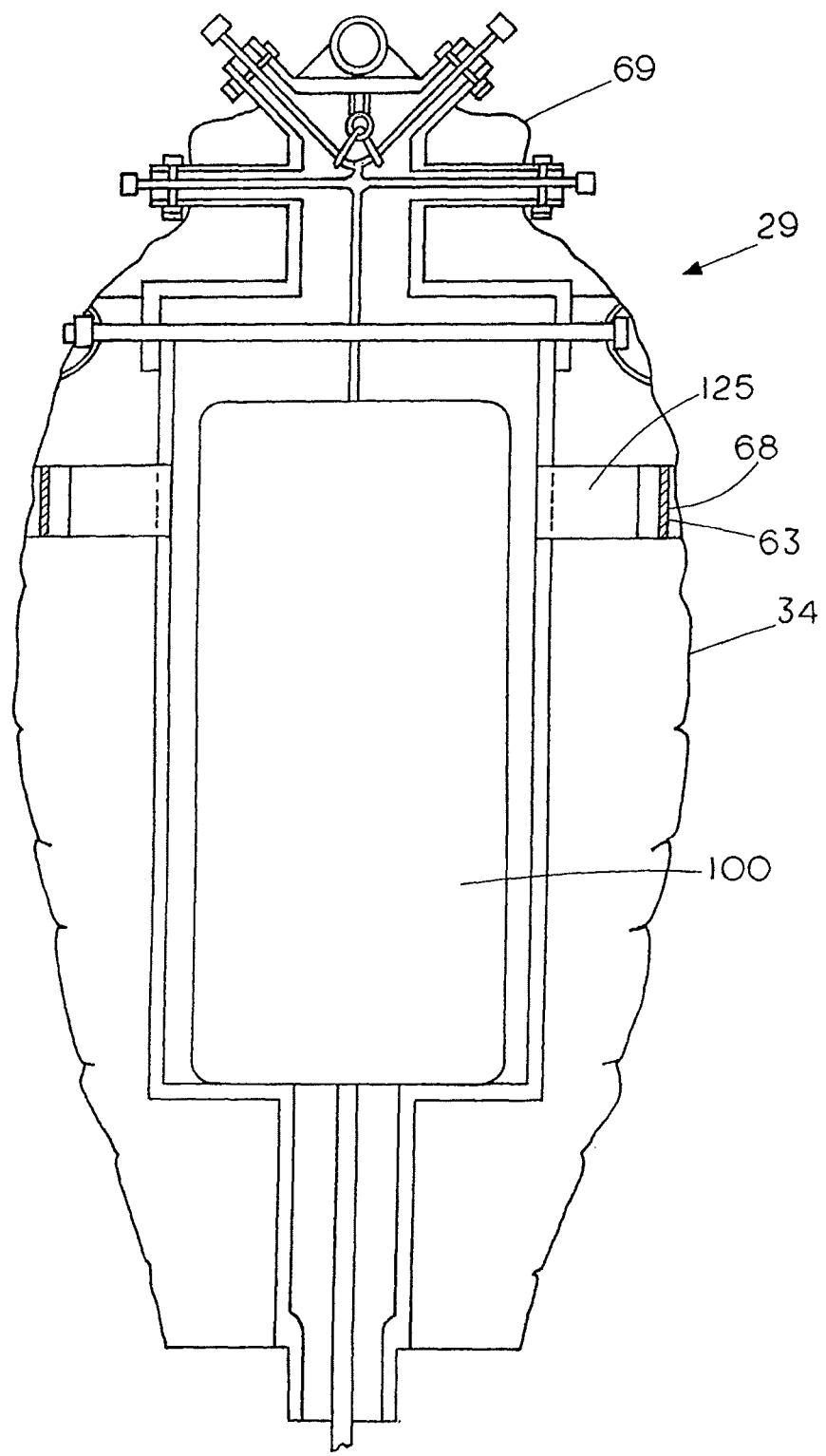
FIG. 14 is a side cross-sectional view of an alternate top portion and cap portion of a trunk of an artificial palm tree for accommodating a transformer.

FIG. 14 is a side cross-sectional view of an alternate top portion 34 and cap portion 69 of a trunk 31 for use in making an artificial palm tree 29. As shown, the top portion 34 and cap portion 69 have greater width that the embodiment shown in FIG. 10, and this can provide space for accommodating and substantially concealing a transformer 100. A step-up transformer can be used to step-up the voltage being generated by the solar array so that it can be more efficiently carried over long distances. Conversely, a step-down transformer can be used to step-down the voltage being carried by a high voltage power line. A transformer can be connected to overhead transmission lines, or alternatively to buried power lines which can carry DC current or AC current. Shown is a duct 125 including a vent 68 having a screen 63 for permitting ventilation while preventing the entry of birds, bees, or other foreign matter.

Figure 15:
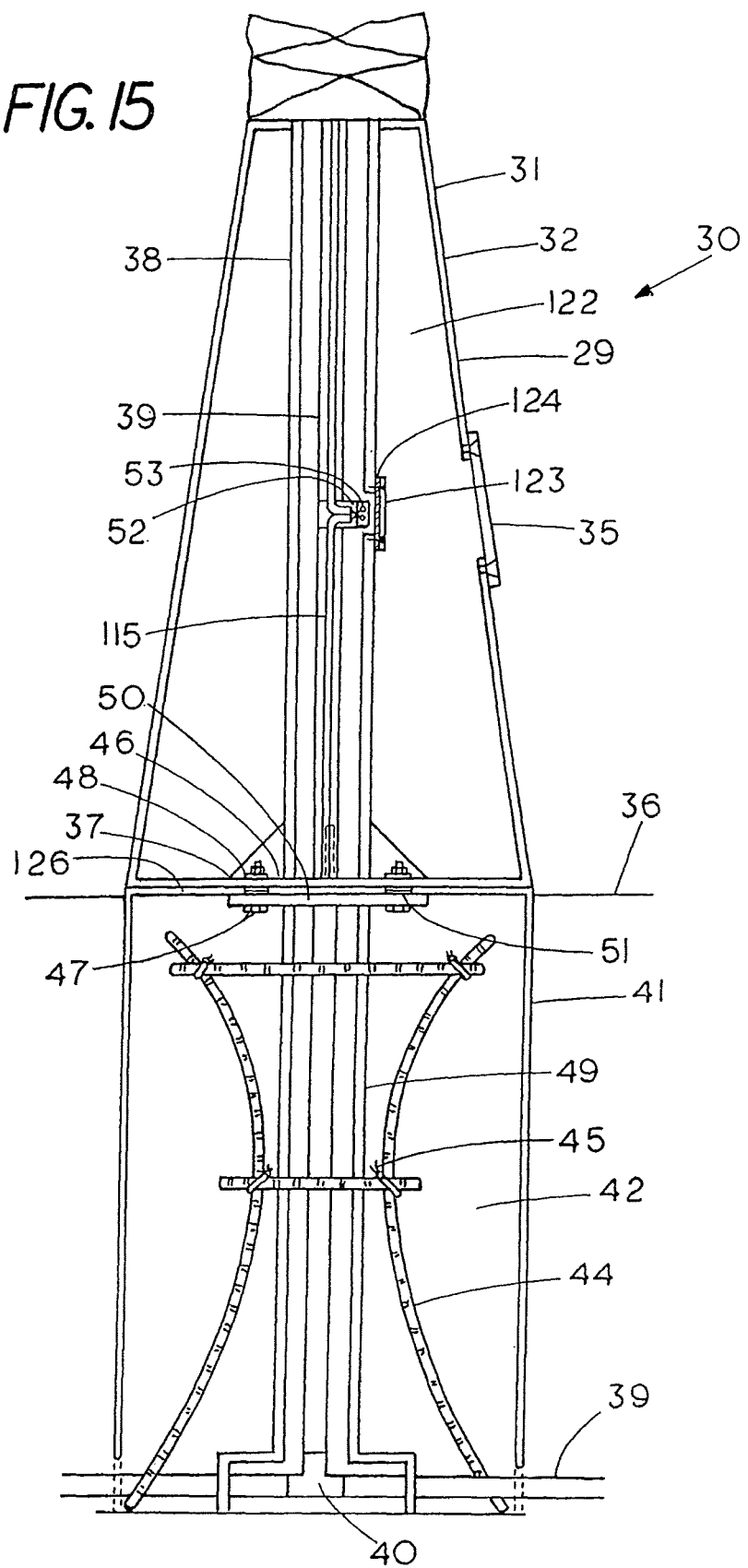
FIG. 15 is a side cross-sectional view of a bottom portion of a trunk and also a footing of an artificial palm tree that consists of a solar array.

FIG. 15 is a side cross-sectional view of the bottom portion 32 of a trunk 31, and also a footing 126 including a support platform 49 for an artificial palm tree 29 that forms a solar array 30 showing both internal and external components. As shown, the bottom portion 32 of the trunk 31 gradually widens as it approaches the ground surface 36, thus simulating the appearance of many palm tree species. The bottom portion 32 of the trunk 31 can include at least one access door 35 to an interior compartment 122. The support pole 38 can further include a cover 123 and a gasket 124 which permits access to a wire connection 52 between the solar array 30 and electric wire 115. The wire connection 52 can be secured by wire nuts 53, or alternatively, by other conventional fastening means such as bolts or screws associated with a junction box 54. The electric wire 115 can be protected from damage by a conduit 39 made of metal or plastic, and in particular, in areas where the soil, insects, or rodents could cause harm or degradation to the wire 115.

The base 37 of the pole 38 includes a reinforced flange 46 that provides several openings for the passage of bolts 47. The base 37 of the pole 38, and in particular, the inferior side of the flange 46 is configured to bear upon a footing 126 which can include a submerged platform 49 including a reinforced flange 50. The vertical alignment of the pole 38 can be adjusted at the junction of flange 46 and flange 50 with the use of one or more washers 51 when the bolts 47 and nuts 48 are secured. The platform 49 can include a stand-off at the inferior side for permitting the conduit 39 and conduit fitting 40 including the electric wire 115 to pass directly beneath, but also to permit the concrete 42 used in the footing 126 to substantially encompass the platform 49. The concrete 42 can be further reinforced by including metal rebar 44 therein. The rebar 44 can be configured as desired and secured with the use of tie wire 45 prior to pouring the concrete 42. A circular hole or pit can be drilled in the ground using power equipment and a circular or tube shaped form 41 can be inserted into the hole or pit for properly containing the concrete 42 when it is poured. It can be readily understood that the particular configuration, structure, and size of a footing 126 can vary depending upon the geology, soil conditions, climate, and seismic characteristics of the installation site.

Figure 16:
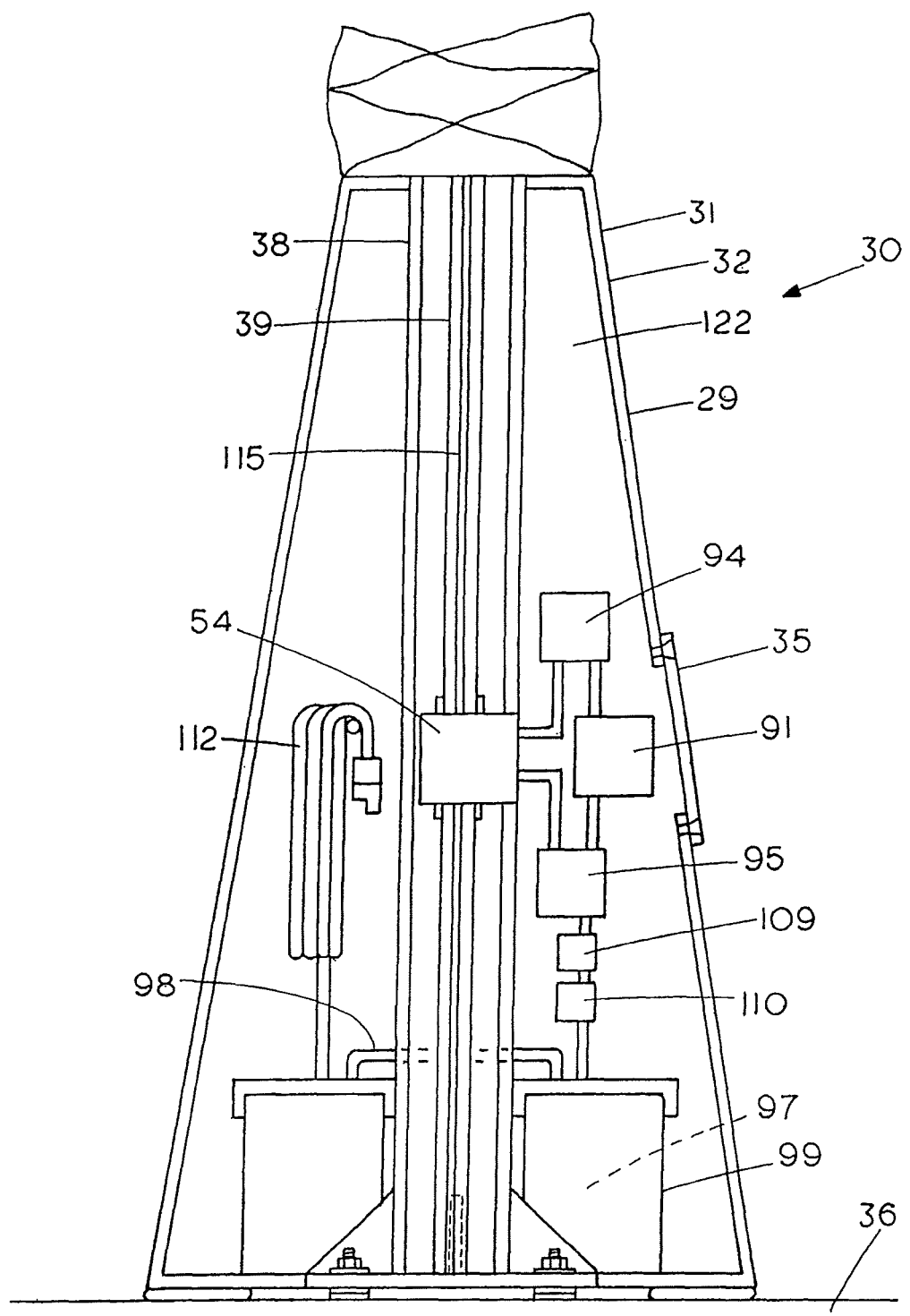
FIG. 16 is a side cross-sectional view of a bottom portion of a trunk of an artificial palm tree generally similar to that shown in FIG. 15, but including additional electrical devices within the interior compartment.

FIG. 16 is a side cross-sectional view of the bottom portion 32 of the trunk 31 and of an artificial palm tree 29 that constitutes a solar array 30 showing both internal and external components generally similar to that shown in FIG. 15. However, instead of the solar array 30 being directly connected by an electric wire 115 to a network of solar arrays and a solar power grid or conventional electric power grid, the solar array 30 further includes a number of devices which can be located internally. In particular, a solar array 30 can include in various partial or complete combinations, an inverter 91 such as a Sunnyboy brand grid-tie inverter made by SMA America, Inc. of Grass Valley, Calif., or those of PV Powered of Bend, Oreg. for converting DC current to AC current, a converter for converting AC current to DC current, a transformer, a battery 97 and associated battery cables 98, a battery box 99, a junction box 54, a control panel, an AC circuit breaker, a DC circuit breaker, an AC disconnect 94, a DC disconnect 95, a meter, a ground fault switch, a power surge protection device, a fuse, a capacitor, a resistor, a transistor, a diode, a chip, a battery controller 109, a battery status meter 110, a generator, conduit 39 including suitable electric wire 115, a retractable extension cord including a plug, a light, an adapter for recharging small batteries, appliances and power tools, and, an electric power recharging cord 112 for recharging a vehicle such as an electric scooter, bicycle, car, boat, or aircraft. The recharging cord 112 can be mounted within the interior compartment 122 of the base 32 on an automatic retractable reel, whereas the end of the recharging cord 112 including the connector 118 can be located externally and be readily accessible for use. It can be readily understood that some of the devices and things recited in this paragraph can be combined in structure and function in the form of hybrid devices.

Figure 17:
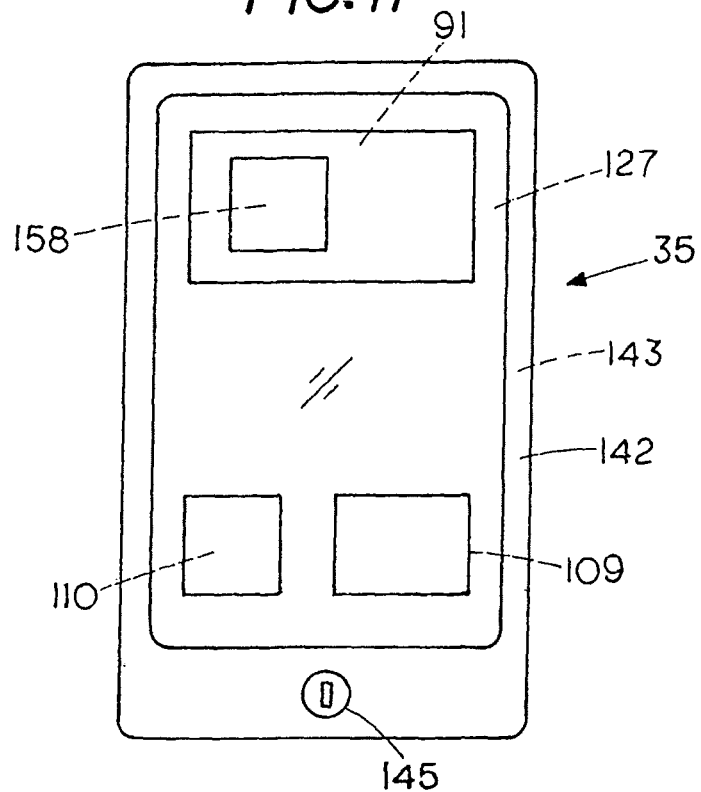
FIG. 17 is a top perspective view of an alternate access door to the interior compartment of the bottom portion of the trunk of an artificial palm tree.

FIG. 17 is a top perspective view of an access door 35 to the interior compartment 122 of the bottom portion 32 of the trunk 31 of an artificial palm tree 29 which forms a solar array 30. As shown, the access door 35 can include a transparent window 127 on the exterior side 142 for viewing the status of one or more devices such as an inverter 91, a meter, an AC disconnect, a DC disconnect, a battery controller 109, and a battery status meter 110. A battery controller 109 can be used to prevent overcharging of a battery, and also to reverse electric power flow at night. As shown, the visual display 158 associated with these electronic devices, and the like, can be mounted near or directly to the interior side 143 of the access door 35, whereby these devices can be easily viewed and serviced. As shown, the access door can included a keyed lock 145, or other closure and locking means.

Figure 18:
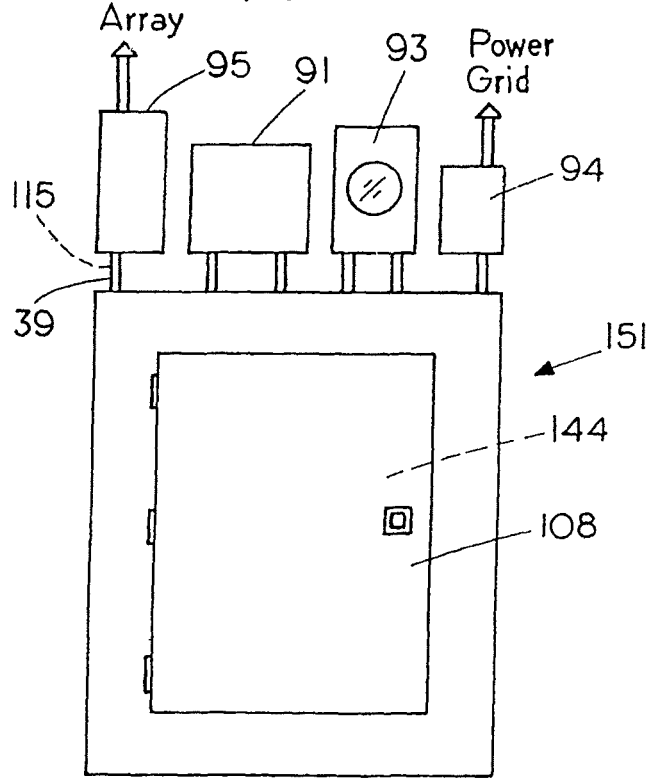
FIG. 18 is a side perspective view of a solar electric power control panel for possible residential use.

FIG. 18 is a perspective view of a grid-tie power center 151 which could be used in a typical residential installation in combination with one or more solar arrays 30 resembling natural foliage according to the present invention. Shown is an inverter 91 for converting DC current to AC current, an AC disconnect 94, a DC disconnect 95, a meter 93, a control panel 108 including circuit breakers 144, and conduit 39 containing suitable wire 115. A grid-tie power center 151, or alternately an off-grid power center, can also include or integrate in various partial or complete combinations a battery and associated battery cables, a battery box, a battery status meter, a battery controller, a ground fault switch, a surge protector, a converter, a transformer, an extension cord, a light, a generator, an adapter for recharging small batteries, appliances, and power tools, and an electric power recharging cord for recharging a vehicle such as an electric scooter, bicycle, car, or boat.

Figure 19:
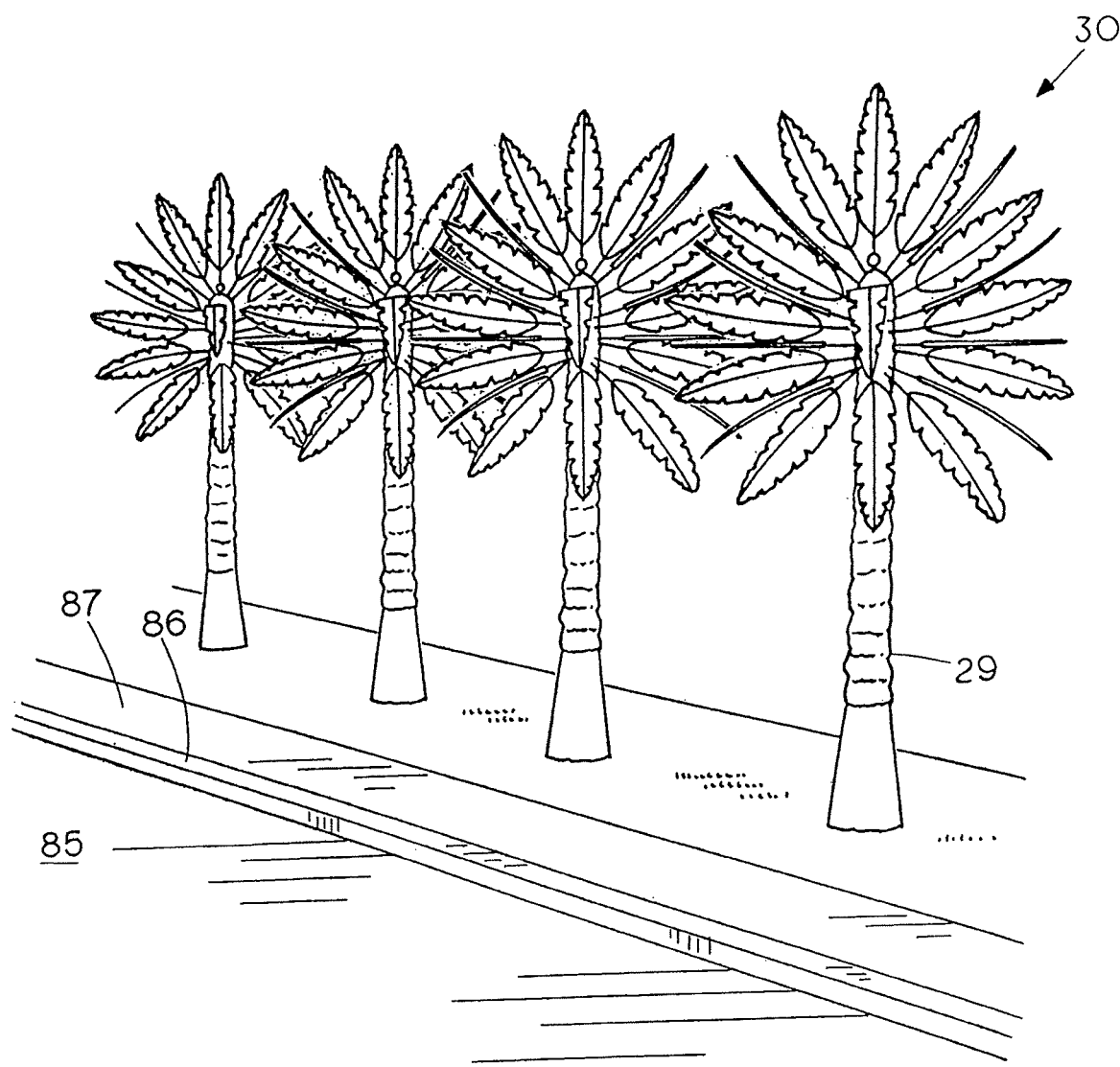
FIG. 19 is a perspective view of one side of a street and sidewalk including a row of artificial palm trees that consist of solar arrays.

FIG. 19 shows a row 128 of artificial palm trees 29 that consist of solar arrays 30 on one side of a street 85. The solar arrays 30 have a structure configured to resemble natural foliage and can be placed in communication to create a network 153 of solar arrays 30 that constitute at least a portion of a solar power grid 154. Further, the solar arrays 30 can be individually connected to power transmission lines associated with a power grid. Alternatively, a plurality of solar arrays 30 can be connected together, and then connected as a group to power transmission lines. The solar arrays 30 can be wired together in series, or alternately in parallel. When a plurality of solar arrays 30 are wired together for connecting to an AC power grid, a grid-tie inverter can be used. The artificial palm trees 29 are aesthetically more pleasing than conventional overhead power lines, and also the sparse vegetation found by the sides of roads and highways in the Southwest area of the United States and other arid regions of the world. The artificial palm trees 29 are shown near a curb 86 and adjacent sidewalk 87. Besides providing clean and renewable electric power, the solar arrays 30 can also provide shade and serve as a windbreak. Unlike natural foliage which is difficult to maintain by the sides of roads and highways in the Southwest area of the United States and other arid regions of the world, an artificial palm tree 29 always has a healthy appearance, never needs watering, and requires little maintenance. In desert areas, the shade provided by artificial palm trees 29 can be used to facilitate the cultivation of natural foliage and agriculture. A network of solar arrays 30 can also be positioned along canals and pipelines. The power produced by a solar array 30 can be used to pump oil, or water, and also to desalinate and filter water for residential and agricultural use. Solar water heating devices such as those made by Maltezos SA of Athens, Greece can then be used to provide hot water. Solar arrays 30 can also be positioned alongside railways for providing power for electric trains. The ability to generate and distribute power where it is actually needed can result in logistical and economic efficiency. In this regard, the location, pattern, and density of public roads and highways generally well reflects the local population density and demand for energy. Accordingly, the creation of a network 153 of solar arrays 30, and at least one solar power grid 154 alongside public roads can be consistent with the local economy of scale.

Figure 20:
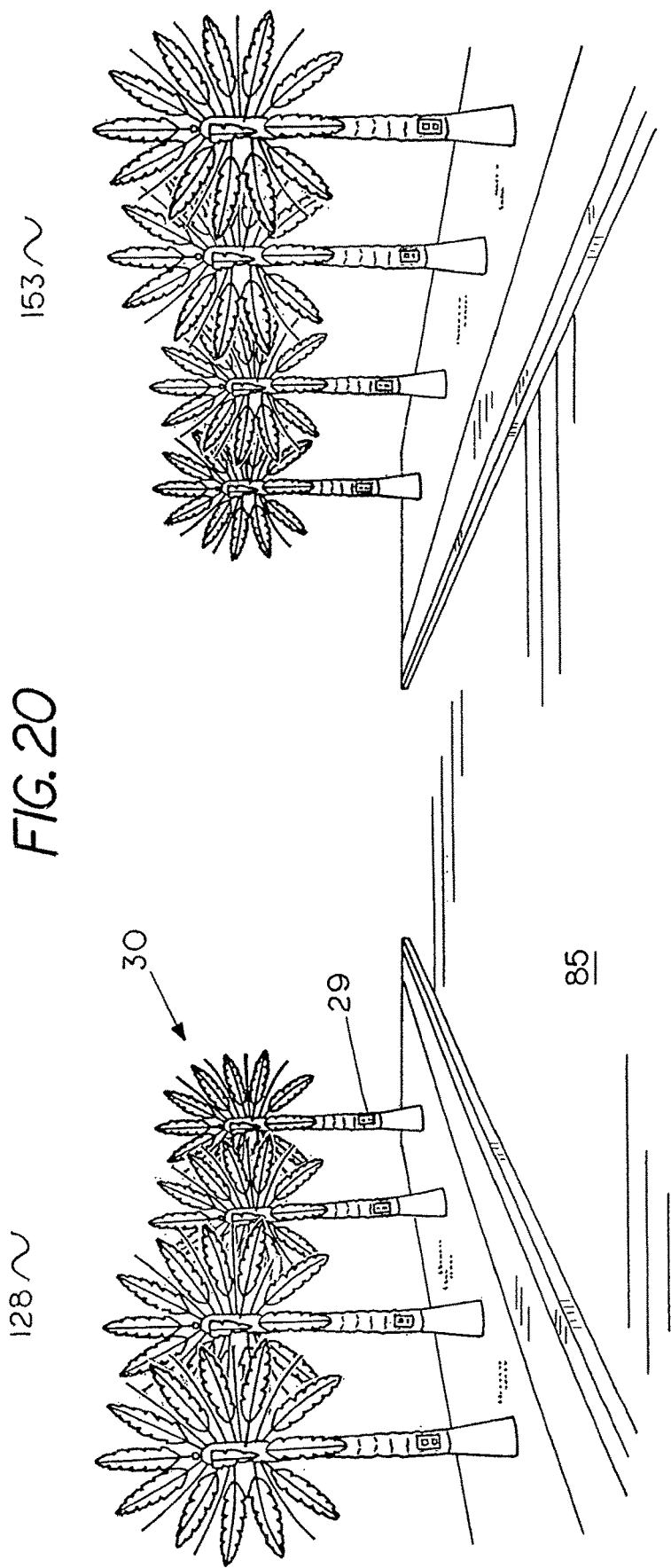
FIG. 20 is a perspective view of two rows of artificial palm trees that consist of solar arrays positioned on opposite sides of a street.

FIG. 20 shows a row 128 of artificial palm trees 29 that consist of solar arrays 30 located on both sides of a street 85. The solar arrays 30 have a structure configured to resemble natural foliage and can be linked together to create a network 153 of solar arrays 30 and a solar power grid 154. FIG. 20 conveys some sense of the structure and aesthetic impression created by a network 153 including a plurality of solar arrays 30.

Figure 21:
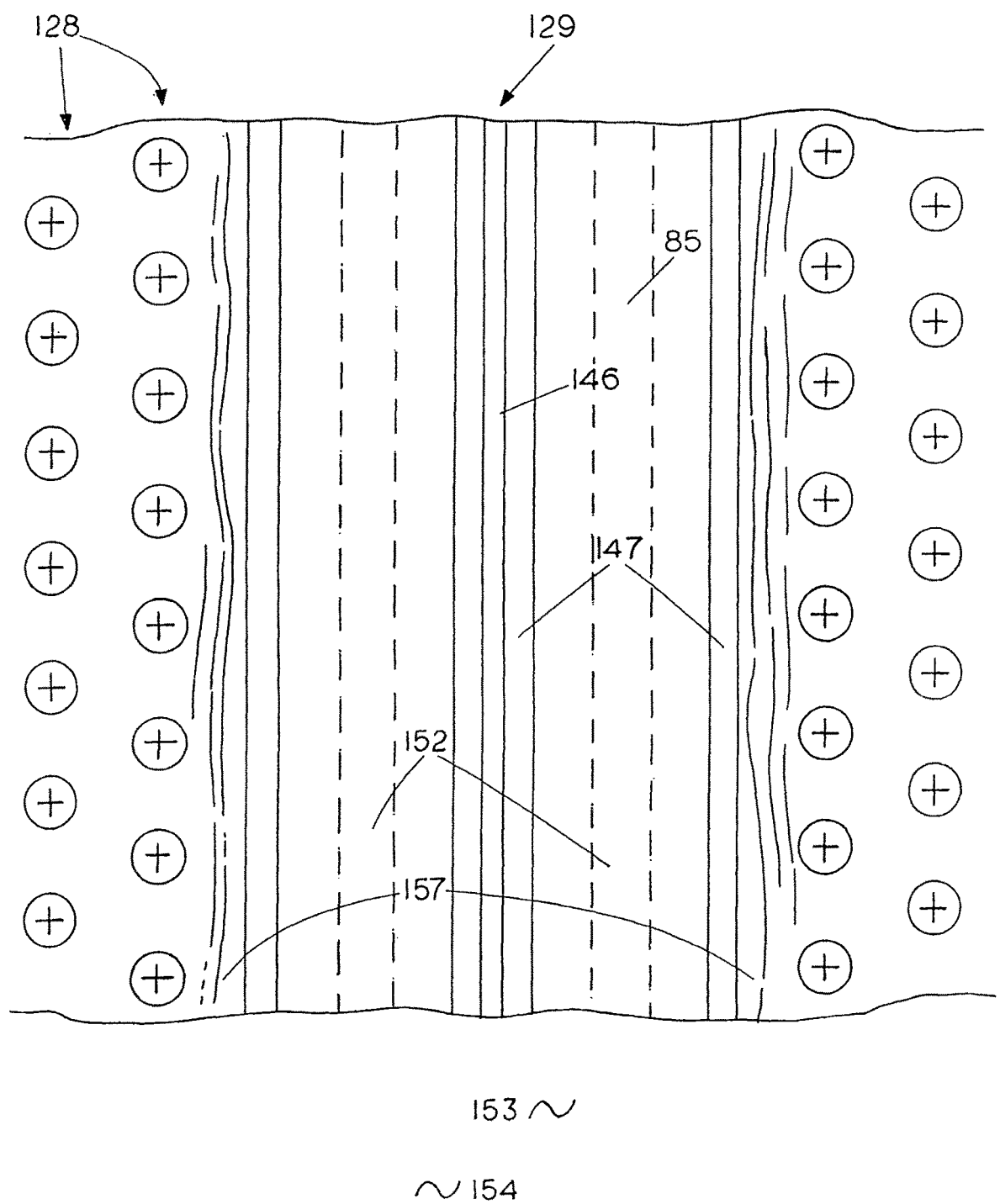
FIG. 21 is a top plan view of a section of interstate highway showing a plurality of artificial palm trees that consist of solar arrays.

FIG. 21 is a top plan view of a section of interstate highway 129 showing one possible configuration of a plurality of artificial palm trees 29 consisting of solar arrays 30 positioned in staggered double rows 128 on each side of the highway 129. The solar arrays 30 have a structure configured to resemble natural foliage and can be linked together to create a network 153 of solar arrays 30 and a solar power grid 154. In FIG. 21, the opposite lanes 152 of the interstate highway 129 each have two shoulders 147, and are separated by a center divider or barrier 146. Further, the topography to the outside of both lanes 152 of the interstate highway 129 is characterized by gradually increasing vertical elevation and hills 157. Many other landscapes, topographical characteristics, and configurations are possible. As shown, the artificial palm trees 29 are positioned approximately thirty-two feet apart in each row 128, and the two rows 128 are also separated by thirty-two feet. Other dimensions can be used, as desired, but it can be advantageous to provide sufficient spacing to prevent substantial shading of adjacent solar arrays 30. The height, diameter, and composition of the artificial palm trees 29 can be varied, and other styles and types of artificial foliage consisting of alternative solar arrays can be used in synergistic combination with the artificial palm trees 129, or alternatively, with evergreen or deciduous trees, as may be desired. Accordingly, many combinations and permutations are possible. The ability to provide a large number of different combinations can be functional from the standpoint of optimizing power generation, and can also serve aesthetic purposes consistent with the best practices of engineering and landscape architecture.

Moreover, the present invention anticipates and teaches making various planning models for application to common road configurations regarding the installation of solar arrays, and also recharging stations. For example, various standardized models can be created for installations alongside relatively straight one mile stretches or other standard distances such as one kilometer stretches of two lane, divided two lane, divided four lane, divided three lane, and other common road and highway configurations. Appropriate models can also be made for various common intersections such as four way intersections, T shaped intersections, L shaped intersections, turnabouts, and various on and off ramp configurations associated with roads and highways. Accordingly, the planning for various installations can be made relatively fast and easy, and both the costs and electrical power generated by any selected set of options can be known with a great degree of certainty. A city, county, state, or federal planner, or an elected official such as a commissioner, mayor, governor, representative, or senator can then be empowered with accurate information for decision making concerning the installation of a network of solar arrays, recharging stations, and other devices and structures associated with a solar power grid.

Figure 22:
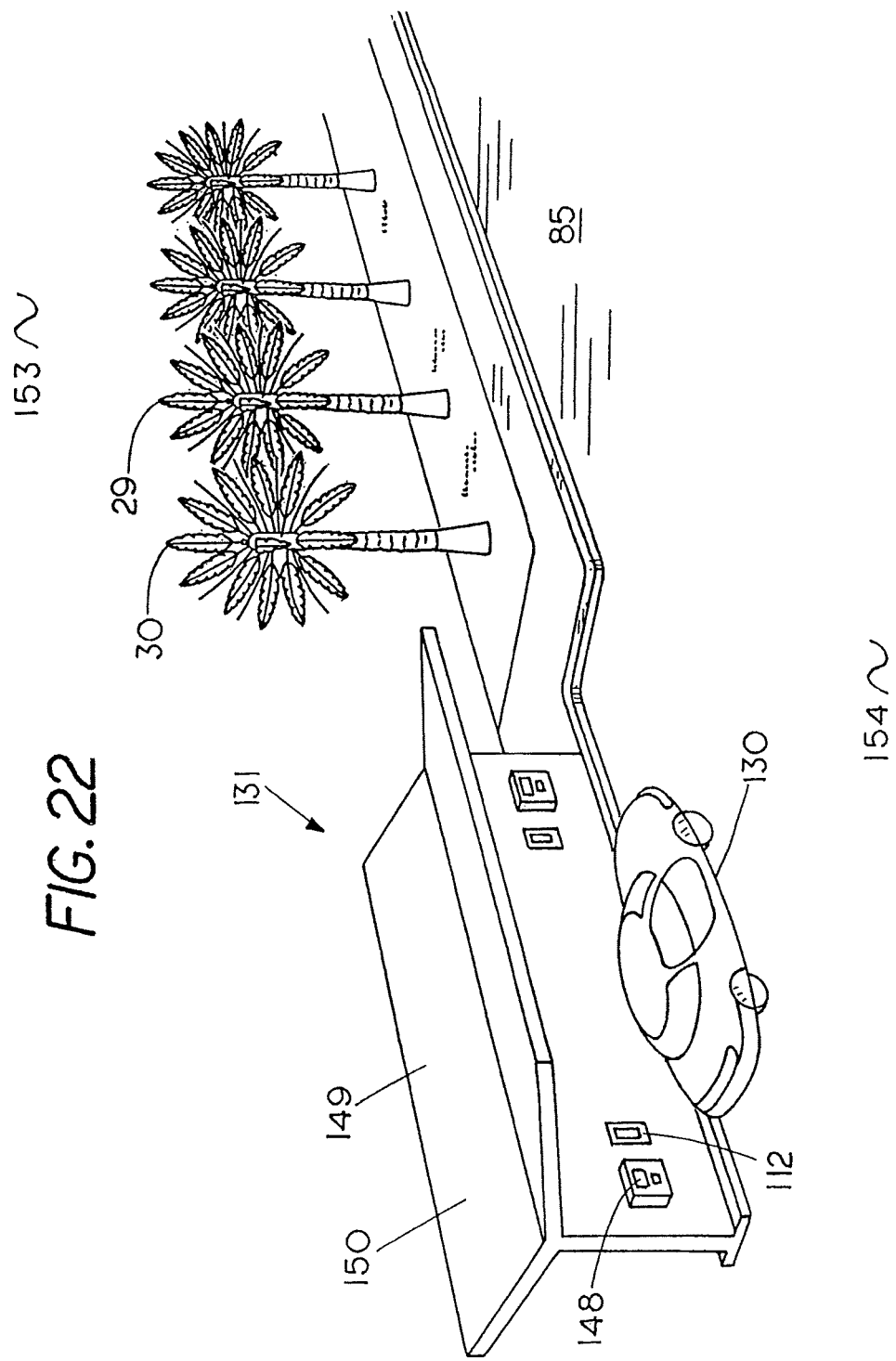
FIG. 22 is a side perspective view of an electric or hybrid automobile parked at an electric recharging station by the side of a road.

FIG. 22 is a perspective view of a transportation vehicle comprising an electric or hybrid automobile 130 that is parked at an electric recharging station 131 by the side of a street. In this regard, it can be readily understood that a transportation vehicle can also comprise an automobile, truck, bus, train, trolley car, bicycle, scooter, or motorcycle. The roof 150 of the recharging station can include conventional photovoltaic solar panels 149. Manufacturers of conventional photovoltaic solar panels 149 include Kyocera Solar, Inc. of Scottsdale, Ariz., Sharp Electronics Corporation, Inc. of Mahwah, N.J., Evergreen Solar of Marlboro, Mass., BP Solar of Linthicum, Md., and Shell Solar of Camarillo, Calif. The recharging station 131 can serve as an energy storage facility, and can be in communication with electrical energy and power which is produced by a network 153 of artificial palm trees 29 or other forms of artificial foliage which constitute solar arrays 30. The solar arrays 30 can line the sides of a parking lot area, or public transportation right of ways such as a street, or highway. The network 153 of solar arrays 30 and recharging station 131 can form or be in communication with one or more other solar power grids 154, and can also be coupled to one or more conventional power grids. As shown and discussed in FIG. 16 above, and also in FIG. 33 below, a solar array 30 can comprise a recharging station 131 and include mechanical means for making a direct connection with a transportation vehicle 130, including, but not limited to, an electric cord 112, or a conduit for the transmission of solid or fluid matter, and the like. Further, a recharging station 131 can provide one or more fully recharged energy storage devices, including, but not limited to, an electric battery, or capacitor, for making a rapid exchange with one or more energy storage devices present on a transportation vehicle which have been substantially depleted.

Figure 23:
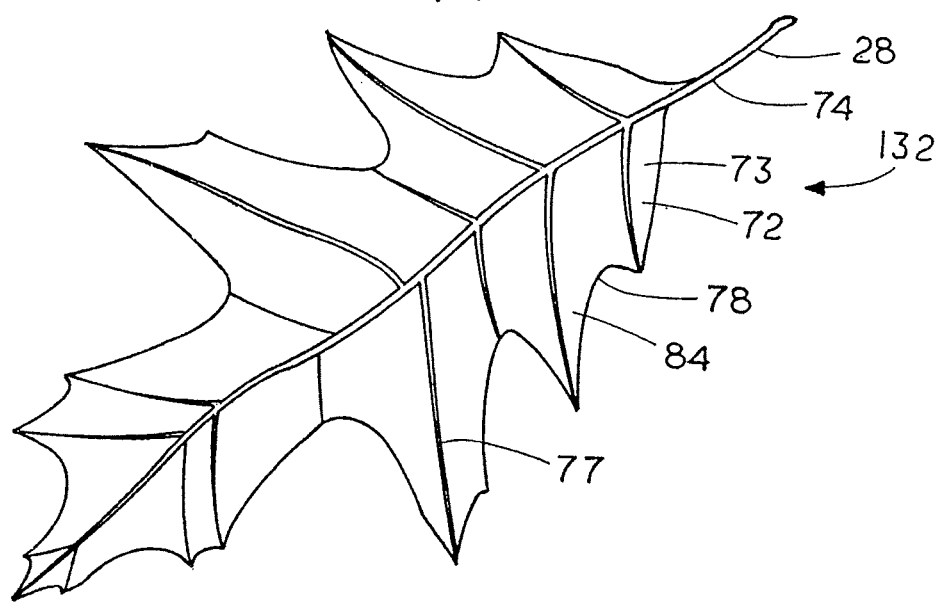
FIG. 23 is a top view of an artificial oak leaf for use with an artificial deciduous oak tree that consists of a solar array.

FIG. 23 is a top view of an artificial oak leaf 132 for use with an artificial deciduous oak tree 135 which consists of a solar array 30. The artificial oak leaf 132 can include a solar module 28 having at least one solar cell 73. As shown, the artificial oak leaf 132 can include a stem 74, a blade portion 84, notches 78 and veins 77.

Figure 24:
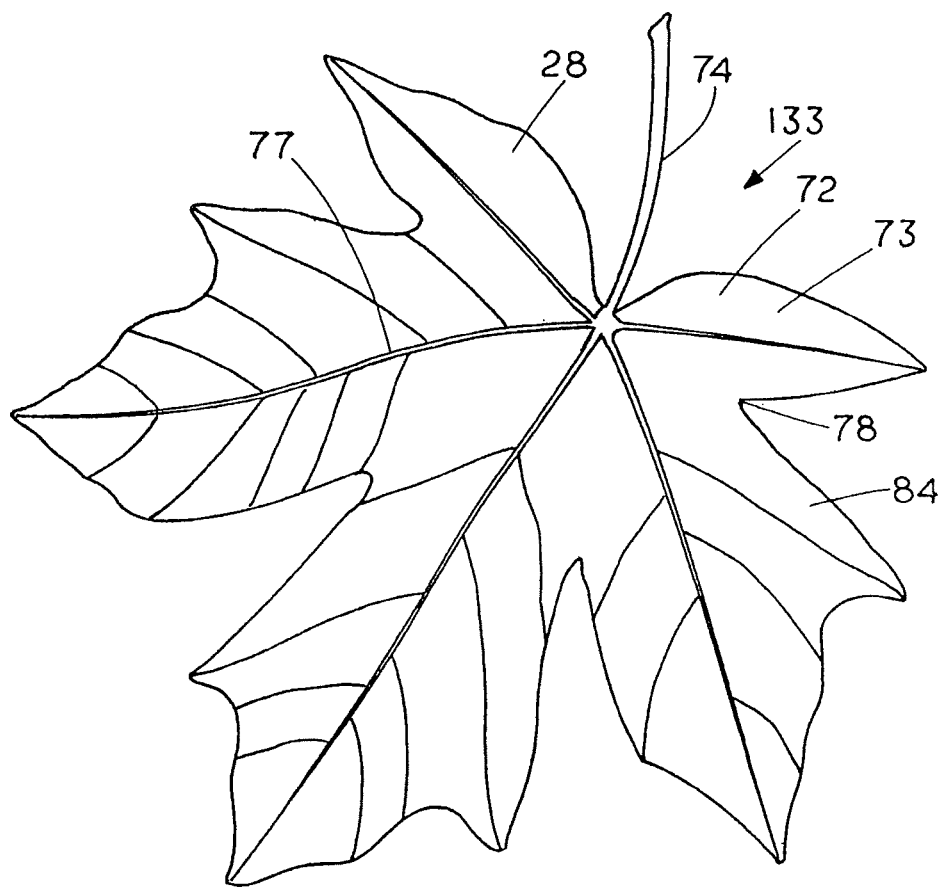
FIG. 24 is a top view of an artificial maple leaf for use with an artificial deciduous maple tree that consists of a solar array.

FIG. 24 is a top view of an artificial maple leaf 133 for use with an artificial deciduous maple tree 136 which consists of a solar array 30. The artificial maple leaf 133 can include a solar module 28 having at least one solar cell 73. As shown, the artificial maple leaf 133 can include a stem 74, a blade portion 84, notches 78 and veins 77.

Figure 25:
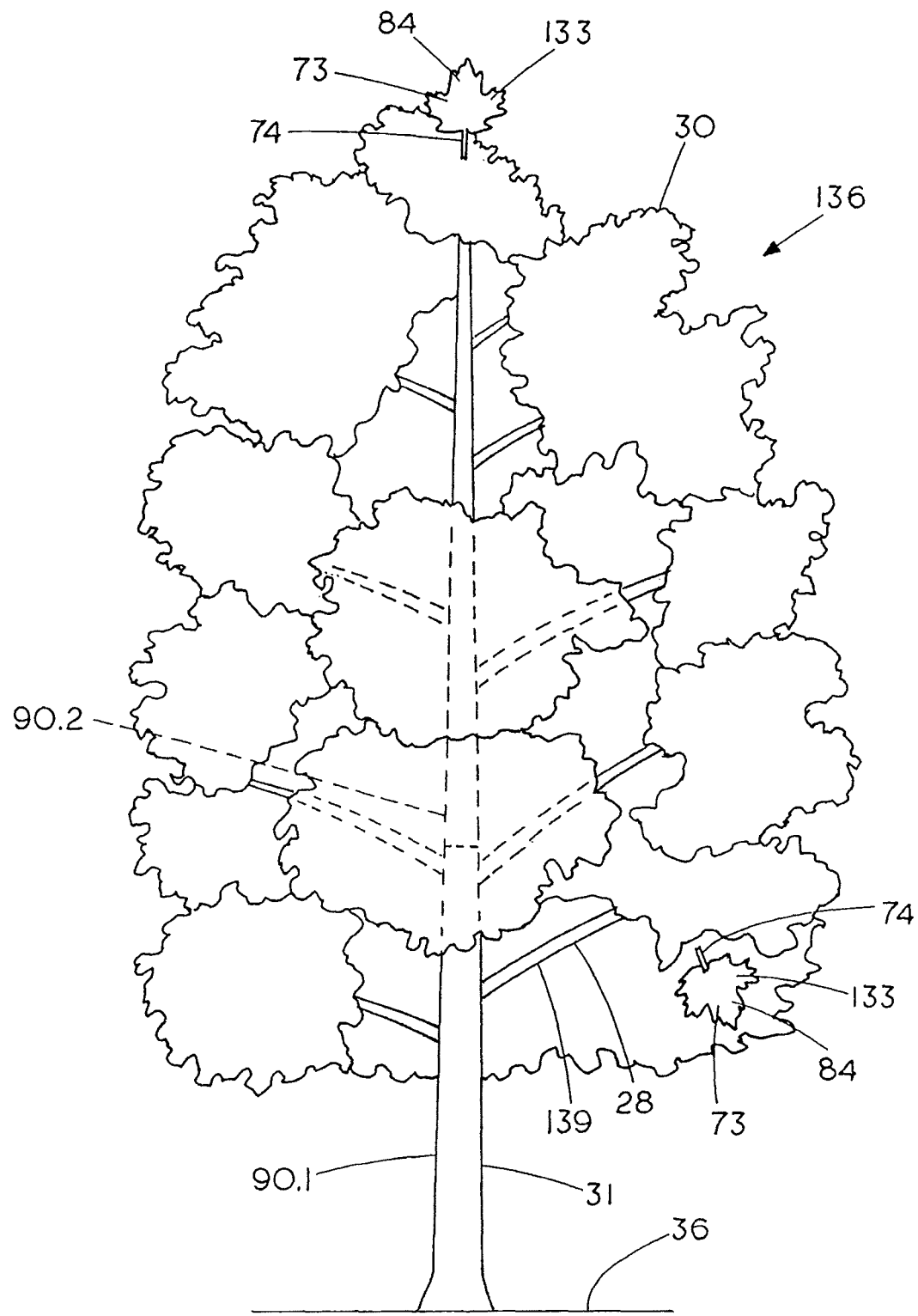
FIG. 25 is a side perspective view of an artificial deciduous maple tree that consists of a solar array.

FIG. 25 is a side perspective view of an artificial deciduous maple tree 136 which consists of a solar array 30. The artificial maple tree 136 includes a trunk 31 and a plurality of artificial branches 139 which include a plurality of artificial maple leaves 133. Again, the artificial maple leaves 133 can include a solar module 28 having at least one solar cell 73. The trunk 31 can be made in a plurality of sections having different lengths such as sections 90.1 and 90.2, and the height of an artificial maple tree 136 can then be varied, as desired.

Figure 26:
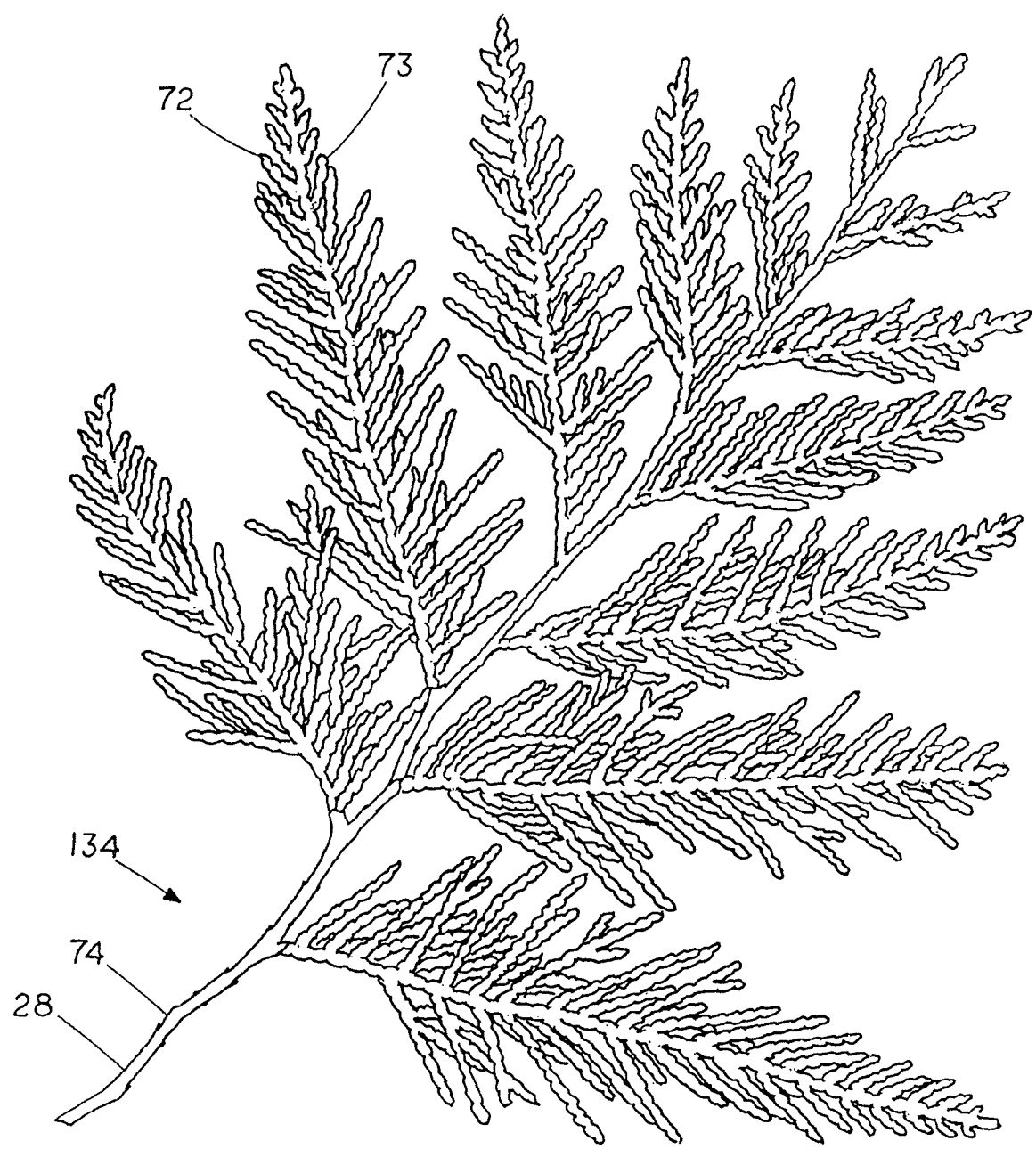
FIG. 26 is a top view of a portion of an artificial evergreen tree branch and leaf for use with an artificial evergreen tree that consists of a solar array.

FIG. 26 is a perspective view of a portion of an artificial branch 139 including leaves 134 for use with an artificial evergreen tree 137 that consists of a solar array 30. The artificial leaf 134 can include a solar module 28 having at least one solar cell 73. As shown in FIG. 26, the branches 139 and leaves 134 can be made to resemble those of a western red cedar or sequoia. It is possible to use conventional molding and cutting techniques to make at least a portion of an artificial branch 139 including leaves 134.

Figure 27:
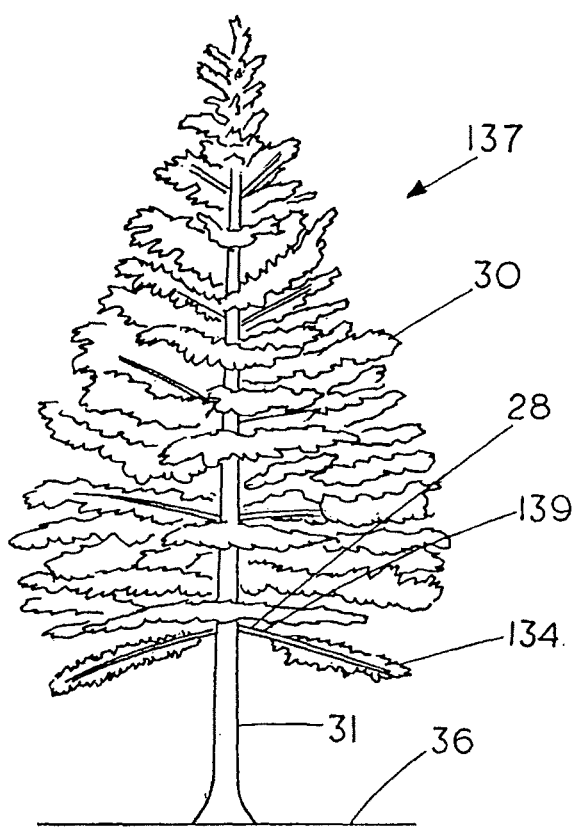
FIG. 27 is a side perspective view of an artificial evergreen tree that consists of a solar array.

FIG. 27 is a side perspective view of an artificial evergreen tree 137 such as a western red cedar which consists of a solar array 30. The leaves or needles of the cedar tree and also sequoias are relatively planar, and in particular, when compared with the leaves or needles of many other evergreen trees. In this regard, the leaves or needles of a cedar tree have the appearance of having been pressed. Gravity then causes the leaves and branches of cedar trees to drape and take on a soft random feathered appearance. Because of the relatively planar configuration of their leaves, it is possible to made artificial branches and leaves 134 resembling those of the western red cedar and sequoia. The leaves 134 can include a solar module 28 including at least one thin-film solar cell 73, or alternatively one made by painting, or other coating process.

Figure 28:
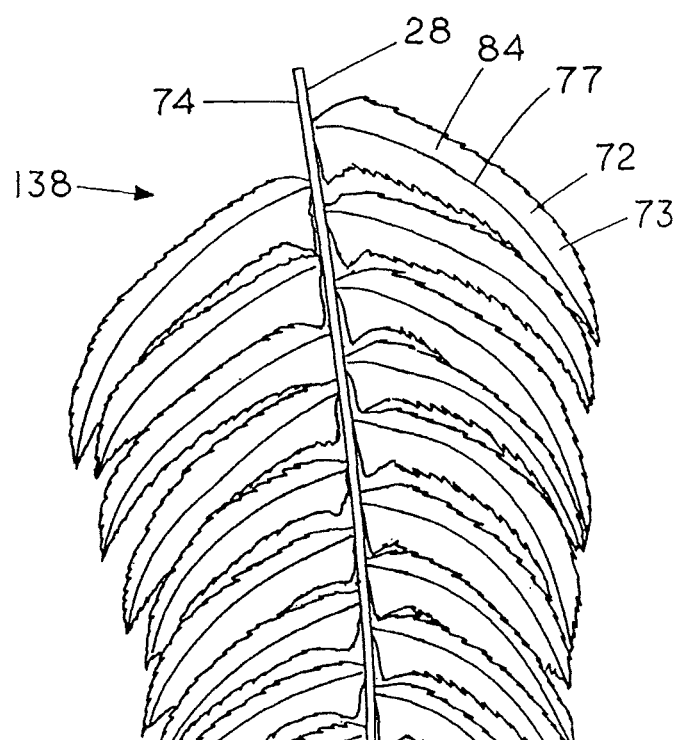
FIG. 28 is a top view of an artificial fern leaf for making an artificial fern plant consisting of a solar array.

FIG. 28 is a top view of an artificial fern leaf 138 for making an artificial fern plant. The artificial fern leaf 138 can include a solar module 28 having at least one solar cell 73. As shown, the artificial fern leaf 138 can include a stem 74, a blade portion 84 including notches 78, and veins 77.

Figure 29:
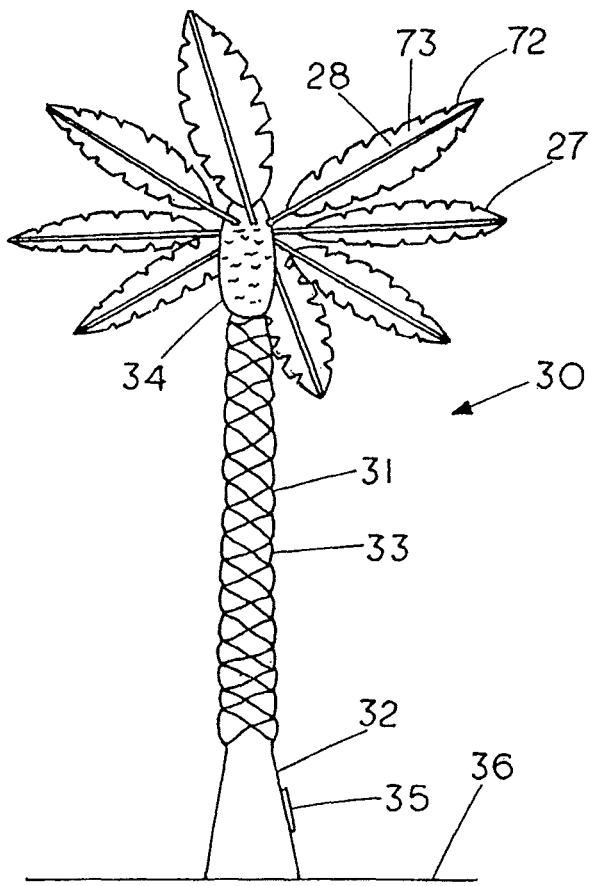
FIG. 29 is a side perspective view of an artificial palm tree that consists of a solar array including a plurality of artificial palm fronds that consist of solar modules.

FIG. 29 is a side perspective view showing an artificial palm tree 29 which consists of a solar array 30. In this embodiment, the leaves or artificial palm fronds 72 can include a solar module 28 made of a relatively rigid material including monocrystalline silicon, polycrystalline silicon, crystalline gallium arsenide, and the like. The artificial palm fronds 72 can be relatively rigid and the solar modules 28 including at least one solar cell 73 can then be affixed to a relatively rigid substrate. In this regard, glass reinforced plastics, ceramics, or metal materials such as aluminum or stainless steel can be used. Using conventional photovoltaic solar cells 73 that are presently commercially available, the solar modules 28 and solar array 30 shown in FIG. 29 can have an efficiency of approximately 14-16 percent. However, given the status of current research and development efforts in the solar industry something exceeding 35 percent efficiency may be possible to achieve within the next decade. For example, Spectrolab of Sylmar, Calif., a subsidiary of The Boeing Company has achieved an efficiency of 36.9 percent with a photovoltaic cell. Given the commercial products available today, the efficiency of a solar cell made using a crystalline silicon material is then nearly three times that of one made using amorphous thin-film materials which commonly enjoy an efficiency of only 5-6 percent. However, the former solar cells are more expensive and less environmentally friendly to manufacture relative to the latter.

As shown in FIG. 29, a solar array 30 can have eight artificial palm fronds 72 including solar modules 28 each having a working area of 18 square feet. Accordingly, the solar array 30 has a total working area of about 144 square feet, or approximately two square meters. Given an efficiency of 15 percent, the solar array 30 will produce about 300 watt-hours, thus about 2.4 kilowatt-hours during an eight hour period. However, given an efficiency of 35 percent, such a solar array 30 would produce about 700 watt-hours, thus about 5.6 kilowatt-hours during an eight hour period. In comparison, the model discussed previously of a solar array made using some thirty-two artificial palm fronds including solar modules having solar cells consisting of an amorphous thin-film material, and in particular, R15-1200 Powerfilm® made by PowerFilm, Inc. enjoyed a working surface area of 192 square feet and could produce 4.6 kilowatt-hours during an eight hour period.

Figure 30:
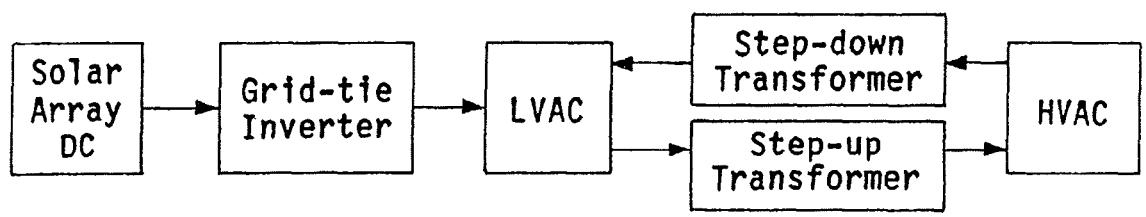
FIG. 30 is a flow diagram showing a solar array in communication with a grid-tie DC to AC inverter that is in communication with low voltage AC power transmission lines associated with an AC power grid.

FIG. 30 is a flow diagram showing a solar array 30 linked to a grid-tie inverter for changing DC current to AC current, and then also to a low voltage AC (LVAC) power transmission line associated with a conventional AC power grid. The AC power grid can further include step-up transformers for creating high voltage AC (HVAC) current from low voltage AC current for long distance distribution. Further, the AC power grid can further include step-down transformers for converting high voltage AC power to low voltage AC power. Many other devices and means are also commonly used to generate and control electric power within a power grid, including but not limited to generators, capacitors, combiners, inductors, shot reactors, transformers, breakers, means for balancing power swings such as a static var compensator, thyristors, a thyristor-controlled series capacitor, and the like. Power coming into a residence in the United States is normally 120 volts (V) or 220 V AC at a frequency of 60 cycles per second, whereas local distribution lines commonly carry voltages of 6.9 kilovolts (kV), 13.8 kV, 27.6 kV, 44 kV, and high voltage AC transmission lines can be at 115 kv, 230 kV, or 500 kv.

Figure 31:
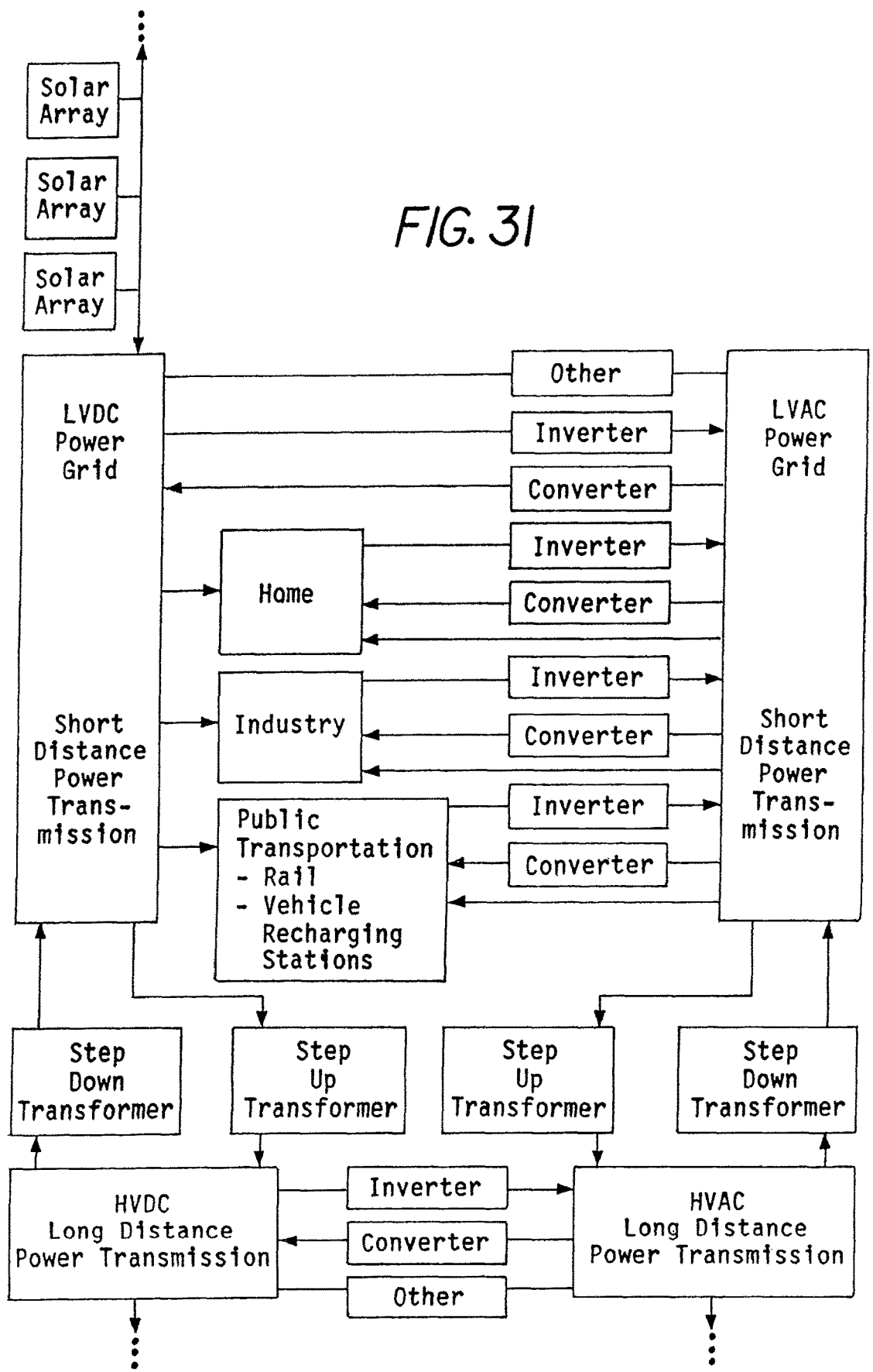
FIG. 31 is a flow diagram showing a solar array in communication with low voltage DC power transmission lines associated with a DC solar power grid.

FIG. 31 is a flow diagram showing a network of solar arrays which form at least a portion of a solar power grid. As shown, the solar arrays can transmit power using low voltage DC (LVDC) lines. The DC solar power grid can be linked to an AC power grid. Inverters can be used to change DC to AC current, and converters can be used to change AC to DC current. Step-up transformers can be used to change low voltage DC current to high voltage DC current (HVDC), or low voltage AC current (LVAC) to high voltage AC current (HVAC). Conversely, step-down transformers can be used to change HVDC to LVDC, or HVAC to LVAC. Many other devices and means are also commonly used to generate and control electric power within a power grid. Given the technology which is available at the present time and at distances greater than 500 miles, high voltage DC power is less expensive to transmit than high voltage AC power. Low voltage DC power can generally be transmitted as inexpensively as AC power for a distance of 50 km when buried underground, and also for a distance of 600-800 km when transmitted by overhead power lines. If the power being produced by the solar arrays will primarily be used locally, then the use of low voltage DC power can indeed be efficient. Various DC combiners and converters can be used with a DC solar power grid. Further, it is anticipated that low voltage DC power created by a network including a plurality of solar arrays can be changed using a step-up transformer to create high voltage DC (HVDC) current which can be efficiently transmitted long distances using superconductors.

Figure 32:
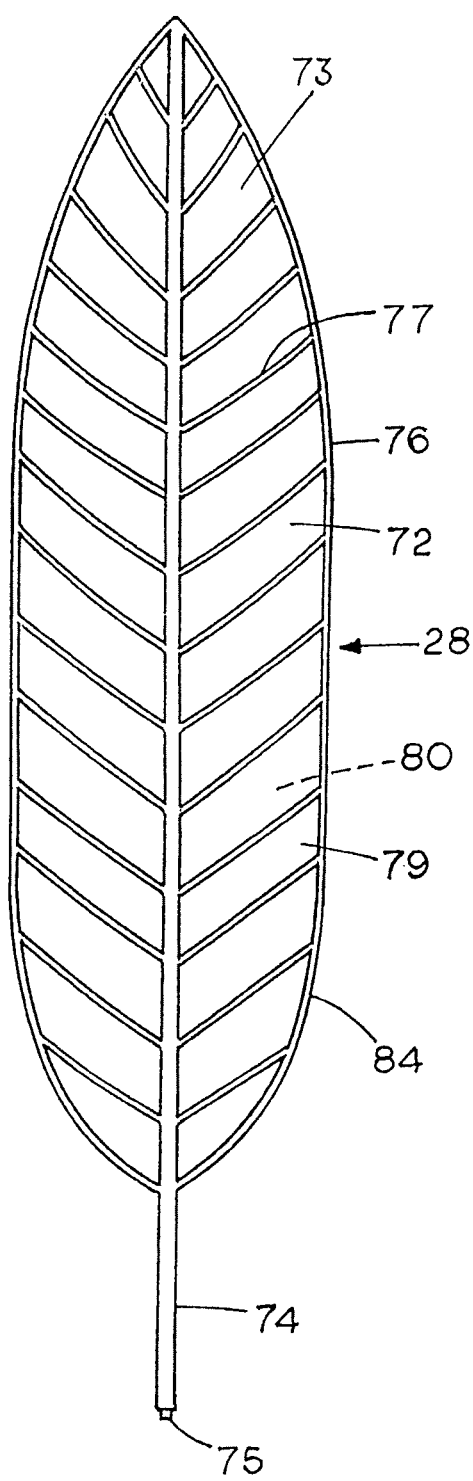
FIG. 32 is a top plan view of an artificial palm frond including a stem portion and also a blade portion having smooth edges.

FIG. 32 is a top plan view of an artificial palm frond 72 including a stem portion 74 and also a blade portion 84 having smooth edges.

Figure 33:
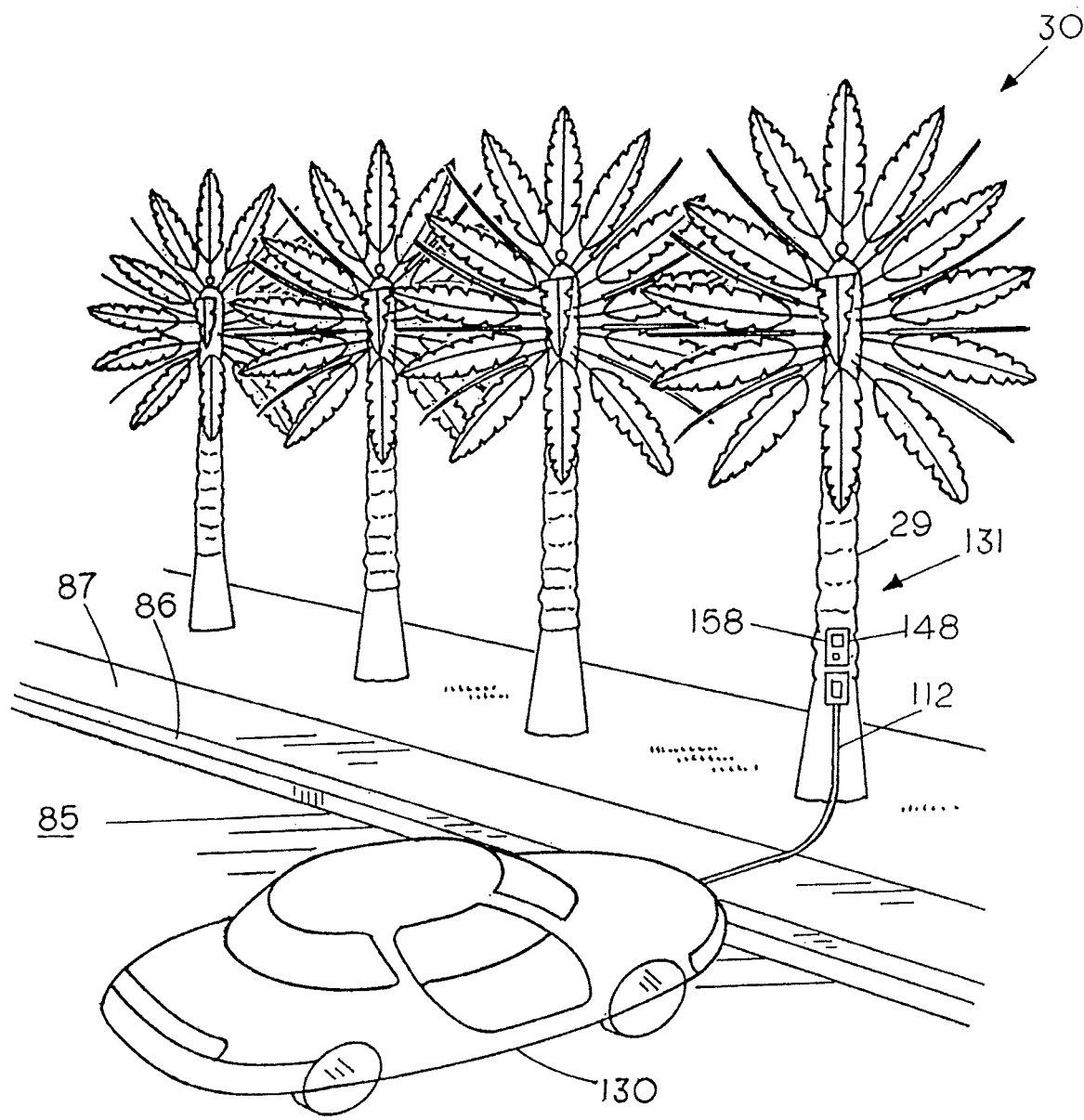
FIG. 33 is a top perspective view of a transportation vehicle connected with the use of hard wiring and in this case a recharging cord to a solar array having an integral recharging station including a vending machine device.

FIG. 33 is a top perspective view of a transportation vehicle 130 connected with the use of hard wiring, and in this case, a recharging cord 112 to a solar array 30 having an integral recharging station 131 including a vending machine device 148. The vending machine device 148 can accept payment, e.g., in the form of cash, credit card, debit card, voucher, or ticket for different provided and/or selected quantities of electric power, and thereby permit recharging of the means for storing electric power on the transportation vehicle, including, but not limited to, an integral or removable storage device such as a battery 97, or capacitor. A solar array or network of solar arrays can be included in parking areas, lots, but also parking structures.

An example of a parking lot located in Europe that provides conventional wired recharging stations is disclosed in the article "Recharging electric cars with solar panels, the first in Europe," by Automotive, Dec. 30, 2009, http://www.auto-car-shop.com/15112/recharging-electric-cars-with-solar-panels-the-first-in-europe.

Figure 34:
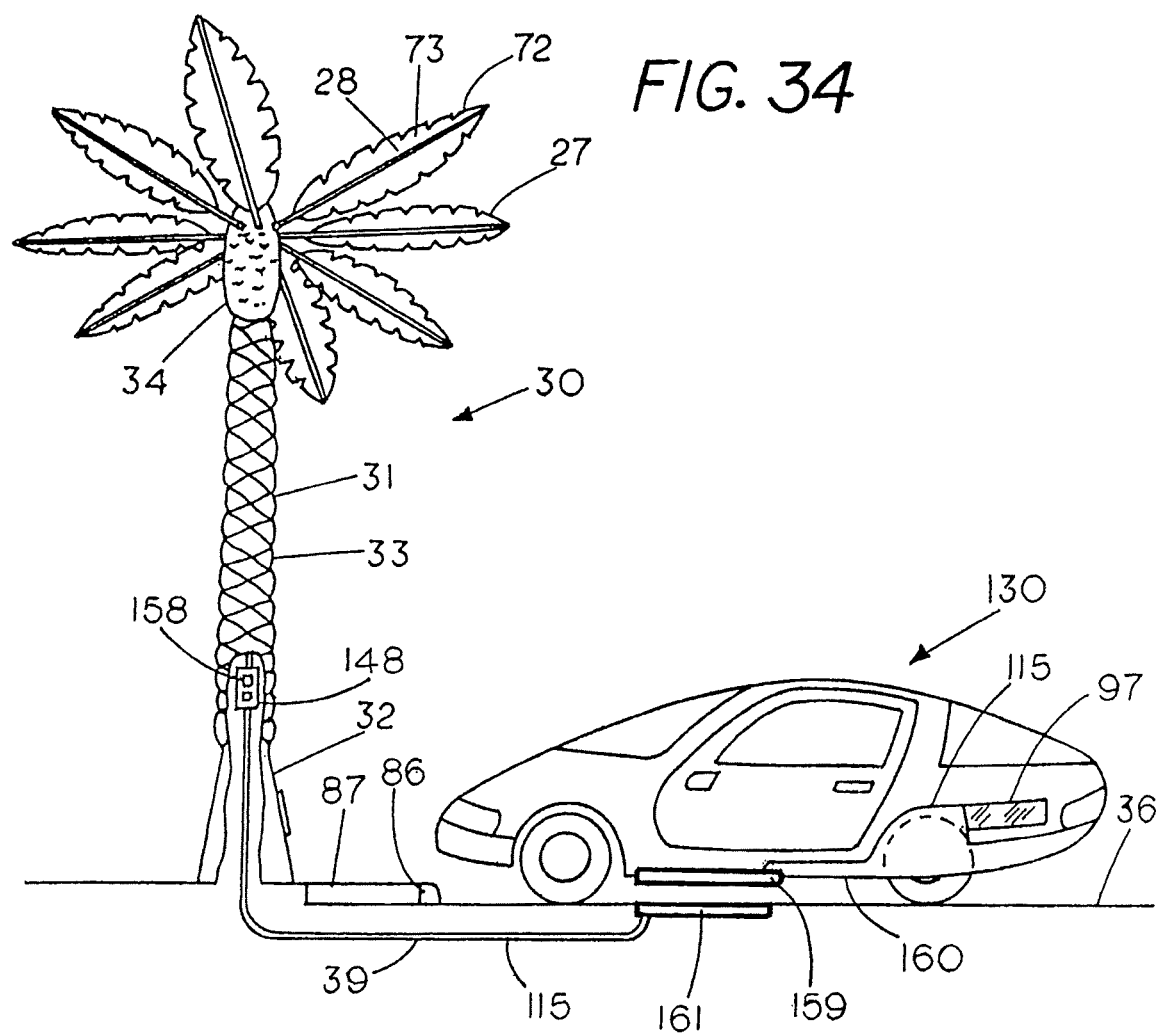
FIG. 34 is a side view illustration with some parts broken away of a transportation vehicle including a wireless receiver device on a lower surface positioned over a wireless transmission device which is located on the underlying support surface and electrically coupled to a solar array resembling a palm tree.

Remote Wireless Charging and Powering of Electrical Devices and Transportation Vehicles FIG. 34 is a side view illustration with some parts broken away of a transportation vehicle 130 including a wireless receiver device 159 on a lower surface 160 positioned over a wireless transmission device 161 which is located on the underlying support surface 36 and electrically coupled and possibly hard wired to a solar array 30 resembling a palm tree. Accordingly, the wireless receiver device 159 can be positioned in functional relation and electrically coupled to the wireless transmission device 161, thus permitting the recharging of the means for storing electrical energy and power on a transportation vehicle such as an energy storage device, including, but not limited to, a battery 97, or capacitor. In this regard, the transportation vehicle can include an integral or removable energy storage device. Again, a solar array or network of solar arrays comprising a wireless transmission device 161 can be included in parking lot areas, but also parking structures.

Accordingly, the present invention teaches and shows solar arrays resembling natural foliage, e.g., palm trees, which produce energy and can comprise wireless transmission devices adapted to provide energy to electronic devices, electrical appliances and devices, and transportation vehicles. This energy can be in the form of energy associated with the electromagnetic spectrum which includes gamma ray energy, x-ray energy, ultraviolet light energy, visible light energy, infrared energy, microwave energy, radar energy, radio frequency energy, electrical energy, television signal energy, and telephone signal energy. In particular, the present invention teaches solar arrays resembling natural foliage including wireless transmission devices adapted to provide electrical energy to electric or hybrid transportation vehicles. Accordingly, when a network of solar arrays resembling palm trees are placed in functional relation and proximity to electric or hybrid transportation vehicles, the network of solar arrays and wireless transmission devices can be used to recharge and/or actively power stationary and/or moving electric or hybrid transportation vehicles in parking lot areas, or structures, and also in public transportation right of ways such as roads, and highways. A more detailed disclosure and discussion of wireless transmission devices and also wireless receiver devices which can be suitable for use is provided below.

At this time, several automobile manufacturers are making hybrid or electric vehicles: e.g., see www.teslamotors.com as of Aug. 29, 2011 for information on Tesla electric vehicles; www.toyota.com as of Aug. 29, 2011 for information on the plug-in Toyota Prius; www.nissanusa.com as of Aug. 29, 2011 for information on the Nissa Leaf electric vehicle; and, www.chevrolet.com as of Aug. 29, 2011 for information of the Chevy Volt. Further, several different companies are working on or in the process of commercializing devices which enable the remote wireless charging of electric transportation vehicles and other electronic devices.

Some of the methods and devices being employed include the use of magnetic inductance, magnetically coupled resonance, and radio frequency.

For example, Halo IPT, in New Zealand, which is associated with Professor John Boys is working on remotely powering and charging electric vehicles, e.g., as disclosed on the website www.haloipt.com as of Aug. 29, 2011, and the article "Ditch the Cord, Let the Road Charge Your EV," by Keith Barry, Nov. 22, 2010, http://wired.com/autopia/2010/11/ditch-the-cord-let-the-road-charge-your-ev. Halo IPT is presently able to get 7 Kw across a 300 mm gap, and 3 Kw across a 400 mm with an efficiency in the range between 85-98% for the entire system. Boys is associated with a large number of patent applications and patents including, e.g., the following published U.S. patent applications, 20090129126, 20090302688, 2010019604, 20100289340, 20110105020, and 20110116290, and also, the following issued U.S. Pat. Nos. 4,295,189, 4,563,630, 4,881,022, 5,126,585, 5,293,308, 5,450,305, 5,528,113, 5,619,078, 5,821,638, 5,898,579, 5,969,497, 6,020,658, 6,100,663, 6,188,179, 6,483,202, 6,621,183, 6,705,441, 6,903,532, 7,279,850, 7,474,062, 7,633,235, 7,781,916, 7,969,269, the complete contents of all these recited patent applications and issued patents being hereby incorporated by reference herein.

A large auto parts company having the name Delphi and also Toyota Motors are teaming up with the company WiTricity that was founded by several individuals associated with MIT. In particular, the company is associated with the work of Assistant Professor Marin Soljacic who is named on a large number of patents on the subject, as disclosed on the website www.witricity.com as of Aug. 29, 2011, and also the articles "Wireless Car Charging.Net The Next Generation of Motion" on the webpage, http://www.wirelesscarcharging.net, and "Wireless Electricity Is Here (Seriously)" by Paul Hochman, Jan. 6, 2009, in FastCompany.com: http://www.fastcompany.com/magazine/132/brilliant.html. In particular, Soljacic is named as an inventor on two issued U.S. patents, namely, U.S. Pat. Nos. 7,741,734, and 7,825,543, but also on the following published and still pending U.S. patent applications: 20110069339, 20110162895, 20110148219, 20110140544, 20110074347, 20110074346, 20110074218, 20110049998, 20110049996, 20110043049, 20110043048, 20110043047, 20110043046, 20110025131, 20110018361, 20110012431, 20110002574, 20100327661, 20100327660, 20100277005, 20100264745, 20100259108, 20100253152, 20100237708, 20100237707, 20100237706, 20100231053, 20100225175, 20100219694, 20100207458, 20100201205, 20100187911, 20100181844, 20100171370, 20100171368, 20100164298, 20100164297, 20100164296, 20100148589, 20100141042, 20100133920, 20100133919, 20100133918, 20100127575, 20100127574, 20100127573, 20100123355, 20100123354, 20100123353, 20100117456, 20100117455, 20100109445, 20100102641, 20100102640, 20100102639, 20100096934, 20090284083, 20090267710, 20090267709, 20090224856, 20090195333, 20090195332, 20080278264, the complete contents all of these recited U.S. patents and patent applications being hereby incorporated by reference herein.

Fulton Innovation, LLC. in Michigan is associated with Bret Lewis and a pad based system called eCoupled, and this company also has over 600 patents relating to wireless power transmission as discussed on the website www.fultoninnovation.com, and www.wirelesspowerconsortium.com, as of Aug. 29, 2011. In particular, Fulton Innovation, LLC. is presently associated with U.S. Pat. Nos. 6,975,198, 7,126,450, 7,212,414, 7,233,222, 7,385,357, 7,462,951, 7,518,267, and 7,522,878, the complete contents all of these recited patents being hereby incorporated by reference herein. Further, the company has demonstrated inductive recharging of a Tesla Roadster electric vehicle.

Ryan Tseng of WiPower in Altamonte Springs, Fla. has created an induction system, and he is associated with two pending U.S. patent applications which have been published, i.e., 20080067874, and 20110133570, and the complete contents of these two patent applications are hereby incorporated by reference herein. A company named Powercast in Pittsburgh, Pa. makes a radio frequency remote power system, sells wireless Christmas ornaments and is testing industrial sensors, as disclosed on the website www.powercastco.com, as of Aug. 29, 2011.

Solar Roadways has obtained a grant from the U.S. Department of Transportation to include solar panels into roadway surfaces and to then transmit the power to electric vehicles as disclosed on the website www.solarroadways.com, and the article "Will Solar Roads Change Electric Cars?" by Team Planet Green, Oct. 13, 2010, PlanetGreen.com, planetgreen.discovery.com/tech-transport/will-solar.

Nissan has a wireless EV charging station at Google headquarters which was made by Plugless Power which is based in Virginia as disclosed on the website www.pluglesspower.com as of Aug. 29, 2011, and also in the following articles: "Google Installs Wireless EV Charging Station," by Keith Barry, Mar. 21, 2011, http://wired.com/autopia/2011/03/google-installs-a-wireless-ev-charging-station/; "Nissan's plug-free electric car" by Bibi van der Zee and Adam Vaughan, Jul. 20, 2009, guardian.co.uk, www.guardian.co.uk/ . . . /jul/20/nissan-electric-car-plug-free; "EV charging station recharges without wires," by Liane Yvkoff, Jul. 29, 2010, CNET Reviews, http://reviews.cnet.com/8301-13746_7-20012101-48.html?tag=mncol;txt; and, "How Far Off is Wireless Electric Car Charging?" by Team Planet Green, Oct. 19, 2010, PlanetGreen.com, planetgreen.discovery.com/tech-transport/how-far-off-is.

BMW is now teaming with Siemens to provide wireless charging of electric vehicles as disclosed in the article "BMW and Siemens partnering for wireless-charging EVs, cutting the cord this May," by Tim Stevens, Apr. 14, 2011, http://engadget.com/2011/04/14/bmw-and-siemens-partnering-for-wireless-charging-electric-vehicles.

Volvo is also providing for inductive recharging of electric vehicles as disclosed in the article "Volvo working on wireless charging for EVs," by Liane Yvkoff, May 20, 2011, CNET Reviews, http://reviews.cnet.com/8301-13746_7-20064771-48.html.

In brief, wireless recharging or powering of electric vehicles is presently being implemented and provided by automobile manufacturers. Moreover, the present work of Professor Boys at Halo IPT in New Zealand, and also that of Assistant Professor Soljacic at MIT and the company WiTricity can provide the ability to recharge and/or power electric vehicles at some distance, and also while the transportation vehicles are in motion.

Figure 35:
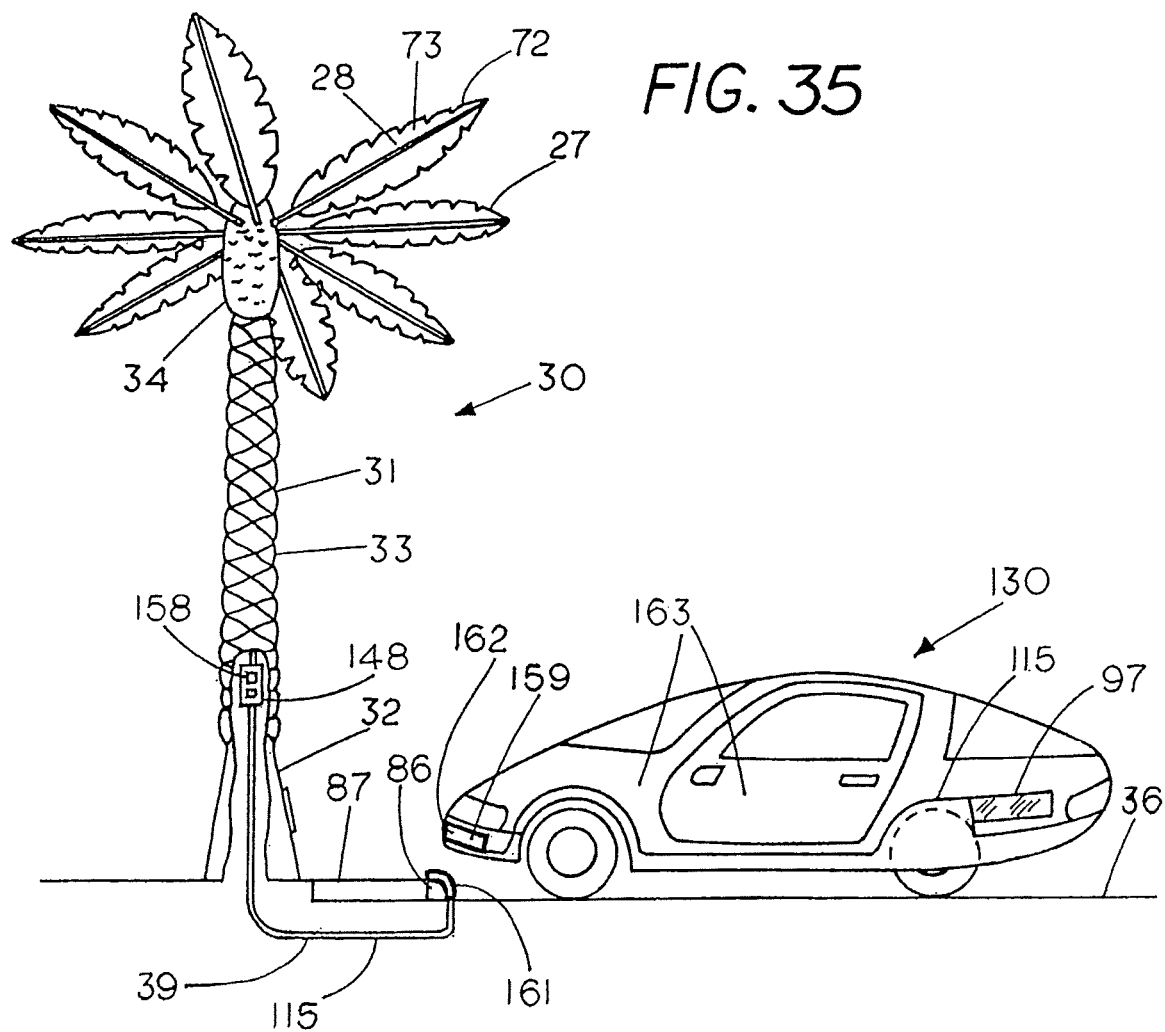
FIG. 35 is a side view illustration with some parts broken away of a transportation vehicle including a wireless receiver device on a front surface positioned adjacent to a wireless transmission device positioned on a curb which is electrically coupled to a solar array resembling a palm tree.

FIG. 35 is a side view illustration with some parts broken away of a transportation vehicle 130 including a wireless receiver device 159 on a front surface 162 positioned adjacent to a wireless transmission device 161 which is electrically coupled and possibly hard wired to a solar array 30 resembling a palm tree 29 and positioned on a curb 86. Accordingly, the wireless receiver device 159 can be positioned in functional relation and electrically coupled to the wireless transmission device 161, thus permitting the recharging of the means for storing electric power on the transportation vehicle, including, but not limited to, a battery 97, or capacitor. Accordingly, it can be readily understood that the transportation vehicle can include an integral or removable energy storage device.

FIG. 36 is a side perspective view showing a plurality of wireless repeater devices 164 located on a horizontal support surface 36 in a parking lot, 165 having individual parking spaces indicated by lines 166. The wireless repeater devices 164 are electrically coupled to at least one solar array 30 including means for wireless communication and transmission of electric power. This can include a wireless transmission device 161 positioned, e.g., on a curb 86 or horizontal support surface 36 which is electrically coupled, and possibly by hard wiring, to a vending machine device 148. Shown on the left of FIG. 36 is a plurality of wireless transmission devices 161 positioned on both the curb 86, but also on the horizontal support surface 36 within each parking spot which are electrically coupled and possibly hard wired to at least one solar array 30 in order to accommodate transportation vehicles 130 having wireless receiver devices 159 located on either their front surface 162 or lower surface 160. Shown on the right of FIG. 36 is a plurality of wireless transmission devices 161 positioned on the curb 86 which are electrically coupled and possibly hard wired to at least one solar array 30 in order to accommodate transportation vehicles 130 having wireless receiver devices 159 located their front surfaces 162, but also a plurality of wireless repeater devices 164 positioned on a horizontal support surface 36 which are remotely electrically coupled to the wireless transmission devices 161 in order to accommodate transportation vehicles 130 having wireless receiver devices 159 located on their lower surfaces 160. It can be readily understood that the wireless transmission devices and repeater devices can be similarly employed in an alternative parking area, such as a parking ramp, or parking structure.

Figure 37:
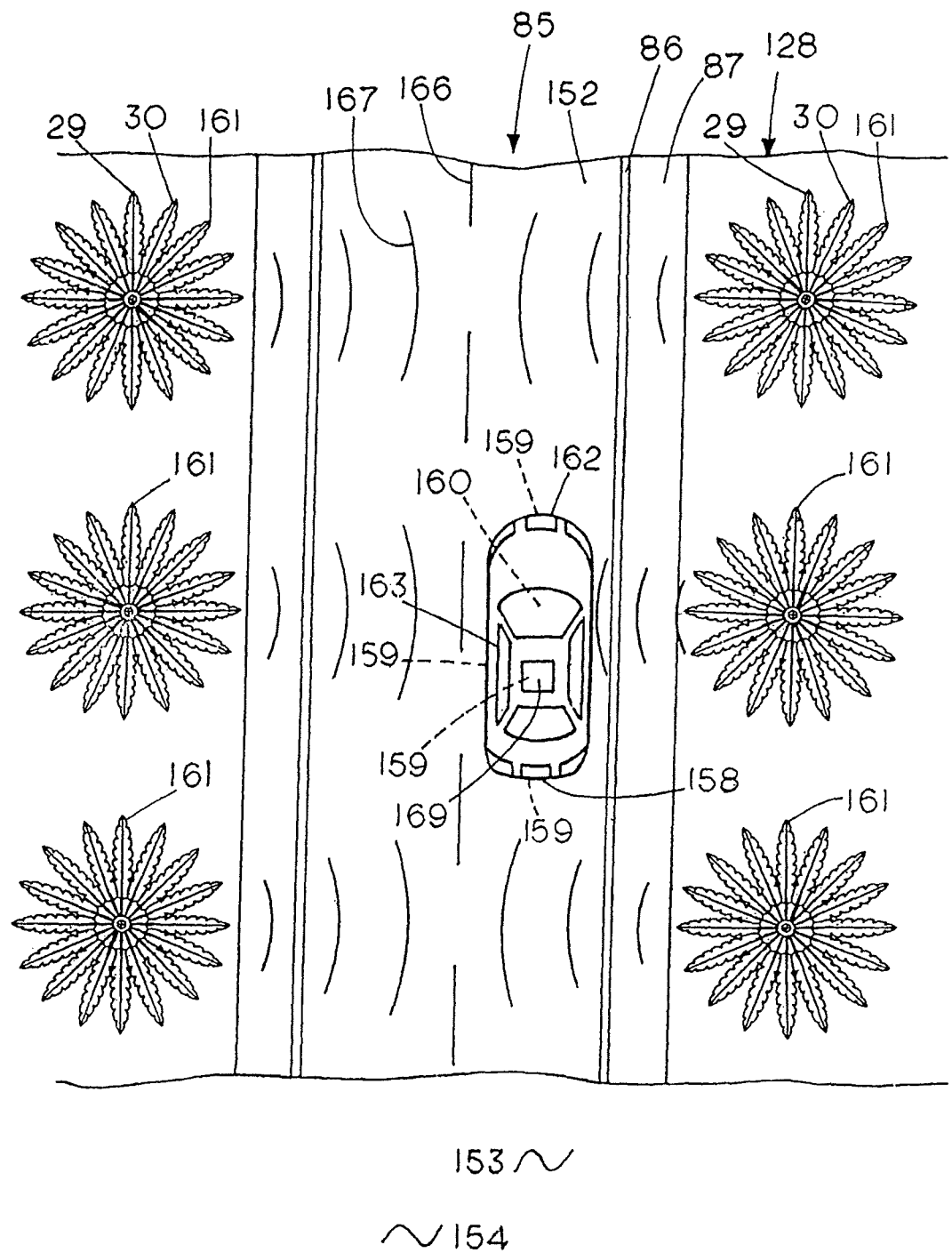
FIG. 37 is a top plan view showing a network of solar arrays resembling palm trees including means for wireless communication and transmission of electric power such as wireless transmission devices located alongside both sides a street, and also a transportation vehicle in motion.

FIG. 37 is a top plan view showing a network of solar arrays 153 resembling palm trees 29 including means for wireless communication and transmission of electric power, such as wireless transmission devices 161, being located alongside both sides a street 85, and also a transportation vehicle 130 in motion. As shown, the transportation vehicle 130 can have at least one wireless receiver device 159 on one or more of the front surface 162, back surface 168, top surface 169, lower surface 160, or side surfaces 163 for electrically coupling with at least one wireless transmission device 161 which is electrically coupled with at least one solar array 30. Alternatively, the network of solar arrays 153 could extend along only one side of a street 85.

Repeater Devices for Extending the Range of Wireless Transmission

In order to increase the efficiency of the wireless transmission of electrical energy, and also the recharging of energy storage devices such as batteries, or capacitors which may be included upon a transportation vehicle, and in order to extend the effective range of wireless power transmission devices at least one repeater, resonator, or so-called range expander device can also be used. These repeater devices can be located at suitable distances for electrical coupling in parking lot areas, or along public transportation right of ways such as roads and highways. In some cases, wireless transmission devices, repeaters, resonators or range expanders can be positioned between or across the lanes of a public transportation right of way such as a railway, street, or highway.

Figure 38:
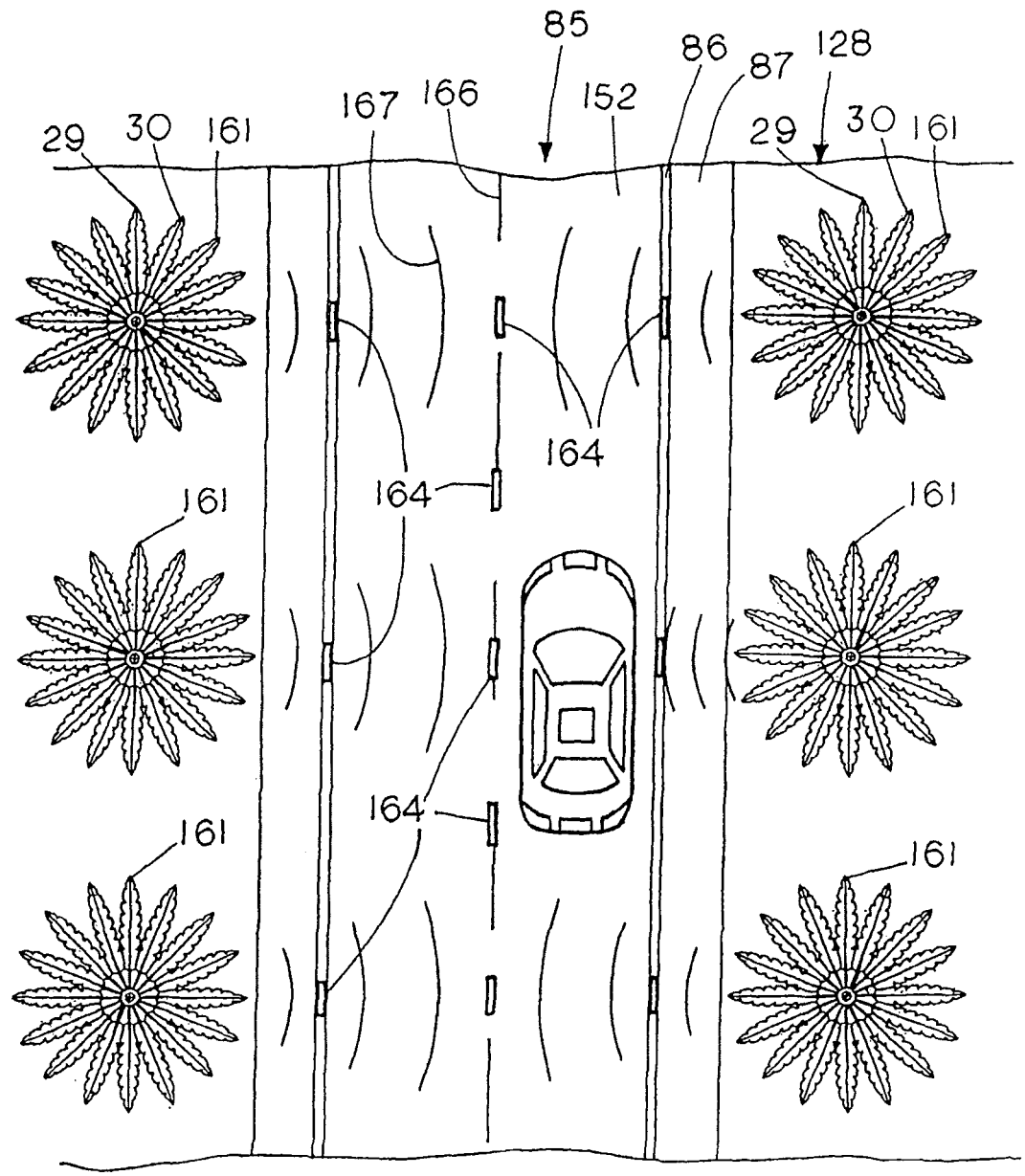
FIG. 38 is a top plan view similar to FIG. 37 showing a network of solar arrays resembling palm trees including means for wireless communication and transmission of electric power such as wireless transmission devices located alongside both sides of a street, but also a plurality of wireless repeater devices.

FIG. 38 is a top plan view similar to FIG. 37 showing a network of solar arrays 153 resembling palm trees 29 including means for wireless communication and transmission of electric power, such as wireless transmission devices 161, being located alongside both sides of a street 85, but also a plurality of wireless repeater devices 164. The wireless transmission devices 161 are electrically coupled with a plurality of wireless repeater devices 164 on or near the street 85, and also a transportation vehicle 130 in motion. As shown, the transportation vehicle 130 can have at least one wireless receiver device 159 on one or more of the front surface 162, back surface 168, top surface 169, lower surface 160, or side surfaces 163 for electrically coupling with at least one wireless transmission device 161 electrically coupled with at least one solar array 30, and also with at least one of the wireless repeater devices 164 located on or near the street 85. Alternatively, the network of solar arrays 153 could extend along only one side of a street 85.

Figure 39:
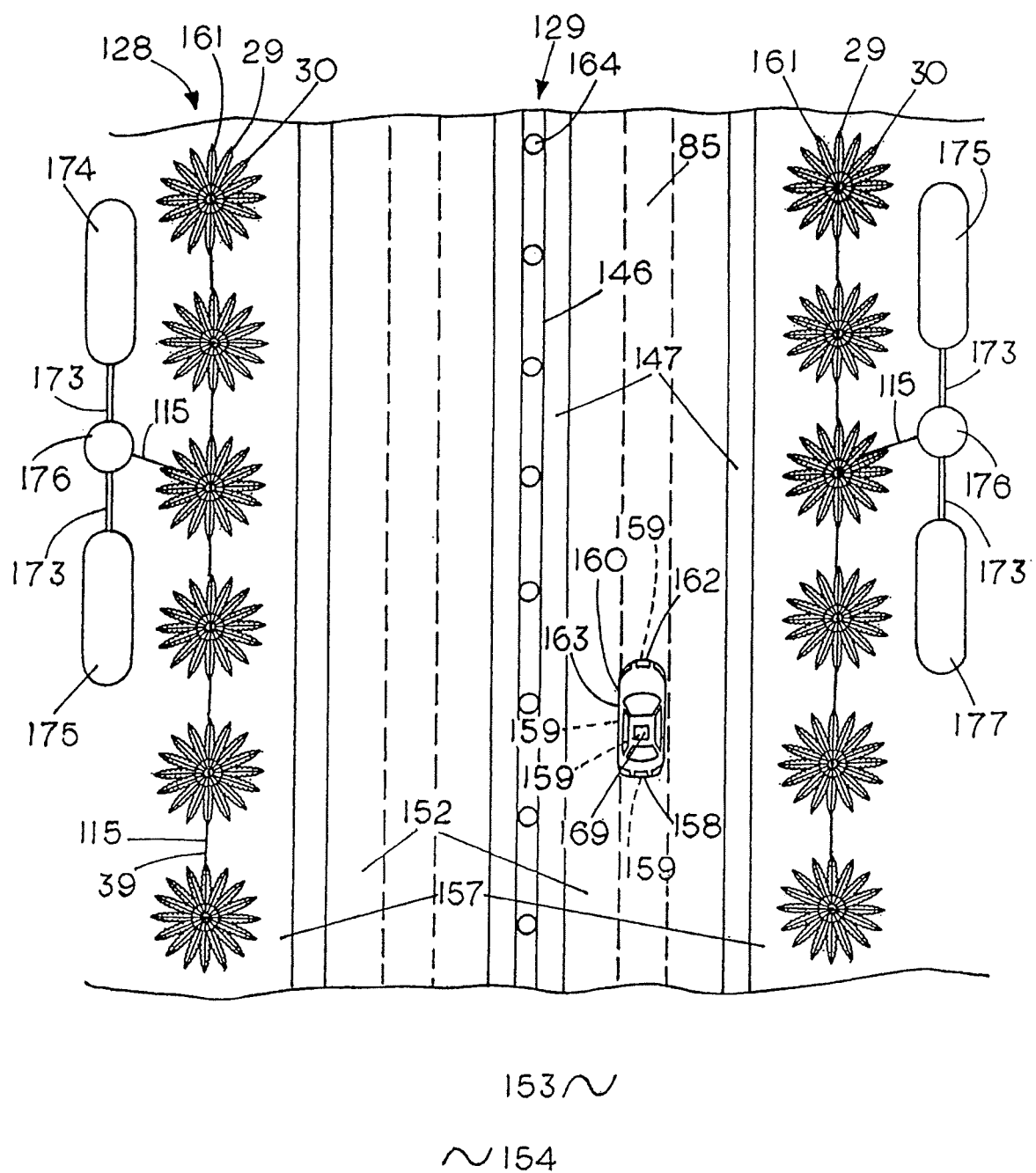
FIG. 39 is a top plan view showing a network of solar arrays resembling palm trees including means for wireless communication and transmission of electric power such as wireless transmission devices located alongside a highway and electrically coupled with a plurality of wireless repeater devices on a centerline barrier and divider, but also the use of at least one electrolyser device.

FIG. 39 is a top plan view showing a network of solar arrays 153 resembling palm trees 29 including means for wireless communication and transmission of electric power, such as wireless transmission devices 161, being located alongside a highway 129 and electrically coupled with a plurality of wireless repeater devices 164 on a centerline barrier and divider 146. The wireless transmission devices 161 are electrically coupled with a plurality of wireless repeater devices 164 on a centerline barrier and divider 146, and also a transportation vehicle 130 in motion. Again, the transportation vehicle 130 can have at least one wireless receiver device 159 on one or more of the front surface 162, back surface 168, top surface 169, lower surface 160, or side surfaces 163 for electrically coupling with at least one wireless transmission device 161 electrically coupled with at least one solar array 30, and also with at least one of the wireless repeater devices 164.

Electrolysers for Water Purification and Hydrogen Production

Further, solar arrays resembling natural foliage, e.g., palm trees, of the present invention can produce electric power for powering electrolysers for purifying and/or de-salinating water when the solar arrays are coupled in functional relation with at least one suitable electrolyser device, e.g., such as one made by Global Energy Technology, Inc., a Puerto Rico Corporation having a mailing address of P.O. Box 90756, Long Beach, Calif. 90809, and website: http://get-inc.com as of Aug. 28, 2011, and phone (787) 303-0090, or General Electric having a webpage: http://www.ge.com and http://ecomagination.com/portfolio/desalination as of Aug. 28, 2011, and a phone (203) 373-2211.

Moreover, solar arrays resembling natural foliage, e.g., palm trees, of the present invention can produce electric power for powering electrolysers for making hydrogen fuel such as those made by Hydrogenics Coporation of 200 Admiral Boulevard, Mississauga, Ontario, Canada, L5T 2N6, having a website: http://www.hydrogenics.com as of Aug. 28, 2011, and a phone: (905) 361-3660. The hydrogen fuel can then be used for powering, e.g., transportation vehicles, homes, businesses, and also industrial use.

Also shown in FIG. 39 is the possible electrical coupling of a network of solar arrays 153 with at least one electrolyser device 176. On the left side of FIG. 39, a electrolyser device 176 is shown electrically coupled to the network of solar arrays 153 and positioned between and connected by pipes 173 to both a dirty/salt water storage tank 174 and also a clean water storage tank 175 the water contents of which have been purified by the electrolyser device 176. In this regard, solar arrays resembling natural foliage, e.g., palm trees, of the present invention can produce electric power for powering electrolysers for purifying and/or de-salinating water when the solar arrays are coupled in functional relation with at least one suitable electrolyser device, e.g., such as one made by Global Energy Technology, Inc., a Puerto Rico Corporation having a mailing address of P.O. Box 90756, Long Beach, Calif. 90809, and website: http://get-inc.com as of Aug. 29, 2011, and phone (787) 303-0090, or General Electric having a webpage: http://www.ge.com and http://ecomagination.com/portfolio/desalination as of Aug. 29, 2011, and a phone (203) 373-2211.

On right side of FIG. 39, a electrolyser device 176 is shown electrically coupled to the network of solar arrays 153 and positioned between and connected by pipes 173 to a clean water storage tank 175 and a hydrogen storage tank 177 the contents of which have been produced by the electrolyser device 176. Accordingly, it can be readily understood that solar arrays resembling natural foliage, e.g., palm trees, of the present invention can produce electric power for powering electrolysers for making hydrogen fuel such as those made by Hydrogenics Coporation of 200 Admiral Boulevard, Mississauga, Ontario, Canada, L5T 2N6, having a website: http://www.hydrogenics.com as of Aug. 29, 2011, and a phone: (905) 361-3660. The hydrogen fuel can then be used for powering, e.g., transportation vehicles, homes, businesses, and also industrial use.

Antennas, Cell Towers, and Other Communications Devices

Figure 40:
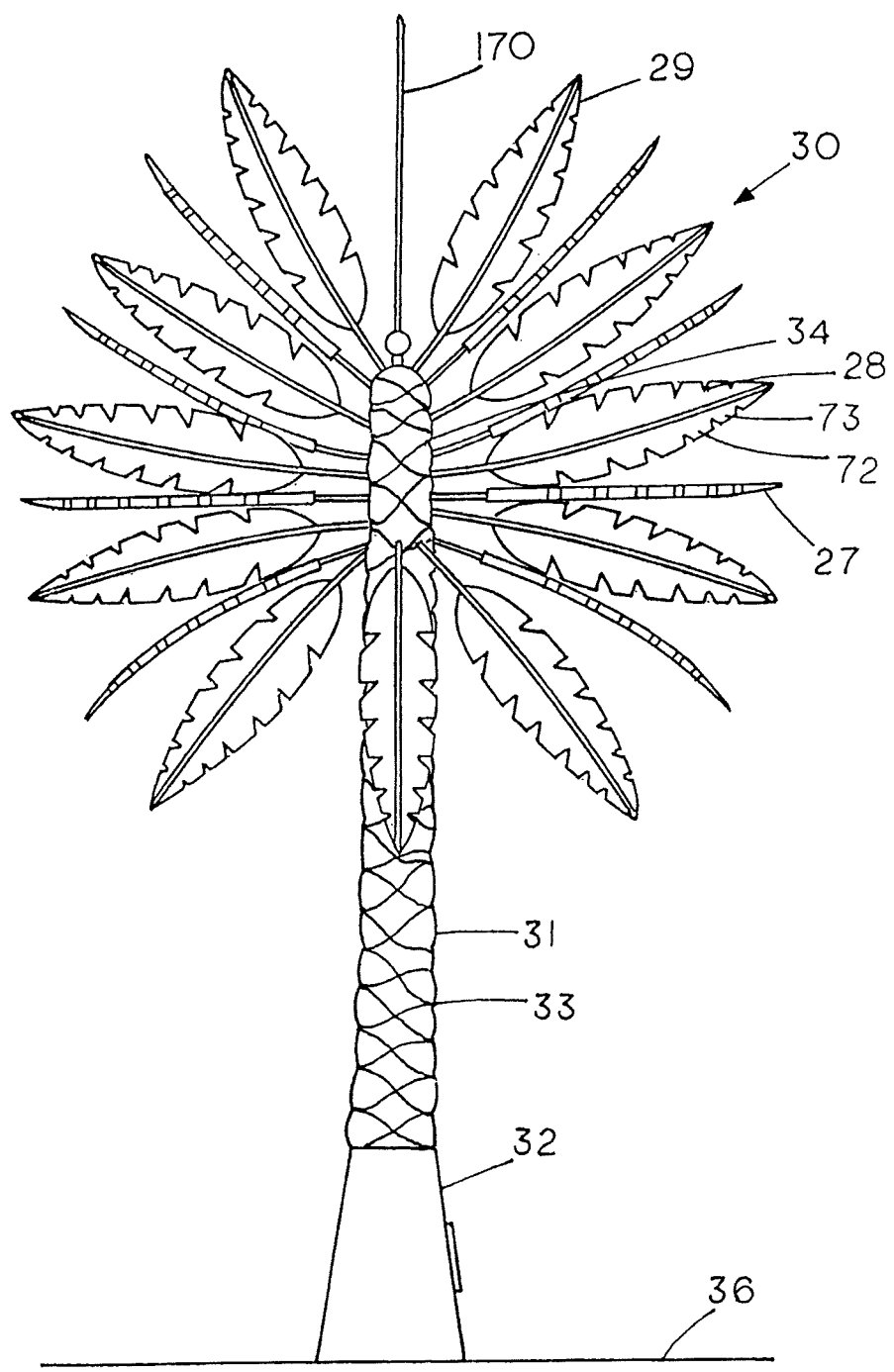
FIG. 40 is a side view of a solar array resembling a palm tree with parts broken away to show the inclusion of an antenna.

FIG. 40 is a side view of a solar array 30 resembling a palm tree 29 with parts broken away to show the inclusion of an antenna 170. The antenna 170 can be used to receive and/or transmit, e.g., radio communication, television signals, and other wireless communication. Moreover, it can be readily understood that when a solar array 30 resembling natural foliage such as a palm tree 29 has a structure including metallic components such as a support pole 38 which may be coupled to a plurality of artificial palm fronds 72 also including metallic stems 74, that a large portion of the solar array 30 can form and function as an antenna and at least a portion of a communications device.

Figure 41:
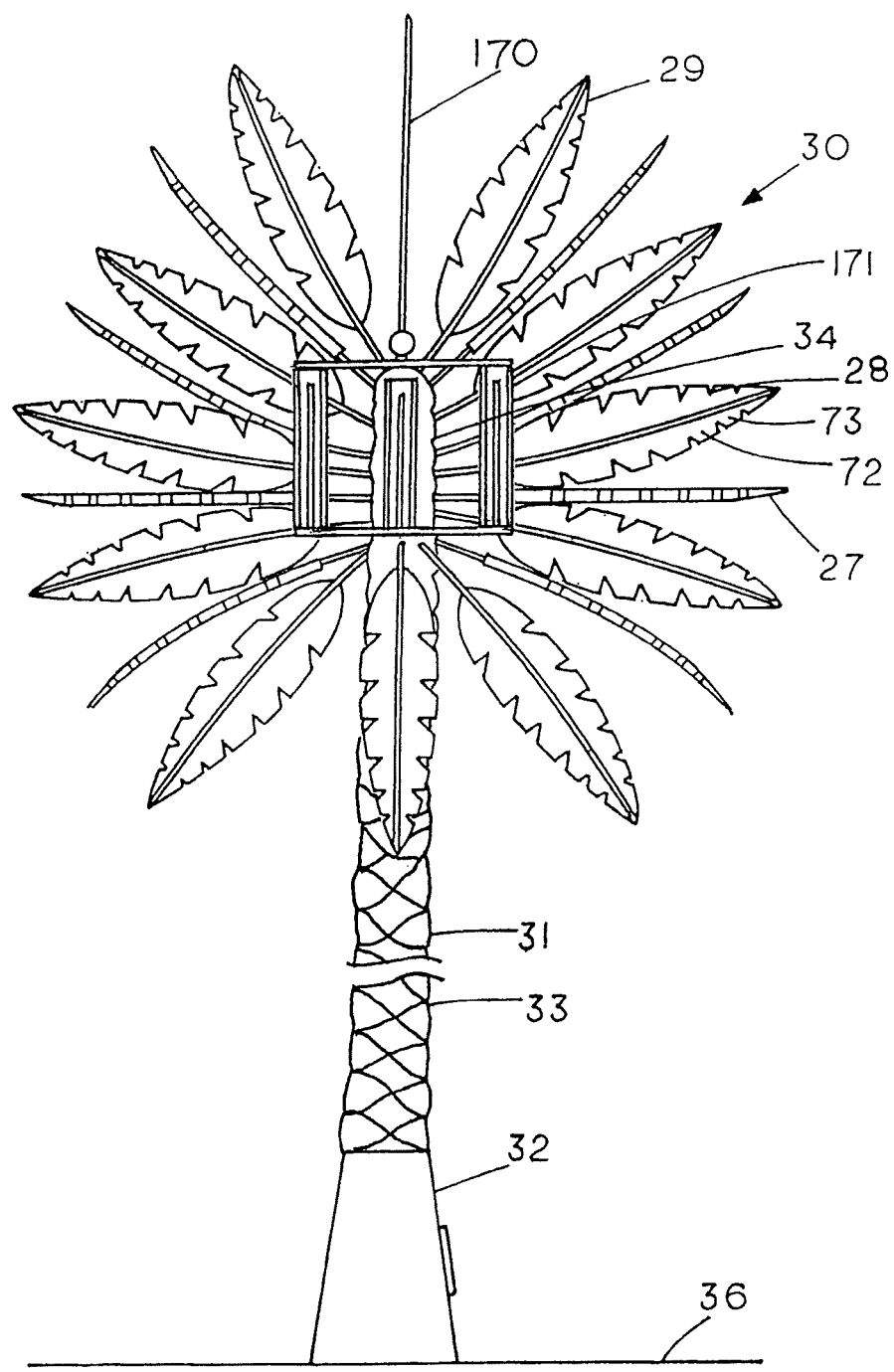
FIG. 41 is a side view of a solar array resembling a palm tree with parts broken away to show the inclusion of a plurality of cell antennas.

FIG. 41 is a side view of a solar array 30 resembling a palm tree 29 with parts broken away to show the inclusion of a plurality of rectangular shaped cell tower communications devices 171, e.g., antennas, relays, or repeaters, and the like. As shown, the solar array 30 can also include an antenna 170 for receiving and/or transmitting radio communication, television signals, and other wireless communication. Again, it can be readily understood that when a solar array 30 resembling natural foliage such as a palm tree 29 has a structure including metallic components such as a support pole 38 which may be coupled to a plurality of artificial palm fronds 72 also including metallic stems 74, that a large portion of the solar array 30 can form and function as an antenna and at least a portion of a communications device. The solar array 30 can consist of a stand alone unit and be completely independent, or be electrically coupled to at least one other solar array 30 to form a network of solar arrays 30 and an independent solar power grid. Alternatively, one or more of solar arrays 30 can be tied to a conventional power grid.

However, a solar array 30 resembling natural foliage such as a palm tree can produce electric power which would enable an antenna 170, and/or cell tower communication device 171, e.g., an antenna, relay, repeater, to continue to function if and when a conventional electric power grid would fail, as could happen as the direct result of a natural disaster such as an earthquake or flood. In this regard, a solar array 30 resembling natural foliage such as a palm tree 29 can provide the electrical energy to continuously power radio, internet, telephone, television, and other vital communications equipment during the day, and also at night provided that it is electrically coupled with means for storage of at least some of the electric energy being produced during the daylight hours. Suitable electrical energy storage devices include, but are not limited to, e.g., a battery, capacitor, and the like. Accordingly, a network of solar arrays resembling natural foliage can provide a certain redundancy and an emergency backup system in the event of a natural disaster and possible failure of the conventional power grid.

Solar Palm Tree Cost/Benefit Analysis

In an embodiment of the present invention, an artificial palm tree consisting of a solar array can be created by using between five and forty artificial palm fronds, although a greater or lesser number of artificial palm fronds can be used, as desired.

Low Efficiency Model

For the purpose of providing a non-limiting simple example concerning the performance of such a solar array made with a thin film material having a relatively low efficiency in the range between 5-6%, a model can be constructed using photovoltaic thin film made by Power-Film, Inc. A total of thirty-two artificial palm fronds can be arranged in four staggered layers with each layer including eight artificial palm fronds. The artificial palm fronds can have a stem approximately one and one half feet long. The working surface of the blade portion of each of the artificial palm fronds can measure approximately one foot by six feet, thus providing an area of six square feet. Accordingly, the total working surface area of the artificial palm tree model can consist of 192 square feet.

The resulting solar array can produce significant amounts of electrical power. In particular, each artificial palm frond including a R15-1200 Powerfilm® module made by PowerFilm, Inc. operates at 15.4 volts and produces 1.2 amps. Multiplying the volts times the amps yields 18.48 watt-hours of power, and then multiplying the rounded off 18 watt-hours by eight hours of sunlight yields 144 watt-hours per day for each artificial palm frond. Further, multiplying 144 watt-hours by thirty two fronds yields 4.6 kilowatt-hours per day for a single artificial palm tree consisting of a solar array. If and when there would be more than eight hours of sunlight, or when the artificial palm fronds would be larger in size, or when an additional thirty two R15-1200 Power-film® modules would be affixed to the bottom side of the artificial palm fronds as well, then the amount of power generated in a single day would be increased over and above the 4.6 kilowatt-hours per day.

A large portion of the Southwest region of the United States averages between six and seven hours of peak solar exposure or so-called "full sun hours" during the day, and the peak solar exposure in desert regions located closer to the equator is even greater. The sun's power or irradiance peaks at about 1,000 watts per square meter per hour. Most commercially available crystalline silicon photovoltaic solar cells have an efficiency of about 14-16 percent, but at least one major manufacture has a solar cell in development which can exceed 35 percent efficiency. Typical amorphous solar cells such as those commonly associated with flexible thin-films presently have an efficiency of approximately 5-6 percent, but thin-film solar cells are also in development which have greater efficiency. It would be possible to enjoy sunny days at least 75 percent of the time when the solar array would be located in Southern California, Ariz., or Nevada, thus providing about 294 days of productive power generation each year. In this regard, a solar reference cell such as one made or distributed by Kyocera Solar, Inc. of Scottsdale, Ariz. can be used to measure the solar energy present in a given location. A solar array which can produce 4.6 kilowatt-hours given eight hours of exposure each day can generate approximately 1,352 kilowatt-hours each year, that is, given 294 productive days and a total of 2,262 productive hours. However, in desert climates such as the United Arab Emirates there could well be 360 productive days each year, thus 1,656 kilowatt-hours could be produced over 2,880 productive hours.

The artificial palm tree model consisting of a solar array can include a trunk approximately twenty feet high and have an overall height of about twenty-four feet. Further, each solar array can have a diameter of approximately sixteen feet, that is, given the span of two opposing artificial palm fronds each including stems one and one half feet long, blades six feet long, and a pole or trunk having a diameter of one foot. Given these dimensions, it can be advantageous that the artificial palm trees be separated by approximately thirty two feet on center in order to provide approximately sixteen feet of space between the ends of the artificial palm fronds in closest proximity, as this will avoid counterproductive shading out of adjacent artificial palm trees and solar arrays when the sun is inclined at less than 45 degrees with respect to the underlying ground surface. Accordingly, a single row of artificial palm trees and solar arrays spaced thirty two feet apart on both sides of a road can total approximately 330 units over a linear mile, and when a staggered double row is used on both sides of a highway the total can be approximately 660 units. Multiplying 1,352 kilowatt-hours per individual artificial palm tree and solar array per year given 294 productive days by 660 units along each mile of highway yields 892,320 kilowatt-hours per year. The average U.S. home consumes approximately 8,900 kilowatt-hours each year, thus each mile of highway so equipped could satisfy the power requirements of approximately 100 homes.

In the worst case scenario, given present distributor pricing for R15-1200 Powerfilm® photovoltaic thin film, the cost of each installed model artificial palm tree solar array would be approximately $13,000 dollars. The cost of 660 solar arrays along a one mile stretch of highway would then be approximately $8,580,000 dollars. Assuming that the solar arrays would have a twenty year working life, then the annual cost for providing power to approximately 100 homes would be $429,000 dollars, or $4,290. dollars for each home. In the Pacific Northwest region of the United States, the cost of electricity is approximately 10 cents per kilowatt-hour, thus the annual cost of electricity for a home that consumes 8,900 kilowatt-hours is only $890 dollars. The relative cost of the photovoltaic solar energy system would then be approximately 4.8 times greater than that of the existing system in the Pacific Northwest.

However, the present distributor pricing for R15-1200 Powerfilm® photovoltaic thin film is based upon a scale of production associated with the manufacture of only several thousand feet of material. If each artificial palm tree and solar array would use thirty two artificial palm fronds including a one foot by six foot long photovoltaic thin-film solar module, then 192 linear feet of such material would be required just to cover the top sides of the artificial palm fronds. The creation of 660 solar arrays over a mile of highway would require some 126,720 linear feet or approximately 24 miles of material. Accordingly, 100 miles of highway would require 2,400 miles of such material, and 1,000 miles of highway would require 24,000 miles of such material, that is, nearly equal to the circumference of the earth. Accordingly, the cost of producing photovoltaic thin film would decrease dramatically when manufactured on this scale.

High Efficiency Model

For the purpose of providing a non-limiting simple example concerning the performance of such a solar array made with a thin film material having a relatively high efficiency in the range between 10.5-12.6% and having a cost of approximately $2.50 per watt, a model can be constructed using photovoltaic thin film made by Global Solar. A total of thirty-two artificial palm fronds can be arranged in four staggered layers with each layer including eight artificial palm fronds. The artificial palm fronds can have a stem approximately one and one half feet long. The working surface of the blade portion of each of the artificial palm fronds can measure approximately one and one half foot by nine feet, thus providing an area of 13.5 square feet. Accordingly, the total working surface area of the artificial palm tree model can consist of 431 square feet.

The resulting solar array can produce significant amounts of electrical power. In particular, each artificial palm frond including PowerFLEX® BIPV thin film made by Global Solar operates at approximately 17 volts and produces in the range between 5-6 amps. Multiplying the volts times the amps yields about 100 watt-hours of power, and then multiplying the rounded off 100 watt-hours by eight hours of sunlight yields 800 watt-hours per day for each artificial palm frond. Further, multiplying 800 watt-hours by thirty two fronds yields 25.6 kilowatt-hours per day for a single artificial palm tree consisting of a solar array. If and when there would be more than eight hours of sunlight, or when the artificial palm fronds would be larger in size, or when an additional thirty two PowerFLEX® BIPV units would be affixed to the bottom side of the artificial palm fronds as well, then the amount of power generated in a single day would be increased over and above the 25.6 kilowatt-hours per day.

A large portion of the Southwest region of the United States averages between six and seven hours of peak solar exposure or so-called "full sun hours" during the day, and the peak solar exposure in desert regions located closer to the equator is even greater. The sun's power or irradiance peaks at about 1,000 watts per square meter per hour. Most commercially available crystalline silicon photovoltaic solar cells have an efficiency of about 14-16 percent, but at least one major manufacture has a solar cell in development which can exceed 35 percent efficiency. Typical amorphous solar cells such as those commonly associated with flexible thin-films presently have an efficiency of approximately 5-6 percent as discussed in the relatively low efficiency model provided above, but other thin-film products are in development which have greater efficiency and some have already been commercialized such as Global Solar's PowerFLEX® BIPV thin film product. It would be possible to enjoy sunny days at least 75 percent of the time when the solar array would be located in Southern California, Ariz., or Nevada, thus providing about 294 days of productive power generation each year. In this regard, a solar reference cell such as one made or distributed by Kyocera Solar, Inc. of Scottsdale, Ariz. can be used to measure the solar energy present in a given location. A solar array which can produce 25.6 kilowatt-hours given eight hours of exposure each day can generate approximately 7,508 kilowatt-hours each year, that is, given 294 productive days and a total of 2,262 productive hours. However, in desert climates such as the United Arab Emirates there could well be 360 productive days each year, thus 9,216 kilowatt-hours could be produced over 2,880 productive hours.

Again, a single row of artificial palm trees and solar arrays spaced thirty two feet apart on both sides of a road can total approximately 330 units over a linear mile, and when a staggered double row is used on both sides of a highway the total can be approximately 660 units. Multiplying 2,262 kilowatt-hours per individual artificial palm tree and solar array per year given 294 productive days by 660 units along each mile of highway yields 1,357,200 kilowatt-hours per year. The average U.S. home consumes approximately 8,900 kilowatt-hours each year, thus each mile of highway so equipped could satisfy the power requirements of approximately 152 homes.

Given the present $2.50 cost per watt of the Power-FLEX® BIPV thin film product made by Global Solar, the cost of 660 solar arrays along a one mile stretch of highway would then be approximately $3,393,000 dollars. Assuming that the solar arrays would have a twenty year working life, the annual cost for providing power to approximately 152 homes would then be $22,322 dollars, or $1,116 dollars for each home. In the Pacific Northwest region of the United States, the cost of electricity is approximately 10 cents per kilowatt-hour, thus the annual cost of electricity for a home that consumes 8,900 kilowatt-hours is only $890 dollars. The relative cost of the photovoltaic solar energy system would then only be approximately $226 more than in the Pacific Northwest.

However, the present distributor pricing for the Power-FLEX® BIPV thin film product made by Global Solar is based upon a scale of production associated with the manufacture of only several thousand feet of material. If each artificial palm tree and solar array would use thirty two artificial palm fronds including a one and one half foot by nine foot long photovoltaic thin-film solar module, then 288 linear feet of such material would be required just to cover the top sides of the artificial palm fronds. The creation of 660 solar arrays over a mile of highway would require some 190,080 linear feet or approximately 36 miles of material. Accordingly, 100 miles of highway would require 3,600 miles of such material, and 1,000 miles of highway would require 36,000 miles of such material which is more than the circumference of the earth. Accordingly, the cost of producing photovoltaic thin film would decrease dramatically when manufactured on this scale.

In addition, as previously recited above, the article entitled "Solar-cell thinner than wavelengths of light hold huge power potential" which was published on the website: http://www.physorg.com/print204827475.html, as of Sep. 28, 2010, discusses the positive effects of providing a top layer including a patterned, roughened scattering layer which may have a green coloration. This technology can possibly result in more than a ten fold increase in the energy being absorbed by next generation solar cells due to their enhanced so-called "light trapping" capabilities.

Moreover, the direct and indirect costs associated with other alternative sources of electric power will most certainly not remain the same over the next 20 year time period, and so an investment in PV solar arrays which resemble palm trees that are both functional and aesthetically pleasing makes economic sense.

Net Social Welfare Benefit

Once installed, the solar arrays can be easily maintained without substantial further expense. The artificial palm frond and solar module portion of the solar arrays can be recycled and renewed at the end of their expected twenty to forty year service life. If and when newer and more highly efficient artificial palm fronds and solar modules become available, then the older and less efficient components can be easily replaced without requiring significant changes to the network of solar arrays and solar power grid.

It is also important to recognize that the above calculations are unrealistically biased in favor of the status quo, as they are based on the assumption that the present cost of residential electric power in the Pacific Northwest will remain fixed at the present price of 9-10 cents per kilowatt-hour over the next forty years. Given the ever-increasing demand for energy this will certainly not be the case. Further, the Pacific Northwest is fortunate to enjoy hydroelectric power, whereas most of the United States and the rest of the world is dependent upon the burning of fossil fuels such as coal, oil, and gas in order to generate electric power. The cost of burning fossil fuels to produce energy is expected to increase dramatically over the next twenty to forty year time horizon. In fact, some experts believe that the world's non-renewable fossil fuel reserves will be largely exhausted during this period. In contrast, the cost of making and producing photovoltaic solar cells is expected to decrease dramatically.

Moreover, it should also be recognized that the investment costs associated with creating a network of solar cell arrays and solar power grid today will be partially offset by the effects of inflation over the next twenty to forty year period, as was the case with the dams and hydroelectric power plants built during the administration of President Franklin Roosevelt. Inflation is difficult to predict with great certainty, but since 1980 the value of the dollar has decreased such that it now enjoys slightly less than 50 percent of its former purchasing power. For example, it would have taken $2.18 in 2002 to match the purchasing power of one dollar in 1980. Accordingly, in 2020 and 2040 the investment made today in photovoltaic solar energy will appear as cost effective and prudent as the hydroelectric power initiatives of the 1930's and 1940's.

It can also be maintained that the net social welfare benefit associated with the use of clean and renewable solar power, as opposed to non-renewable fossil fuels such as petroleum, natural gas, or coal, also includes the cost savings and investment associated with the latter resources not being consumed. A barrel of oil saved is in some sense a barrel of oil earned, that is, it is a form of accumulated wealth. For example, when renewable solar energy is used the world has essentially saved the equivalent amount of energy associated with burning fossil fuels and saved it for higher value added use in the future. When viewed from a time horizon of a hundred or thousand years, fossil fuels such as petroleum are worth far more in the ground, than they are today when simply burned-up as fuel.

It is possible to roughly estimate the net social welfare benefit associated with using clean and renewable solar power as opposed to non-renewable fossil fuels such as petroleum, natural gas, or coal. In 2003, the cost of a barrel containing 42 gallons of crude oil was approximately $30.00 dollars, but this represented only about 42 percent of the cost of a petroleum end product as delivered to a consumer, thus the actual cost to a household was approximately $71.42 dollars. Only eight years later in 2011, the cost of a barrel containing 42 gallons of crude oil is approximately $80.00 dollars, and this represents about 42 percent of the cost of a petroleum end product as delivered to a consumer, thus the actual cost to a household is approximately $190.40 dollars. One barrel of crude oil is equal to 5,800,000 Btu, and one gallon of gasoline is equal to 124,000 Btu, whereas one gallon of diesel fuel is equal to 139,000 Btu. One kilowatt-hour of electricity is equal to 3,412 Btu. Accordingly, one barrel of crude oil is equal to approximately 1,670 kilowatt-hours. The annual energy consumption associated with electric power and heating for the average home in the United States is approximately 8,900 kilowatt-hours. However, the energy consumption of the average middle class home in the United States is greater. The inventor presently owns a 2,450 square foot home in a suburb of Portland, Oreg. In 2002, about $567 dollars was paid for electric power, and about $815 dollars was paid for natural gas for a total of approximately $1,381 dollars. Converting that sum into kilowatt-hours given a present cost of 10 cents per kilowatt-hour yields a total annual consumption of 13,810 kilowatt-hours.

Furthermore, the annual fuel consumption and energy cost associated with the use of an automobile in the United States should also be considered. An automobile that uses gasoline having a fuel efficiency of 20 miles to the gallon which is driven 12,000 miles each year will consume approximately 600 gallons of gasoline. In 2003, gasoline fuel cost $1.75 per gallon, and those 600 gallons cost $1,050dollars, and would fill about 14.25 barrels having a capacity of 42 gallons. Only eight years later in 2011, gasoline fuels costs $3.75 per gallon, and those 600 gallons cost $2,250 dollars. Almost everything contained in a barrel of crude oil is refined and used to make various petroleum products, but most refineries only produce about 19 gallons of gasoline from a 42 gallon barrel of crude oil. Accordingly, about 1,326 gallons of crude oil are refined to produce those 600 gallons of gasoline, and such would fill about 31.6 barrels having a capacity of 42 gallons. One gallon of gasoline is equal to 124,000 Btu, and thus 600 gallons of gasoline equals 74,400,000 Btu. One kilowatt-hour of electricity is equal to 3,412 Btu. Accordingly, those 600 gallons of gasoline equate to about 21,805 kilowatt-hours, thus over twice what the average home in the United States consumes for basic electric power and heating. Moreover, the burning of fossil fuels also results in additional direct and indirect costs associated with pollution and global warming. While substantial, these indirect costs can be difficult to estimate.

It is clear that United States needs to switch from automobiles which burn gasoline and diesel fuel to electric and hybrid vehicles as soon as possible. In this regard, it should be recognized that merely switching from automobiles that burn gasoline and diesel fuel to electric and hybrid vehicles which must be charged by electric power plants that burn fossil fuels would not provide a viable long term solution to the world's energy and pollution problems. At this time, and for the foreseeable future, the only clean and renewable form of electric power comes from the sun. That energy and power needs to made available in and alongside our nation's public transportation right of ways including railways, roads and highways. Accordingly, the creation of a network of solar arrays and power grid along roads and highways will not only provide electrical energy and power for residential and commercial use, but also support and make viable the widespread use of electric and hybrid transportation vehicles.

While the above detailed description of the invention contains many specificities, these should not be construed as limitations on the scope of the invention, but rather as exemplifications of several preferred embodiments thereof. Although the present invention has been described with reference to preferred embodiments, workers skilled in the art will recognize that changes may be made in form and detail without departing from the spirit and scope of the invention. Accordingly, the scope of the invention should be determined not by the embodiments discussed or illustrated, but by the appended claims and their legal equivalents.

As described in the detailed description which follows and illustrated in the accompanying figures, the antenna support structure of the present invention is in the form of a white pine tree which is indigenous to most of the United States and many parts of the world. However, it will be appreciated that the antenna support structure of the present invention can be adapted to take the form of any type of tree, and would most suitably take the form of a tree which is indigenous to the area in which the antenna support structure is to be installed.

Figure 42:
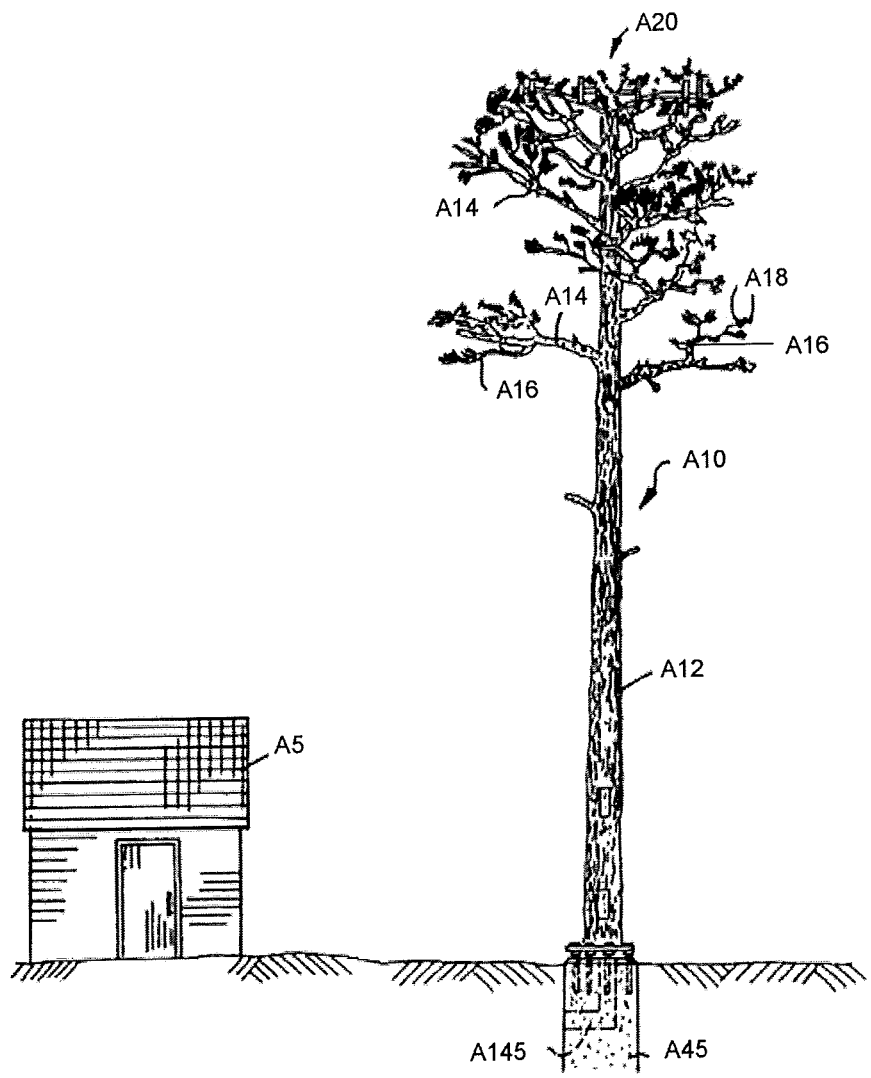
FIG. 42 is a front elevational view of a cell site including an antenna support structure in accordance with the present invention.
Figure 43:
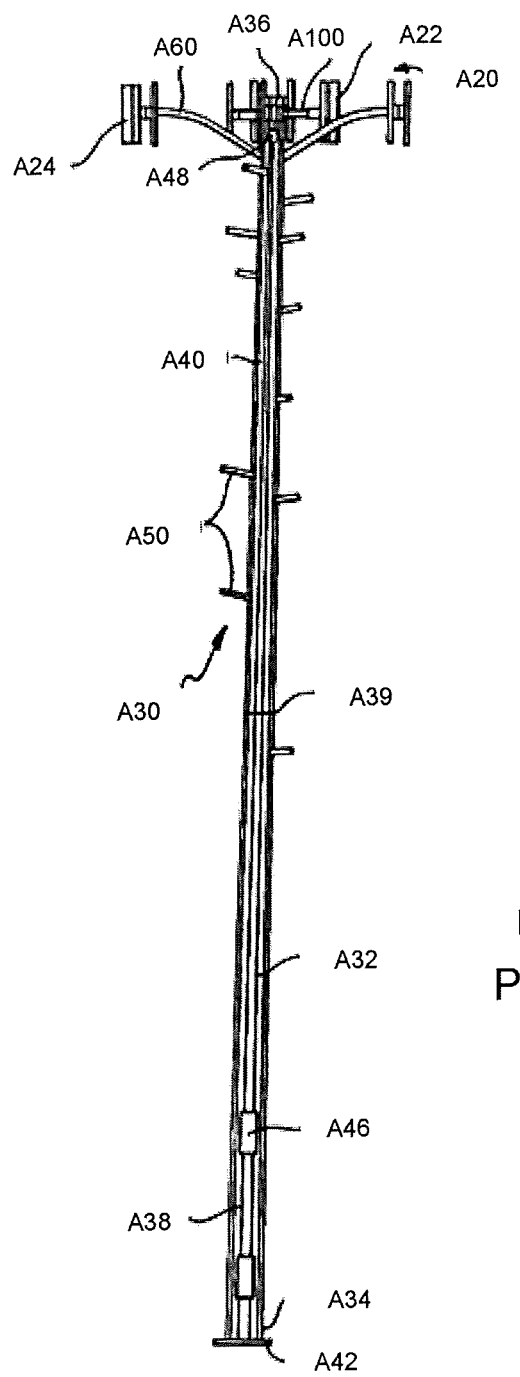
FIG. 43 is a front elevational view of the armature which forms the skeleton of the antenna support structure of the present invention.
Figure 44:
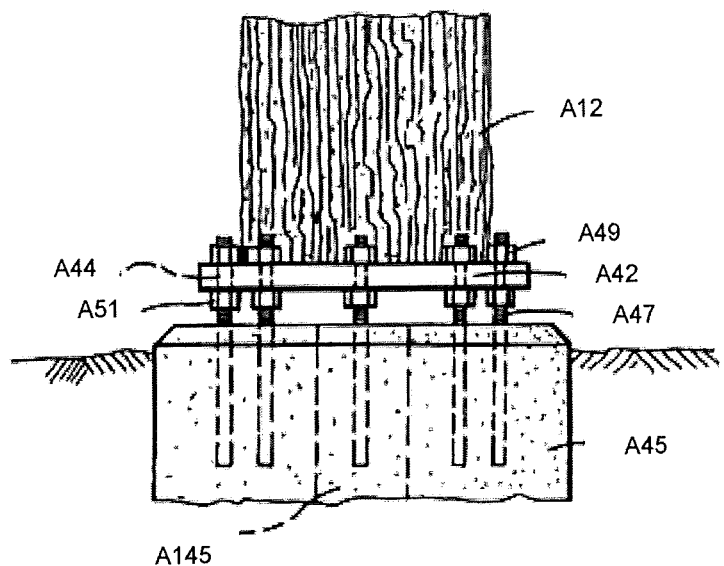
FIG. 44 is an enlarged front elevational view showing an arrangement for installing the antenna support structure of FIG. 42.

Referring to FIG. 42, there is illustrated a cell site including a control room A5 housing switching equipment and other electrical apparatus associated with cellular communications systems, and a preferred embodiment of an antenna support structure A10 in accordance with the present invention. As noted above, antenna support structure A10 is in the form of a tree including a tree trunk A12, a plurality of tree limbs A14, branches A16, and, in the case of the white pine tree described herein, a multiplicity of needles A18 formed on the branches. An antenna mounting system A20 is assembled near the top of support structure A10 so that, when transmitting antennas A22 and receiving antennas A24 (FIG. 43) are mounted by mounting system A20 to support structure A10, the limbs A14, branches A16, and needles A18 will largely obscure the antennas from view.

In designing and constructing antenna support structure A10, careful consideration must be given to the fact that the antenna support structure must be capable of enduring environmental exposure. In this regard, the antenna support structure must have sufficient strength to withstand enormous wind shear forces, and sufficient durability to withstand other environmental conditions, including temperature extremes, icing, freeze/thaw conditions, humidity, acid rain, etc.

A preferred method for fabricating antenna support structure A10 can be understood with reference to FIGS. 43-48. The process begins by supplying a frame or armature A30 on which the antenna support structure is to be built. Armature A30 serves as the frame for tree trunk A12, and includes an elongated hollow support pole A32 formed from a strong, weather resistant material such as, for example, galvanized steel, and having a structure similar to that of the poles typically used to support highway and other types of lighting. Thus, support pole A32 may have a constant, gradual taper from a bottom or base A34 having a relatively large diameter to a smaller diameter top A36. A cap (not shown) encloses the open end of top A36.

The overall length of support pole A32 is selected so that transmitting antennas A22 and receiving antennas A24 will be supported at an adequate elevation to provide line of sight communications with users. Typically, pole A32 will have an overall height of at least about 60 feet, with heights of about 80 feet and more not being uncommon. To ease fabrication and installation, pole A32 is preferably formed in at least two segments A38 and A40 which may be telescopically connected to one another at a joint A39, as described further below. For poles A32 which are excessively long, three or more segments may be joined together.

A base plate A42 having a plurality of apertures A44 may be welded or otherwise connected to the base A34 of bottom pole segment A38 for connecting antenna support structure A10 to a foundation A45. Bottom pole segment A38 may also include one or more access ports A46 near the bottom of pole A32 for pulling coaxial cables (not shown) through antenna support structure A10 or otherwise providing access to the interior of pole A32 once installation has been completed. One or more access ports A48 may also be provided for the same purpose in top pole segment A40 near the top of pole A32.

Armature A30 further includes a plurality of pipes A50 which extend radially outward from pole A32 and which serve as connection points for the connection of tree limbs A14 to the tree trunk A12. Thus, the positioning of pipes A50 on pole A32 will depend upon the positions at which the limbs A14 are to protrude from the tree trunk. In a preferred arrangement, pipes A50 are formed from steel and are connected to pole A32 by welding or by another technique which will provide a strong and secure connection. Where relatively large and heavy tree limbs A14 are to be anchored to tree trunk A12, pipes A50 may be used having a diameter which is larger than the pipes used to anchor relatively smaller and lighter limbs. Thus, for example, pipes A50 having an outer diameter of about 3.625 inches may be used for anchoring heavy tree limbs A14, while pipes A50 having an outer diameter of about 2.0 inches may be used for anchoring lighter limbs. Moreover, pipes A50 are preferably assembled to pole A32 with a slight upward pitch, typically of about 8°, to prevent the limbs A14 from accidentally slipping off of pipes A50 during installation.

Adjacent top A36, pole A32 is provided with an antenna mounting system A20 including a plurality of antenna mounting assemblies for mounting the transmitting antennas A22 and receiving antennas A24 to antenna support structure A10. In a typical arrangement, mounting system A20 will include a total of six antenna mounting assemblies, three assemblies A60 for mounting receiving antennas A24 and three assemblies A100 for mounting transmitting antennas A22. Mounting assemblies A60 and A100 may be assembled to C-shaped brackets A64 which are welded or otherwise connected at evenly spaced intervals around the circumference of pole A32. As shown in FIG. 47, brackets A64 for assembling mounting assemblies A60 are connected to pole A32 at a spaced distance below brackets A64 for assembling mounting assemblies A100 so that all of the transmitting and receiving antennas will be positioned at approximately the same height. Each of brackets A64 includes an aperture A65 in alignment with an aperture A69 in pole A32 for feeding the cable leads (not shown) from the antennas to the interior of pole A32.

Mounting assemblies A60 include an elongated hollow arm A66 having a connecting plate A68 at one end thereof for connection to C-shaped bracket A64, for example, by nut and bolt fasteners A67. From connecting plate A68, arm A66 extends upwardly and outwardly, defining a downwardly curved arc, to an opposite end which includes a bracket A70. Preferably, the length of arm A66 is such that bracket A70 will be positioned at a distance of between about 4 feet and about 6 feet from pole A32. Bracket A70 includes a central plate A72 having an aperture A73 providing access to the interior of arm A66, flared plates A74 and A76 projecting at a forward angle outwardly from central plate A72, and a pair of mounting pipes A80 and A82 connected for pivotal movement to flared plates A74 and A76, respectively. In a preferred arrangement, mounting pipe A80 includes a radially projecting plate A81 having one aperture A84 which aligns with an aperture A86 in flared plate A74 and an elongated curved slot A88 which aligns with a second aperture A90 in flared plate A74. Mounting pipe A80 is thus connected to flared plate A74 by a pair of nut and bolt fasteners A92 so that the mounting pipe can be pivoted downwardly through an angle of about 30° with respect to the longitudinal axis of pole A32. Mounting pipe A82 has substantially the same structure as mounting pipe A80 and is pivotally mounted in a similar fashion to flared plate A76.

Mounting assemblies A100 include a straight hollow arm A102 having an end plate A104 connected at one end thereof for connection to a C-shaped bracket A64, such as by nut and bolt fasteners A106. The other end of arm A102 includes a generally L-shaped bracket A108, one leg A110 of which is connected to arm A102, an aperture A115 in leg A110 providing access to the interior of arm A102, and the other leg A112 of which extends outwardly therefrom for the connection of a single mounting pipe A114. Mounting pipe A114 has generally the same construction as mounting pipes A80 and A82 discussed above, and is connected to bracket A108 in essentially the same fashion so that it may be pivoted downwardly through an angle of about 30° with respect to the longitudinal axis of pole A32. Mounting assemblies A100 preferably are shorter in length than mounting assemblies A60. Most preferably, the length of mounting assemblies A100 is about 21 inches inclusive of arm A102 and L-shaped bracket A108.

Figure 45:
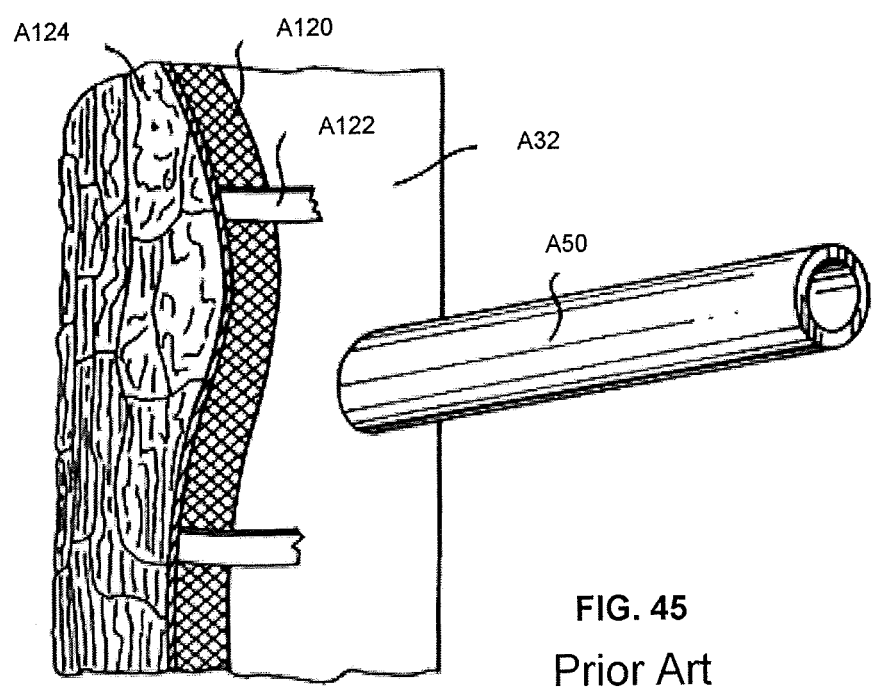
FIG. 45 is an enlarged partial view of the antenna support structure of FIG. 42, broken away to show the construction thereof.

In order to create the appearance of a tree trunk, pole segments A38 and A40 are covered with strong, durable materials which are then surface molded to recreate the texture of actual bark. Referring to FIG. 45, pole segments A38 and A40 are first covered with a plastic lath A120 which is held in place against the surface of the pole segments by conventional plastic straps A122 which are applied at spaced intervals along the length of the pole segments. Lath A120 is a sheet material having a plurality of holes which thus provides a gripping surface for the adherence of surface coatings to pole segments A38 and A40. In a preferred arrangement, an epoxy resin/hardener mixture is then applied in a layer A124 over lath A120 to coat the entire surface of pole segment A40, and to coat substantially the entire surface of pole segment A38, except for a short length at the top of pole segment A38 which slides into the bottom end of pole segment A40 for assembly thereto. Pipes A50 on either pipe segment are not coated. The epoxy resin/hardener mixture may be a conventional two-part epoxy system such as an aromatic diglycidyl compound that is reacted with a conventional hardener such as a diamine, and is preferably applied to pole segments A38 and A40 in a layer about 1.0 inch thick. Before the epoxy resin has cured, the surface of layer A124 is molded or textured to represent the bark of a tree, in this case a white pine tree. This is accomplished in accordance with well-known techniques by creating a mold from the bark of a real white pine tree and then impressing that mold onto the epoxy layer A124 to duplicate the bark pattern therein. When the epoxy has cured to a rigid state, the mold is removed and non-metallic weather resistant paints, such as epoxy paints, are applied to layer A124 to give tree trunk A12 the natural color of bark.

Figure 46:
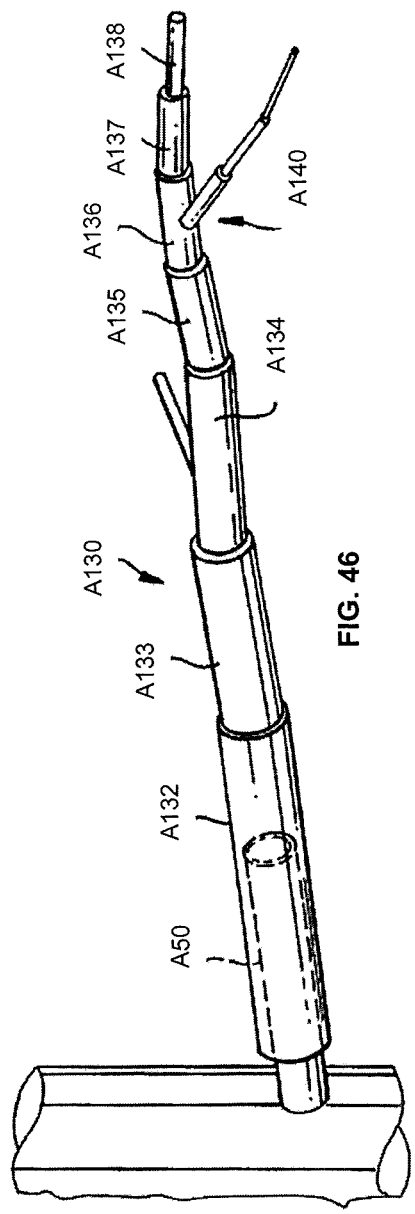
FIG. 46 is an enlarged partial view of the antenna support structure of FIG. 42, showing the pipe assemblies for forming tree limbs and branches.

Tree limbs A14 are created in desired configurations upon pipe assemblies A130. Pipe assemblies A130 may consist of a plurality of pipe segments A132-A138 of progressively decreasing diameter which are joined together in succession with the end of the next smallest diameter pipe inserted into the end of the preceding pipe. The diameter of the innermost pipe segment A132 is preferably selected so that pipe segment A132 fits snugly over pipe A50 for connection to tree trunk A12. It will be appreciated that the pipe segments A132-A138 need not be assembled colinearly. Rather, as shown in FIG. 46, pipe segments A132-A138 are preferably joined together with each pipe segment oriented at a slight angle to the pipe segments on either side thereof in a random pattern so as to mimic the naturally random configuration of a tree limb. In a preferred embodiment, pipe segments A132-A138 are formed from polyvinyl chloride pipe cut to appropriate lengths and glued together to create the desired effect.

Pipe assemblies A130 may also include subassemblies A140, also formed from interconnected pipe segments of decreasing diameter, which define the configuration of branches A16. Subassemblies A140 may be joined to pipe assemblies A130 by drilling holes at selected points in pipe segments A132-A138 and gluing the subassemblies in place in these holes in patterns resembling the natural branch structures of trees. When pipe assemblies A130 have been completed, tree limbs A14 and branches A16 may be created by coating pipe segments A132-A138 and subassemblies A140 with the epoxy resin/hardener mixture, and then surface molding and painting the epoxy coating to resemble natural tree bark.

Figure 48:
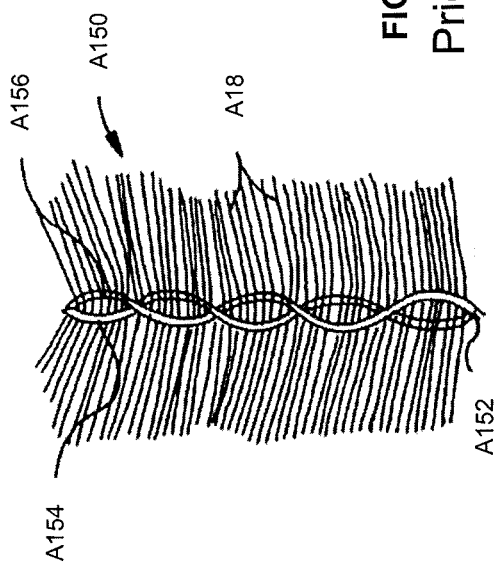
FIG. 48 is an enlarged front elevational view of a foliage assembly of the present invention.

Once the limbs A14 and branches A16 have been created, a multiplicity of artificial pine needles A18 are connected to the branches in the form of foliage assemblies A150. Needles A18 may be formed from a colored plastic material, such as, for example, green and brown polypropylene, in order to resemble naturally occurring pine needles. Foliage assemblies A150 may be formed in substantially the same manner as conventional bottle brushes. However, rather than the metal wires used to form the spine or stem in bottle brushes, the stems A152 of foliage assemblies A150 are fabricated from twisted rods A154 and A156 of a plastic material so as to not interfere with the radio signals being transmitted from and received by transmitting antennas A22 and receiving antennas A24, respectively. As shown in FIG. 48, as plastic rods A154 and A156 are twisted together, needles A18 are caught between adjacent twists, with the ends of rods A154 and A156 being glued together with epoxy or otherwise held together to prevent unraveling. The completed foliage assemblies A150 may be assembled to limbs A14 and branches A16 by inserting the stems A152 of the foliage assemblies into holes drilled at selected positions in the limbs and branches and epoxy gluing same in place.

The following will detail one procedure for installing antenna support structure A10 at a selected site. Initially, a concrete foundation A45 is poured to a sufficient depth to anchor antenna support structure A10 to the ground and to prevent same from toppling over in the event of excessive wind forces. Foundation A45 includes a conduit A145 providing a passageway for the antenna cables from the interior of pole A32 to an underground feed to control room A5, and a plurality of upwardly projecting bolts A47 arranged in a pattern for alignment with the apertures A44 in base plate A42. Before erecting tree trunk A12, bottom pole segment A38 and top pole segment A40 are joined together by inserting the uncoated upper portion of bottom pole segment A38 into the open bottom end of top pole segment A40. This assembly may be secured by bolting the overlapping walls of the pole segments together. When the assembly has been completed, the seam A39 between the pole segments may be hidden by covering with the epoxy resin/hardener mixture, surface molding and painting to blend in with the rest of the tree trunk A12. Also before erecting tree trunk A12, mounting assemblies A60 and A100 may be assembled to C-shaped brackets A64, and mounting pipes A80, A82 and A114, respectively, fastened to the free ends thereof.

Tree trunk A12 may be lifted and positioned over foundation A45 by crane or otherwise and then lowered until base plate A42 is assembled onto bolts A47. Tree trunk A12 may be secured in this assembled position by fastening nuts A49 onto bolts A47. Desirably, a set of nuts A51 are threaded onto bolts A47 before base plate A42 is assembled thereon, nuts A51 providing a mechanism for adjusting the level of base plate A42 and therefore the angle of tree trunk A12 with respect to the ground.

With tree trunk A12 installed in an erect position, transmitting antennas A22 and receiving antennas A24 may be assembled to the respective mounting pipes. Transmitting antennas A22 and receiving antennas A24, the details of which are not shown, are conventional sector antennas for cellular communications and are available from manufacturers such as Motorola, Decibel Products, American Telephone and Telegraph, Ericson and others. One receiving antenna A24 may be clamped in a conventional fashion to each mounting pipe A80 and another receiving antenna A24 may be clamped in a similar fashion to each mounting pipe A82. The cable lead (not shown) from each receiving antenna A24 may be fed through the appropriate aperture A73 into arm A66, out therefrom through an aperture (not shown) in connecting plate A68, and then through aperture A65 in C-shaped bracket A64 and corresponding aperture A69 into the interior of pole A32. The cables may then travel down the interior of pole A32 and out from the base thereof through conduit A145 in foundation A45 and toward control room A5.

In addition, one transmitting antenna A22 may be clamped in a conventional fashion to each mounting pipe A114. The cable lead (not shown) from each transmitting antenna A22 may be fed through the appropriate aperture A115 into arm A102, then out therefrom through an aperture (not shown) in connecting plate A104, through apertures A65 and A69 into the interior of pole A32, and finally out from the base of pole A32 and through conduit A145 toward control room A5.

With transmitting antennas A22 and receiving antennas A24 in place, the assemblies consisting of tree limbs A14, branches A16 and needles A18 may be joined to tree trunk A12 by placing same over the appropriate pipes A50 and bolting same in place. The seam between the limbs A14 and tree trunk A12 may be concealed by filling the seam with some of the epoxy resin/hardener mixture and painting. The limbs A14, branches A16 and needles A18 in the assembled position substantially obscure the transmitting and receiving antennas and mounting assemblies A60 and A100 from view, but do not interfere with the radio signals being transmitted to and from the antennas.

It will be appreciated that the antenna support structure A10 of the present invention may be used to support other types of antennas, such as, for example, antennas for paging systems and antennas for personal communication systems. In this regard, the configuration of mounting assemblies A60 and A100 may be altered to accommodate different types and numbers of antennas. Thus, while mounting assemblies A60 and A100 described above allow for the mounting of three transmitting antennas A22 and six receiving antennas A24, other arrangements of mounting assemblies may be devised for mounting an additional number of antennas or for mounting the antennas in a different configuration. In such event, the placement of tree limbs A14, branches A16 and foliage assemblies A150 may be altered so that the antennas and their mounting assemblies are adequately obscured.

Figure 49:
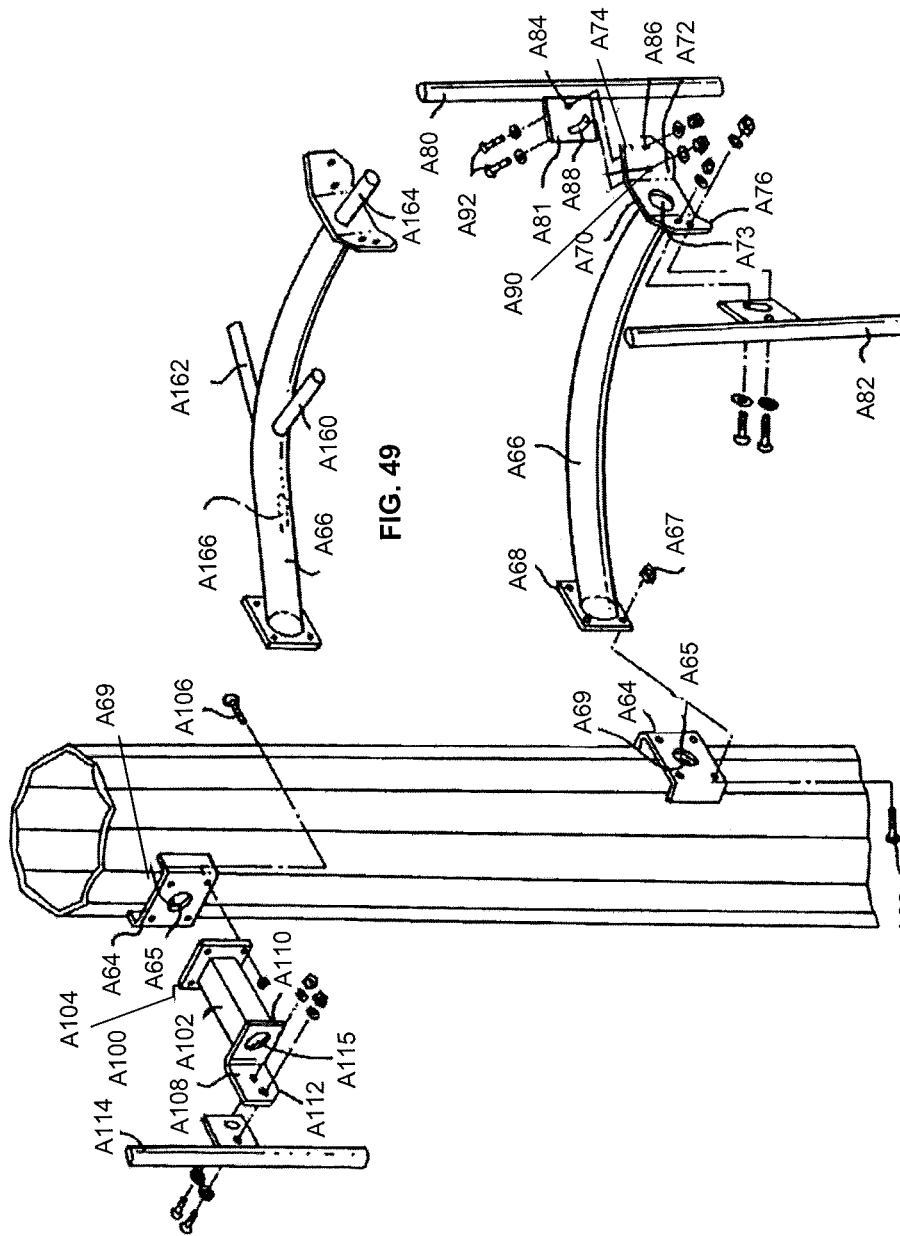
FIG. 49 is an enlarged exploded view showing an alternate embodiment of one of the mounting assemblies shown in FIG. 47.

In one alternate embodiment, shown in FIG. 49, arm A66 may be provided with pipes A160 and A162 projecting from the sides thereof and a pipe A164 extending outwardly from bracket A70 concentrically with aperture A73. Pipes A160, A162, and A164 are similar to pipes A50 and serve the same function, i.e. they provide connection points for connecting tree limbs A14 to mounting assembly A60 to more completely obscure mounting assembly A60 and the receiving antennas connected thereto from view. In this embodiment, arm A66 is provided with an aperture A166 for routing the cable leads from the receiving antennas into arm A66 and then into pole A32.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The original embodiment of the present invention, is best described as a monopole wireless electronic communications antennae and equipment tower with natural appearing, but simulated tree components B1. The original embodiment of the present invention is best described as a monopole wireless electronic communications antennae tower B3 with natural-appearing, but simulated palm tree components. The preferred embodiment comprises a wireless electronic communications antennae and equipment structure B5, the monopole B3, and artificial palm tree components. Specifically, the invention is comprised of a metal monopole B3 which tapers upward and terminates to a tip B11 or a cap plate B13, to support the wireless electronic communications equipment and antennae panels B17 of the structure.

The monopole itself B3, without artificial appurtenances or components, typically has 8, 10, 12, or 16 sides as seen at B19, B21 on monopole B3. The number of sides or facets will depend upon the tower's height, the wind load for a particular configuration of the wireless antennae, and the accompanying artificial palm frond camouflage. At the upper end of the monopole B3 there are artificial palm fronds B25 attached by mechanical means to outwardly protruding metal female receptors B27, which will be described in detail below.

In the preferred embodiment, the monopole B3 is the type provided by FWT, Inc. of Fort Worth. Tex. However, similar monopoles obtainable from other sources are also included within the scope of this invention.

Also in the preferred embodiment, the antennae support assembly is comprised of a galvanized steel monopole B3 which tapers upwardly from its base to a top or cap plate at the very top of the monopole. As already mentioned, this steel monopole B3 can be many-sided or faceted, depending upon the required height and an engineer's calculations for wind related stress forces. The preferred steel for construction of the shaft monopole B3 is ASTM A-575 Grade 65, 50, or 36, and the galvanizing process is ASTM A-123. The antennae cable entries are at the base B2, as is the tower foundation. There is also a butt connection B29 for the different types of simulated palm bark components along the length of monopole B3. In the preferred embodiment, at the upper end of the monopole B3 are six to nine directional panel antennae B17 cantilevered on arms B30 of steel tubing. However the invention also contemplates that the steel arms for antennae B30 can emerge from between any coronae of palm fronds B25.

In the preferred embodiment the artificial palm plant components simulate a palm tree. Also in the preferred embodiment, the artificial palm fronds B25 are approximately eight feet long and thirty-six (36) inches wide at the base, while tapering to ten inches wide at the tip of the frond. However, the invention also contemplates a range in frond length of between approximately four feet to approximately ten feet. The stem of the frond is approximately 1 and ½ inch in diameter at its base and tapers to approximately ⅜ inch at its tip. The leaflets which comprise the fronds are molded of polyurethane with a greenish yellow and greenish brown coloring. Each artificial palm stem B31 of a frond is embedded with a rigid spine, comprised of a threaded nylon rod or similar material, steel, or high-strength urethane or other resin. This spine or rod extends from the base of the frond through approximately seven inches of the stem portion of the frond. Injection of adequate polyurethane at the junctions between each leaflet and the stem of the frond insures stability during strong wind forces. Each frond ranges from approximately 3025 grams (6 lbs. 11 oz.) to 3652 grams (8 lbs, and 1 oz) in weight. For the preferred embodiment, the source of the palm fronds and attached leaflet material is Preserved Treescapes, Carlsbad, Calif. However, similar materials which are obtainable from other sources are also included within the scope of this invention.

Figure 50:
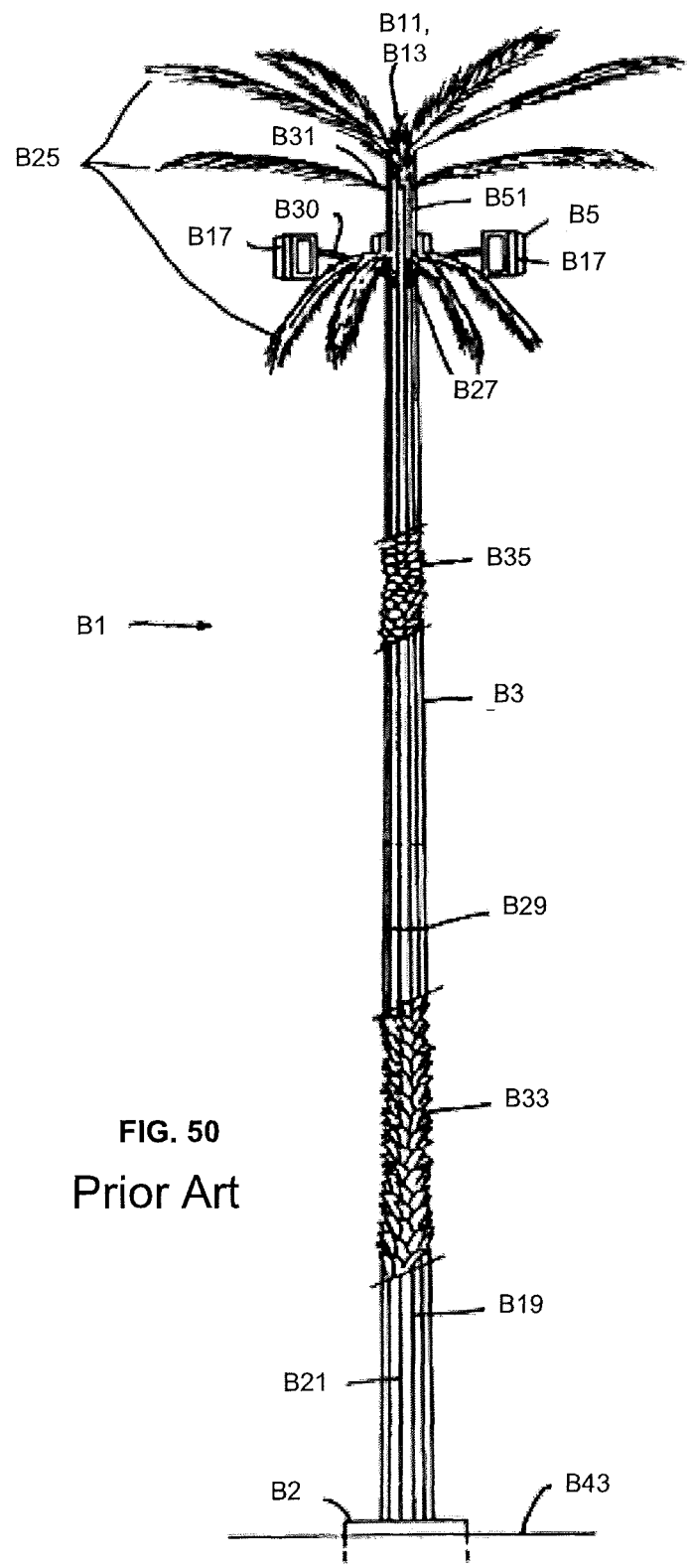
FIG. 50 is an illustration of the entire monopole tower with protruding artificial palm fronds and antenna.

FIG. 50 illustrates a side view of the entire wireless electronic communication antennae and equipment support structure of monopole B3. In the preferred embodiment, the plurality of sides, or facets on the galvanized steel monopole B3 can be seen at B19, B21. This multifaceted galvanized steel monopole B3 rises upwardly as a tapering truncated pyramid form to either simply terminate at its tip at the top of the monopole or terminate in a cap plate B13. The degree of taper for the monopole B3 is 0.25 to 0.5 inch per lineal foot.

Also in the preferred embodiment, the steel monopole B3 is clad with two types of simulated bark. Material intended for the lower portion of the monopole is fiberglass B33, cast as half-tubes within a mold to simulate natural palm bark, and which is fairly rigid. The matrix for the fiberglass material may be acrylic, silicone, or epoxy. The upper portion, generally fifteen feet above the base of the monopole B3, is covered with a polyurethane and is also cast to simulate natural tree bark B35.

The polyurethane allows the upper covering more flexibility when the monopole B3 sways as a result of wind forces. The two kinds of bark castings B33, B35 are first cut to naturally fit around the bottom or upper portion of the monopole B3. The two kinds of bark, upper and lower, then meet at butt junction B39, approximately 15 feet from the base of the monopole B3. However, the use of only one kind of artificial or simulated palm tree bark to cover the entire monopole B3 is also contemplated within the scope of this invention.

In the preferred embodiment the monopole tip or cap plate is elevated approximately 20 to 70 feet from the ground B43. However, the monopole can be as high as 125 feet and is made of shaft steel ASTM A-572 grades 65, 50, or 36. In addition, in the preferred embodiment, immediately below the monopole tip or cap plate are the directional panels B17, in antennae assembly B5. However, as already noted, the supports for the antennae can emerge between any level of corona with fronds B25. The galvanized steel monopole B3 is approximately thirty inches in diameter at its base B2, and tapers to 16 inches in diameter towards its upper portion B51. The baseplate member is of material ASTM A-572 Grade 50 steel. During wind tunnel tests conducted on the artificial palm fronds, such palm fronds adhered to their attachments at wind speeds up to 110 mph for at least 10 to 12 minutes.

Figure 51:
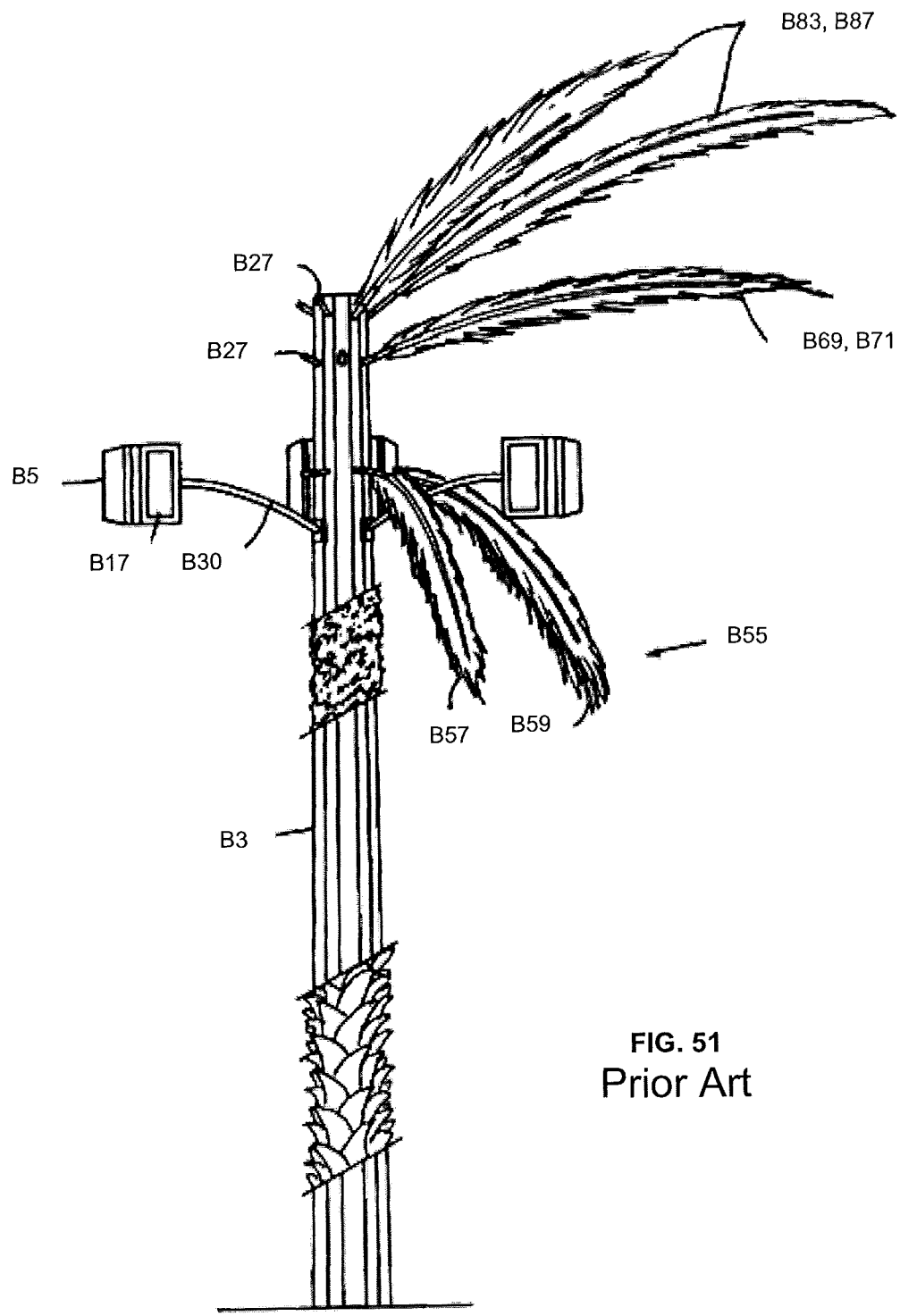
FIG. 51 is a view of protruding metal female receptors with artificial palm fronds in a coronae.
Figure 52:
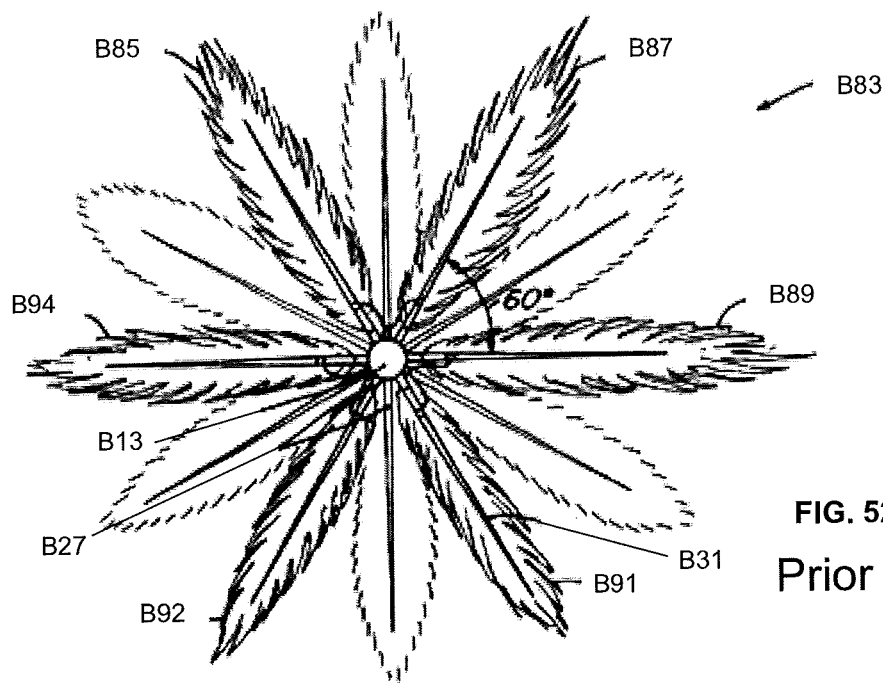
FIG. 52 is a plan view of the highest corona of the welded female receptors artificial palm fronds.
Figure 53:
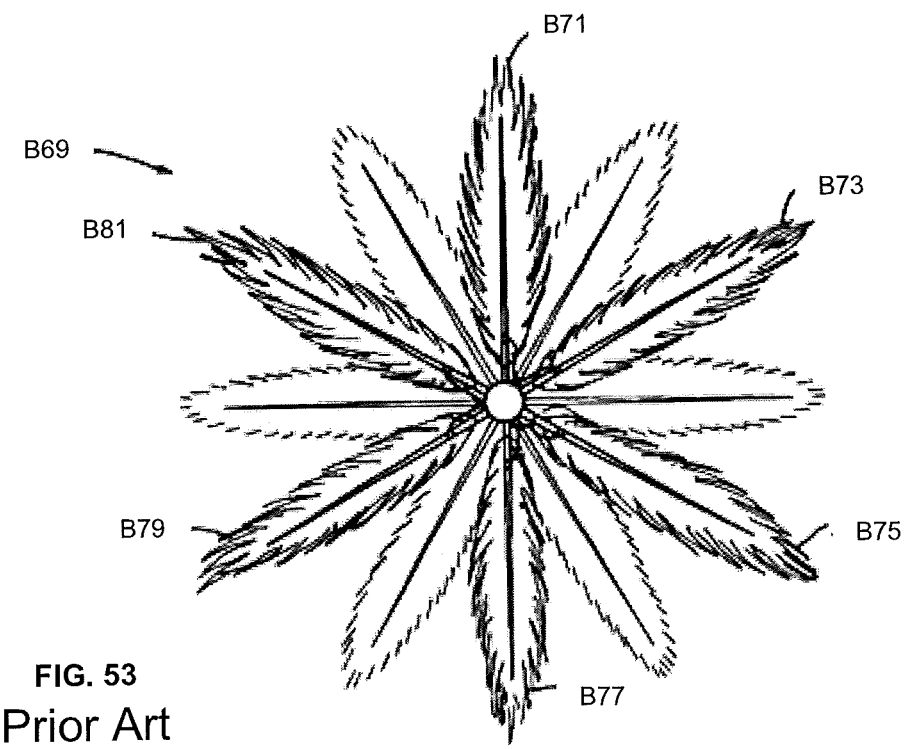
FIG. 53 is a plan view of the second highest corona of female receptors with artificial palm fronds.
Figure 54:
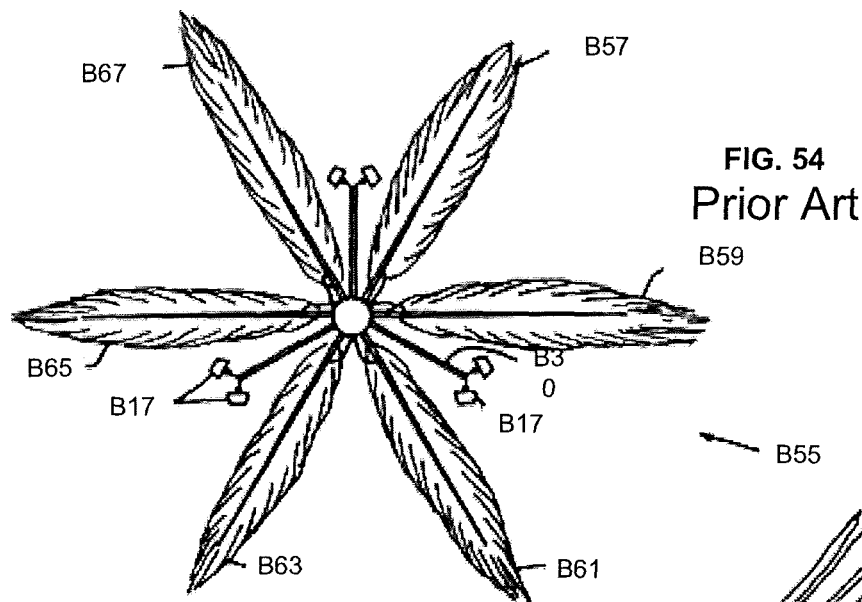
FIG. 54 illustrates a plan view of the lowest corona with artificial palm fronds.

FIG. 51 illustrates a side view of the structures which comprise the three parallel coronae with artificial palm fronds. In this context the term corona signifies a ring around the upper part of the monopole. In the preferred embodiment, these coronae each contain six artificial palm fronds which emerge at the top portion of the monopole B3 or the monopole tip B11 or cap plate B13. The lowest corona B55 along the monopole is located at fronds B57, B59, B61, B63, B65, B67, as seen in FIG. 54, although most of the fronds cannot be seen in FIG. 51. The next highest corona B69 is at B71, B73, B75, B77, B92, B94, as seen in FIG. 53, and the highest corona B83 is at B85, B87, B89, B91, B92, B94, as seen in FIG. 52. Again, several fronds in the middle corona and in the highest corona cannot be seen in FIG. 51.

Each of the two highest coronae typically has six female upwardly protruding receptors B27 for a total of twelve receptors B27. However, the bottom corona has six female receptors protruding slightly downward, so that when fronds are attached, they have a natural, drooping appearance. To further enhance their natural appearance the fronds B25 from the lowest corona are shorter than the upper fronds and are different shades of green, yellow, and brown. The designed windload for the fronds B25 and other equipment attached to the monopole B3 is up to 110 miles per hour for ten to twelve minutes.

FIG. 52 illustrates a plan view of the highest corona B83, where each female receptor B27 is approximately eight inches in length. Typically, the female receptors are approximately 60 degrees in either direction from each adjacent female receptor. However, the arrangement in the highest corona can be in a range of 110 degrees apart to accommodate antennae and to make the arrangement of fronds B25 appear more natural.

FIG. 53 represents another plan view immediately below the highest corona to corona B69. In this illustration, the highest corona is not shown for purposes of simplicity. As with the highest corona, each female receptor B27 is approximately eight inches in length.

FIG. 54 illustrates the corona lowest in height along the monopole B3. Again, each outwardly and slightly downward protruding female receptor B27 is approximately 8 inches in length and one and one-half inches in width. The angle between adjacent receptors projected on a horizontal plane is approximately 60 degrees in the preferred embodiment, but can range between ten degrees and 120 degrees.

In the preferred embodiment, panel antennae can be seen on the extending steel supports B30 which originate below the lowest corona. However, this invention also includes within its scope steel supports for the panel antennae which originate between any corona of artificial fronds B25.

Figure 55:
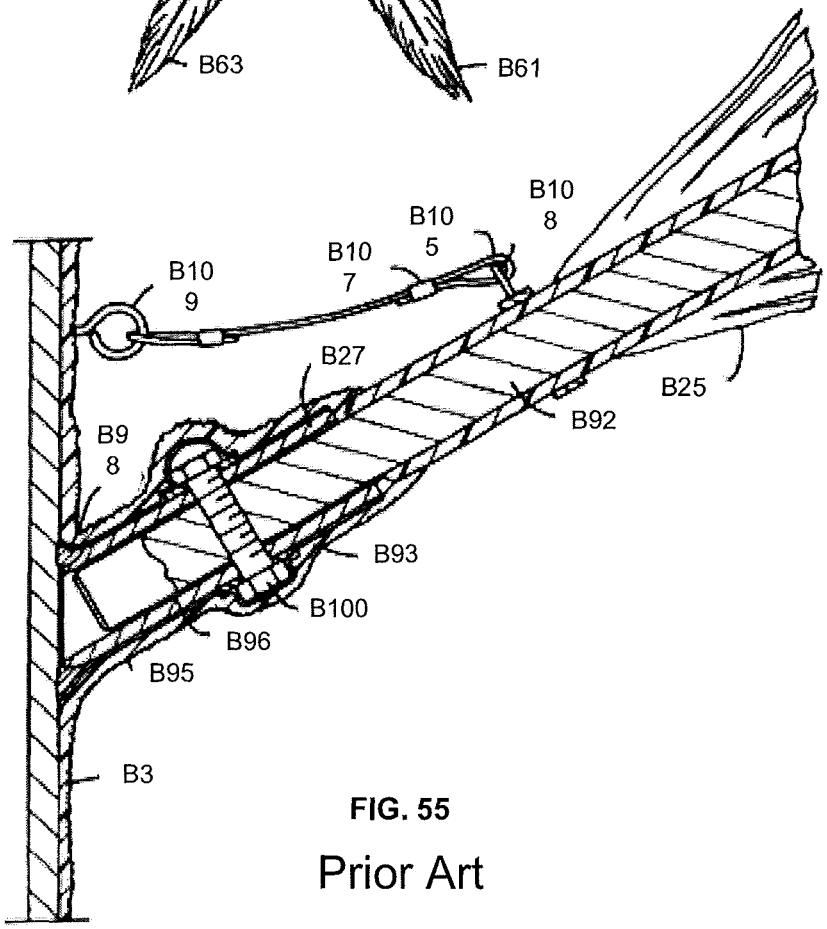
FIG. 55 is a detailed illustration of an assembly of an artificial palm frond securely inserted into a female receptor which is welded to the mole.

FIG. 55 illustrates how one frond B25 appears when attached to one side of the monopole tower B3. In the preferred embodiment, a steel stem B92 of each palm frond B25 originates in a female receptor B27, where each receptor is covered by a gusset-like weld B98. This assembly is then covered by polyurethane B93. If the stem is also glued in some manner as is the bark B95, for the best mode the recommended mastic B96 is manufactured in St. Paul, Minn. by 3M (Industrial Specialties Division). This mastic has as principal ingredients polyol and isocyanide. However, other appropriate adhesives are also contemplated within the scope of the invention.

One such alternative mastic, also manufactured by 3M, is known as construction mastic 4323. This particular mastic has synthetic rubber as a base with a hexane solvent and other additives. It is suitable for plywood, concrete, aluminum, steel, and polystyrene foam. An appropriate adhesive with similar properties to the above, but not limited thereto, is also contemplated for securing all types of artificial bark to the monopole tower B3.

FIG. 55 also illustrates in detail the preferred embodiment for attachment of each artificial palm frond stem to each female receptor B27, which for the two upper coronae have upwardly protruding receptors B27. Each receptor B27 is welded B98 to the side of the monopole tower B3 or to the monopole tip or cap plate. The metal protruding female receptors B27 are approximately eight inches long and approximately one and one-half inches wide. There is a through bolt B100 which penetrates the female receptor B27 and male end of the palm frond, simultaneously securing one to the other at approximately the receptor's midpoint. A polyurethane layer B93 surrounds each female receptor B27 and bolt and is approximately ¼ inch thick. Superimposed over this layer B93 is the bark material B95 wrapped around the female receptor B27.

In the preferred embodiment the frond B25 can also be further secured against falling by mechanical means such as a cable or rope B105 attached to a clamp B107, which loops through eyelet connector device B108 on the palm frond and attaches to the monopole tower B3 at another location B109 on the same tower. Other mechanical means contemplated within the scope of the invention to further secure the female receptors B27 to the monopole B3 include bolts and nuts. Another securing device is a nylon rope inserted within the stem of the palm frond and attached to the receptor on the monopole. Other connective means, adhesive or mechanical, are also included within the scope of the invention.

Figure 56:
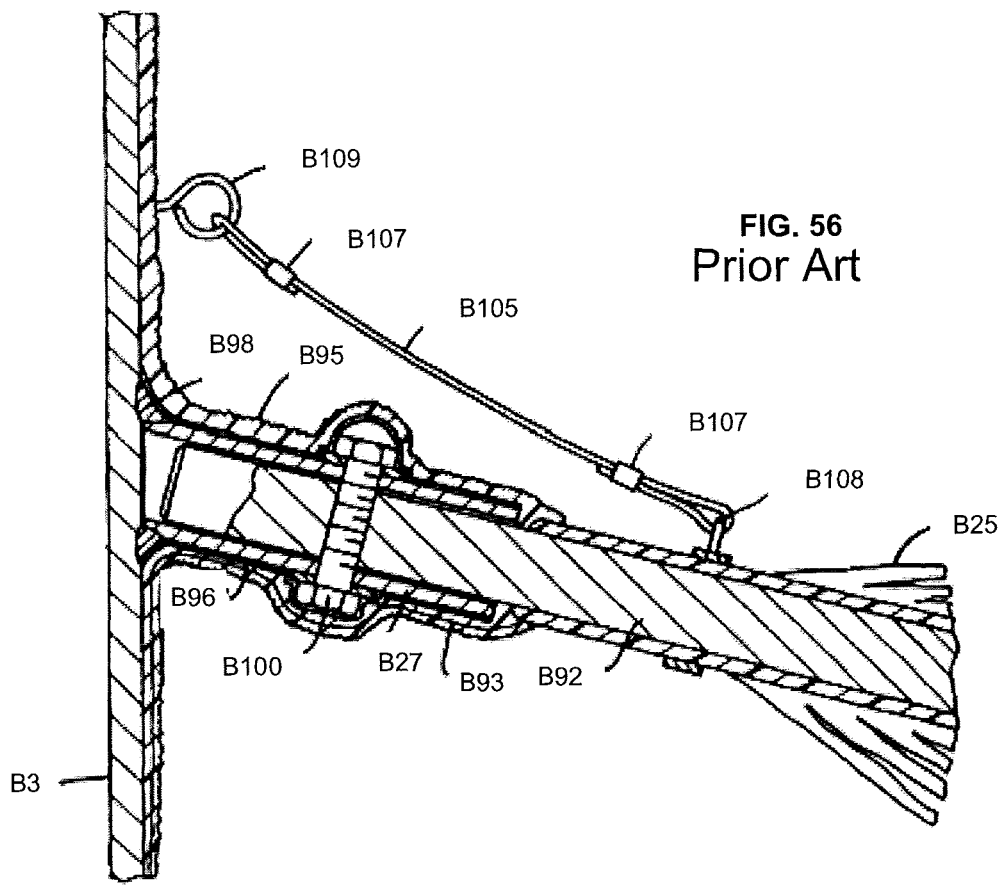
FIG. 56 is a detailed illustration of an assembly similar to that in FIG. 55, but the female receptor is now protruding slightly downward in the lowest corona on the monopole.

FIG. 56 shows the fronds B25 emerging from the lowest corona. Consequently, the receptors B27 are oriented outwardly and slightly downward, instead of protruding upwards. This gives the shorter and lower fronds B25 a more natural appearance when they droop downwards and exhibit colors such as a different shade of green, brown, or yellow.

The most current embodiment of the present invention is also best described as a monopole wireless electronic communications antennae and equipment support structure B201 with natural appearing, simulated pine tree components. See FIG. 57. The preferred embodiment comprises wireless electronic communications antennae and equipment, a galvanized steel tapering pyramidal monopole B203, antennae and receiver assembly B205, and artificial pine tree components such as branches B209 and boughs B211. Specifically, the invention is comprised of a metal monopole B203 which tapers upward and terminates at a tip B206 or cap plate B208 to support the wireless electronic communications antennae and equipment. The monopole itself B203 has a polygonal shape and typically has 8, 10, 12, or 16 sides as seen at B210, B212. The number of sides or facets will depend upon the tower's height, the wind forces for a particular configuration of wireless electronic communications antennae and equipment, and the accompanying artificial pine branches B209 and boughs B211.

Located primarily at the upper and middle portions of the monopole B203 are the artificial pine branches B209 and boughs B211 attached primarily by mechanical means to outwardly protruding metal female receptors B215. The receptors are located approximately 10 inches from above and below each other at a slight angle and their structure will be described in detail below. For the preferred embodiment, the monopole B203 is the type provided by FWT, Inc. of Fort Worth, Tex. However, similar monopoles from different sources are also included within the scope of the invention.

In the preferred embodiment of the artificial pine tree, the electronic structure is comprised of a galvanized steel monopole B203 which tapers upwardly from the ground to a tip or cap plate. The shaft steel for construction of monopole B203 is ASTM A-Grade 65, 50, or 36 and the galvanizing process is ASTM A-123. The antennae cable entries are at the base B216, as is the tower foundation. The cables traverse upwardly through the interior of the monopole to emerge through openings in the monopole B203 to connect to the antennae panels.

The diameter of the metal circular baseplate B216 is approximately 24 inches. The diameter of the base of the trunk is approximately 16 inches in diameter. In the preferred embodiment, the monopole is a twelve-sided polygon with a taper of 0.2284" per lineal foot.

In the preferred embodiment, at the upper end of monopole B203 is a curved polyurethane top B218 (See FIG. 59) with three protruding female receptors B215 to hold and support three simulated pine branches B209 (not seen in this figure). In the preferred embodiment the wireless electronic antennae and equipment B205 is located at the top of the monopole B203. However, the invention contemplates that the steel arms B204 for the wireless antennae receiver apparatus B205 can emerge from between any level of pine boughs B211.

In the preferred embodiment, the artificial pine boughs B211 range from between one and one half feet and four feet in length. The branches B209, which contain the simulated pine needles in leaflet motifs B219, are also approximately one foot to four feet in length. However, the invention also contemplates a range in branch length of more or less than these particular dimensions. Each bough B211 weighs approximately 846 grams (two pounds) without foliage or a spine inserted within the base. Each branch B209 with leaflets weights approximately 196 grams (seven ounces).

The boughs B211 are molded in half-sections in fiberglass molds. After first lubricating the interior of the mold with a hard wax, the first two layers applied are polyester resin, SP9108, obtainable from Plasticolors, Inc. in Ashtabula, Ohio. This prepolymer material contains calcium carbonate, styrene, and talc. The next layer is a fiberglass matt which is thoroughly wetted and covered with a second resin known as Polylite 33-40, available from Reichold Chemicals Durham. N.C. Both resins use the same catalyst which has as components polyether, polyol, and aromatic diamine. Polylite contains 46-50% styrene monomer and generally cures at 250 degrees F., as an isophthalic-based polyester.

The next layer is a fiberglass cloth, covered with a second fiberglass matting and saturated with Polylite 33-40. The final layer consists of a length of nylon rope embedded in fiberglass segments to give strength to the bough B211 in the event of breakage in the environment.

The filled molds are cured in an oven at 180 degrees for 1 hour or for 24 hours at room temperature at atmospheric pressure. Each bough half section is removed from the mold and glued or fastened by other mechanical or adhesive means to another bough half section to complete an artificial bough B211. Polyester resin is the preferred method of gluing the half-section together in this particular embodiment.

Figure 60:
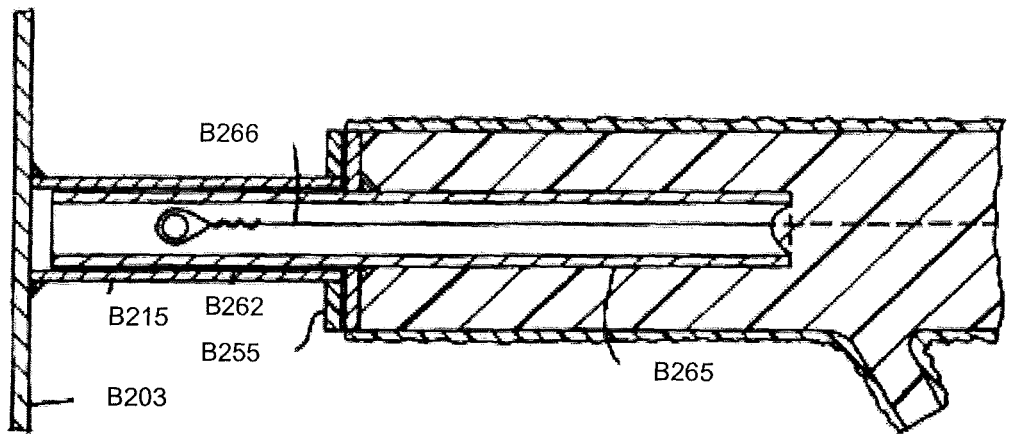
FIG. 60 schematically illustrates a transverse sectional frontal view of a "pine bough" segment as it connects to a female receptor welded to a monopole.

Before the cured bough sections are glued together, half of the base of the bough is embedded with a spine B265 as in FIG. 60. The cured sections are then placed with, for example, additional polyurethane or mastic as described above with the palm tree embodiment.

The spine can consist of metal, such as steel, a threaded nylon rod, or rigid cured urethane. Each completed artificial base of a bough B211 is thus reinforced with a rigid spine which extends from the bough's base approximately seven or eight inches toward its tips. The spine also protrudes approximately 3 inches externally from the bough base B262 (FIG. 60). As a preliminary estimate the largest boughs B211 should withstand approximately 300 to 400 pounds of stress on their tips. The boughs are also designed to withstand 120 mph wind forces parenthesis around with no ice conditions, and with ice in the environment, they are designed to withstand 80-90 mph winds.

A silicon mold is inject with urethane prepolymer to form the pine needle clusters B219 (See FIG. 57), which comprise a component of the branch B209. Branches are usually, but not always, located within a terminus of a bough B211. Each branch has a stem which is approximately 7 to 8 inches long and this stem has several successive notches and nodules B220 (See FIG. 64) and terminates in a bulb-like member B228. Prior to the gluing together of the two halves of a molded bough, the nodular stem is placed within the two halves at one terminus of the bough half. When the bough segments are glued together, the branch is securely fastened, by frictional, mechanical, and adhesive means to the terminus of that particular bough.

The branches which comprise the pine needle clusters B219 are pigmented with epoxy resin mixed with pigment "blue 15" and pigment "yellow 93." These pigments can be obtained under the trade name Ren, from Ciba-Geigy Corporation in East Lansing, Mich. For the preferred embodiment, a source of the artificial pine boughs and branches with attached pine needle clusters is General Exhibit Displays of Chicago, Ill. However, similar pine needle clusters can be obtained from other sources and still be included within the scope of the invention.

Figure 57:
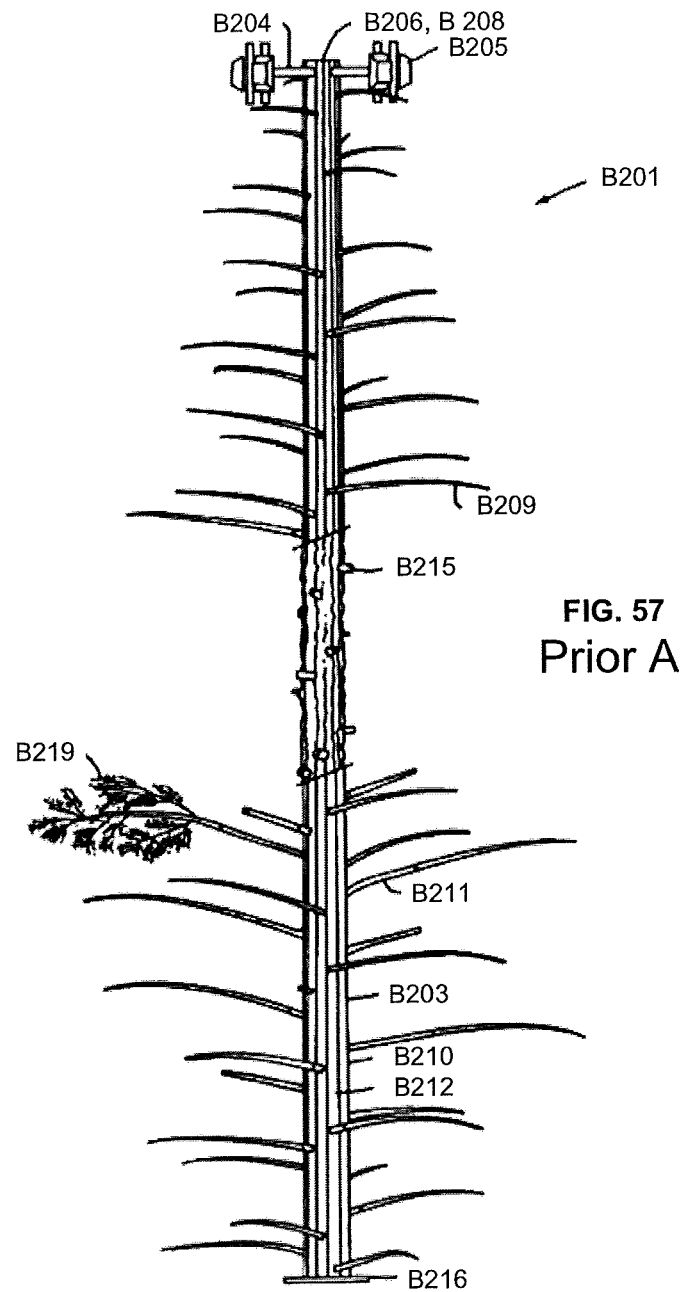
FIG. 57 is a view of a monopole with pine branches, boughs, and antennae assembly.

FIG. 57 illustrates a frontal view of the monopole wireless electronic communications antennae and equipment B201 with artificial pine tree components. In the preferred embodiment the plurality of sides, or facets, on the galvanized steel monopole B203 can be seen at B210, B212. This multifaceted galvanized steel monopole B203 rises upwardly as a tapering truncated pyramidal form to either terminate at its tip B206 or in a cap plate B208. The degree of taper for the monopole B3 is approximately 0.2284" per lineal foot. The steel galvanized monopole B203 is approximately thirty inches in diameter at its base B215 and tapers to 16 inches in diameter towards its upper cap portion. The baseplate material is of ASTMA-572 Grade 50 steel.

Figure 58:
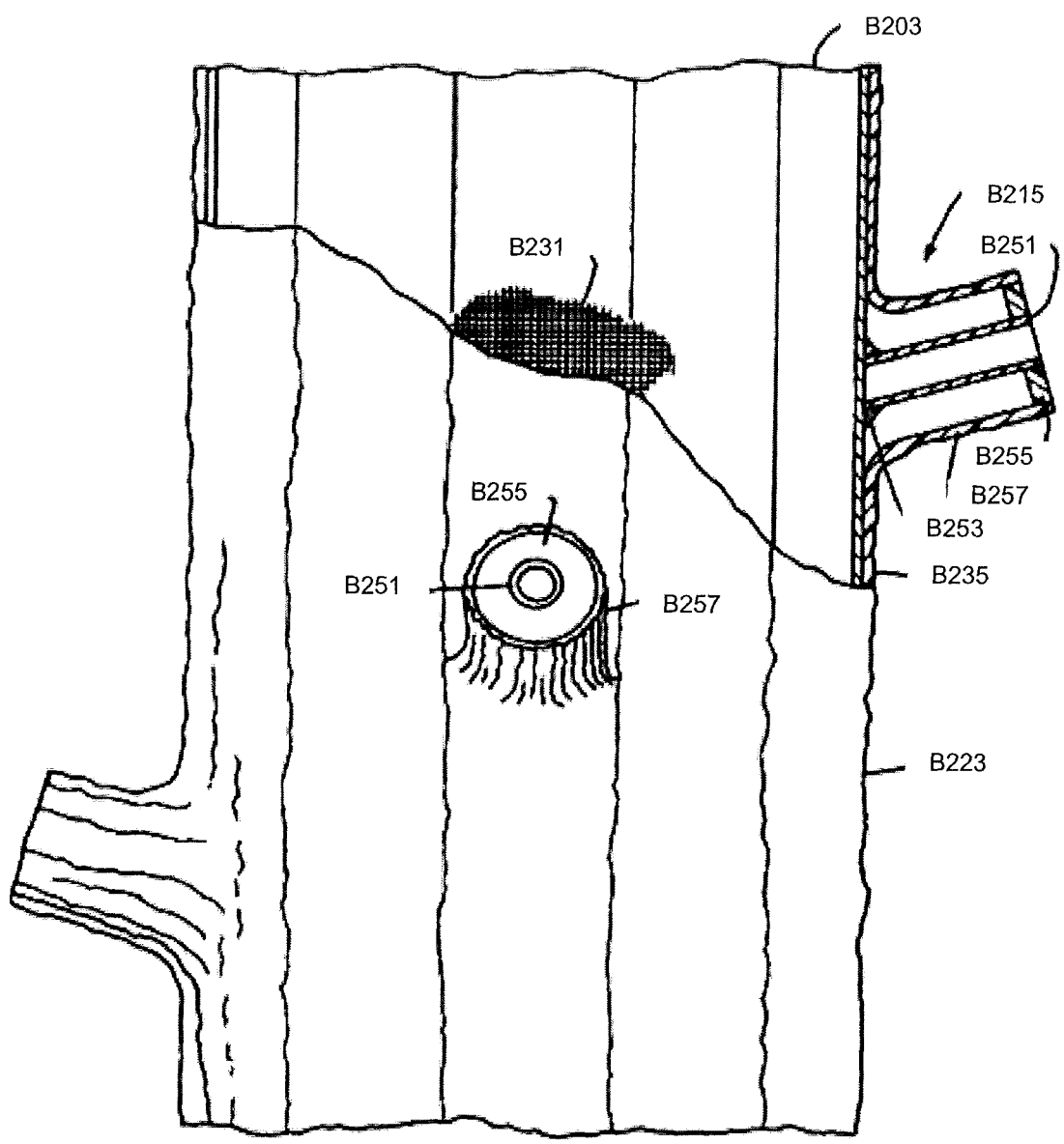
FIG. 58 illustrates a portion of an artificial tree trunk with female receptors for the preferred embodiment of the invention.

FIG. 58 illustrates a segment of monopole B203 with receptors B215. In the preferred embodiment, the steel monopole B203 is clad with simulated bark to form the trunk B223. Here one can see the receptors in transverse and cross-section. The monopole B203 has female receptors B215 protruding through the artificial trunk B223. The cover for approximately the lowest seven to fifteen feet of the monopole is cast or chopped and sprayed fiberglass B239.

The upper remaining exterior trunk is next covered with blue fiberglass netting B231 which is taped into place over the monopole's exterior surface. Over the glass netting is layered, by brush, spatula, wooden paddle, or knife means, urethane prepolymer B235. In this manner the polyurethane also acts as a glue for the fiberglass to adhere to the metal monopole. This is also the same polyurethane material used to mold the pine needle clusters B219, only with a natural dark brown color for the trunk B223.

The female receptors B215, irrespective of their location on the monopole B203, are similarly covered with dark brown polyurethane. This particular urethane polymer system contains methylene bis (4-cyclohexylisocyanate) (HNDI), space and the catalyst comprises ditheyltoluene diamine and mineral spirits. For the preferred embodiment, the prepolymer and catalyst system can be obtained from Conap, Inc., Olean, N.Y. However, other similar polymer and catalyst systems from other sources are also contemplated within the scope of this invention.

Figure 59:
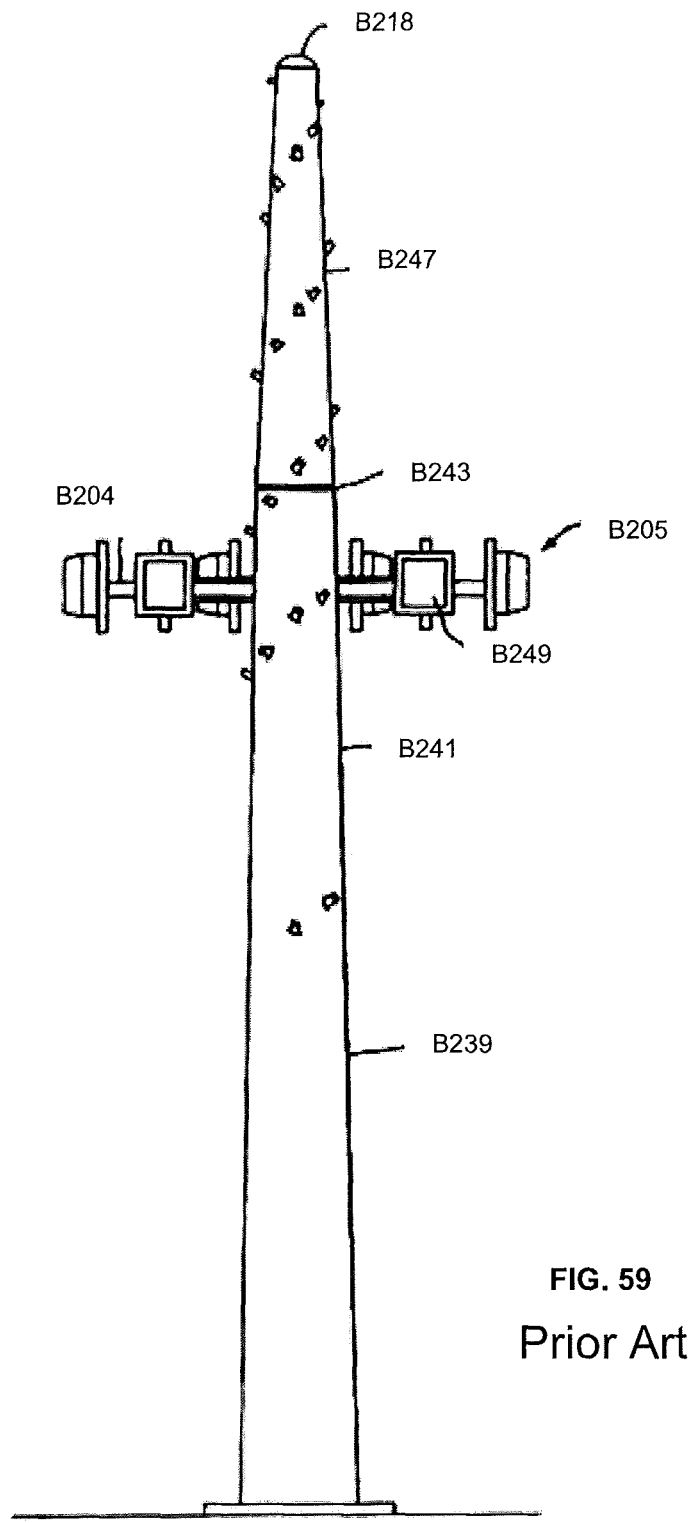
FIG. 59 illustrates another embodiment for the trunk portion of the invention with attached antennae assemblies.

As seen in FIG. 59, in a second embodiment of the trunk B223, a different approach is taken. A fiberglass mold is used to create curved segments, which will comprise the lower portion of the trunk in three segments B239. After lubricating the interior, the mold is filled with first a layer of urethane prepolymer and then a layer of fiberglass mat. The urethane prepolymer thoroughly wets the fiberglass mat. Each segment is successively cured and released from the mold. Three segments are then glued together with polyurethane or other adhesive means and joined with rivets or similar means to form the lower segment B240 of the simulated trunk. All surfaces of the mold are designed to simulate the texture of natural pine tree bark.

In this second embodiment, the middle section of the trunk B241 is covered solely with a polyurethane sheet to give the monopole structure B203 more flexibility under wind conditions. This middle section is similarly cast within one fiberglass mold, but without the fiberglass component.

A second group of three segments is next made from this same fiberglass mold. As with the first set of molded and cured segments, the material in the mold is cured at room temperature for 24 hours at one atmosphere or placed in an oven for one hour at 180 degrees F. After three finished segments are successively removed from the mold, they are cut to form a cylindrical shape with a smaller diameter to reflect the taper of the monopole B203 at a greater height. The three molded cured segments are glued together with resin/urethane or similar means. They can also be riveted, or reinforced with mechanical means, as were the first three segments forming the bottom portion of the trunk B239.

As also seen in FIG. 59, there may be a butt junction B243 between the second segment of the trunk and the upper section of the trunk section B247. Section B247 is also cast in three segments, but in a narrower, tapering mold. This third upper section can top the pole with additional foliage. It can also be omitted entirely without affecting the radio signals from the antennae and panels located below. If the user wishes to add the additional foliage, then the bark would consist of glass matting and polyurethane, as does the lower trunk segment B240, and the bark layers for the female receptors B215.

In summary, in this second embodiment of trunk construction, the lowest approximately 7 to 15 feet, is polyurethane and fiberglass cast in fiberglass molds. The middle section B241 uses a polyurethane sheet for flexibility. Use of only one kind of artificial tree bark to cover the entire monopole B203 of the pine tree, or the use of only one kind of bark to cover the palm tree monopole B3, is also within the scope of the invention. Moreover, the combination of fiberglass matt and polyurethane covers the female receptors B215 irrespective of on which section of the trunk a receptor is located. However, this would not be the case for the lowest fifteen feet which is solely fiberglass. Any similar resin or appropriate variation of urethane is contemplated within the scope of the invention, assuming it has the requisite properties described in this application, and is suitable for the parameters of this invention.

In the preferred embodiment, the monopole tip or cap plate is elevated from approximately 20 to 125 feet from the ground, depending on the height desired. The monopole can be as high as 125 feet and is made of shaft steel ASTM A-572 grades 65, 50, or 36. In the preferred embodiment, immediately below the monopole tip or cap plate are the directional panels with a total of six to nine antenna panels. However, the scope of the invention is not limited to a monopole height of approximately 20 to 125 feet.

The arms for the antennae and receiver assembly B205 can emerge from any level of female receptors containing boughs B211 or branches B209. However, in the preferred embodiment, the antennae panels B249 to which the cables run after traversing the interior of the monopole, are located at the top of the trunk approximately 20 to 125 feet from the ground. The three antennae panel assemblies B205 are radially dispersed around the trunk equidistant from each other.

As can be seen from FIG. 59 the very upper first 3½" of the tower B218 consists of a curved support which will hold branches which range from approximately ten to twenty inches in length. The stems of a branch are approximately three inches in length.

FIG. 58 illustrates cross-sectional views of the female receptors B215 which support the artificial pine tree boughs B211, or occasionally branches B209. The receptors are actually steel pipe segments B251 which are welded to resemble gussets B253 to the monopole B203. However, they do not protrude into the interior of the monopole structure. A cross sectional view of the receptor reveals the cavity within the steel pipe B251 comprising the receptor, a minimal layer of masonite or plastic washer B255 which extends approximately ½ inch from the entrance to the receptor and a thin outer layer of simulated bark B257. As the steel female receptor B215 protrudes, it is also covered with artificial bark B235.

Referring to FIG. 60, to initially connect the female receptor B215 to the base of a bough B211, a thin layer adhesive such as polyurethane B263 or similar material is first placed within the receptor. The spine B265 emerging from the base of the bough is then placed within the steel pipe of the female receptor for a tight frictional and adhesive fit. There is also a nylon rope B266 through which the bolt or similar device passes for further support. Nevertheless, the preferred embodiments for connecting either branches or boughs to the female receptors require additional mechanical and adhesive means. In this manner, the chance for a branch or bough to break during adverse weather conditions is reduced.

Figure 61:
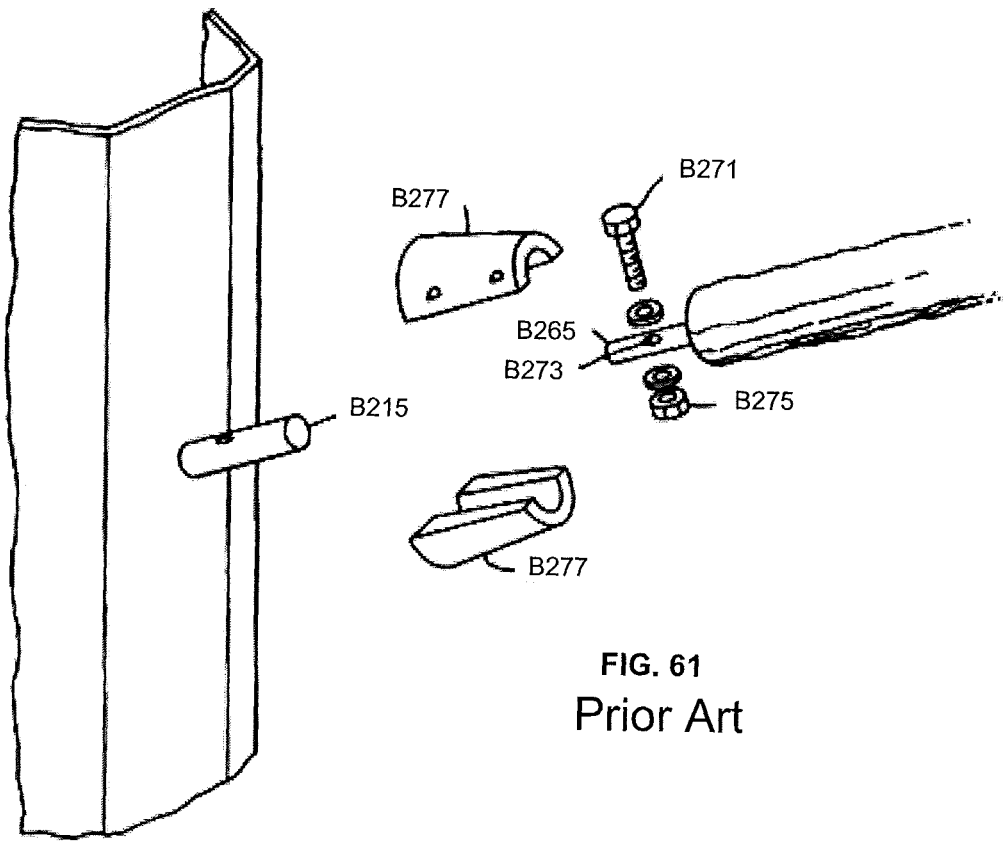
FIG. 61 illustrates the components of one possible mechanical attachment of a bough to the monopole.

Referring to FIG. 61, in one such approach, a bolt B271 or similar mechanical means is inserted through the upper surface of the receptor B215, through an opening B273 in the spine B265, and emerges at the lower surface of the receptor to be secured with a nut or similar means B275. Fittings B277 over the receptor and spine are also illustrated.

Figure 62:
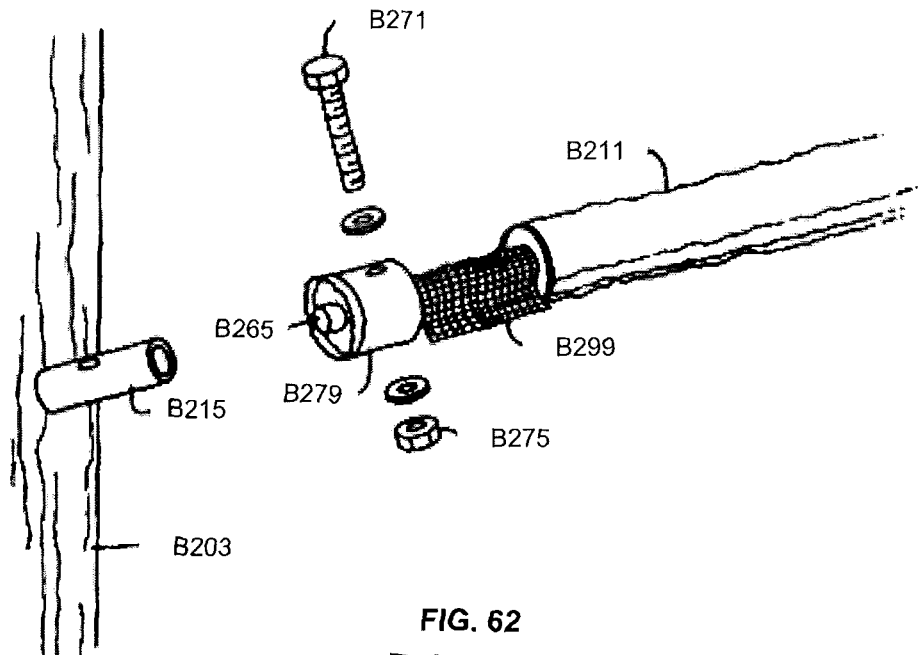
FIG. 62 illustrates a second mechanical attachment of a bough or branch to a monopole.

In FIG. 62, for another connector means, silicone sealant B279 is first applied to the perimeter of the base adjacent the monopole. The particular formula for this sealant used for the preferred embodiment is polydimethysiloxane 701310G7-8 and can be obtained from General Electric, Corp. in Waterford, N.Y. However, similar sealants available from other sources can also be included within the scope of this invention. In this instance, the bolt enters an opening in the base, where it then pierces the female receptor, and emerges from the underside of the receptor tightly secured by a nut or similar means. Also included as a feature in this second variation is a nylon mesh B299. It is attached to the bough interior and contacts both the interior stem component and steel spine which protrudes from the base. In this fashion the nylon rope adds strength and further support by attachment to the trunk.

Figure 63:
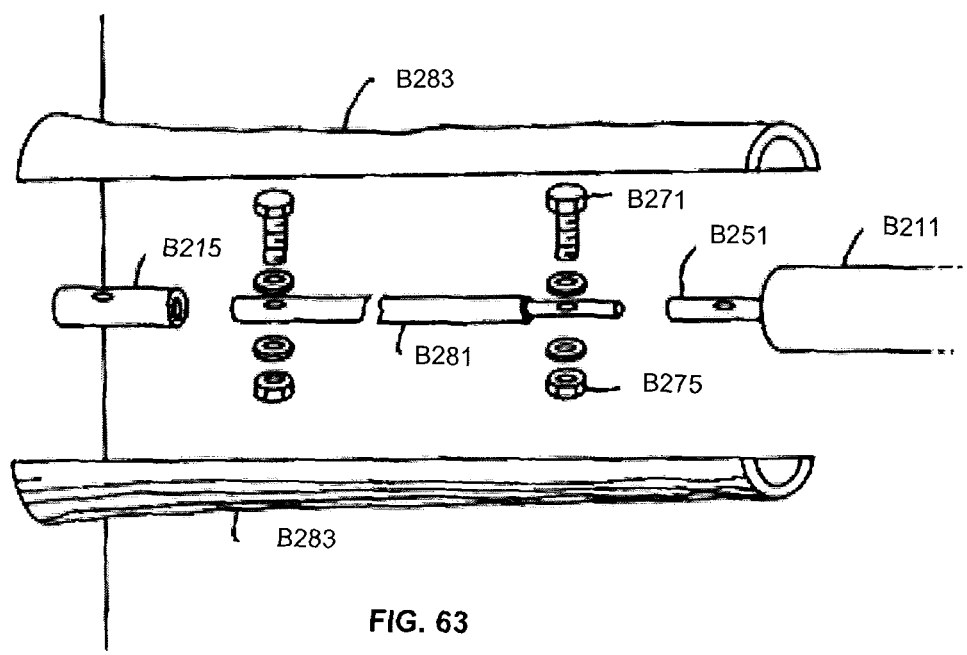
FIG. 63 illustrates a third approach, with additional components, for attachment of a bough or branch to a monopole.

In another variation for attachment to the female receptor, silicone, polyurethane sealant, or a similar material strengthens the ends of the bough segments B211 which surround the receptor and contact the trunk. In the interior of these two half-boughs is a cylindrical narrow bough extender B281 (FIG. 63) which simultaneously fits into the female receptor and spine at either of its terminals. This particular bough extender is reinforced mechanically with a plurality of bolts or similar mechanical devices. These devices pierce the receptor and the extender at several different locations along the length of the bough.

In this third variation, in the preferred embodiment the two half bough segments B283 which cover the bough extender B281 are injected with polyurethane. Necessarily, they cannot be glued together with additional urethane to encircle the extender, receptor, or mechanical fasteners until the tree components and monopole are assembled at a particular site. An additional feature for this fastener is a hook in the monopole's surface to which a fiberglass rope is attached simultaneously to the monopole and the bough for additional strength. Also, the end of the rope in the bough can be attached to the receptor. Please see FIG. 56.

FIG. 57 illustrates the monopole tower with all branches B211 and boughs B209 in place. In particular, it illustrates how each antenna panel assembly B205 attaches towards the top of the monopole B203. As can be seen receptors B215 are of different diameters to accommodate boughs B211 and branches B209 of different diameters. In the preferred embodiment the branches are sparse and the receptors do not completely encircle the trunk. In the dense embodiment, the branches and boughs fit into receptors which completely encircle the circumference of the trunk. Generally, a dense tree will have eighty-four branches, while a sparse variation thereof will have only sixty.

Figure 64:
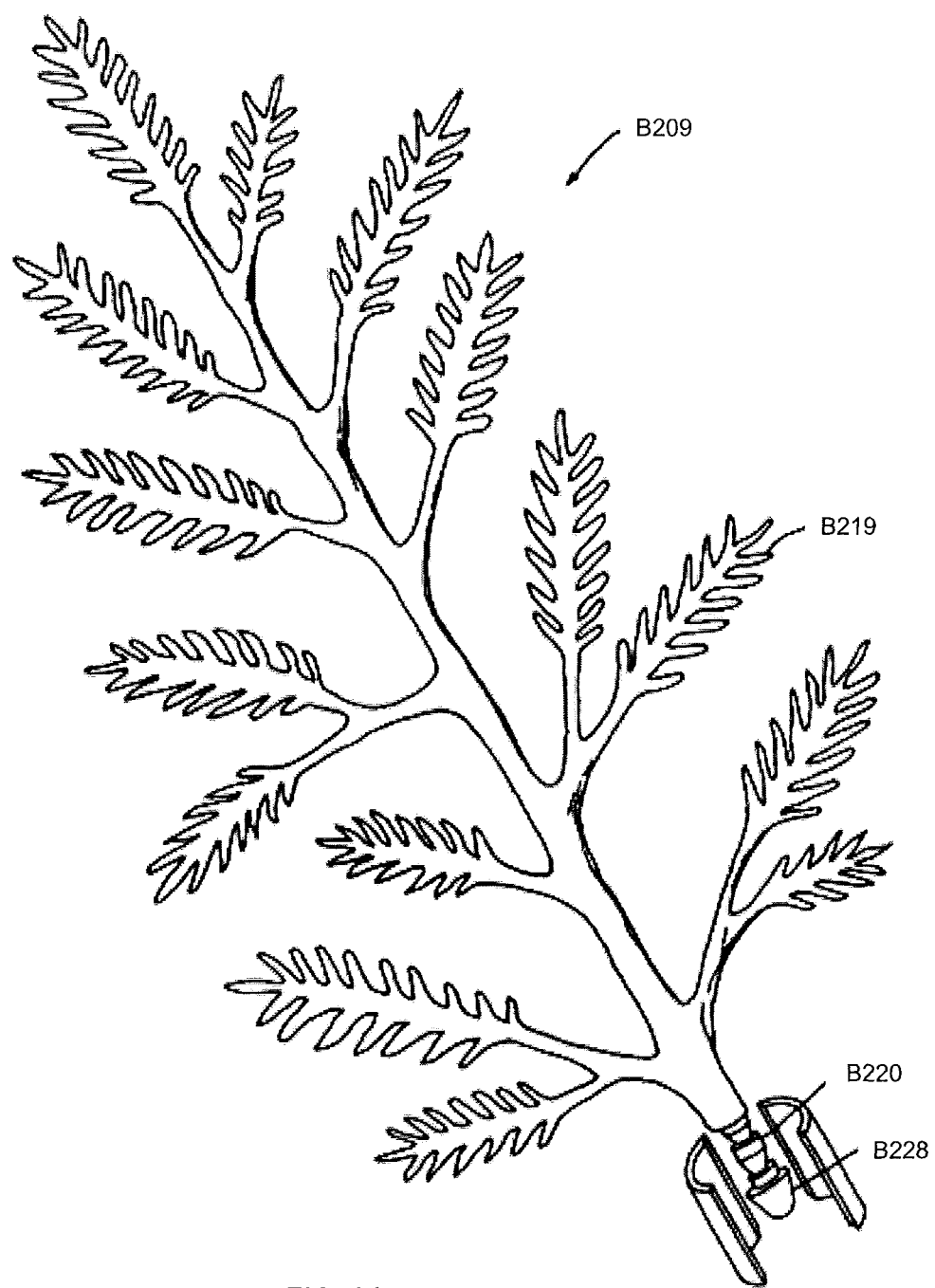
FIG. 64 illustrates a branch with simulated pine needle clusters and the branch's attachment to a female receptor or bough terminal.

FIG. 64 illustrates a branch B209 with pine needle clusters B219. Different sized branch stems will fit into differently sized bough openings B251 (FIG. 58) or female receptors B215. The pine needle clusters are made of the same urethane system as that of the bark on the trunk B237 and receptors B215. The liquid urethane component and catalyst are initially injected into silicon molds. The urethane prepolymer is mixed with the catalyst, containing polyether, polyol, and an aromatic diamine. The length of the branches varies approximately 1 and ½ feet. 2 feet. 3 feet, and 4 feet. There are several pine needle cluster patterns available and an infinite variety is contemplated within the scope of this invention.

As already noted, each stem of a branch B209 (FIG. 54) is molded to contain several notches B220 terminating in a rounded plug member B228. This portion of the stem is inserted between the two halves of a bough B211 with an adhesive means such as, but not limited to, polyurethane or fiberglass mixed with resin. The two half segments of the bough are then clamped together and additionally sealed with polyurethane, fiberglass resin, or other suitable material, leaving the last 3" to 4" knobbed stem portion of the branch inside the final three-dimensional cavity of the bough terminus. In this manner there are three sources of support for the branch: the mechanical support of stem notches, the frictionally fitting plug in the stem held by the bough, and the adhesive effect of the resin filling the remaining space in the half bough cavity between the two boughs fastened together.

Figure 65:
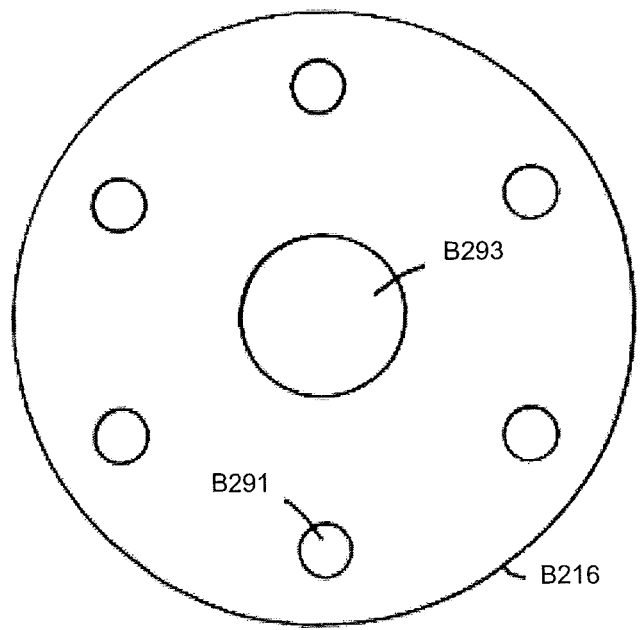
FIG. 65 illustrates a plan view of the baseplate of the monopole.

FIG. 65 is a plan view of the metal base of the monopole tower B216. It shows bolt opening B291 and cable access B293. Another embodiment within the scope of this invention includes a plurality of monopole towers fastened together, at a minimum, at their head or upper portions. In this manner, several monopoles, complete with a variety of wireless electronic communications antennae and related equipment, can be used to relay signals when one such monopole is insufficient. Such monopoles could be of the type described as the preferred embodiment for both artificial palm tree or pine trees described as the preferred embodiment in this application. The invention also includes within its scope other types of artificial foliage, mixed varieties of artificial foliage, and similar monopoles, which, however, are compatible with the systems described herein.

The preferred embodiment of this invention is intended to support and camouflage any type of wireless electronic communications antennae and equipment. This, of course would include users of cellular telephone apparatus in the area of the electromagnetic spectrum from 820 to 960 megahertz. However, the invention is capable of camouflaging and protecting any wireless electronic communication antennae and equipment during strong wind forces and snow.

This invention is similarly capable of protecting and camouflaging antennae which use the entire spectrum of radio frequencies, even if each antennae is designed for a specific or different use. In particular, there is no reason why the present invention cannot be adapted for AM, FM, police radio, taxicab radio, or pagers which use a variety of frequencies. In the preferred embodiment the range of frequencies is virtually unlimited.

This tower can also be used for frequencies somewhat lower or higher for the services which are mentioned above. Moreover, in this invention, all antennae panel are transceivers. Because the monopole is completely galvanized there can be no long-term penetration by corrosion. To this end each female receptor is welded to the monopole B3 (FIG. 50) or B203, FIGS. 57 and 62) as the case may be. This weld is then covered, first with galvanized primer paint, and secondly with polyurethane simulated bark material to produce an airtight, watertight protective surface.

In particular, the metal components as described herein, together with firmly secured artificial tree components, will not interfere with any region of the radiowave spectrum. In addition, there is also lightening protection provided for the monopoles because of an appropriate grounding system. In sum, with the present invention, a purchaser will be benefited by an aesthetically pleasing functional utility structure which will remain camouflaged in adverse weather conditions without interference with necessary radio wavelengths.

Figure 66:
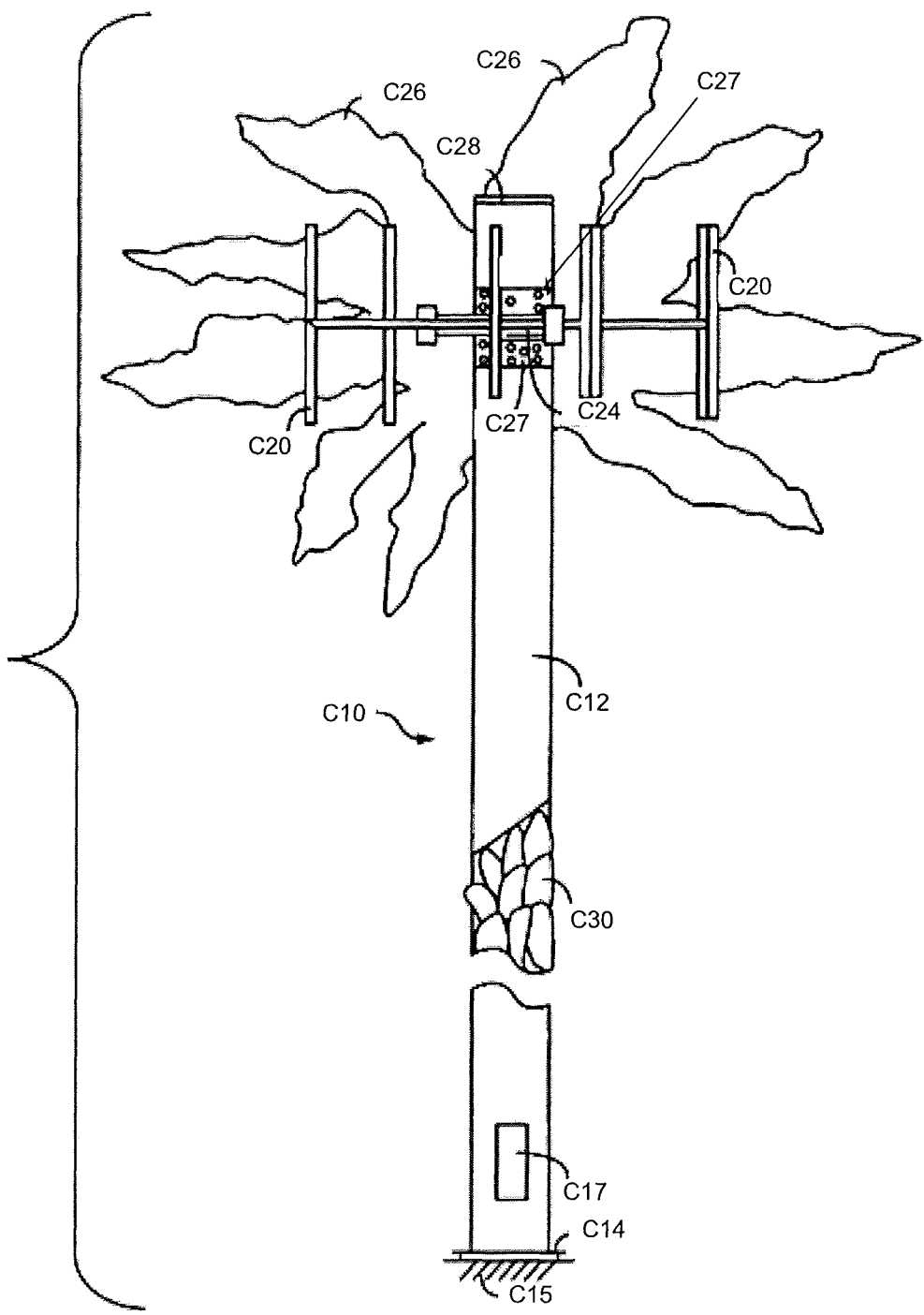
FIG. 66 is an illustration of an antenna structure according to this invention formed as a palm tree.
Figure 67:
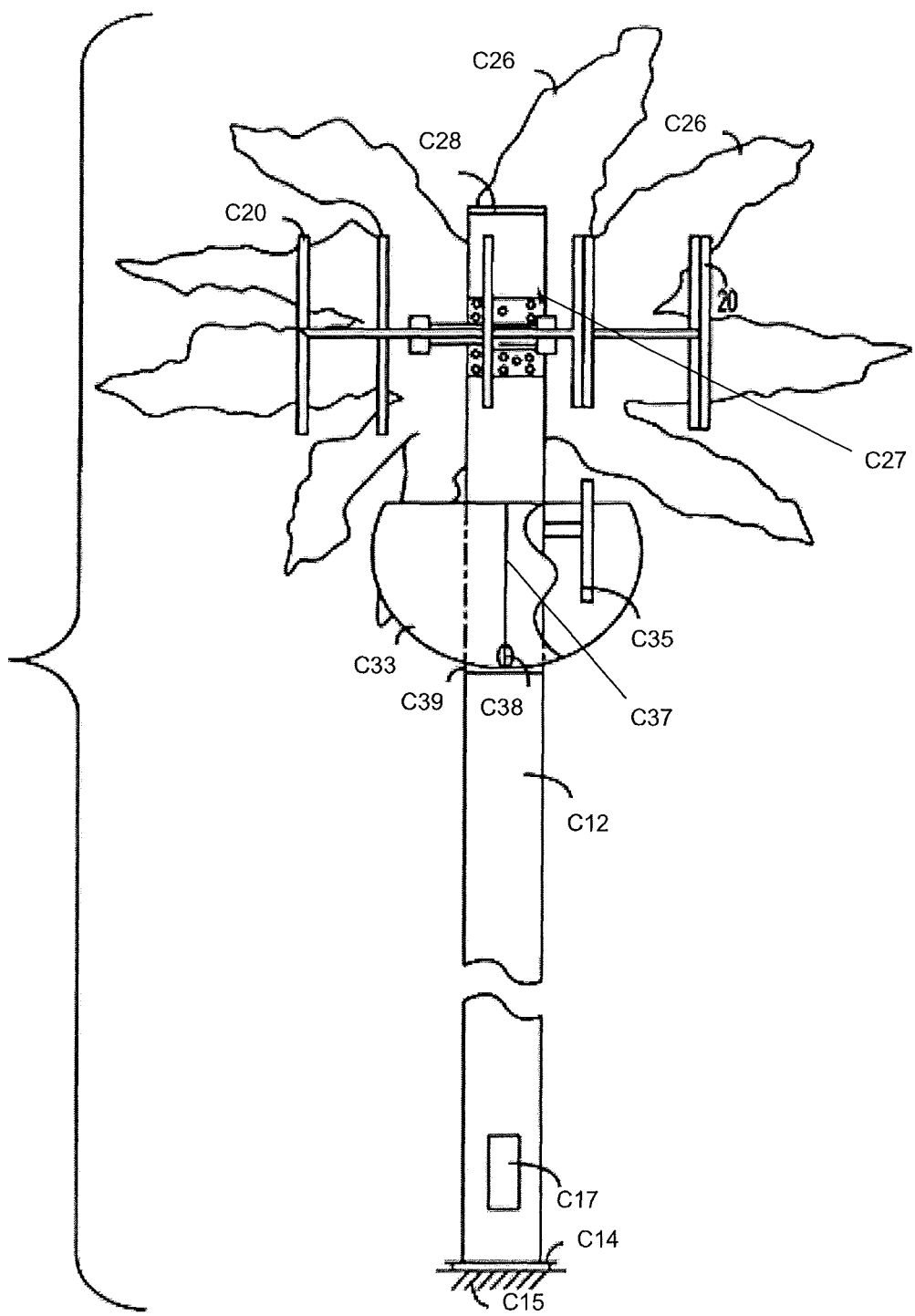
FIG. 67 is an alternative embodiment of the antenna structure depicted in FIG. 66, adapted to accommodate a second set of antennas that are mounted within a simulated growth pod.

A first embodiment of this invention in which the antenna tower is formed as a simulated palm tree is illustrated in FIGS. 66 and 67. The tower structure is shown generally at C10, with a tubular pole C12 serving as the trunk of the palm tree. Pole C12 may be fabricated from metal, concrete, or a fiber reinforced composite, commonly referred to as FRC. By way of illustration, pole C12 may suitably comprise a tubular steel pipe having a diameter of eighteen to twenty four inches with a wall thickness ranging from three-sixteenths to one-half inch. The overall height of the tree antenna tower C10 may range from about forty to more than two hundred feet.

The lower end of pole C12 is secured fixed to a support so that the pole is held in a secure upright position. That may be done, for example, by burying the lower end of the pole in the ground or by welding the pole end to a butt plate C14 which, in turn, is fixed to a foundation C15 that suitably may be a concrete monolith. Ports C17 are provided near the bottom of pole C12 to allow entry of communications cables that pass through the interior of pole C12 and connect to antennas C20 which are mounted on the pole near the top thereof. Antennas C20 are attached to pole C12 by means of an antenna bracket sub-assembly C24 that is shown in more detail in FIG. 71. A plurality of palm fronds C26, suitably on the order of sixty, are attached to pole C12 adjacent to antennas C20 by means of frond bracket sub-assemblies C27 which are shown in more detail in FIGS. 69 and 70. The top of pole C12 is closed by a weatherproof cap C28 to protect the wiring and other electronic components that are located within the pole. Also, the exterior of pole C12 is clad by a layer of molded and colored urethane or other suitable polymer to simulate the texture and appearance of a real tree trunk.

The realistic appearance of the cladding that forms the surface of the tree plant trunks, and of the tree branches as well, is obtained first by forming a mold from tree plant parts, either bark or branch, of the pine, or palm, or other plant species tree that is being emulated. Segments of branches or bark are then cast in the mold from a polymeric material such as polyurethane. The surface of the simulated tree plant part is colored to match the local foliage. Coloring is preferably accomplished in a two-step fashion. A pigment or other coloring agent is added to the polymeric material used to make the casting to obtain the base coloration of the tree part. Then, darker highlights are added by painting accent areas to more closely match the coloration of the natural tree part.

FIG. 67 illustrates another embodiment of the palm tree antenna tower shown in FIG. 66. In this embodiment a pod structure C33 that mimics the new growth pod, or pineapple, found on palm trees is mounted underneath the frond brackets C27. Pod structure C33, shown in partial break away view, is arranged for the deployment of a set of antennas C35 therein. That set of antennas may be the only antennas carried by the tree tower, or it may be a second set of antennas together with associated hardware. Pod structure C33 preferably is of a generally hemispherical shape, open at the top, and is molded of a fiber reinforce composite or other material that is essentially transparent to electromagnetic radiation. It is preferred that pod C33 be molded in either two or three segments that connect along joints C37. One or more drain ports C38 are provided at the bottom of pod C33 to prevent rain water from collecting therein. The pod segments are secured to pole C12 by means of clamp means C39 at the lower margin of pod C33.

Figure 69:
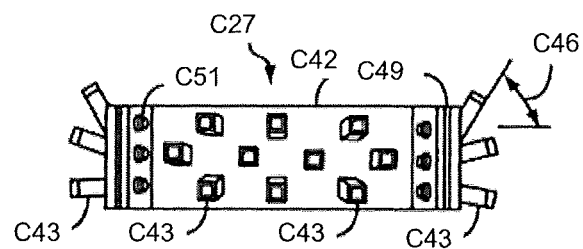
FIG. 69 is a side view of a bracket sub-assembly arranged to securely hold a plurality of palm fronds.
Figure 70:
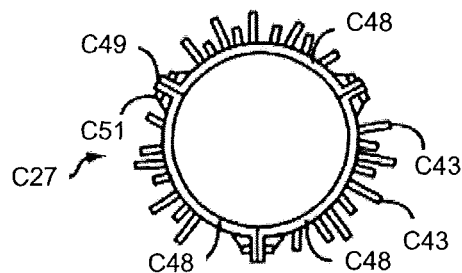
FIG. 70 is a plan view of the bracket sub-assembly of FIG. 69.

Details of frond bracket sub-assembly C27 are shown in FIGS. 69 and 70. Bracket C27, shown in side view in FIG. 69, comprises a metal collar C42 that fits around and clamps to pipe C12. A number of receiver fixtures C43 are fixed to collar C42 by welding or other suitable means. In a preferred embodiment, fixtures C43 comprise short lengths of square pipe oriented at various angles C46 to the horizontal. Angle C46 may range from about 90° above the horizontal to about 30° below the horizontal. Collar C42 is preferably formed in segments C48, suitably three, that are fastened together at junctures C49 by means of bolts C51 to tightly clamp around the exterior of pipe C12. The vertical height of collar C42 may conveniently range from about six to twelve inches and each collar segment 48 may have attached thereto as many as ten or more fixtures C43 to hold an equal number of fronds C26.

Figure 71:
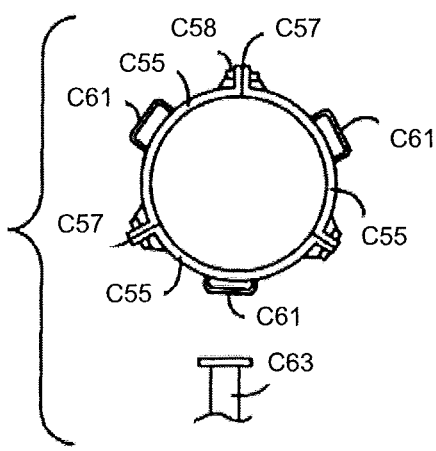
FIG. 71 is a plan view of a second bracket sub-assembly for the mounting of antennas to the antenna tower.

It is preferred to mount a pair of brackets C27 on pole C12, one directly above, and one directly below the antenna bracket sub-assembly C24 that is shown in FIG. 71. Like frond holding brackets C27, the antenna bracket C24 comprises a collar that is made up of multiple segments C55 that are fastened together at junctures C57 by means of bolts C58. Each bracket segment C55 is provided with an antenna mount C61 to which is attached an antenna arm member C63. Bracket C24 is freely rotatable about pole C12 so as to allow convenient angular orientation of the antenna structure.

Figure 72:
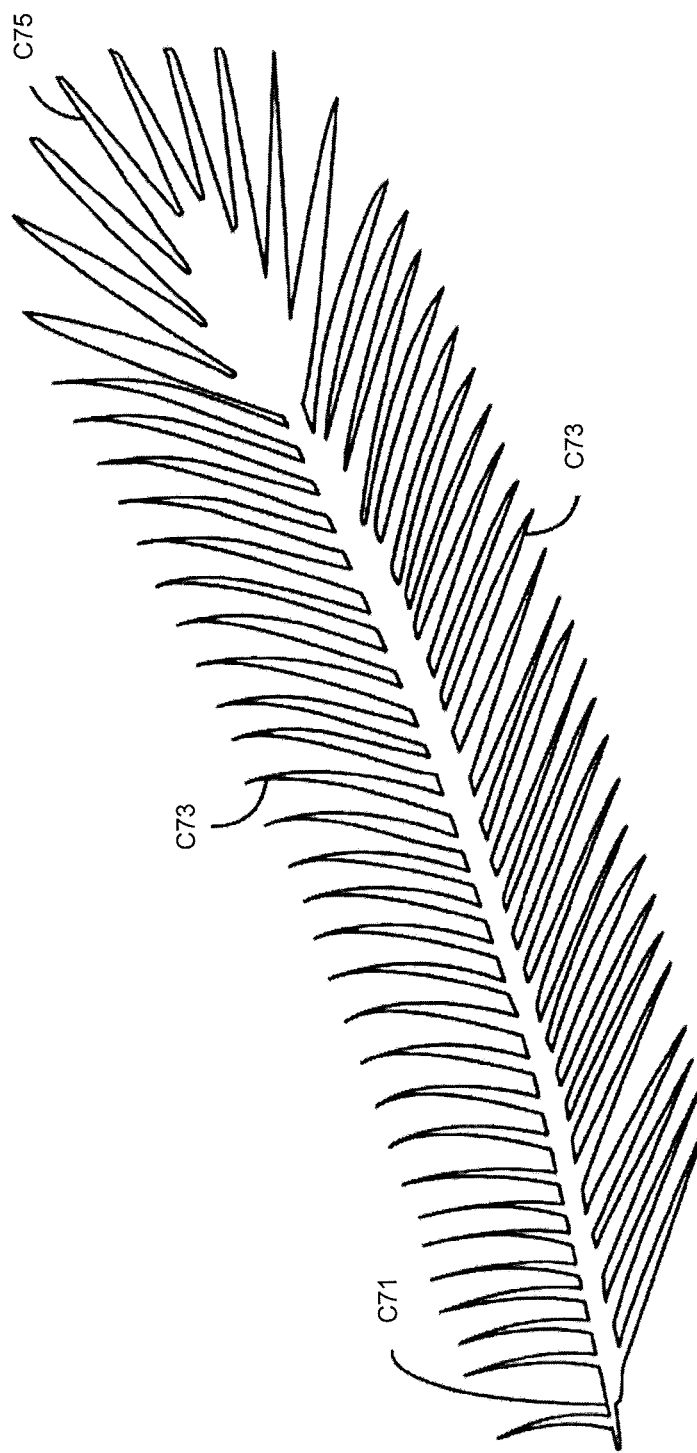
FIG. 72 is an illustration of a palm frond that forms the foliage of the tree antenna structure of FIG. 66.
Figure 76:
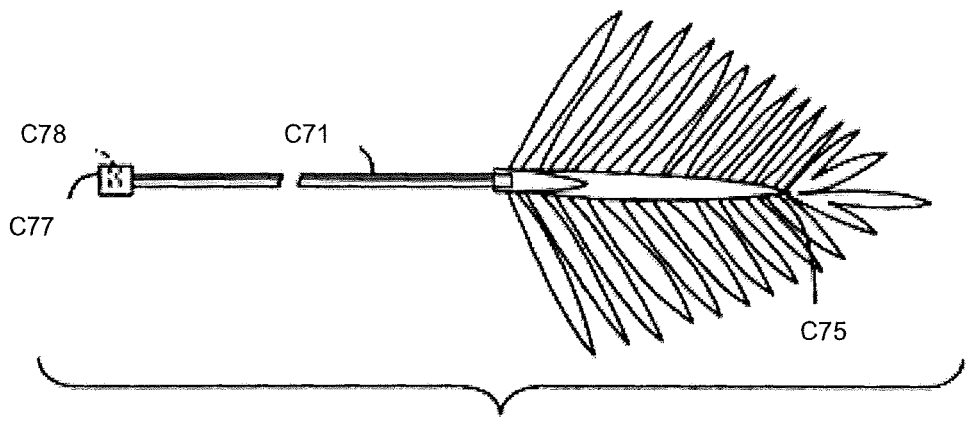
FIG. 76 is an illustration of a frond tip that makes up the terminus of the palm frond depicted in FIG. 72.

FIG. 72 illustrates an artificial palm frond that is fabricated according to this invention. It is constructed of a material, preferably a thermoplastic such as polystyrene or polyvinyl chloride, that does not interfere with the radio signals that are transmitted to and from the antennas. The frond includes a flexible rod core C71 that is suitably fabricated from a glass fiber reinforced resin. Rod core C71 is preferably of uniform polygonal cross section, has a plurality of frond leaflets C73 mounted thereon, and terminates at a frond tip C75 which is adhesively secured to an end of rod core C71. The stem end of rod core C71, opposite to the frond tip, terminates in a round or polygonal (shown here as square) metal tube member C77 (FIG. 76) that snugly fits into any one of fixtures C43. Tube member C77 is secured within a fixture C43 using adhesives, or preferably by means of a pin inserted through holes provided in the side walls of fixture C43 and through bore C78 of tube C77.

As is best shown in FIGS. 73 and 75, individual frond leaflets C73 have a pointed tip end C81 and a wider, flattened basal end C83. The frond leaflets C73 preferably display a generally triangular or shallow V-shape in cross section as is shown in FIG. 74. A hole C85 through basal end C83 is oriented perpendicular to the flattened sides of end C83. It is preferred that hole C85 be circular to accommodate a generally cylindrical insert C87 that is shown in perspective view in FIG. 77. A bore C89 that generally conforms in size and shape to the polygonal cross section of rod C71 is formed through insert C87. The axis of bore C89 is parallel to, and preferably is aligned with, the cylindrical axis of hole C85.

Individual leaflets are mounted upon rod core C71 in an alternating fashion, left and right, by threading core C71 through the bores C89 of the individual leaflets. The polygonal shape of rod core C71 and conforming bores C89 hold and maintain each frond leaflet in a set orientation. Natural palm fronds display a regularly changing orientation of the frond leaflets. Individual leaflets are oriented generally horizontally at the frond stem end near the trunk, and gradually progress to an approximate vertical orientation at the frond tip. The provision of the cylindrical insert C87 in the basal end of each frond leaflet C73 allows the orientation of each frond leaflet to be incrementally changed simply by angularly adjusting the position of insert C87 within hole C85. Insert C87 is then fixed at the desired angular position within hole C85 by gluing the insert into place. Alternatively, insert C87 and hole C85 can be dimensioned such that the insert forms a tight, press fit within the hole. A progressive adjustment of the angular position of the insert may also be accomplished by providing the outer cylindrical surface of insert C85 with small, uniform notches or serrations C91 as is illustrated in FIG. 78. Corresponding serrations would then be provided on the inner surface of basal end hole C85.

Figure 79:
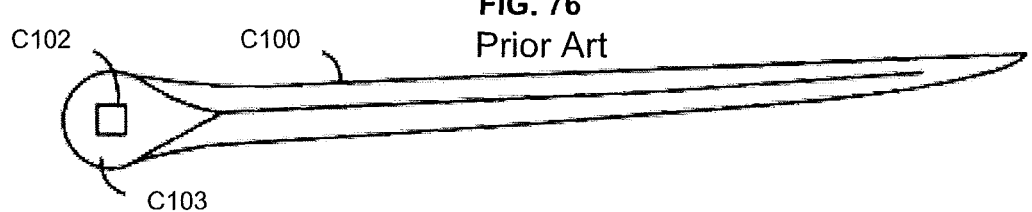
FIG. 79 is a plan view of another embodiment of a frond leaflet making up a part of the frond illustrated in FIG. 72.

Another embodiment of the palm leaflets is illustrated in FIG. 79. The leaflets C100 of this embodiment are generally similar in size and shape to the leaflets illustrated in FIGS. 73 and 75. They differ, however, in an insert (element C87) is not used and the hole or bore C102 at frond leaflet end C103 is sized and shaped to conform to the polygonal cross section of rod C71. As before, individual frond leaflets C100 are mounted upon rod core C71 in an alternating fashion, left and right, by threading core C71 through the bores C102 of the individual leaflets. This embodiment does not allow for the progressive change in the orientation of individual frond leaflets from the stem end of the frond to its tip.

Figure 68:
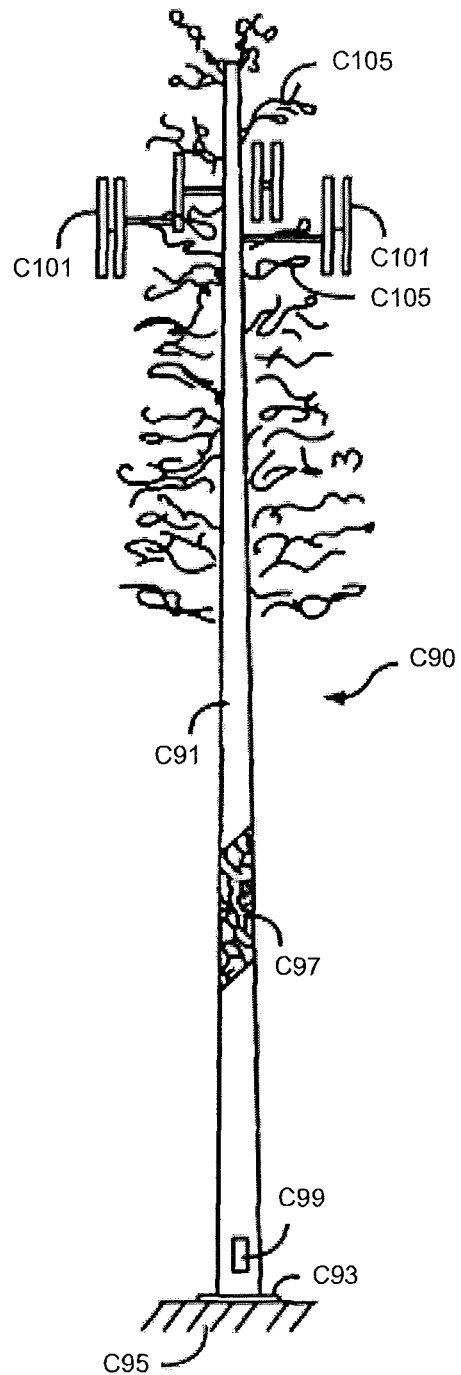
FIG. 68 is an illustration of an antenna structure according to this invention formed as a pine tree.

Turning now to FIG. 68, there is illustrated another embodiment of this invention in which the antenna tower is formed as a pine tree C90. This antenna tower preferably uses a pole C91 having a regular or step taper, decreasing in diameter from bottom to top, to more closely mirror the natural taper of a pine tree trunk. As with the embodiment of FIG. 66, the bottom of pole C91 is secured to a butt plate C93 which, in turn is fixed to a foundation C95. A layer of colored polymeric material, such as polyurethane, is molded from an actual tree and is glued to the exterior surface of pole C91 to give the appearance of a real tree trunk. Ports C99 are provided near the bottom of pole C91 to allow entry of communications cables that pass through the interior of pole C91 and connect to antennas C101 which are mounted on the pole near the top thereof. Antennas C101 are attached to pole C91 by means of the antenna bracket sub-assembly C24 that is detailed in FIG. 71. It is preferred that antennas C101 be placed to extend outward from the tree trunk pole C91 a distance at least as great as is the length of those tree branches C105 which are located in the proximity of, both above and below, antennas C102. So long as there is foliage between the antenna and pole C91 there is created enough visual distraction to render the antennas unobtrusive to the casual viewer. The installation can be made even less noticeable by painting the antenna elements in a camouflage pattern of browns and greens.

Figure 80:
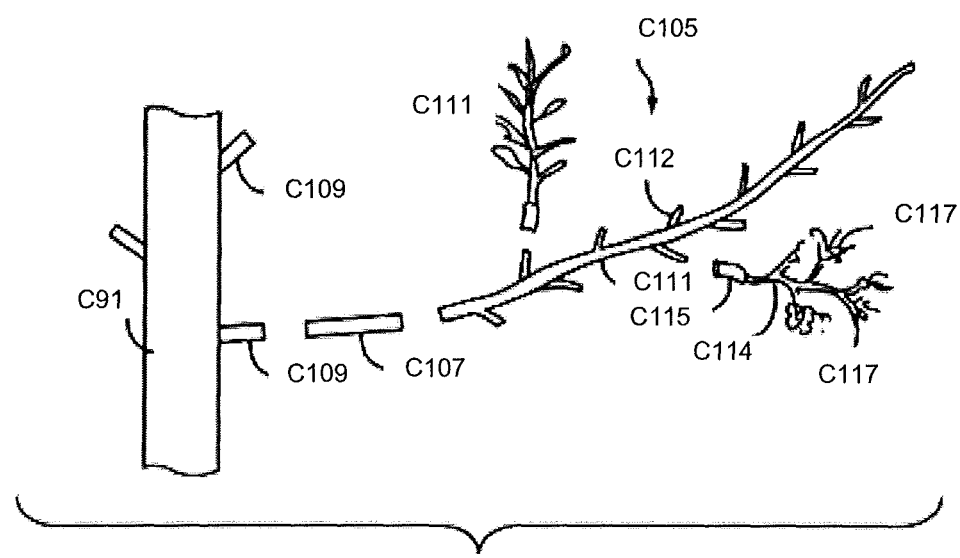
FIG. 80 is a break away view of foliage suitable for use with the embodiment of FIG. 68, as well as the manner in which the foliage is mounted.

FIG. 80 shows in a break away view of the tree branches that are attached to the trunk pole C91. The artificial branches C105 comprise a basal tube mount C107 that serves as a junction between a receiver stub bracket C109, similar to fixture C43 shown in more detail in FIG. 81, and a branch spine C111. Branch spine C111 is fabricated from a structural plastic, such as a glass fiber reinforced resin, by forming a split mold using as a pattern an actual tree branch trimmed of foliage, and with the side branches cut to short stubs C112. In like fashion, side branches C114 are cast separately and are later attached to a stub branch C112 by means of connectors C115. Artificial foliage C117, similar to that used in artificial Christmas trees except made with plastic windings rather than metal, are then attached to the side branches C114. The resulting tree antenna tower is remarkably unobtrusive, particularly in locales having natural pine trees in relatively close proximity. As with the embodiment of FIG. 66, the materials from which the limbs, branches and foliage have been fabricated are selected so as not to interfere with the transmission of radio signals to and from the antennas.

Figure 81:
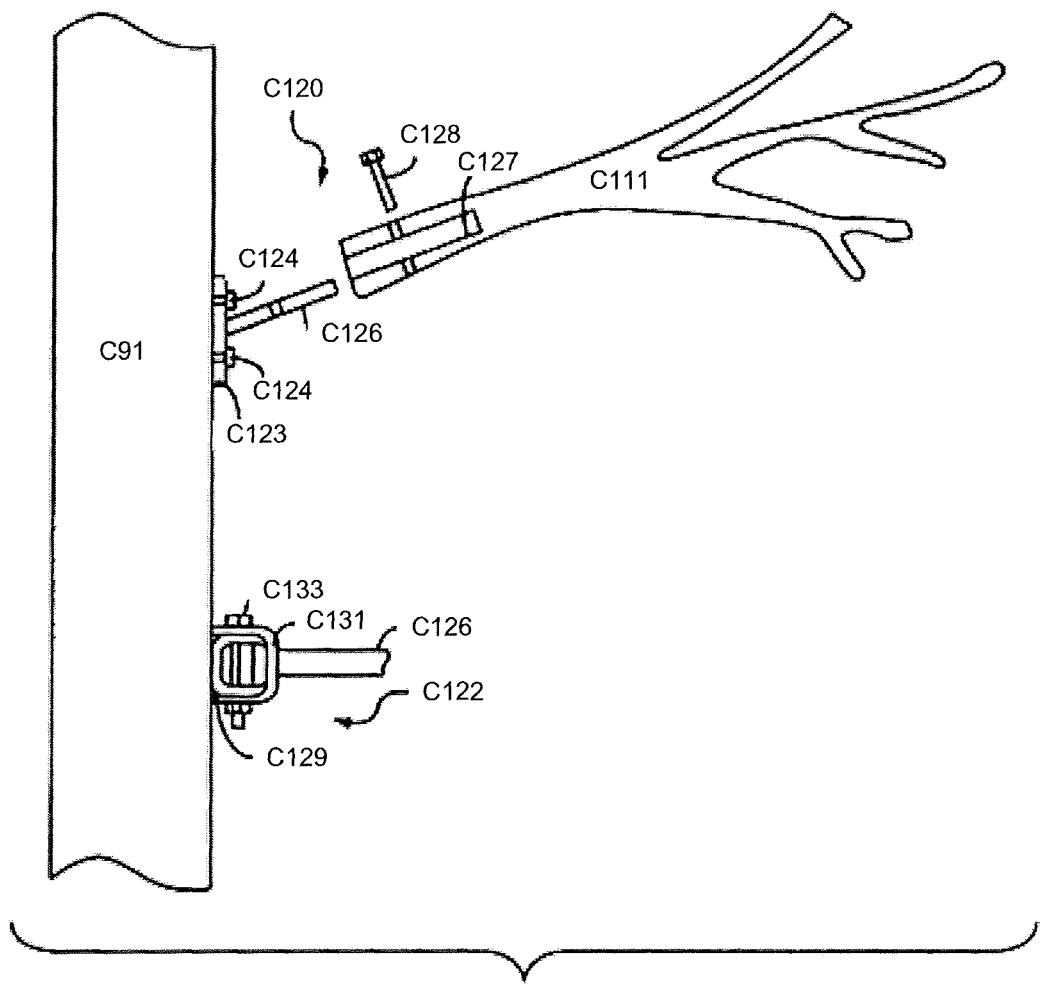
FIG. 81 is a detail view of the foliage mounting means of FIG. 80.

Referring now to FIG. 81, there is shown two different bracket means C120, C122 for attaching foliage branches to a main tree trunk pole C91. Bracket means C120 includes a plate C123 that may be attached to trunk C91 by means of studs C124 which pass through plate C123 and are threaded into tapped holes in the wall of pole C91. A rod member C126 extends outwardly from plate C123 to connect with and support a tree branch C111. Tree branch spine C111 may connect to rod C126 using sleeve C107, as is shown in FIG. 80 or, if branch C111 is large enough, may be inserted into a hole C127 that is provided at the basal end of branch spine C111 as is illustrated. The branch C111 is secured to rod C126 by means of a pin or bolt which passes through holes that are provided in both the pin and branch.

Bracket means C122 comprises a box member C129 that is attached to trunk C91, suitably by welding. A C-shaped channel fixture C131 is sized to fit over box C129 and is attached thereto by means of a bolt or pin member C133 which passes through holes provided in box C129 and channel C131. As in bracket C120, a rod member C127 extends outwardly from channel C131 and is arranged for connection to a tree branch in the manner previously described. The angle to the horizontal made by rod C127 may be varied to conform to the branch pattern displayed by the tree species that is being emulated.

Figures 82, 83:
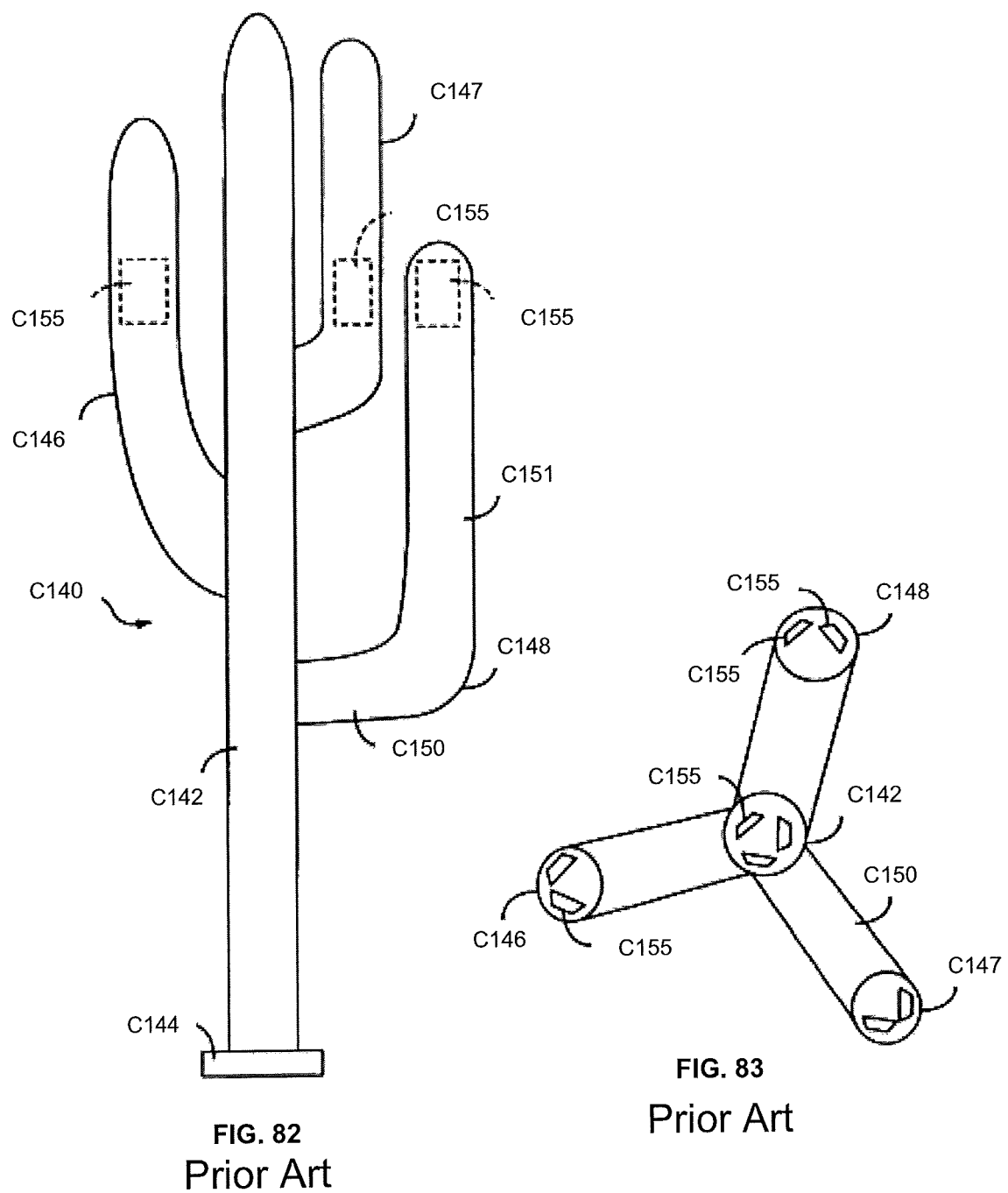
FIG. 82 is an illustration of an antenna structure according to this invention formed as a saguaro cactus.
FIG. 83 is a plan view of the antenna structure of FIG. 82.

Referring now to FIGS. 82 and 83, there is shown another embodiment of this invention in which an antenna tower C140 is structured in the form of a saguaro cactus. The saguaro cactus is native to the Sonoran desert area of the American southwest, and grows in nature to heights of 50 feet or more. In this embodiment, the main trunk or stem C142 comprises a pole of generally uniform diameter that is fabricated from metal, concrete, or a fiber reinforced composite. The lower end of stem C142 is attached to a plate C144 or other suitable mounting means to position the tower in a stable, upright position. The exterior of stem C142 is clad with a layer of molded and colored urethane or other suitable polymer to simulate the surface of an actual saguaro cactus. The exterior cladding is obtained by forming a mold from the surface of an actual cactus and making a casting in that mold from a polymeric material such as polyurethane.

A plurality of branches, preferably three, extend from stem C142. Those branches, C146, C147, and C148, are positioned at the mid to upper level of stem C142. As is shown best by branch C148, each branch includes a generally horizontal segment C150 that extends outwardly from the stem and a longer vertical segment C151. The branch surfaces are covered with a cladding formed in the same way as that used for the stem C142. In a preferred embodiment (best shown in FIG. 83), the three branches are positioned equiangularly 1200 apart around stem C142 so that the vertical segments C150 of each branch form a generally equilateral triangle.

An antenna array that comprises at least one, and preferably a pair, of antennas C155 are mounted within the vertical segment C151 of each branch. Another antenna array C157 may be mounted within stem C142 itself, preferably near the top thereof. The branches may be positioned on stem C142 such that a portion of the vertical segment C151 of each branch overlaps. That arrangement allows the height of antennas C155 in each branch to be the same, although the antennas can be placed at different heights as well. It is necessary that the portion of the branches (and of stem C142) that are adjacent the antenna array be fabricated from a material that will not interfere with the transmission of radio signals to and from the antennas.

For that reason it is preferred that, at least the vertical segment of branches C146, C147 and C148, and the upper portion of stem C142 be fabricated from a structural polymer such as a fiber reinforced resin.

The invention has been described in relation to preferred embodiments thereof that are illustrated in the various Figures. It must be understood that other variations of the invention will be apparent to those skilled in the art.

The following discussion describes in detail one embodiment of the invention and several variations of that embodiment. This discussion should not be construed, however, as limiting the invention to those particular embodiments. Practitioners skilled in the art will recognize numerous other embodiments as well.

Figures 84, 85, 86, 87, 88, 89:
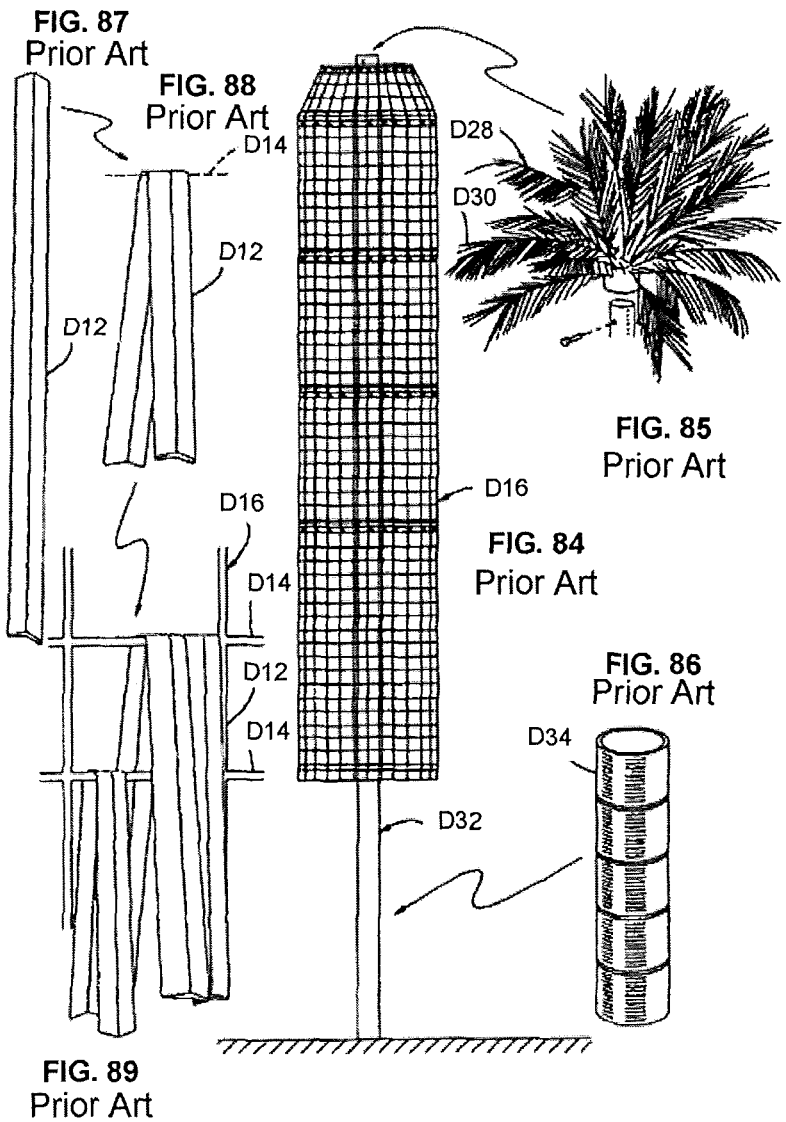
FIG. 84 is a side view of an antenna support structure having features of the invention.
FIG. 85 is an isometric view of a top portion useable in the support structure of FIG. 84.
FIG. 86 is an isometric view of a base cover useable in the support structure illustrated in FIG. 84.
FIG. 87 is an isometric view of a drooping member useable in the invention.
FIG. 88 is an isometric view of the drooping member illustrated in FIG. 87, showing the strip folded in half.
FIG. 89 is an isometric view of several drooping members of the type illustrated in FIG. 87, showing how such drooping members are hung on the netting of the support lattice of the support structure illustrated in FIG. 84.

FIGS. 84-89 illustrate a portion of an antenna support structure D10 having features similar to that which is disclosed and claimed in my presently-pending application, except that the drooping members D12 are now folded over horizontal portions D14 of the support lattice ("netting") D16 as illustrated in FIGS. 88 and 89. The drooping members D12 can be retained on the support lattice D16 by adhesives or by any appropriate mechanical fasteners.

Figure 90:
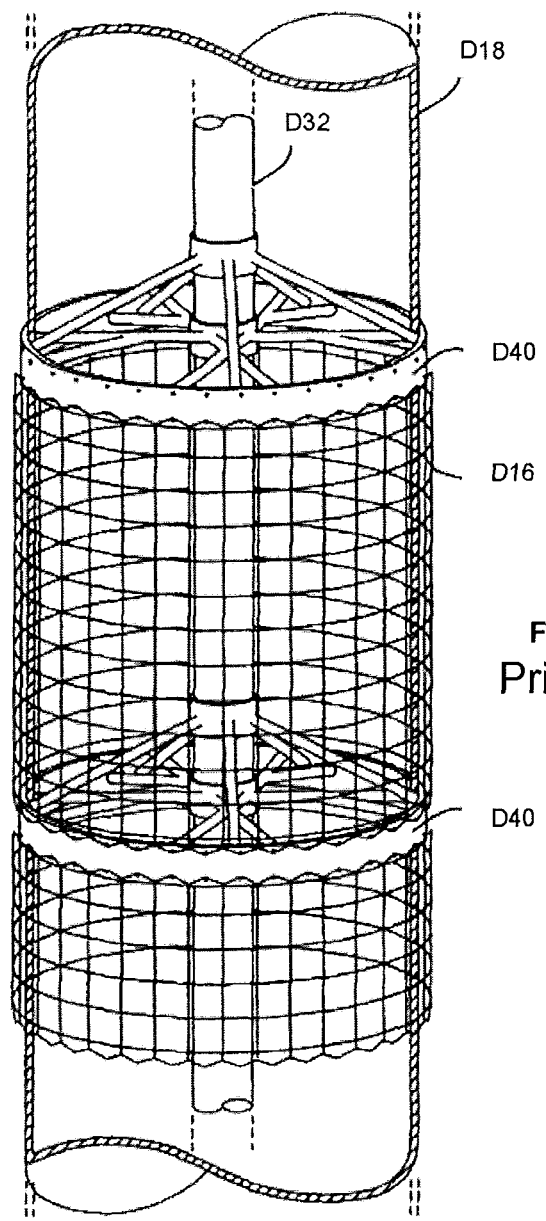
FIG. 90 is an isometric view of a section of a second support structure having features of the invention.

FIG. 90 illustrates a somewhat different embodiment. In this embodiment, a tube D18 is disposed inside the support lattice D16 and outside of the antenna receptor members D20. The tube D18 is made from a plastic or other material which is non-reflective of radio waves. In this embodiment, access to the antenna receptor members D20 must be from below the support lattice D16. This embodiment preserves the round configuration of the simulated palm tree skirt at all times, even in windy conditions. The tube D18 also prevents the support lattice D16 and the drooping members D12 from contacting the antenna receptor members D20.

Figure 91:
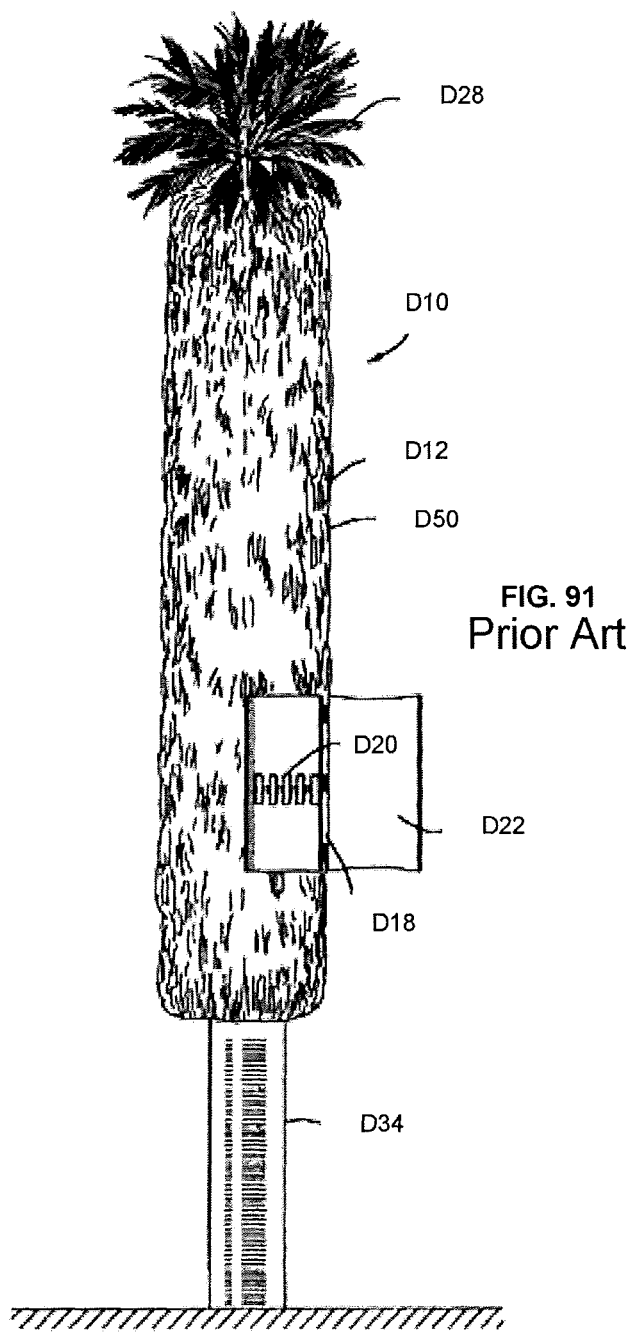
FIG. 91 is an isometric view of a third support structure having features of the invention.
Figure 92:
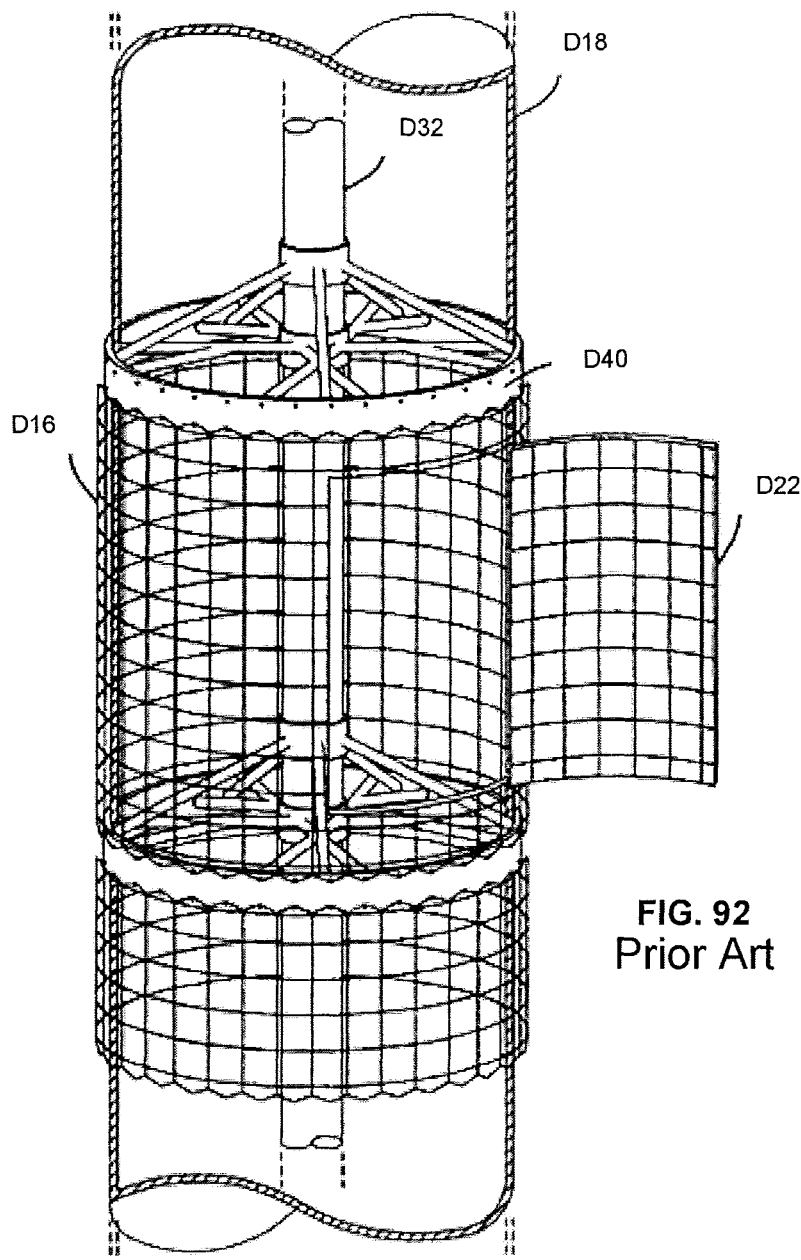
FIG. 92 is a detailed view of the support structure illustrated in FIG. 91.

FIG. 91 illustrates an embodiment similar to that which is illustrated in FIG. 90, except that an access door D22 has been provided in the tube D18 to provide convenient access to an antenna receptor member D20. FIG. 92 is a detailed view of this embodiment illustrated in FIG. 91 showing how the access door ("inspection door") D22 provides access through the support lattice D16 and through the tube D18 to the interior of the support lattice D16.

Figure 93:
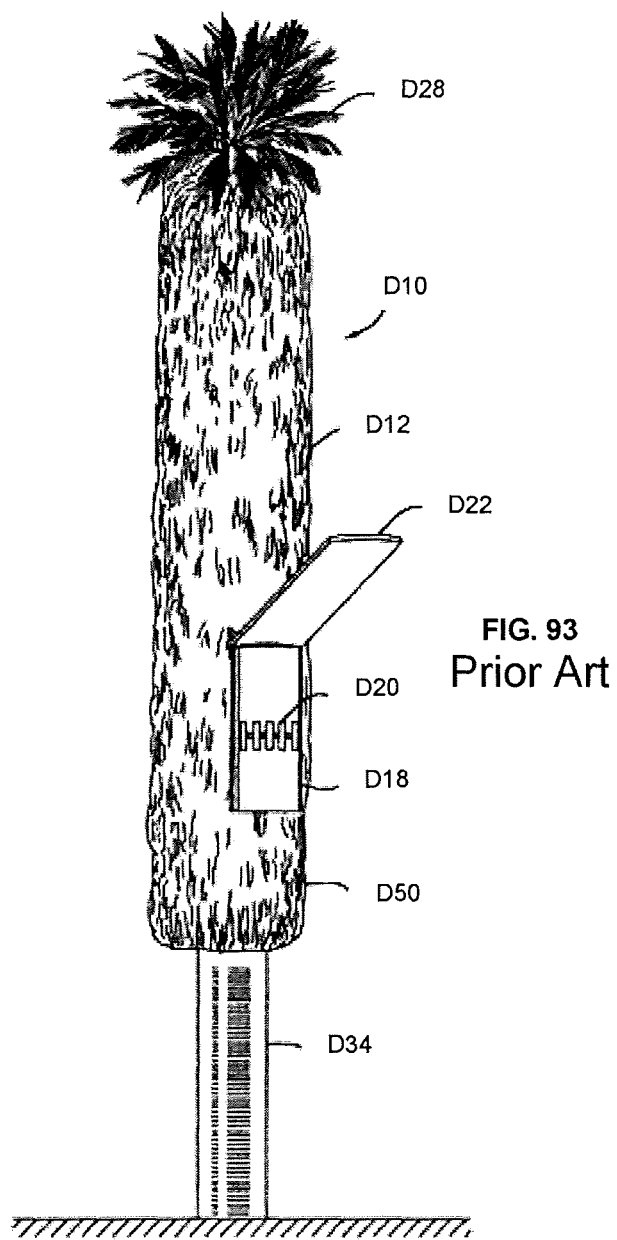
FIG. 93 is an isometric view of a fourth support structure having features of the invention.
Figure 94:
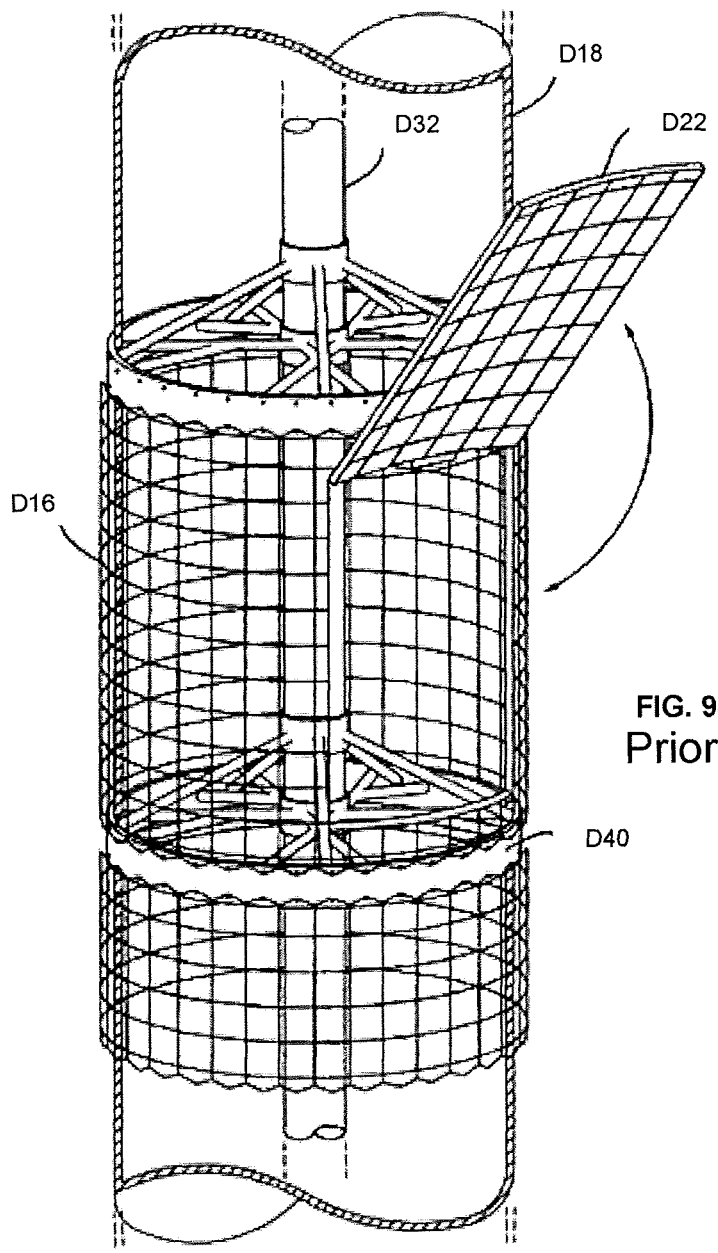
FIG. 94 is a detailed view of the support structure illustrated in FIG. 93.
Figure 101:
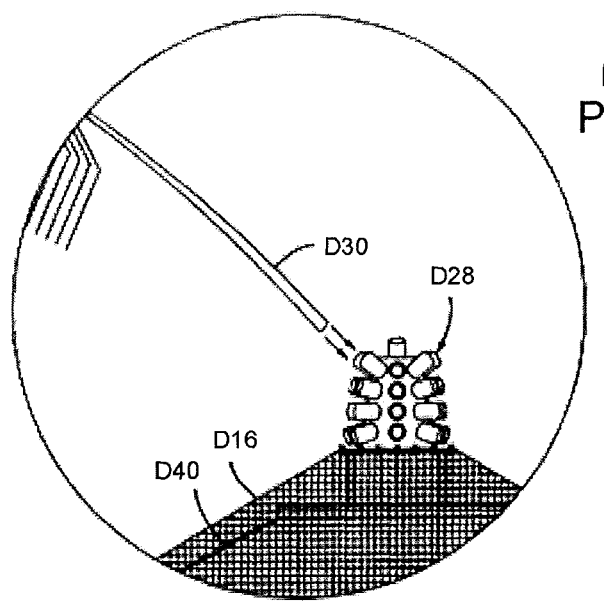
FIG. 101 is an isometric view of a top portion of the support structure illustrated in FIG. 99.
Figure 102:
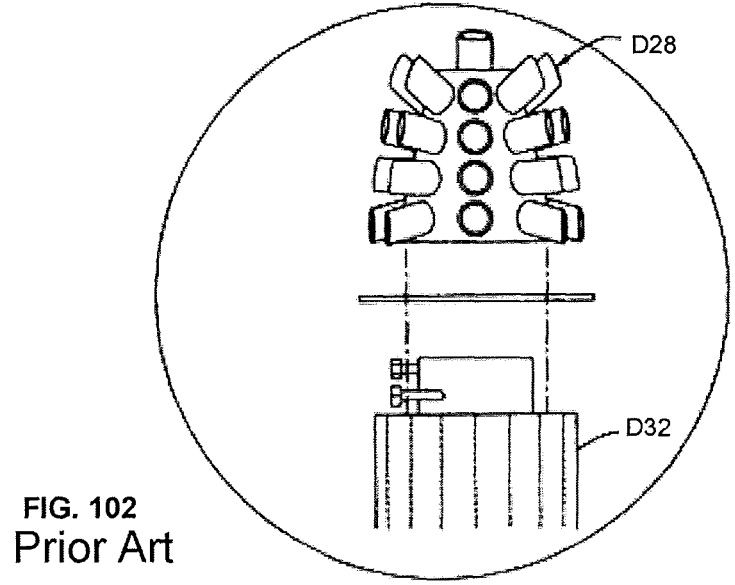
FIG. 102 is an isometric detail view of the top portion illustrated in FIG. 101.
Figure 103:
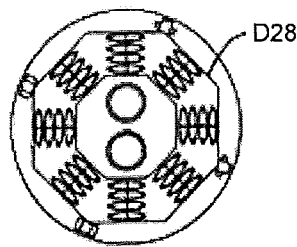
FIG. 103 is a plan view of the top portion of the support structure illustrated in FIG. 101.
Figure 104:
FIG. 104 is a detailed side view of a portion of the top portion illustrated in FIG. 101.
Figure 105:
FIG. 105 is a detailed side view of a portion of the top portion illustrated in FIG. 101.

FIGS. 93 and 94 illustrate a slightly different embodiment. In this embodiment, the access door D22 is hinged across the top of the opening, rather than along the side of the opening. This embodiment has the additional advantage of minimizing the chance that the access door D22 will be blown open in a strong wind.

FIGS. 95-98 illustrate yet another embodiment of the invention. In this embodiment, the support lattice D16 is replaced with a perforated cylinder D24 made from a material which is non-reflective to radio waves. The drooping members D12 are supported by the perforated cylinder D24 by being clipped or otherwise attached within the perforations D26 in the cylinder D24.

FIGS. 99-116 illustrate yet another embodiment of the invention. FIG. 99 illustrates this embodiment with the support lattice D16 in place. FIG. 100 illustrates this embodiment with the support lattice D16 removed and with typical specifications listed.

FIGS. 101-105 illustrate the top portion D28 of the support structure D10 into which can be disposed green members D30 which typically are simulated green palm fronds. The top portion D28 can be a welded steel structure which is mechanically held in place atop the support pole ("monopole shaft") D32 with what can be stainless steel pins. In a typical embodiment, the top portion D28 is made from a one quarter inch thick hot roll steel material which has been galvanized with a green powder coat. The uppermost portion of the support lattice D16 can be mechanically anchored between the top portion D28 and the support pole D32. The green members D30 can be held in place by two stainless steel pins opposed to each other at 90°. Typically, the stainless steel pins are about one inch in diameter. In a typical embodiment, the green members D30 are disposed within the top portion D28 at a 15' offset for each column of green members D30. This replicates the natural placement found on a *Washingtonia Filifera*.

Figure 106:
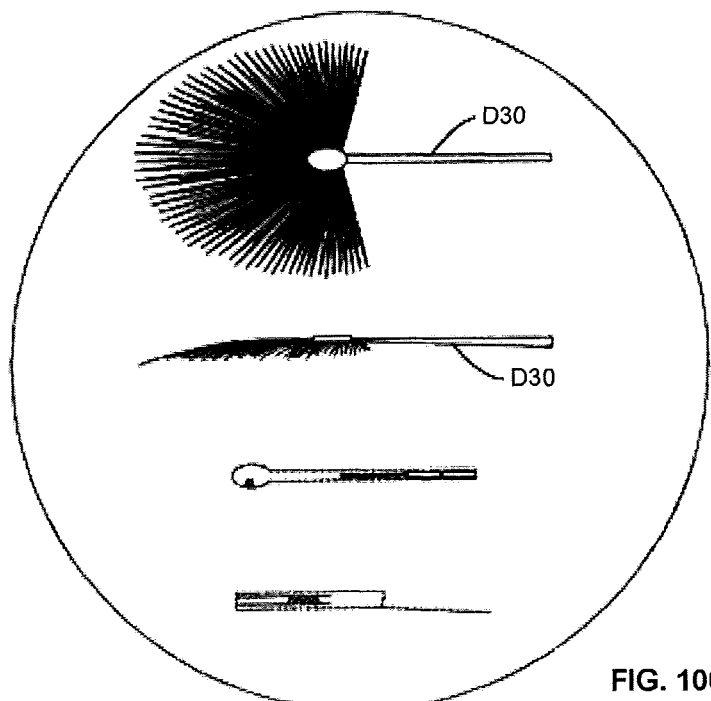
FIG. 106 consists of four detailed views of simulated palm fronds useable in the invention.

FIG. 106 illustrates four views of a typical green member D30 useable in the invention. Each of these green members D30 has the appearance of a palm frond. The frond can be made of materials that simulate natural movement of palm fronds in dynamic wind conditions. Such materials may include a polyurethane shaft to provide the linear and rotational flex found in natural palm fronds. Polyurethane also provides a "memory" ensuring that the shaft returns to its original shape after periods of great flexing. The fan portion of the green member D30 can be composed of acrylonitrile styrene acrylate, such as BASFs Loran S. Such materials ensure long-term weatherability for both structural integrity and color fastness.

FIGS. 107 and 108 illustrate components of a typical base cover D34 useable in the invention. This base cover D34 comprises an inner member D36 made from a hinged pair of carbon steel members, such as members made from/inch hot rolled carbon steel. An outside member D38 is attached to the inner member D36. The outside member D38 is designed to simulate the base of a palm tree. In a typical embodiment, the outside member D38 can be made from a polyurethane (U.V. inhibited).

FIGS. 109-113 illustrate a support member D40 useable in this embodiment. The support member D40 is made from a pair of opposed fiberglass rings D42 which are assembled to one another using fiberglass bolts. The support member D40 is held in place on the support pole D32 by opposed sets of brackets D44. These support members D40 are non-R.F. reflective.

Figure 115:
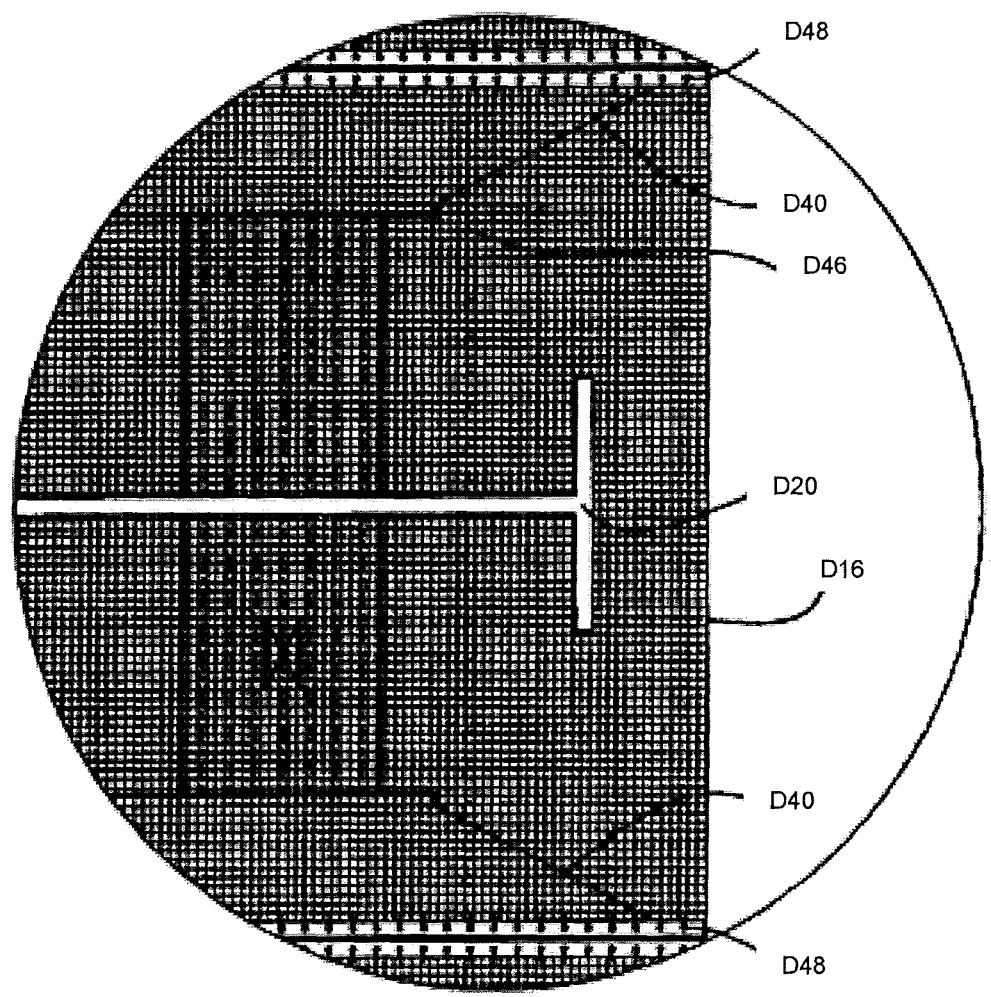
FIG. 115 is a detailed view of a support lattice useable in the invention.
Figure 116:
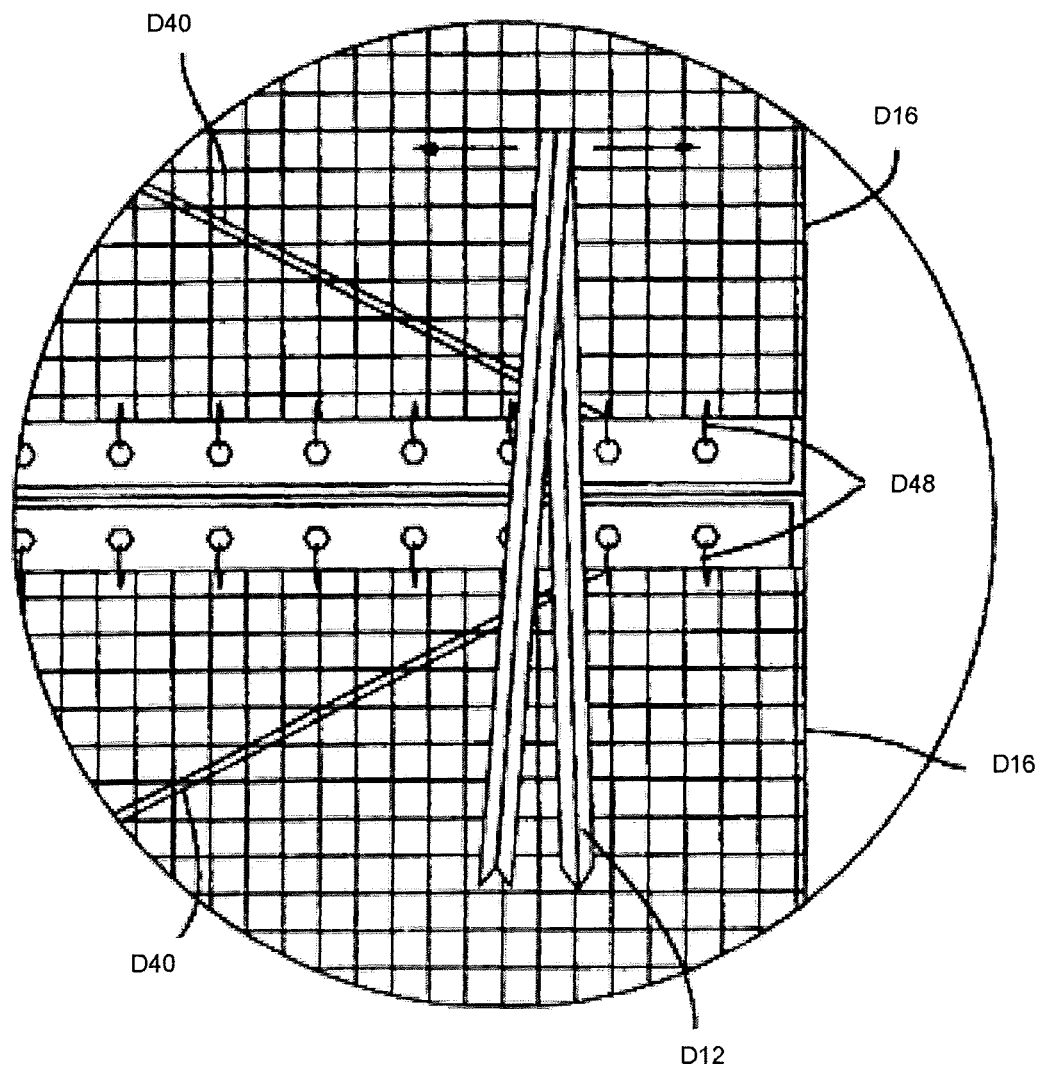
FIG. 116 is a second detailed view of a support lattice useable in the invention.

FIGS. 115 and 116 illustrate how the support lattice D16 is attached to the support member D40. As can be seen in the drawings, individual sections of support lattice D16 are supported at both the top and bottom by adjacent support members D40. By this design, the space between support members D40 is wholly enclosed in a "cage" having support lattice D16 for walls. This feature provides an important safety function, in that workers working between the support members D40 are prevented from falling off of the support pole D32 because of the enclosed "cage" provided by the cooperation of the adjoining support members D40 and the support lattice D16. As illustrated in FIG. 115, an access opening can be provided in the "cage" which can be closed and opened using access clips D46. The vertical openings can be disposed about every 12 feet along the circumference of the skirt. Each location can have three separate openings for easy access to all of the antenna receptor members D20.

A support lattice D16 is secured to the support members D40 by securing the lattice D10 to itself on vertical runs and to the support members D40 on horizontal runs using lattice support clips D48 which are non-R.F. reflective. Such lattice support clips D48 maintain the appearance of the uniform frond skirt and are easily opened and closed for antenna service.

The support lattice D16 can be a type D72 netting, with 1½ inch squares. Construction of the support lattice can be using 32 ends per mesh side of 840 denier nylon which is protruded with U.V. inhibitors for outdoor use. The breaking strength of such a support lattice D16 is about 864 pounds per strand (27 pounds per end). The circumference of the support lattice D16 is supported by a ¾ inch stranded nylon rope. Additional support can be provided by vertical lengths of % thick rope every two feet along the nettings 12 feet.

The drooping members D12 are composed of BASFs Loran S, ensuring the same structural and color fastness as the green fan fronds above the skirt. Each drooping member D12 is about five feet long and is folded in half over a strip of the support lattice D16 and adhered to itself. This creates a mechanical loop which is locked to the support lattice D16. The drooping members D12 are placed in horizontal rows spaced apart by about nine inches. This allows for better wind resistance. The ends of the drooping members D12 are frayed to better replicate a true frond skirt D50. Two similar but different colors are used to give the appearance of a naturally weathered frond skirt D50.

In 2008, the State of Hawaii and U.S. Department of Energy entered into a Memorandum of Understanding in order to reduce the State's dependence on fossil fuels. This later led the Governors of the State of Hawaii to create the Hawaii Clean Energy Initiative which has set the goal of providing 100% clean renewable energy by the year 2045. In 2017, about 27% of the energy provided by the Hawaiian Electric Companies including Hawaiian Electric, Maui Electric and Hawaii Electric Company came from renewable sources. The Kauai Island Utility Cooperative also shares the State's goal of providing 100% clean renewable energy by 2045. In the continental United States, about 30% of the energy which is consumed goes to transportation. The State of Hawaii has less need for heating because of its moderate climate, and on the islands transportation accounts for a higher percentage of energy use.

On the island of Kauai, a significant portion of the energy used for transportation is associated with rental cars and the tourist industry. In this regard, most of the rental agencies and cars are located near Lithue Airport, and the rental cars are used by tourists during the day and located in the parking lots of various motels during the evening. If all of the rental cars provided for use on the Island of Kauai were required to be electric vehicles, and they were fully charged at their point of origin at the rental agencies near Lithue Airport by solar palm trees and recharging stations as taught in the present invention or other effective recharging devices, and if the various motels were also incentivized by the State of Hawaii to provide electric vehicle recharging stations in their parking lots, then a large percentage of the fossil fuel consumption associated with cars on the island of Kauai could be eliminated. On Kauai, the main highways extend north between Lithue and Hanalie, and south between Lithue and Poipu.

Likewise, on the island of Maui a significant portion of the transportation energy use is associated with rental cars and the tourism industry. If the rental car agencies near Kahului Airport were required to provide electric vehicles, and the large motels on the island located on the West coast were also incentivized to provide recharging stations in their parking lots, then a large percentage of the fossil fuel consumption by cars on Maui would be eliminated and converted to renewable electric power.

The island of Oahu includes a major urban center in Honolulu, and besides the use of electric vehicles, electric trains and buses could be used to significantly reduce the use of fossil fuels. However, a large part of the island of Oahu is rural and as with Maui and Kauai the use of electric vehicles would significantly reduce dependence upon fossil fuels.

On all of the Hawaiian Islands, the major road and highways are often lined with conventional wooden utility poles that carry both electric power and communications cables. While the configuration and wiring of these utility poles will often vary depending on local energy and telecommunications requirements, an example of a common prior art utility pole 178 used to support transmission and communication lines is shown in drawing FIG. 117. In this regard, a segment of the length of the utility pole 178 has been omitted to better show certain details and structures located near the top 197. The typical utility pole 178 is about 40 feet in length and it is often buried approximately six feet into the ground support surface 36 and disposed in an approximately vertical orientation. The utility pole 178 often has three utilization spaces, namely, a supply space 181 which is closest to the top 197, a neutral space 182 which serves as a communications worker safety zone, and a communications space 183 which includes communications lines 193. The supply space 181 often includes a wire 179 located at or near the top 197 of the utility pole 178 which is connected to a grounding conductor 184 that is connected to a grounding rod 180 that penetrates into the ground 36. A conventional utility pole 178 can also possibly include a cross arm 194, two braces 195, and insulators 196 for supporting the transmission wires 185 which commonly include an A phase wire 186, a B phase wire 187, and C phase wire 188. Below the transmission wires 185 are found the local distribution wires 189 which often include a primary wire 190, a multi-grounded neutral wire 191, a step-down transformer 100, and multiple service wires 192 for local customers.

Figure 118:
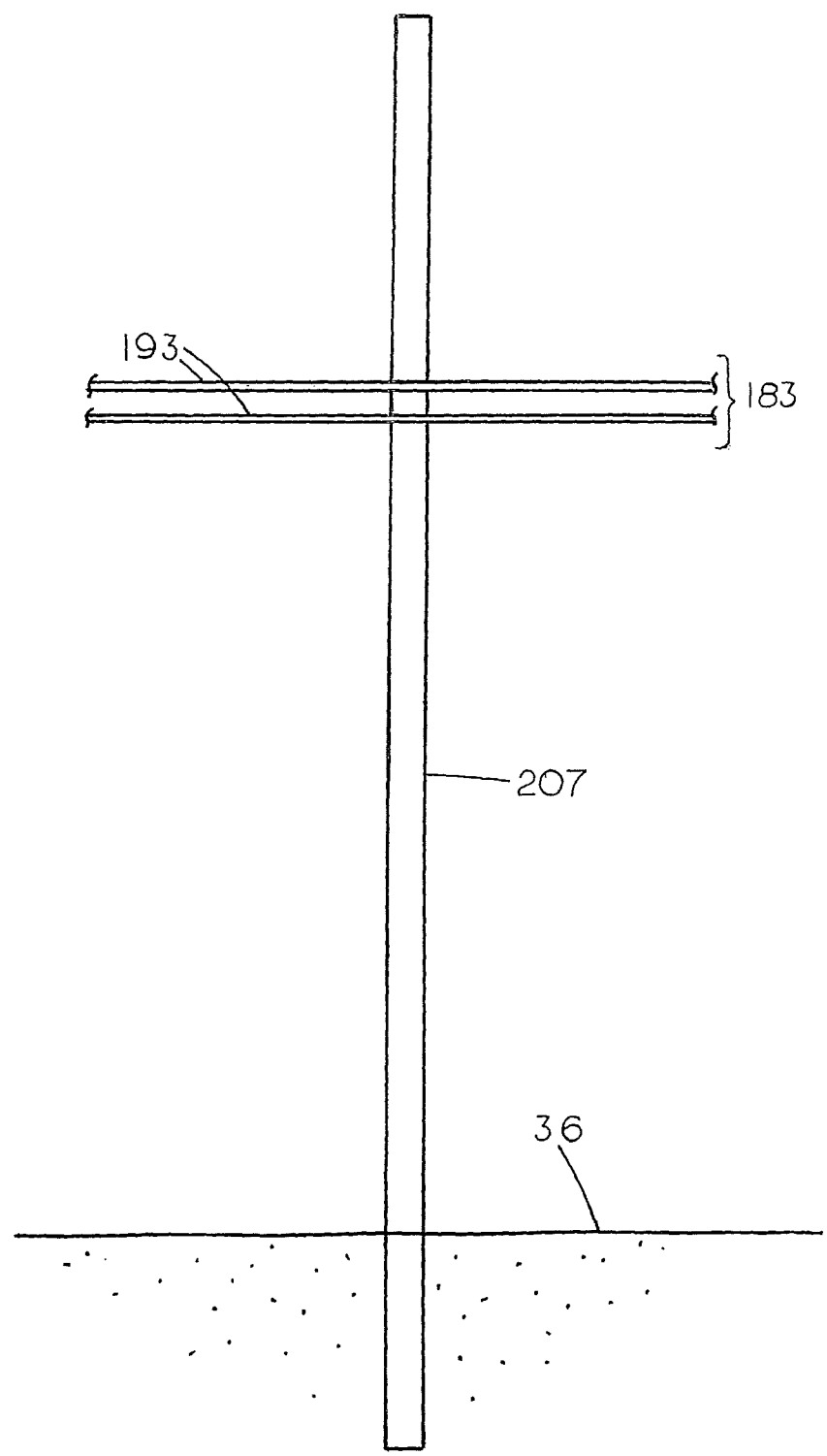
FIG. 118 is a side view of one example of a conventional utility and/or telephone pole including communication lines.

Shown in drawing FIG. 118 is an alternative metal or wood utility pole 207 which supports two communications lines 193. This utility pole 207 is only using the communications space, but could potentially include transmission wires 185 and/or distribution wires 189 in a supply space 181 and then also provide a communications worker safety neutral space 182.

Figure 117:
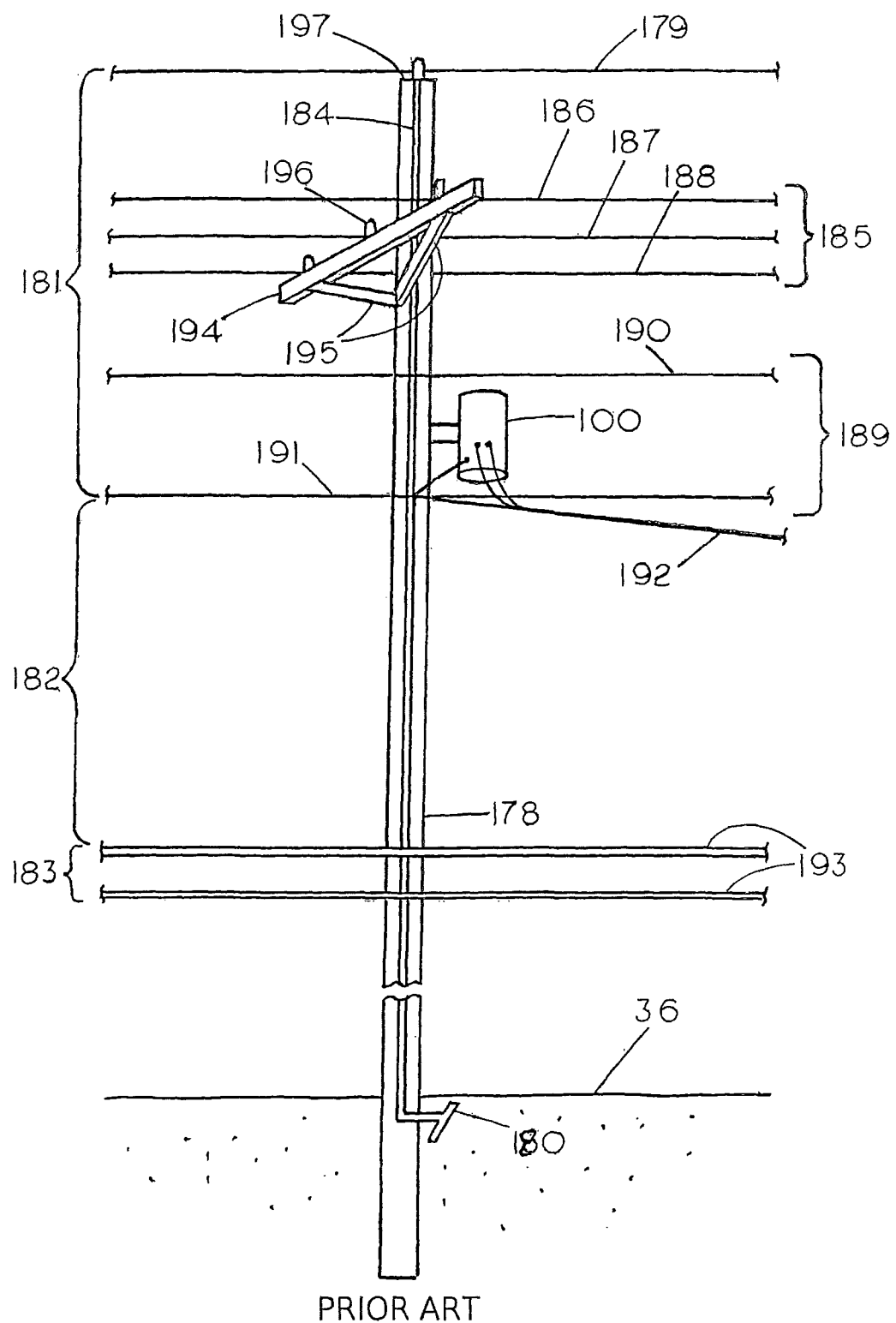
FIG. 117 is a side view of one example of a conventional utility and/or telephone pole including transmission, distribution, and communication lines.
Figure 119:
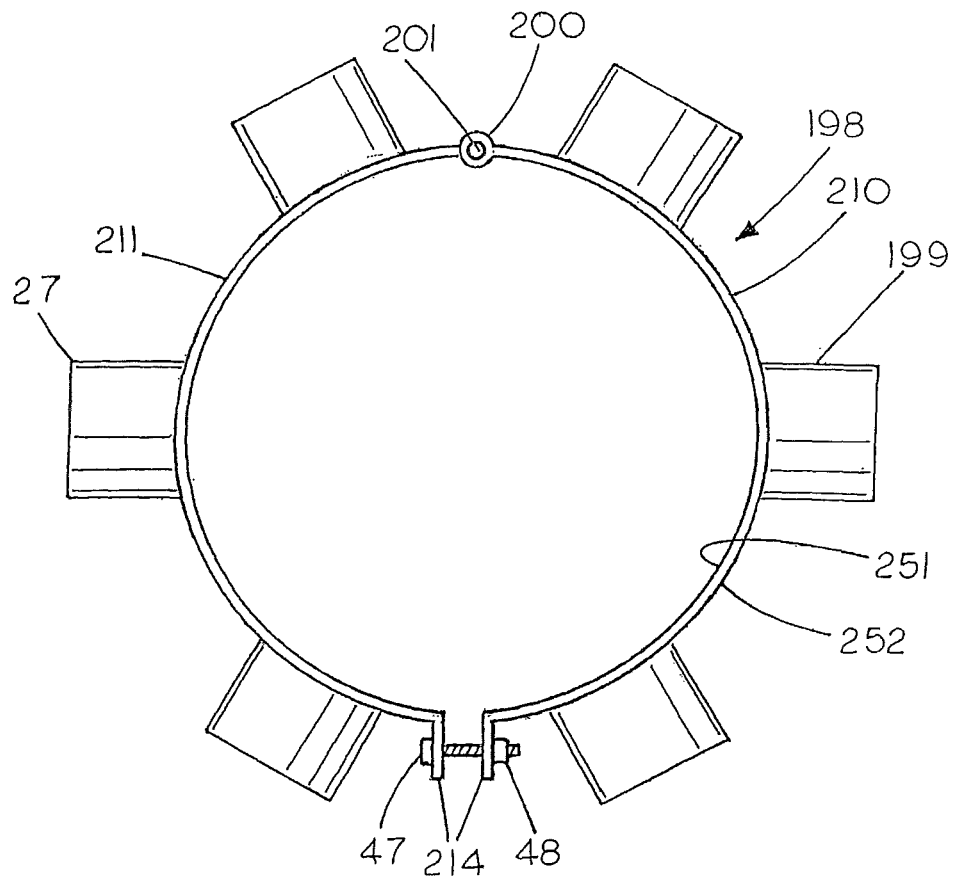
FIG. 119 is a top view of a bracket for mounting on a conventional utility and/or telephone pole.

Drawing FIG. 119 provides a top view of an illustrative and non-limiting example of a bracket 198 having an interior side 251 and exterior side 252 for mounting on a conventional utility pole similar to that shown in drawing FIG. 117. The bracket 198 includes a single layer 27 of six receptacles 199 for coupling with the stem portion 74 of six solar modules 28 resembling palm fronds. While six receptacles 199 are illustrated, the present disclosure can include any numbers of receptacles and any configurations of the receptacles are within the scope of the present disclosure. The bracket 198 can be made in various sizes for use with utility poles having different radii, diameters, and circumferences, and have opposing flange 214 portions including openings 120 for accommodating bolts 47, and the bracket 198 can thereby be tightened with the use of at least one bolt 47 and nut 48 to frictionally secure the bracket 198 to the utility pole. Further, the bracket 198 can include a right segment 210 and left segment 211 including a hinge 200 which can be connected using a hinge pin 201 and safety cotter key or pin 202, or alternatively at least one conventional bolt and nut, which can help to make the bracket 198 easier to install by allowing the bracket to be wrapped around the circumference of the pole.

Figure 120:
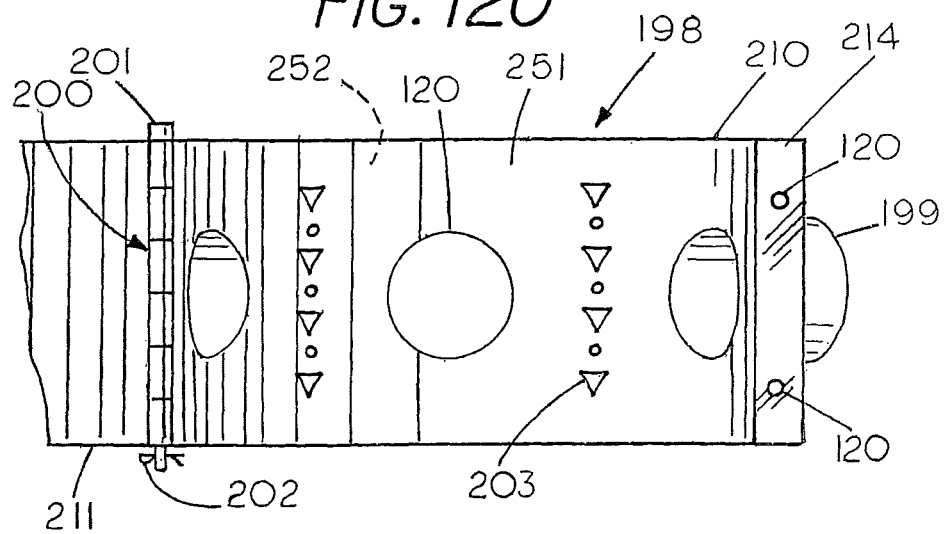
Figure 121:
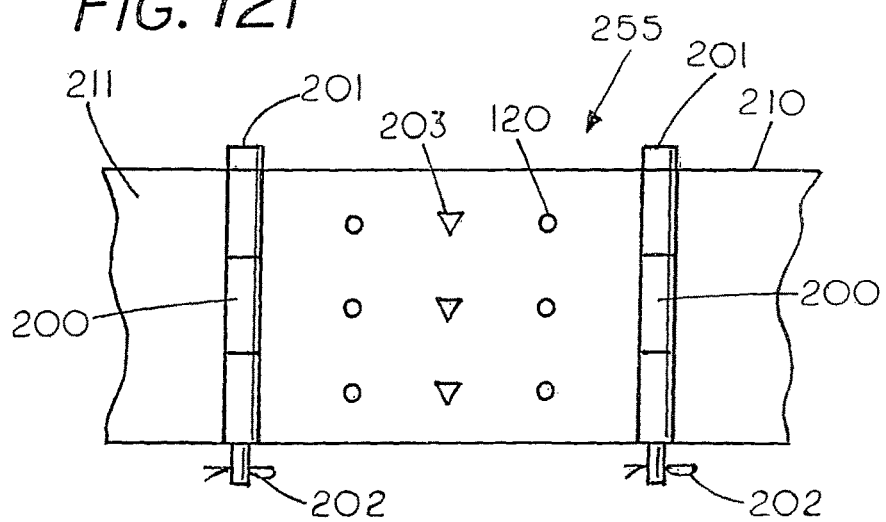
Figure 127:
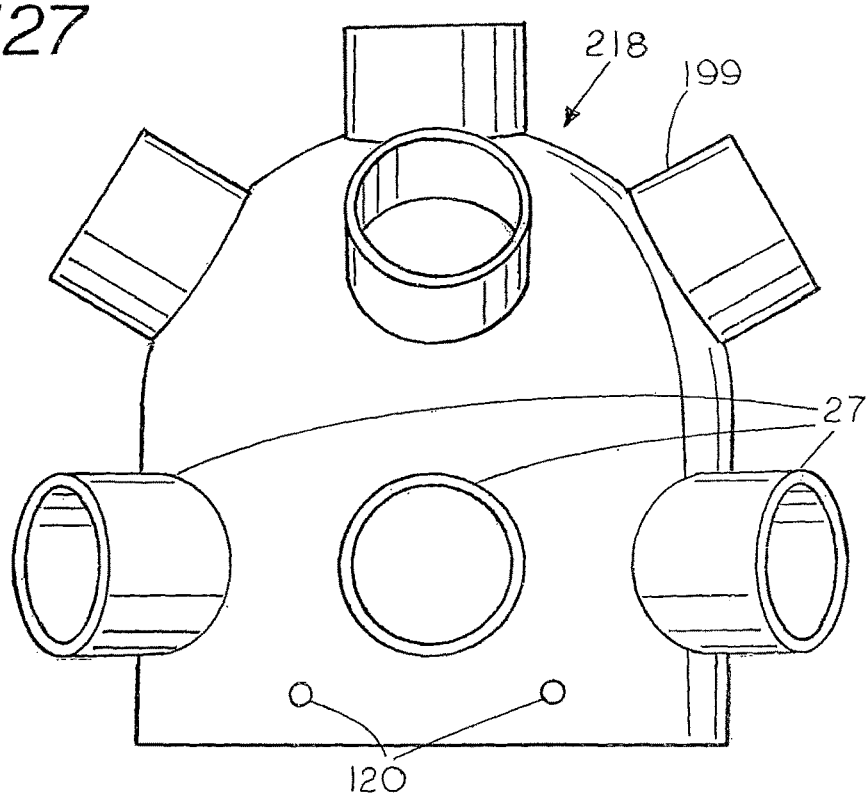

As shown in Drawing FIG. 120, the interior side 208 of the bracket 198 can also include one or more gripping members 203 configured to engage and/or penetrate the utility pole, and as shown in FIGS. 121 and 127 a bracket can also including openings 120 for permitting the use of nails or lag screws to help secure the bracket 198 during installation and afterwards.

As shown in drawing FIG. 121, the bracket 198 can include an extension segment 255 for adding to the resulting circumference and accommodating wider utility poles. The extension segment 212 can be made in various widths, and/or can be used in multiple numbers to accommodate conventional utility and/or telephone poles of various diameters and circumferences.

Figure 122:
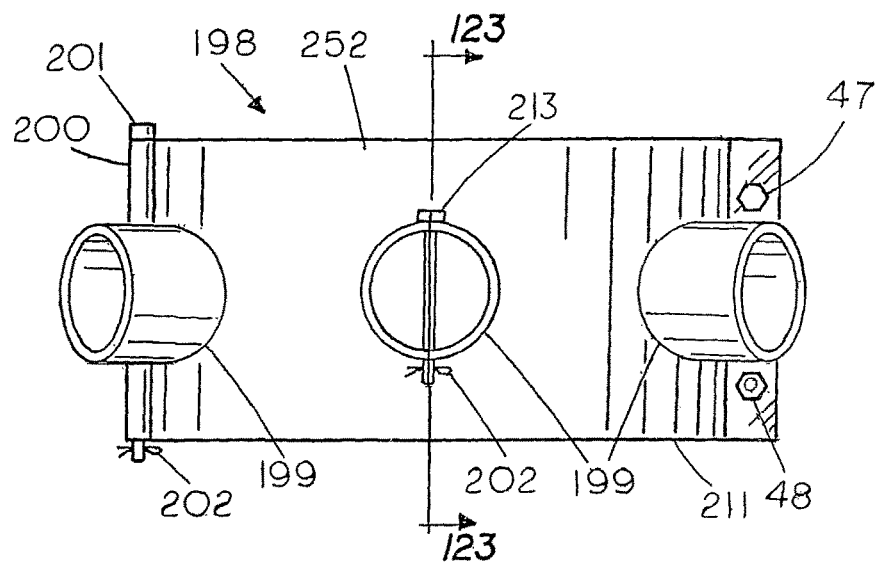

As shown in drawing FIG. 122, the exterior side 252 of the bracket 198 can include six receptacles 199 for coupling with the stem portions 74 of the solar modules 28, but other numbers of receptacles and configurations are possible. Further, multiple stem pins 213 and corresponding safety cotter pins 202, or alternatively nuts and bolts can then be used to secure the stem portions 74 of the solar modules 28. While, stem pins 213 with corresponding safety cotter pins 202 and nuts and bolts are disclosed, any connecting mechanism can be utilized, including but not limited to a camming member and an adhesive.

Figure 123:
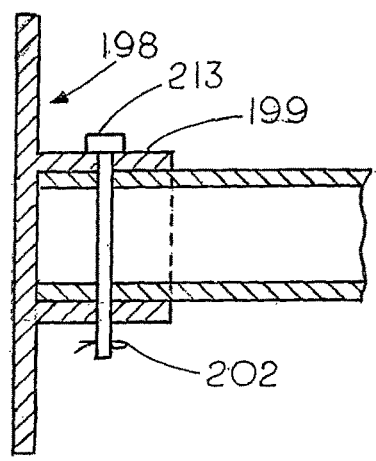

Shown in drawing FIG. 123 is a cross-sectional view of one possible receptacle 199 including an opening 120 for receiving the stem portion 74 of a solar module 28 therein. In this embodiment, the outer diameter of the stem portion 74 fits within the receptacle 199. A stem pin 213 can be used with a safety cotter pin 202 to secure the stem portion 74 of the solar module 28.

Shown in drawing FIG. 124 is a cross-sectional view of an alternative receptacle 199 including a projection 214 for receiving the stem portion 74 of a solar module. In this alternative receptacle 199, the stem portion 74 of the solar module 28 fits over the outer surface of the projection 214 and can then be secured with a stem pin 213 and safety cotter pin 202, or alternatively nut and bolt.

Shown in drawing FIG. 125 is a cross-sectional view of another alternative possible receptacle 199 including a projection 214 for receiving the stem portion 74 of a solar module 28. Like the embodiment shown in FIG. 124, the stem portion 74 of the solar module 28 can fit over the projection 214, but in this embodiment the projection 214 can be made as a separate component and later be secured to the bracket 198 by mechanical means and/or by being welded. The stem portion 74 of the solar module 28 and can then be secured in place with a stem pin 213 and safety cotter pin 202, or alternatively using at least one nut and bolt.

Shown in drawing FIG. 126 is a side view of an alternative bracket 198 including two staggered and gradually ascending rows of receptacles 199, a hinge 200, hinge pin 201, safety cotter pin 202, and several bolts 47 and nuts 48. Multiple brackets 198 having one and/or two or more layers 27 of receptacles 199 or gradually ascending rows of receptacles 199 can be used with any utility pole depending upon the available space to create a three-dimensional solar array 30 resembling a palm tree.

Shown in drawing FIG. 127 is a side view of a top bracket 208 including at least one layer 27 of receptacles 199 which are configured to secure the stem portions 74 of the solar modules 28 at upward angles relative to horizontal. As shown, there are two layers 27 of receptacles 199, a first layer closest to the top of the top bracket 218 having receptacles 199 directed at an upward angle, and a second layer closest to the bottom having receptacles 199 directed at an angle which is closer to horizontal.

Figure 128:
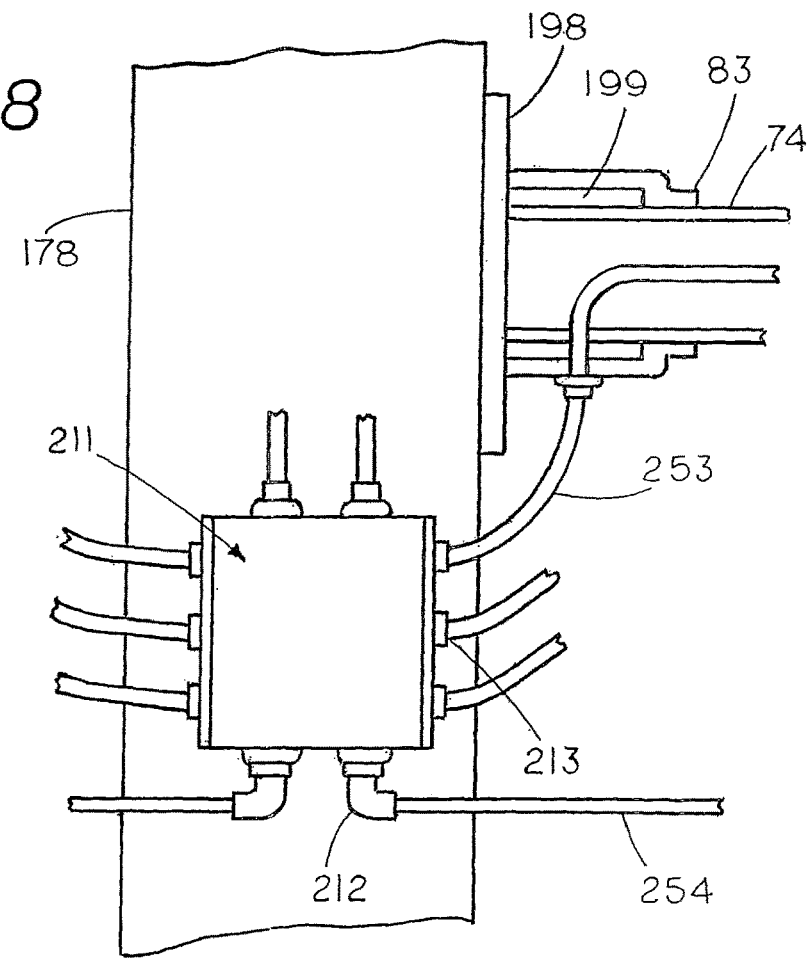

Shown in drawing FIG. 128 is a junction box 211 for receiving lines in 253 from at least one solar module and possibly also other solar arrays and also providing at least one line out 254 going to other solar arrays or other electrical devices. In this regard, the lines in and out can use any type of connectors 213, including, but not limited to straight or L shaped connectors 212, and the like. Moreover, the junction box 211 can possibly combine and provide other functions including but not limited to an interface, controller, inverter to change DC to AC, converter to change AD to DC, and also wired or wireless communications devices. In one embodiment, the controller can activate and deactivate selected solar modules based upon the location of the module on the utility pole and the predicted angle of the sun relative to the module to increase the efficiency of the solar array.

Figure 129:
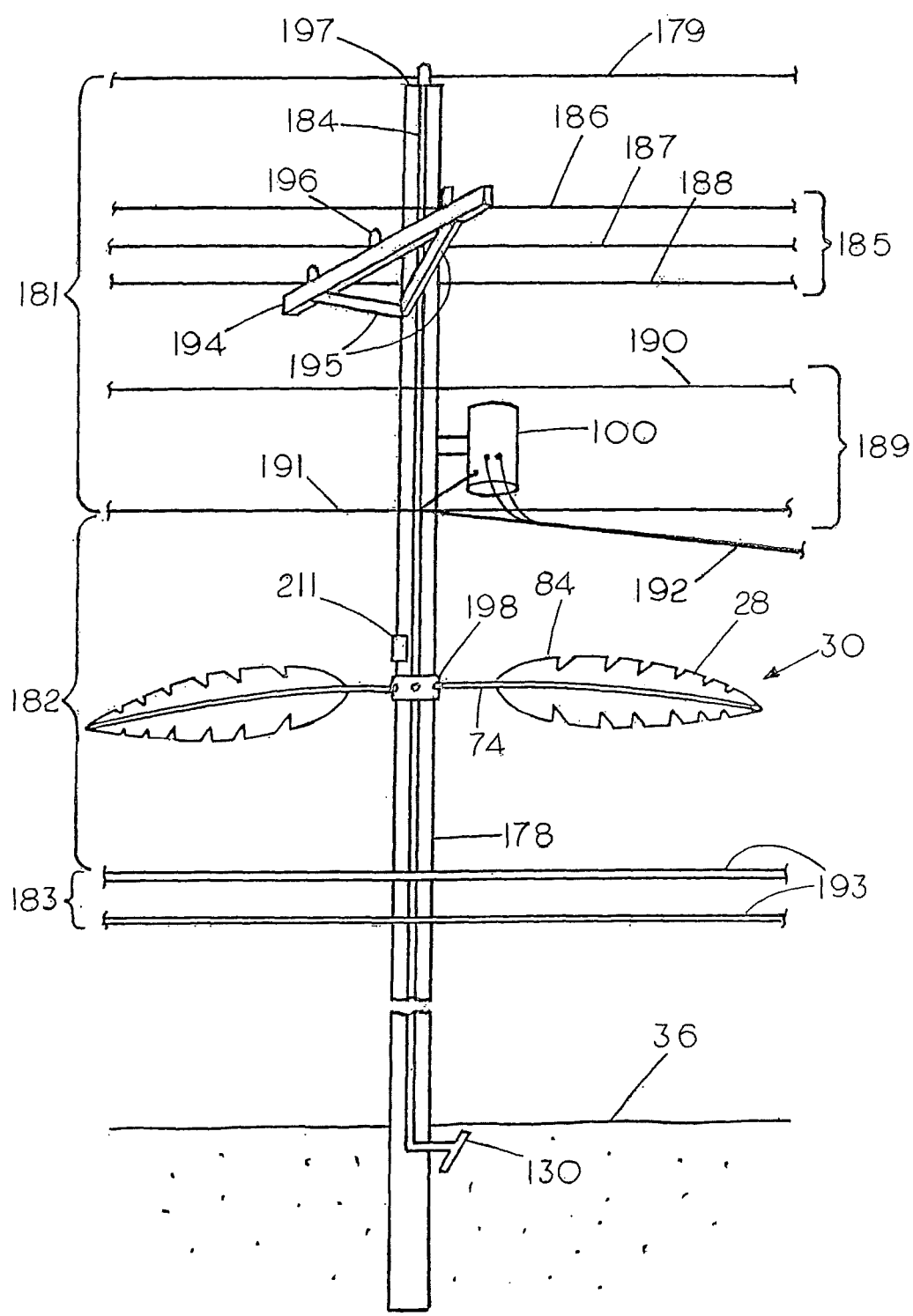

Shown in drawing FIG. 129 is a conventional utility and/or telephone pole 178 generally similar to that shown in drawing FIG. 117, but further including a plurality of solar modules 28 resembling palm fronds having stem portions 74 which are secured to the receptacles 199 of at least one bracket 198 generally similar to that shown in drawing FIG. 122. As shown in greater detail in drawing FIG. 128, a junction box 211 can be used for communicating with and/or conducting the electrical energy being produced by the solar modules 28 and possibly linking a plurality of solar arrays 30 together and/or to the conventional power grid.

Figure 130:
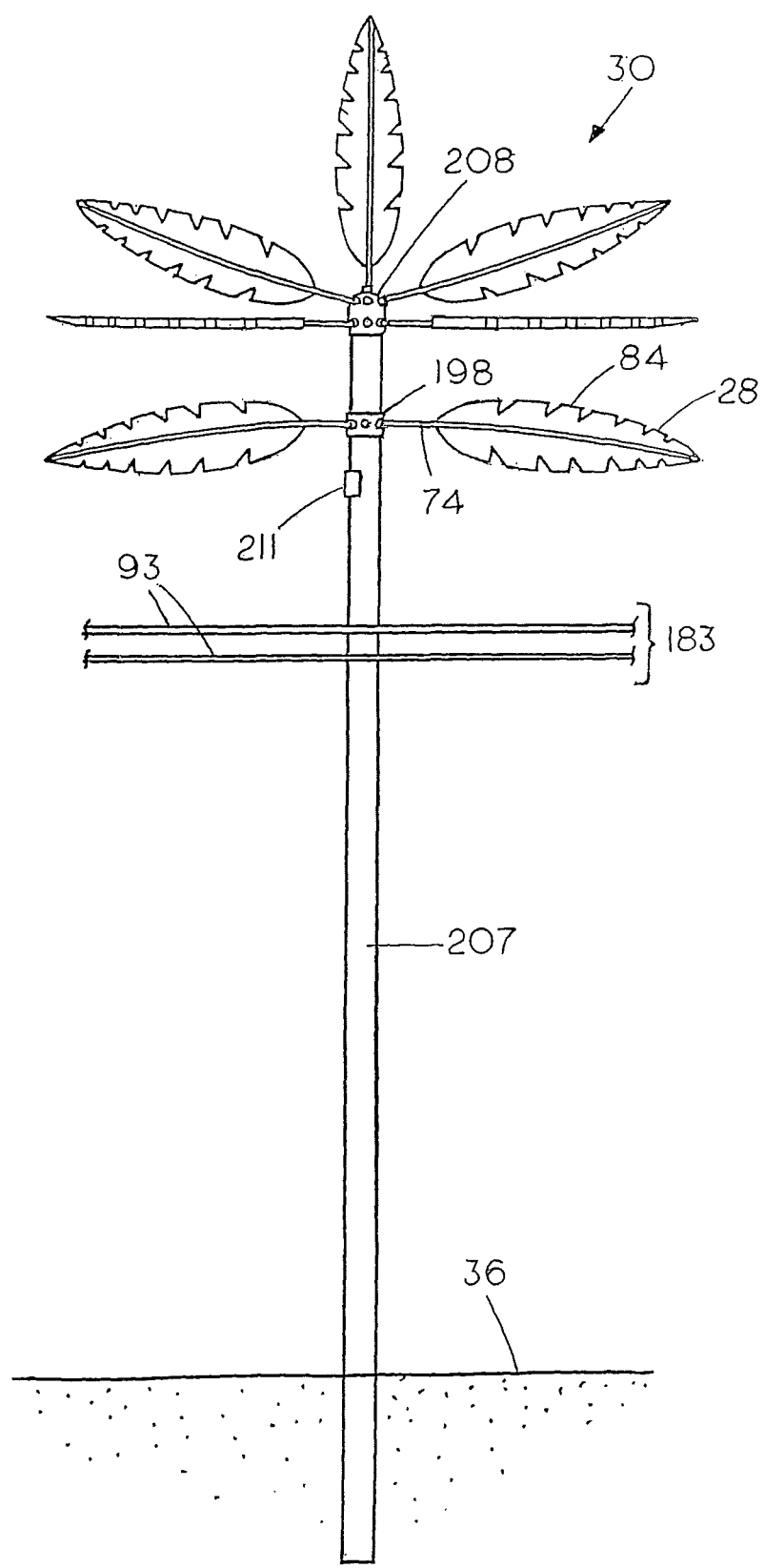

Shown in drawing FIG. 130 is a conventional telephone pole 207 generally similar to that shown in drawing FIG. 118, but including a plurality of solar modules 28 resembling palm fronds having stem portions 74 that are secured to the receptacles 199 of a top bracket 208 generally similar to that shown in drawing FIG. 127. Also shown is a junction box 211 for communicating with and/or conducting the electrical energy being produced by the solar modules 28 and possibly linking a plurality of solar arrays 30 together and/or to the conventional power grid. The line(s) out from the junction box 211 could extend above the communication lines 183 or be positioned below ground. It can be readily understood that the brackets shown in the provided drawing figures, and the like, can be used in multiple, partial, and complete combinations.

Figure 131:
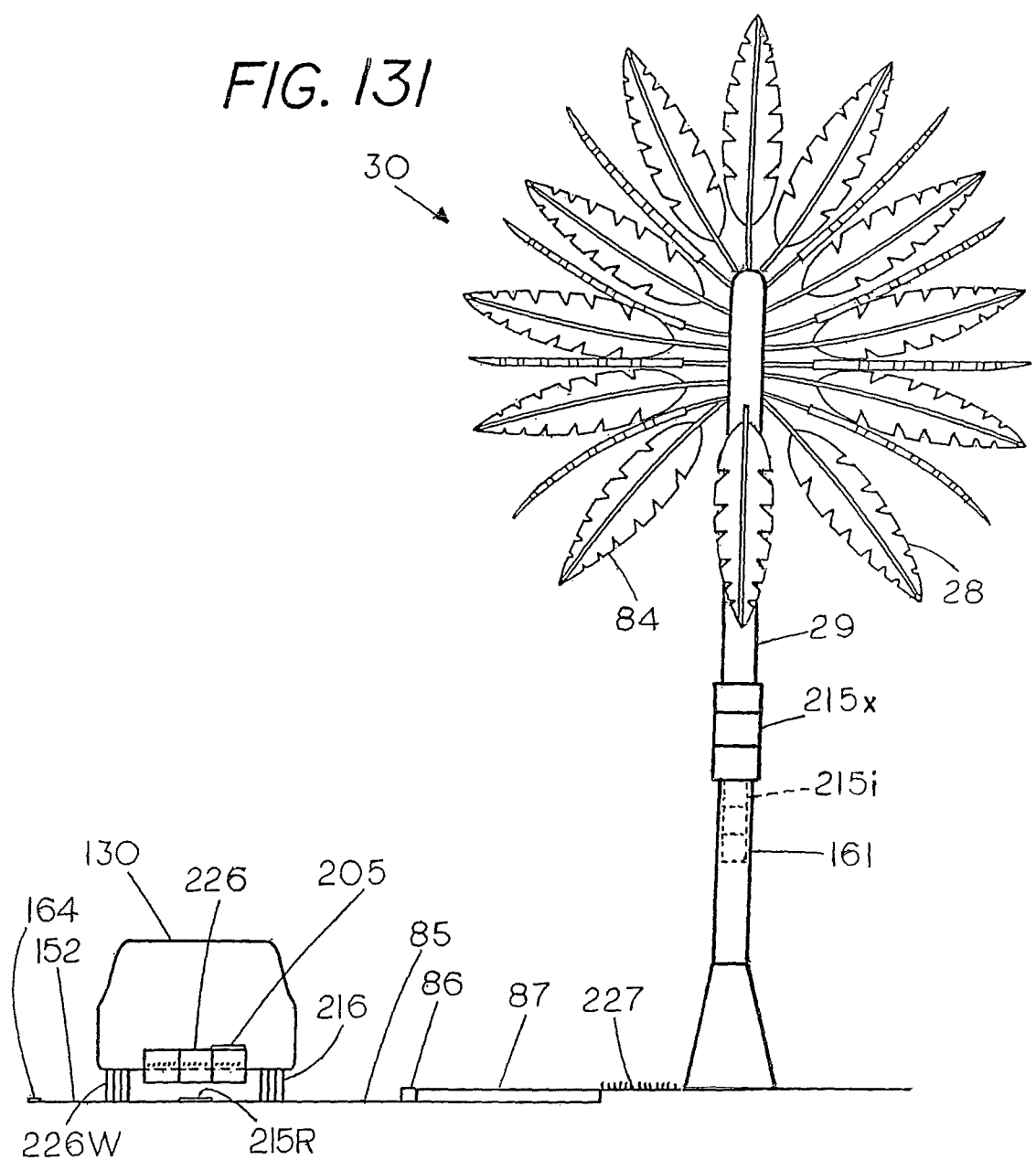

FIG. 131 is a perspective view of a transportation vehicle 130 such as an electric or hybrid automobile including at least one wireless device 226 and/or 226w and a controller 205 proceeding in a lane 152 of a road 85, highway, or other path of automotive travel. Also shown is a sidewalk 87 including a curb 86, and a solar array 30 resembling a palm tree 29 located in a green space 227 which includes at least one internal wireless device 215i and/or external wireless device 215x. Further, a wireless repeater 164 is shown on one side of the lane 152 in the road 85, and a wireless device 215r is also shown in the lane 152 of the road 85 such that the transportation vehicle 130 travels above the wireless device 215r. This wireless device 215r is located in the road 85 such that the wireless device 215r is less than about three feet away from a wireless device 226w disposed on the wheel 216 of a transportation vehicle 130 such as an electric or hybrid automobile. It is possible for these wireless devices 226, 226w, 215i, 215x, 215r, and the like, to be used in partial or complete combination, and they can include at least one coil device, where the wireless device 226w typically has a coiled configuration. Some or all of these wireless devices can transmit energy, receive energy, and/or both transmit and receive energy. It is also contemplated that the wireless devices 215r can be in communication with each other to direct the electromagnetic energy toward the moving vehicle. It is also contemplated that the devices 215r in the road can be wired together to direct electromagnetic energy toward the moving vehicle.

In the United States, the width of a lane 152 of a road 85, highway, or other path of automotive travel is normally twelve feet, and the width of a sidewalk 87 including a curb 86 is about six feet. Utility and/or telephone poles are normally located in a green space 227 relatively close to the sidewalk 87, but sometimes are located in the sidewalk 87 and relatively close to the curb 86, and in particular, when they are located near street corners. The average width and also the height of a transportation vehicle 130 such as an electric or hybrid automobile is about five feet, but this can vary greatly depending on the make and model of vehicle. The solar array 30 can include at least one wireless device 215i mounted internally and/or at least one wireless device 215x mounted externally relative to the support pole 38 and/or trunk portion 31, for transmitting electric power to at least one wireless device 226, 226w, 226s (as illustrated in FIG. 134), and 226h mounted on an electric or hybrid vehicle. Multiple wireless devices 215i and/or 215x on the support pole 38 which can receive and/or transmit the same wavelength and frequency, or which can be controlled or tuned to receive and/or transmit different wavelengths and frequency for providing energy to electric and/or hybrid vehicles can be used.

As shown in drawing FIG. 134, at least one wireless device 226w can be located in a wheel 216, and/or a wireless device 226s can be located in an area surrounding a suspension strut column 222, and/or in a coil array 225 including at least one coil 62 as shown in drawing FIGS. 132 and 133. Multiple wireless devices 226 can be configured and/or controlled or tuned to receive the same wavelength and frequency, or alternatively to receive and/or transmit different wavelengths and frequency for providing energy to electric and/or hybrid vehicles. Further, it possible for a solar array resembling a palm tree and/or a transportation vehicle to include a wireless device including a coil device which can include both primary and a secondary coil subcomponents. For example, a Tesla coil device can be used to create high voltage using a resonating circuit. The inventor Nikola Tesla was associated with the introduction and use of AC current, electric motors, and he also filed many patents relating to radio transmission and/or radiant energy including U.S. Pat. Nos. 649,621, 645,576, 685,957, 787,412, and 1,119,732, and all of these patents are hereby incorporated by reference herein.

FIG. 132 is a top view of a coil array 225 including nine coils 62 for possible use in an electric or hybrid vehicle 130. It is also possible for wireless devices 226 included on transportation vehicles to be used to provide energy to other electrical appliances or devices, a residential home, and/or to an electric power grid.

FIG. 133 is a top view of a coil array 246 including staggered and overlapping coils 62. Again, it is possible for wireless devices 226 included on transportation vehicles to be used to provide energy to other electrical appliances or devices, a residential home, and/or to an electric power grid.

FIG. 134 is a rear and partial cross-sectional view of a portion of a transportation vehicle 130 such as an electric or hybrid automobile including a chassis 221, or alternatively having unibody construction which provides supporting structure, including an electric motor 220, drive shaft 219, U-joint 223, brake disc 250, suspension arms 224, wheel bearing and suspension mount 218, wheel hub 228 including wheel bolts 231, wheel 216 including a recess 235, wheel rim 233, a gas filled cavity 256 formed by the wheel 216 and tire 217, wheel nuts 229, electric motor wire bolt 230, and drive shaft wire or conductor 234, showing a wireless device 226s located around the suspension spring 247 mounted between top spring support 249 and bottom spring support 248 and shock absorber 222.

The vehicle includes at least one wire 236 that can be placed in communication with a controller of the electric motor 220 and/or a battery, and another wireless device 226w located in the recess 235 on the wheel 216 which is in communication with at least one wire 237 that can be placed in communication with a controller of the electric motor and/or battery. As shown, a wireless device 226w can be located in a recess 235 in the wheel 216 below the edges of the rim 233 where the tire 217 is mounted, and the wireless device 226w can be a sealed unit. At least one wire 232 can extend from the wireless device 226w to the central portion of the wheel in electrical isolation and be connected by a mechanical fastener such as an electrical communication bolt 230 to an isolated electrical conductor 234 which can then be placed in communication with a brush 238 or similar electrical connection, and then with a wire 237 that can be placed in communication with a controller of the electric motor 220 and/or a battery. The wireless device 226w mounted in at least one wheel 216 of a transportation vehicle is then disposed in relatively close proximity to the ground support surface 36 and road 85, highway, or other path of transportation. As a result, the wireless device 226w can then be placed closer to the ground than the bottom surface of the chassis 221 or body of the transportation vehicle 130. Accordingly, if and when transmitting wireless devices and/or repeaters are placed within, upon, or near a road surface and possibly between lanes as shown and discussed in drawing FIGS. 36, 38, and 39, 131, and 135, and/or as shown and discussed in U.S. 2009/0045773, by Pandya et al., this patent application being hereby incorporated by reference herein, the relatively close location of the wireless transmitting and receiving devices can then serve to enhance their operational efficiency.

FIG. 135 is a rear and partial cross-sectional view of a transportation vehicle 130 such as an electric or hybrid automobile generally similar to that shown in drawing FIG. 131 which includes at least one wireless device 226 and a controller 205 proceeding in the lane 152 of a road 85 or other path of transportation. Also shown is a nearby sidewalk 87 including a curb 86, and a utility and/or telephone pole 207 located in a greenspace 227 that includes brackets 198 and 208, and solar modules 28 for making a solar array 30 resembling a palm tree 29. An external wireless device 215x can be mounted on the utility and/or telephone pole when it is installed or being retrofitted. Alternatively, a mounting base 239 can be installed on the utility and/or telephone pole, and a wireless device 215x can be secured thereto, and a cover 240 be closed to create a sealed and protective environment. When the utility pole and/or solar array includes a hollow internal structure, or interior compartment 122, it can possibly include at least one internal wireless device 215i. Further, a wireless repeater 164 is shown on one side of the lane 152 in the road 85, and a wireless device 215r is shown beneath the surface of the road 85 disposed on the inside of the lane 152 between the transportation vehicle 130 and the curb 86. This wireless device 215r is then often less than three feet away from a wireless device 216w disposed on the wheel 216 of a transportation vehicle 130 such as an electric or hybrid automobile. Alternatively, a wireless device 215r can be positioned near or under the tire 217 and wheel 216 of a transportation vehicle 130, and/other locations in the lane 152 of a road 85. It is possible for wireless devices 226, 226w, 215i, 215x, 215r, and the like, to be used in partial or complete combination, and they can include at least one coil device. Some or all of the aforementioned wireless devices can transmit energy, receive energy, and/or both transmit and receive energy. The present disclosure teaches a three dimensional solar array which can include solar modules and/or solar cells configured to resemble natural foliage such as palm, deciduous, and conifer trees, but also more broadly teaches a three dimensional solar array including a plurality of solar modules having one or more geometric shapes configured about the support pole in a spiral and/or layered configuration.

Once again, multiple wireless devices 215i, 215x, 215r, 164, 159, 161, 226, 226w, 226h, 226s, which can receive and/or transmit the same wavelength and frequency, or which can be controlled or tuned to receive and/or transmit different wavelengths and frequency for providing energy to electric and/or hybrid vehicles can be used, so that the batteries of the vehicle can be charged as the vehicle is being used, whether stopped or in motion. Likewise, wireless devices 226, 226w, 226h, 226s, 159 which can be included on transportation vehicles can be configured and/or controlled or tuned to receive and/or transmit the same wavelength and frequency, or alternatively to receive and/or transmit different wavelengths and frequencies for providing energy to other electric devices, a residence, or power grid so that the batteries of the vehicle can be charged as the vehicle is being used, whether stopped or in motion. Allowing the batteries to be charged as the vehicle is used increases the driving range of the vehicle in a manner that causes virtually no emissions into the environment. Further, the amount of charging required at a particular charging station will be reduced, which will reduce the amount of time required to fully charge the vehicle, which can be especially beneficial while travelling from one location to another location, as the charging time increases the amount time required to reach a destination.

FIG. 136 is a side view of an alternative utility pole 241 for supporting a street light 242 showing an externally mounted wireless device 215X on the vertical support pole portion 243. Also shown is a larger wireless device 215AX being mounted on or between the bracing support structure 244 of the arm portion 245 and the vertical support pole portion 243, and internal wireless device 215i. In this regard, the range and efficiency of a wireless device including a coil can sometimes be a function of the size of the included coil. It can be readily understood that a receiving and/or transmitting wireless device including a coil having a matching size and corresponding function can be used on a transportation vehicle.

FIG. 137 is side view of an alternative wheel 216a and tire 217 for a transportation vehicle with the hub cap 260 removed showing an external wireless device 226w mounted on the outside of the wheel 216a. This configuration can provide easy access to the wireless device 226w.

FIG. 138 is a front view of an alternative wheel 216b and tire 217 for a transportation vehicle with parts broken away generally similar to that shown in FIG. 134, which shows a wireless device 226w that is not in direct communication with the gas filled cavity 256 formed by the wheel 216b and tire 217, but rather the wireless device 226w is disposed between the outside portion 257 and inside portion 258 of the wheel 216b. The inside portion 257 and outside portion 258 of the wheel 216b can be removably secured together with the use of conventional bolts, bolts and nuts, or other male and female mating structures and devices.

FIG. 139 is a front view of an alternative wheel 216c and tire 217 for a transportation vehicle with parts broken away generally similar to that shown in FIG. 134, showing an alternative wheel 216c having a removable hub cap 259 which includes a wireless device 226h. A hub cap 259 can also include in partial or complete combination a capacitor 261, and/or a battery 261.

FIG. 140 is a front view of an alternative wheel 216d and tire 217 with for a transportation vehicle with parts broken away which shows a wireless device 226w and converter 91 and inverter 92 disposed on the wheel 216d.

FIG. 141 is a front view of an alternative wheel 216e and tire 217 for a transportation vehicle with parts broken away which shows a wireless 226w, capacitor 261, and battery 262 disposed on the wheel 216e.

FIG. 142 is front view of an alternative wheel 216f and tire 217 for a transportation vehicle with parts broken away generally similar to that shown in FIGS. 134, 138 and 141, which shows a wireless device 226w, capacitor 261, and battery 262 disposed on the wheel 216f, and also an electric motor 220 located near the wheel 216f. As shown, the wireless device 226w, capacitor 261, and battery 262 are disposed between the outside portion 257 and inside portion 258 of the alternative wheel 216b. Again, the inside portion 257 and outside portion 258 of the wheel 216b can be removably secured together with the use of conventional bolts, bolts and nuts, or other male and female mating structures and devices. This configuration and structure places the aforementioned devices in close proximity with one another, and also enables them to be readily accessed and serviced by removal of the wheel 216f.

There is be a great need for electric power along these roads and highways. Solar palm trees located alongside roads and highways would be able to provide electric power in certain regions. Further, there are hundreds of thousands of utility/telephone poles located next to existing traffic lanes on roads and freeways in the United States. Many of these utility/telephone poles are already supporting electric power lines and/or communication lines. Accordingly, it would be relatively easy to tap into those electric power lines for use with transmitting devices mounted, e.g., on solar palm trees, utility/telephone poles, and repeaters which could be disposed above and/or below road surfaces for use with corresponding receiving devices and providing electric power to transportation vehicles.

It can be readily understood and that when a conductive metal object is elevated in a vertical position it can actually or potentially become an antenna for receiving and/or transmitting energy in the electromagnetic spectrum. The ionosphere which extends approximately between 50-600 miles above the earth includes a high concentration of charged ions and free electrons. In general, the atmosphere is characterized by a positive charge relative to the earth which is negative and ground. Lightning is an electrical discharge that can be seen between clouds such as thunderheads and the earth. This is associated with something known as Schuman resonance. In order to properly ground some radio antennas, it is known to create a ground plane, ground screen, and/or counterpoise. In this regard, a counterpoise can also possibly serve as a capacitor. Because a three-dimensional solar palm tree can be made of conductive metal components such as a metallic vertical support pole and also include a plurality of metal poles which support solar modules which extend therefrom, the resulting structure can by design be an antenna, and one which possibly includes a counterpoise. The spacing of a plurality of three-dimensional solar palm trees in parking lots, or alongside roads and then perhaps for many miles can also possibly create a phased array.

Having thus described the invention, it should be apparent that numerous structural modifications and adaptations may be resorted to without departing from the scope and fair meaning of the instant invention as set forth hereinabove.

The invention claimed is:

1. A utility pole comprising:
one or more solar modules configured to collect solar energy and convert said solar energy to electromagnetic energy; and
a first wireless device located proximate to the utility pole and being configured to receive the electromagnetic energy from the one or more solar modules, wherein the first wireless device is configured to transmit the electromagnetic energy therefrom to a second wireless device located on an outer surface of a wheel or a hubcap of an electric or hybrid vehicle, wherein said electric or hybrid vehicle is spaced from the first wireless device, said second wireless device being in electrical communication with at least one battery and/or electric motor of said electric or hybrid vehicle and providing a source of electromagnetic energy therefore, whether the electric or hybrid vehicle is stopped or in motion.

2. The utility pole of claim 1, and further comprising a junction box electrically coupling the one or more solar modules to the first wireless device.

3. The utility pole of claim 2, and further comprising one or more export lines configured to carry electromagnetic energy from the junction box.

4. The utility pole of claim 3, and further comprising a converter or an inverter between the one or more input lines and the one or more output lines.

5. The utility pole of claim 2, and further comprising one or more communications devices configured to utilize electromagnetic energy from the junction box.

6. The utility pole of claim 5, wherein the one or more communications devices comprises a wireless communication device.

7. The utility pole of claim 5, wherein the one or more communications devices comprises a wired communication device.

8. The utility pole of claim 1, wherein the one or more solar modules are configured to resemble natural foliage.

9. The utility pole of claim 1, and further comprising a mounting bracket comprising a plurality of coupling structures configured to removably secure said plurality of solar modules thereto, said mounting bracket is configured to be positioned and retained about a circumference of said utility pole.

10. The utility pole of claim 9, wherein each of said plurality of solar modules is configured as palm fronds, wherein each solar module of the plurality of palm fronds is configured to be removably secured to one of said plurality of coupling structures.

11. The utility pole of claim 9, wherein said mounting bracket comprises a domed configuration adapted to be positioned on a top of said utility pole, wherein the mounting bracket further comprises a plurality of coupling structures.

12. The utility pole of claim 9, wherein said plurality of solar modules is configured as palm fronds, wherein each of said plurality of solar modules is configured to be removably secured to one of said coupling structures, and said coupling structures comprise a plurality of receptacles.

13. A method of retrofitting an existing utility pole to utilize solar energy, the method comprising:
attaching a plurality of solar modules to the utility pole, each of the plurality of solar modules configured to collect solar energy and convert said solar energy to electromagnetic energy; and
attaching a first wireless device to the utility pole, the first wireless device configured to receive the electromagnetic energy from the plurality of solar modules and to transmit the electromagnetic energy therefrom to a second wireless device located on an outer surface of a wheel or a hubcap of an electric or hybrid vehicle, wherein said electric or hybrid vehicle is spaced from said first wireless device, said second wireless device being in electrical communication with at least one battery and/or electric motor of said electric or hybrid vehicle and providing a source of electromagnetic energy therefore.

14. The method of claim 13, and further comprising attaching a first mounting bracket to the utility pole, wherein the first mounting bracket comprises a first plurality of coupling structure that secure the plurality of solar modules to the utility pole, wherein the first mounting bracket is attached to the utility pole above a communications space.

15. The method of claim 13, and further comprising attaching a second mounting bracket to the utility pole above a supply space, the second mounting bracket comprising a second plurality of coupling structures for removably securing said plurality of solar modules.

16. The method of claim 15, wherein the second bracket has a domed structure and is attached to a top end of said utility pole.

17. The method of claim 16, wherein the plurality of solar modules configured as palm fronds.

18. The method of claim 13, and further comprising transmitting said electromagnetic energy from the first wireless device to the second wireless device to supply energy to the electric or hybrid vehicle.

19. The method of claim 17, and further comprising inverting or converting said electromagnetic energy.

20. The method of claim 18, and further comprising transmitting said electromagnetic energy to one or more communication devices comprising cellular telephones and/or computers.

21. The method of claim 13, and further comprising:
transmitting the electromagnetic energy from the first wireless device to one or more repeaters; and
transmitting the electromagnetic energy from the one or more repeaters to the second wireless device.

22. A utility pole comprising:
a source of electromagnetic energy; and
a first wireless device attached to the utility pole configured for receiving and transmitting the electromagnetic energy to a second wireless device configured for at least receiving said electromagnetic energy,
wherein said second wireless device is disposed on the outer surface of a wheel or a hubcap of an electric or hybrid vehicle spaced from said source of electromagnetic energy, said second wireless device being in electrical communication with at least one battery and/or electric motor of said electric or hybrid vehicle and providing a source of electromagnetic energy therefore, whether the vehicle is stopped or is in motion.

23. The utility pole of claim 22, wherein the first wireless device is further configured to transmit said electromagnetic energy to one or more communication devices comprising cellular telephones and/or computers.

24. The utility pole of claim 22, wherein the first wireless device is configured to transmit the electromagnetic energy to one or more repeaters and wherein the one or more repeaters are configured to transmit the electromagnetic energy from the one or more repeaters to the second wireless device.

25. The utility pole of claim 22, wherein the second wireless device is configured to communicate electromagnetic energy to a third device.

26. The utility pole of claim 22, wherein the second wireless device is configured to communicate electromagnetic energy to the first wireless device.

* * * * *